United States Patent
Chiang et al.

(10) Patent No.: US 12,272,603 B2
(45) Date of Patent: Apr. 8, 2025

(54) METHOD OF MANUFACTURING A SEMICONDUCTOR DEVICE AND A SEMICONDUCTOR DEVICE

(71) Applicant: Taiwan Semiconductor Manufacturing Company, Ltd., Hsinchu (TW)

(72) Inventors: Hung-Li Chiang, Taipei (TW); Chih-Liang Chen, Hsinchu (TW); Tzu-Chiang Chen, Hsinchu (TW); I-Sheng Chen, Taipei (TW); Lei-Chun Chou, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/504,027

(22) Filed: Nov. 7, 2023

(65) Prior Publication Data
US 2024/0071834 A1    Feb. 29, 2024

Related U.S. Application Data

(60) Continuation of application No. 17/706,362, filed on Mar. 28, 2022, now Pat. No. 11,848,242, which is a
(Continued)

(51) Int. Cl.
*H01L 29/76* (2006.01)
*H01L 21/8238* (2006.01)
(Continued)

(52) U.S. Cl.
CPC ............... *H01L 21/823821* (2013.01); *H01L 21/823828* (2013.01); *H01L 21/823864* (2013.01);
(Continued)

(58) Field of Classification Search
CPC ..... H01L 21/823821; H01L 21/823828; H01L 21/823864; H01L 21/823871;
(Continued)

(56) References Cited

U.S. PATENT DOCUMENTS

| | | | |
|---|---|---|---|
| 7,521,322 B2 | 4/2009 | Tang et al. | |
| 9,236,267 B2 | 1/2016 | De et al. | |

(Continued)

FOREIGN PATENT DOCUMENTS

| | | |
|---|---|---|
| KR | 101795208 B1 | 11/2017 |
| TW | 201724279 A | 7/2017 |
| TW | 201730956 A | 9/2017 |

OTHER PUBLICATIONS

Non-Final Office Action issued in U.S. Appl. No. 16/281,679, dated Apr. 13, 2020.
(Continued)

*Primary Examiner* — Theresa T Doan
(74) *Attorney, Agent, or Firm* — STUDEBAKER BRACKETT PLLC

(57) ABSTRACT

A method of manufacturing a semiconductor device includes forming a plurality of fin structures extending in a first direction over a semiconductor substrate. Each fin structure includes a first region proximate to the semiconductor substrate and a second region distal to the semiconductor substrate. An electrically conductive layer is formed between the first regions of a first adjacent pair of fin structures. A gate electrode structure is formed extending in a second direction substantially perpendicular to the first direction over the fin structure second region, and a metallization layer including at least one conductive line is formed over the gate electrode structure.

20 Claims, 94 Drawing Sheets

Related U.S. Application Data continuation of application No. 17/114,347, filed on Dec. 7, 2020, now Pat. No. 11,289,384, which is a division of application No. 16/281,679, filed on Feb. 21, 2019, now Pat. No. 10,861,750.

(60) Provisional application No. 62/693,180, filed on Jul. 2, 2018.

(51) Int. Cl.
*H01L 27/092* (2006.01)
*H01L 29/06* (2006.01)
*H01L 29/66* (2006.01)
*H01L 29/78* (2006.01)
*H01L 29/94* (2006.01)
*H01L 31/112* (2006.01)

(52) U.S. Cl.
CPC .. *H01L 21/823871* (2013.01); *H01L 27/0924* (2013.01); *H01L 29/0673* (2013.01); *H01L 29/66545* (2013.01); *H01L 29/66795* (2013.01); *H01L 29/785* (2013.01); *H01L 2029/7858* (2013.01)

(58) Field of Classification Search
CPC ............ H01L 27/0924; H01L 29/0673; H01L 29/66545; H01L 29/66795; H01L 29/785; H01L 2029/7858; H01L 29/0653; H01L 29/0847; H01L 29/1079; H01L 29/401; H01L 29/42392; H01L 29/66439; H01L 29/78696; H01L 21/823412; H01L 21/823807; H01L 29/165; H01L 29/6656; H01L 29/7848; H01L 21/823475; H01L 27/088; H01L 29/775; H01L 27/092; H01L 29/0684; H01L 29/7831; H01L 21/823431; H01L 21/823437; H01L 29/0669; H01L 29/41791; H01L 29/7855; B82Y 10/00

USPC ........................................................ 257/369
See application file for complete search history.

(56) References Cited

U.S. PATENT DOCUMENTS

| | | | |
|---|---|---|---|
| 9,502,265 | B1 | 11/2016 | Jiang et al. |
| 9,520,466 | B2 | 12/2016 | Holland et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,786,739 | B2 * | 10/2017 | Balakrishnan ...... H01L 29/0676 |
| 9,786,774 | B2 | 10/2017 | Colinge et al. |
| 9,837,414 | B1 | 12/2017 | Balakrishnan et al. |
| 9,853,101 | B2 | 12/2017 | Peng et al. |
| 9,881,993 | B2 | 1/2018 | Ching et al. |
| 11,289,384 | B2 | 3/2022 | Chiang et al. |
| 2002/0149031 | A1 * | 10/2002 | Kim ................. H01L 29/66772 257/E21.415 |
| 2003/0207523 | A1 | 11/2003 | Liu et al. |
| 2012/0129301 | A1 | 5/2012 | Or-Bach et al. |
| 2015/0041899 | A1 | 2/2015 | Yang et al. |
| 2015/0372104 | A1 | 12/2015 | Liu et al. |
| 2017/0104061 | A1 | 4/2017 | Peng et al. |
| 2018/0145030 | A1 | 5/2018 | Beyne et al. |

OTHER PUBLICATIONS

Notice of Allowance issued in U.S. Appl. No. 16/281,679, dated Aug. 7, 2020.

Notice of Allowance issued in U.S. Appl. No. 17/114,347, dated Nov. 19, 2021.

Non-Final Office Action issued in U.S. Appl. No. 17/706,362, dated Apr. 10, 2023.

Notice of Allowance issued in U.S. Appl. No. 17/706,362, dated Aug. 7, 2023.

* cited by examiner

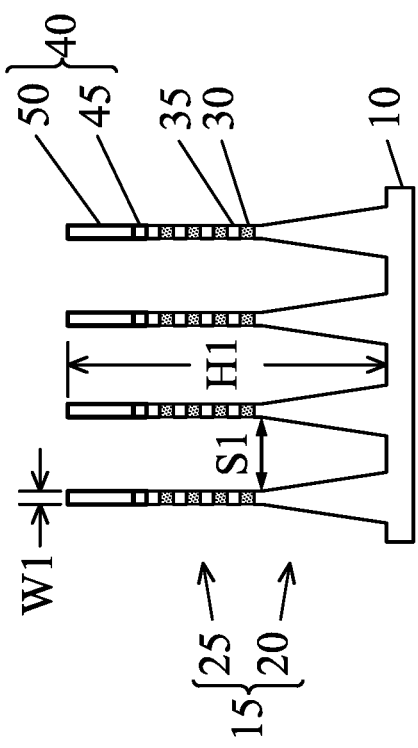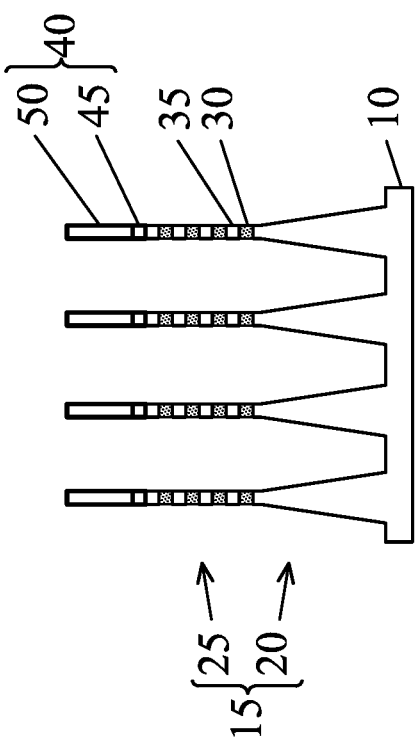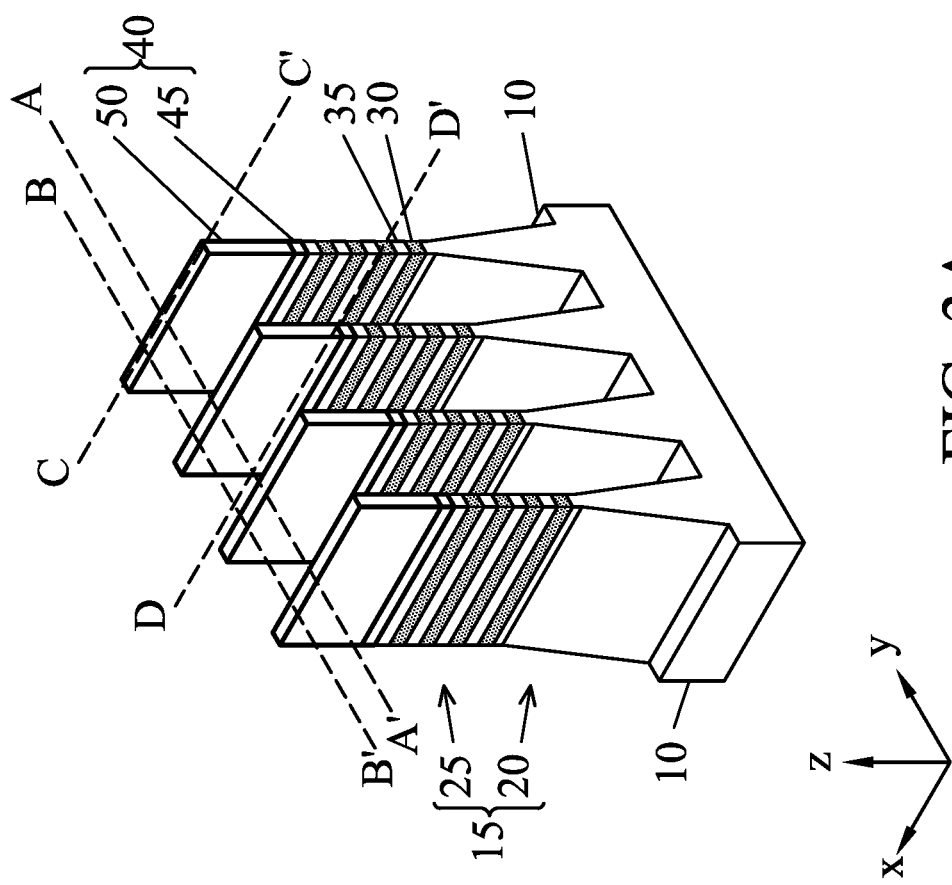

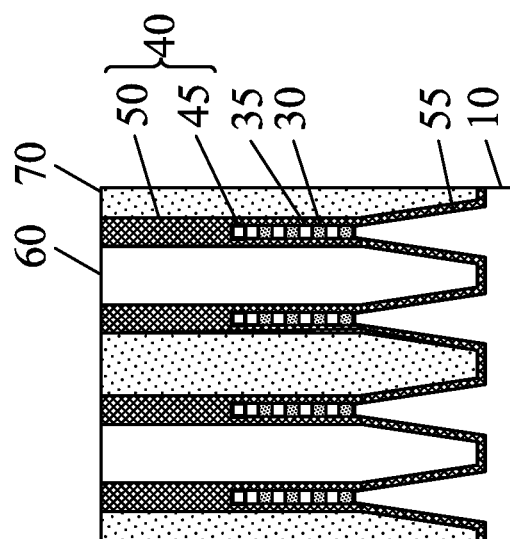
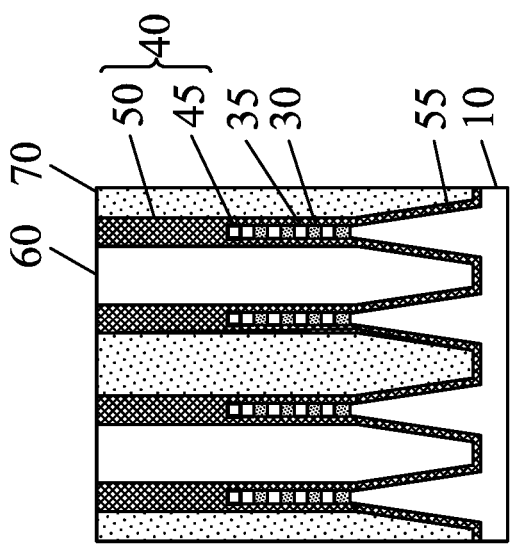
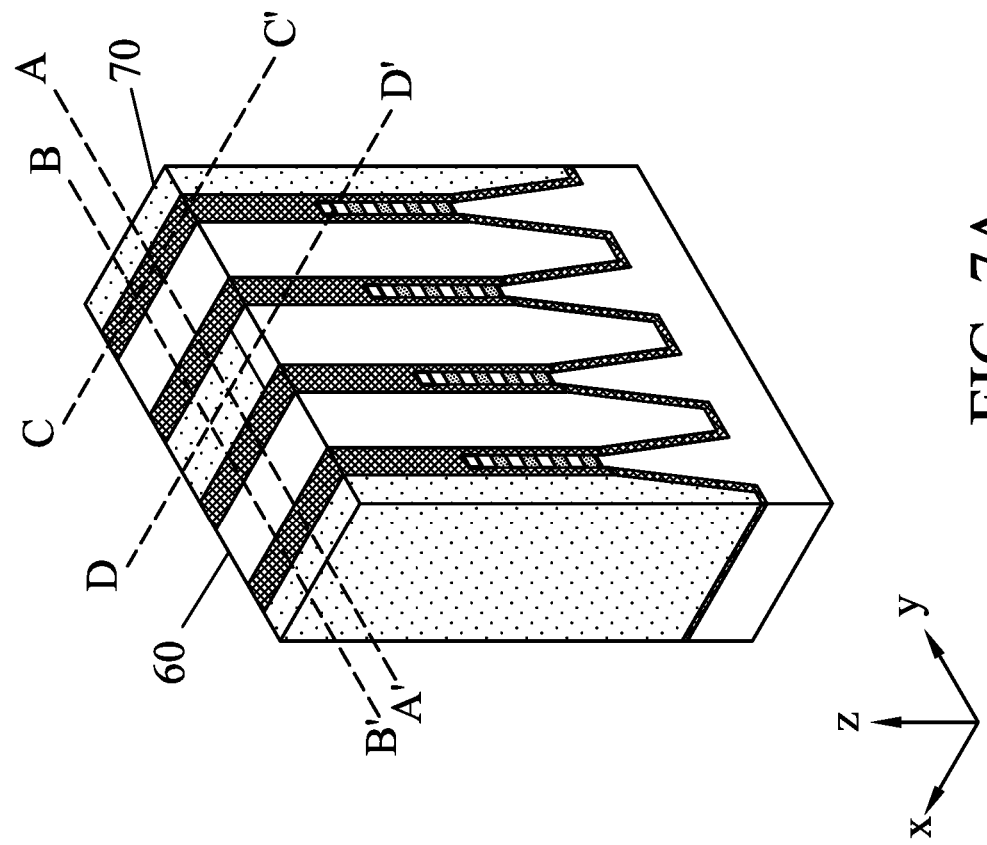
FIG. 7B
FIG. 7C
FIG. 7A

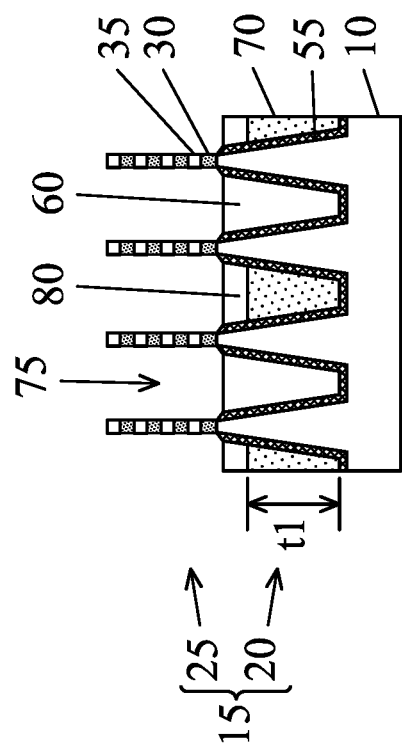
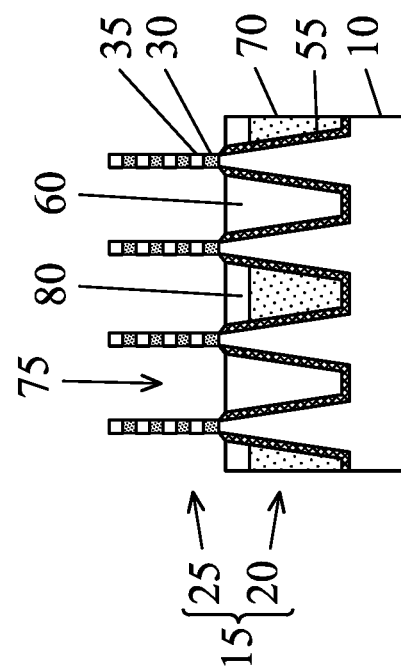
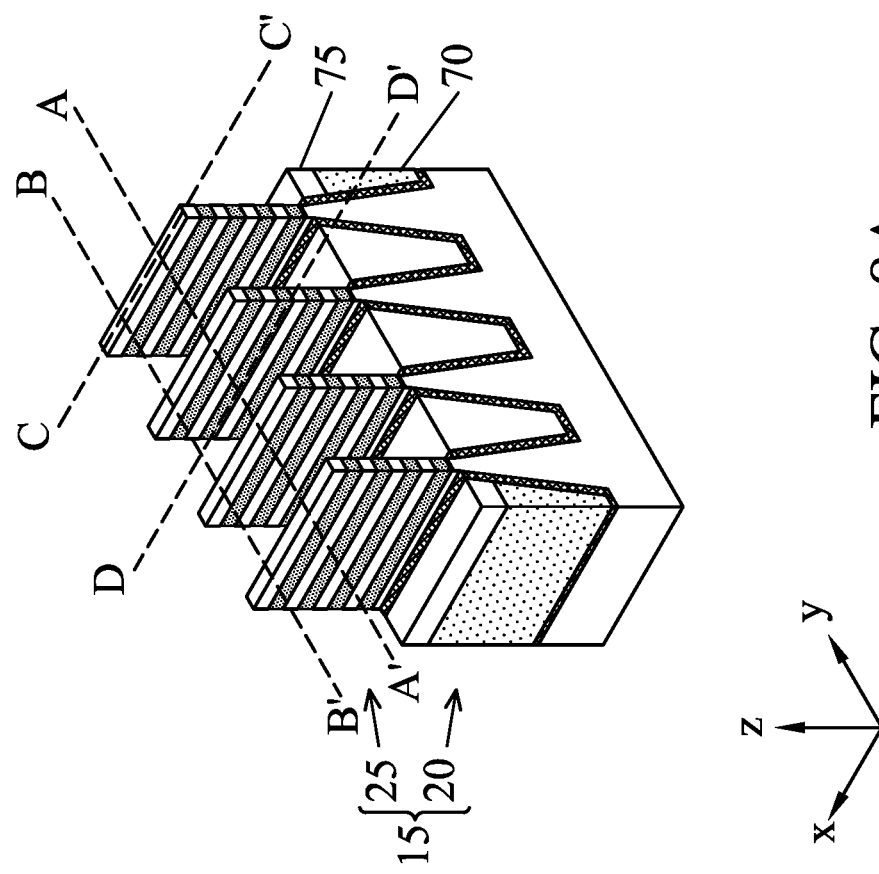
FIG. 8A
FIG. 8B
FIG. 8C

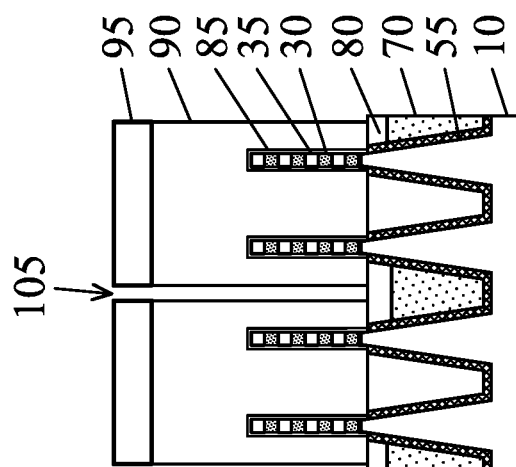
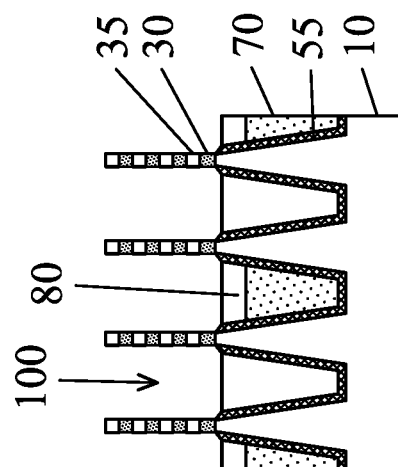
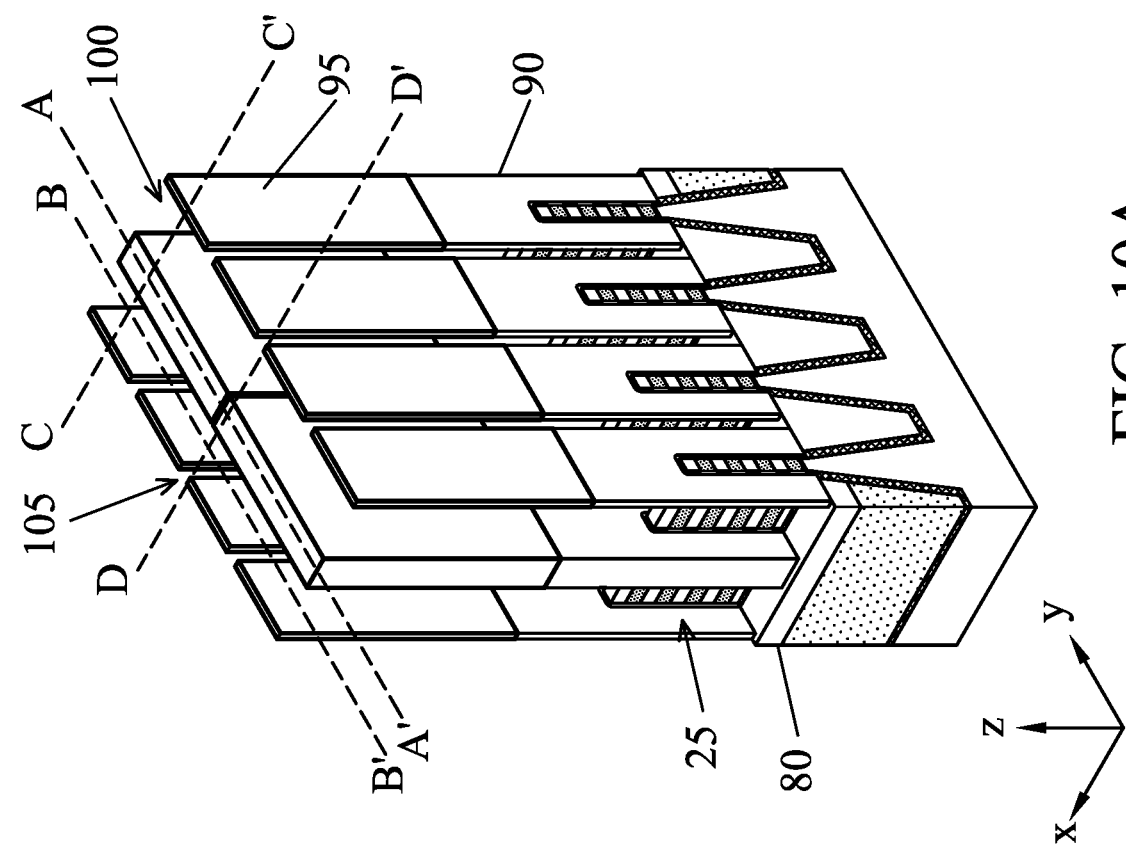
FIG. 10A
FIG. 10B
FIG. 10C

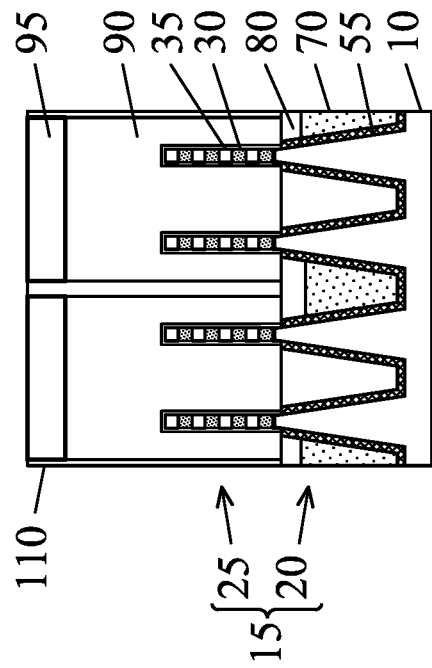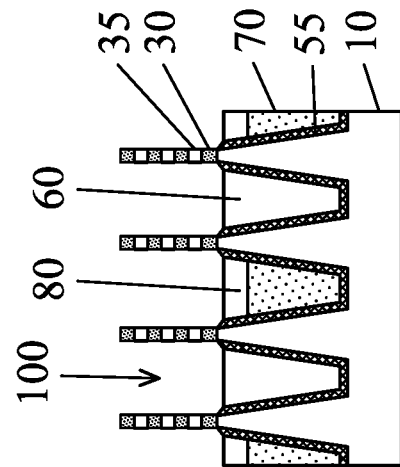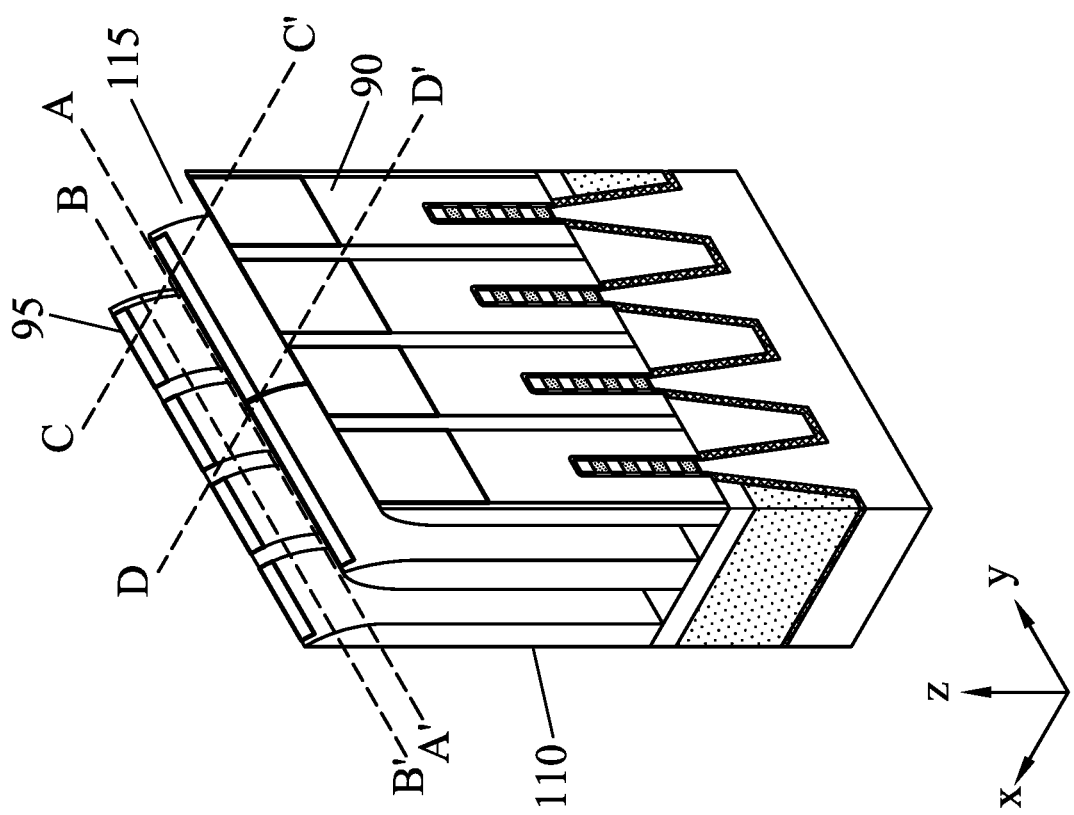
FIG. 11A
FIG. 11B
FIG. 11C

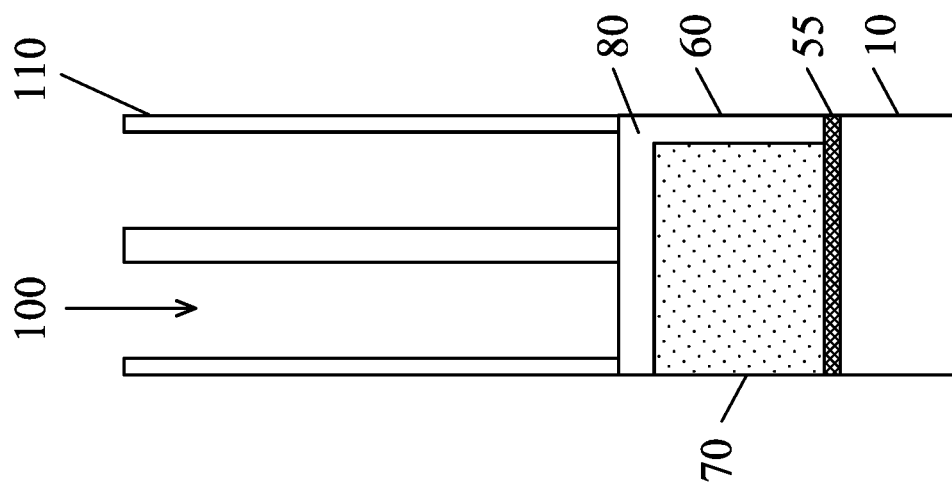
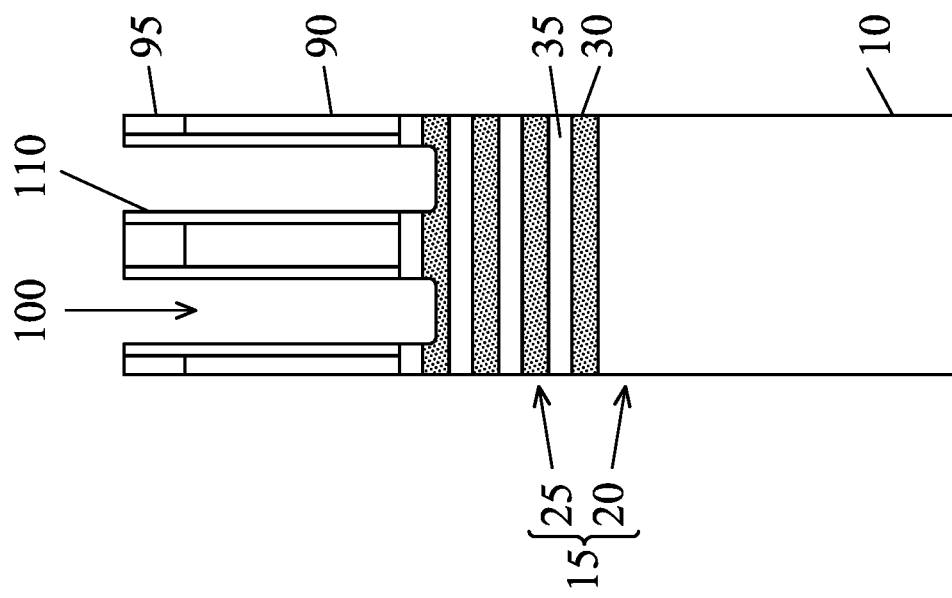

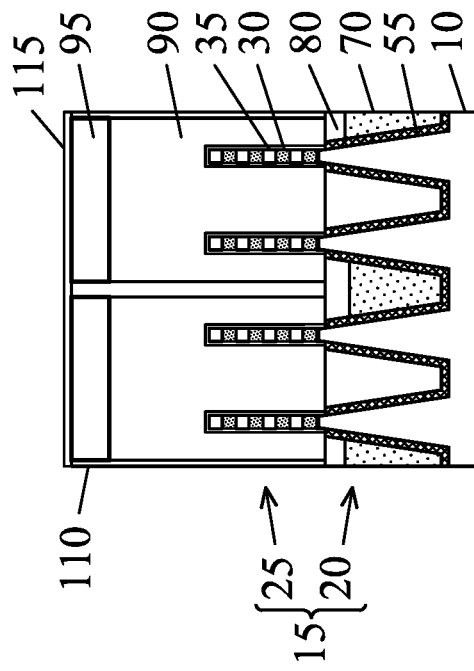
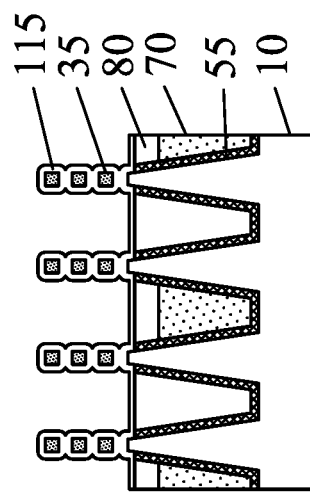
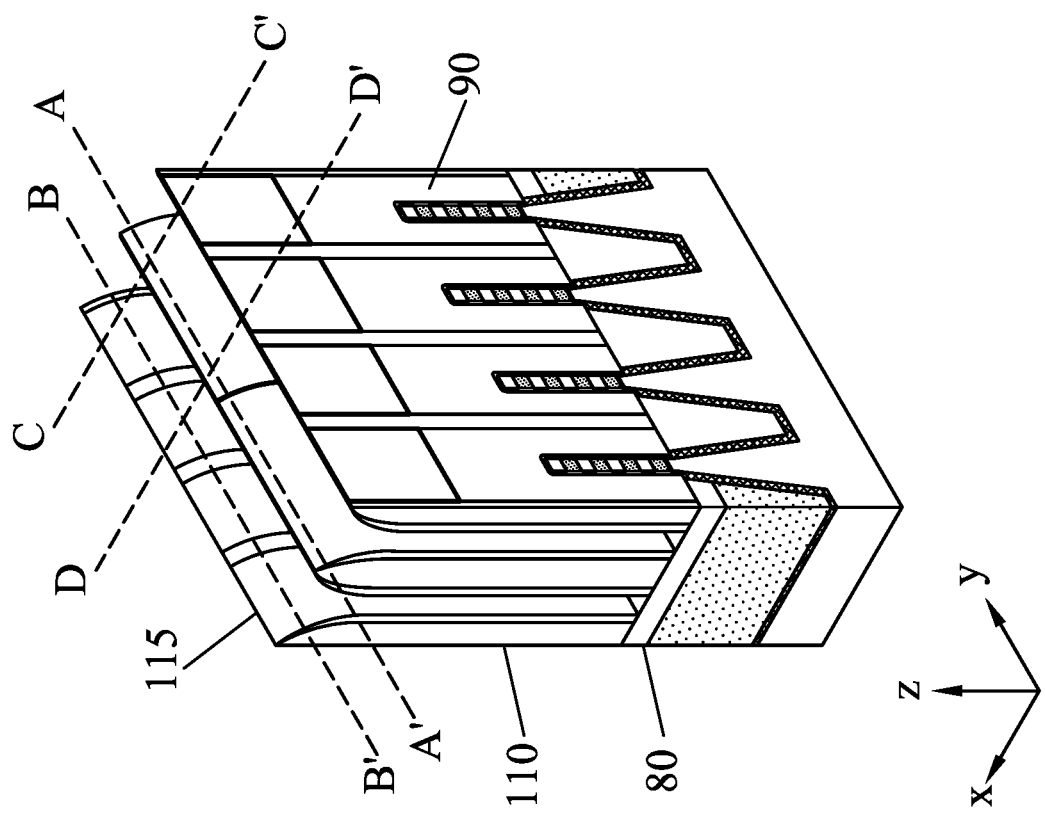
FIG. 12B
FIG. 12C
FIG. 12A

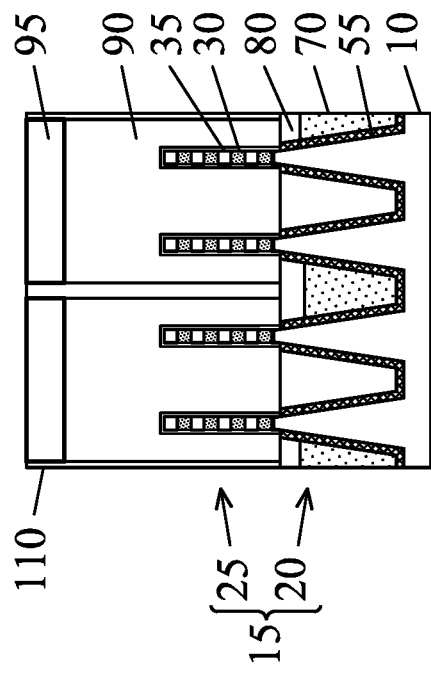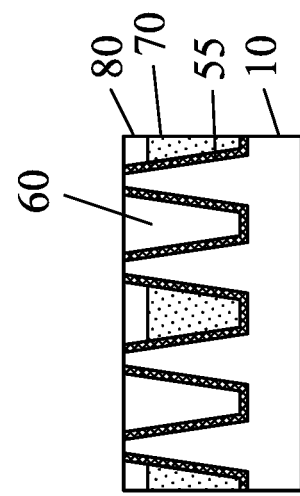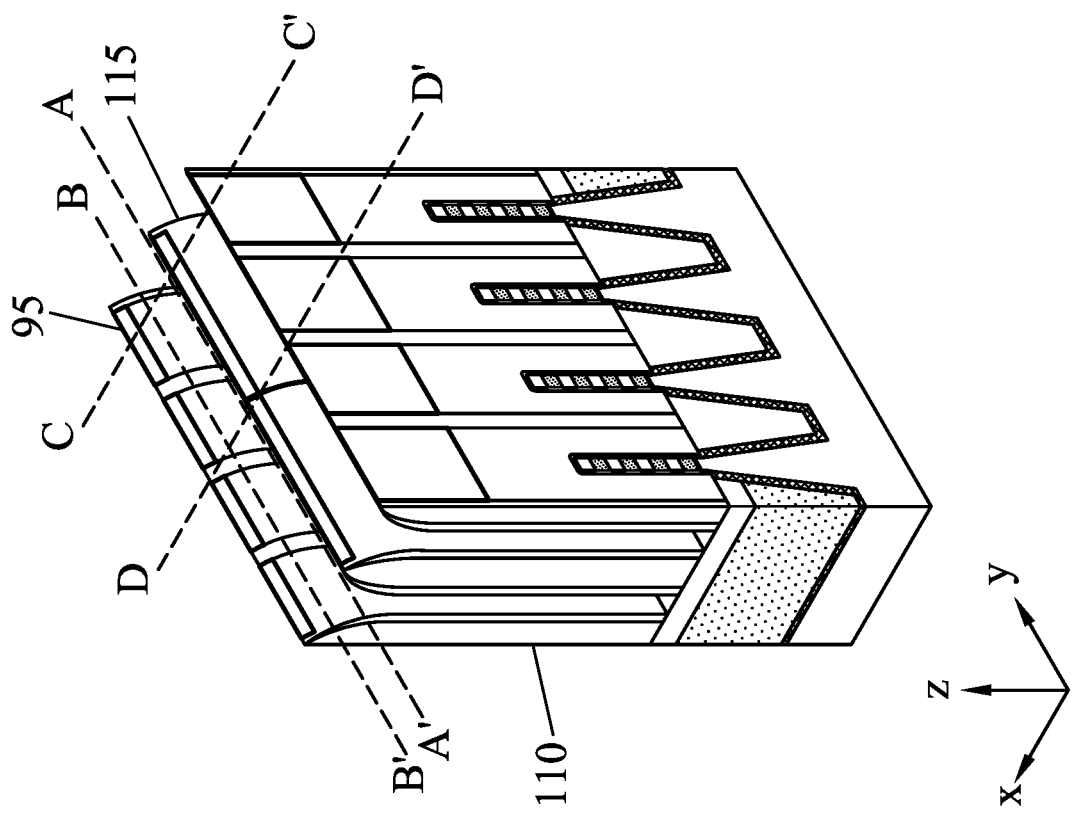
FIG. 13A
FIG. 13B
FIG. 13C

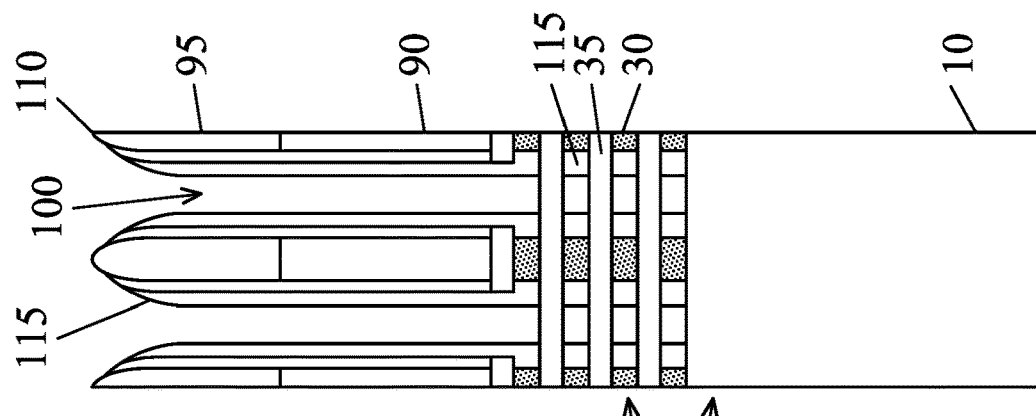
FIG. 13F
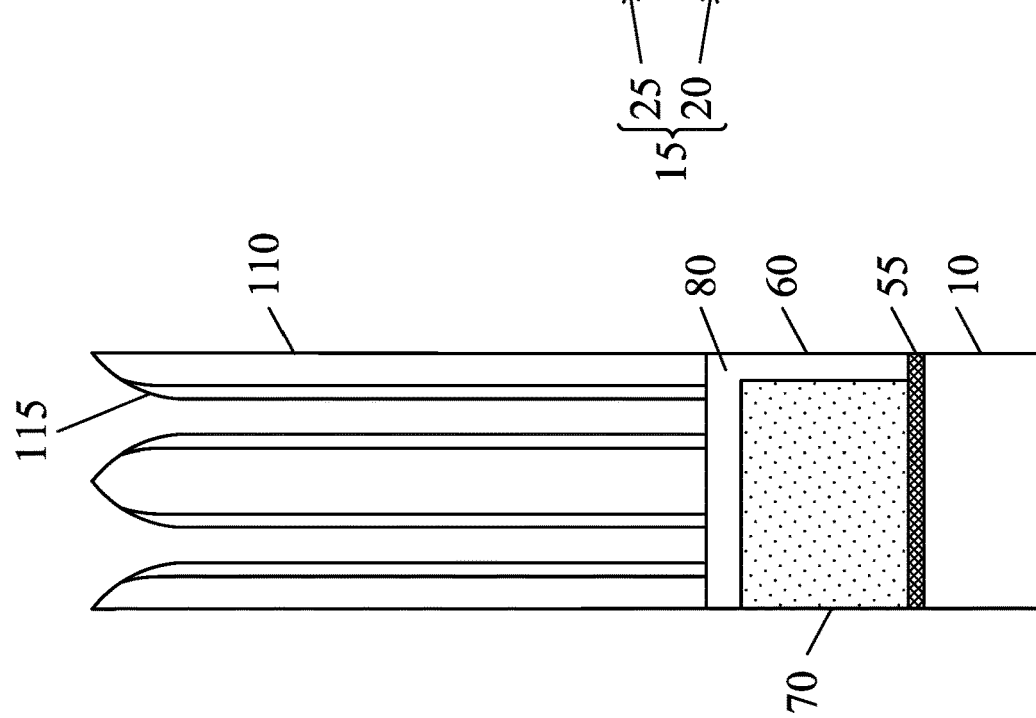
FIG. 13E
FIG. 13D
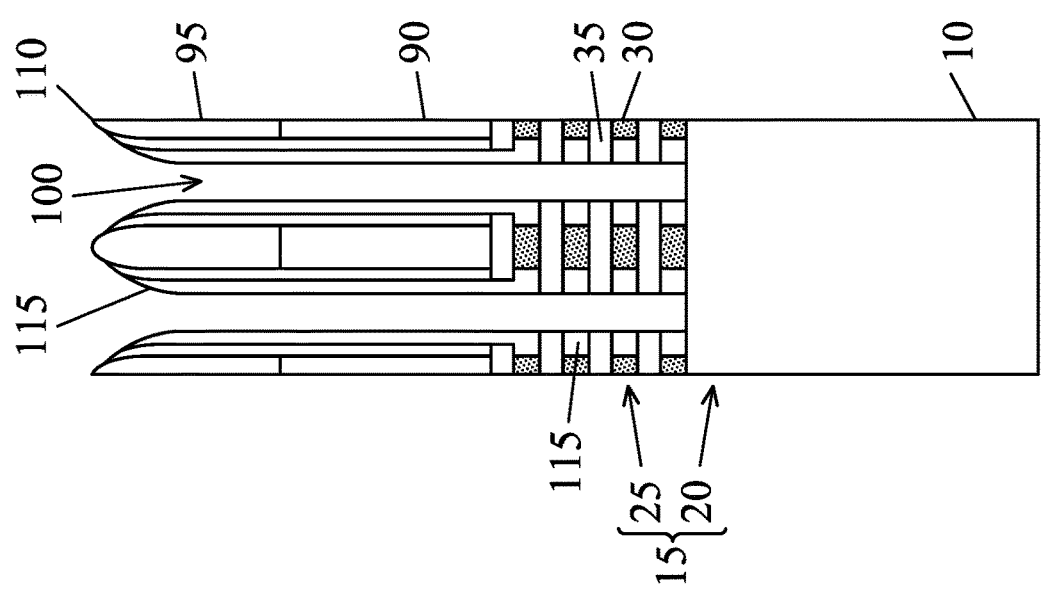

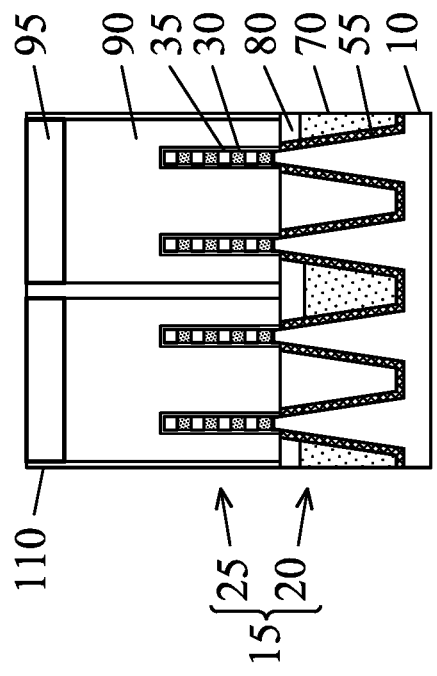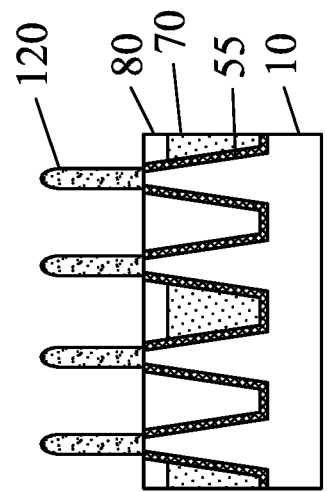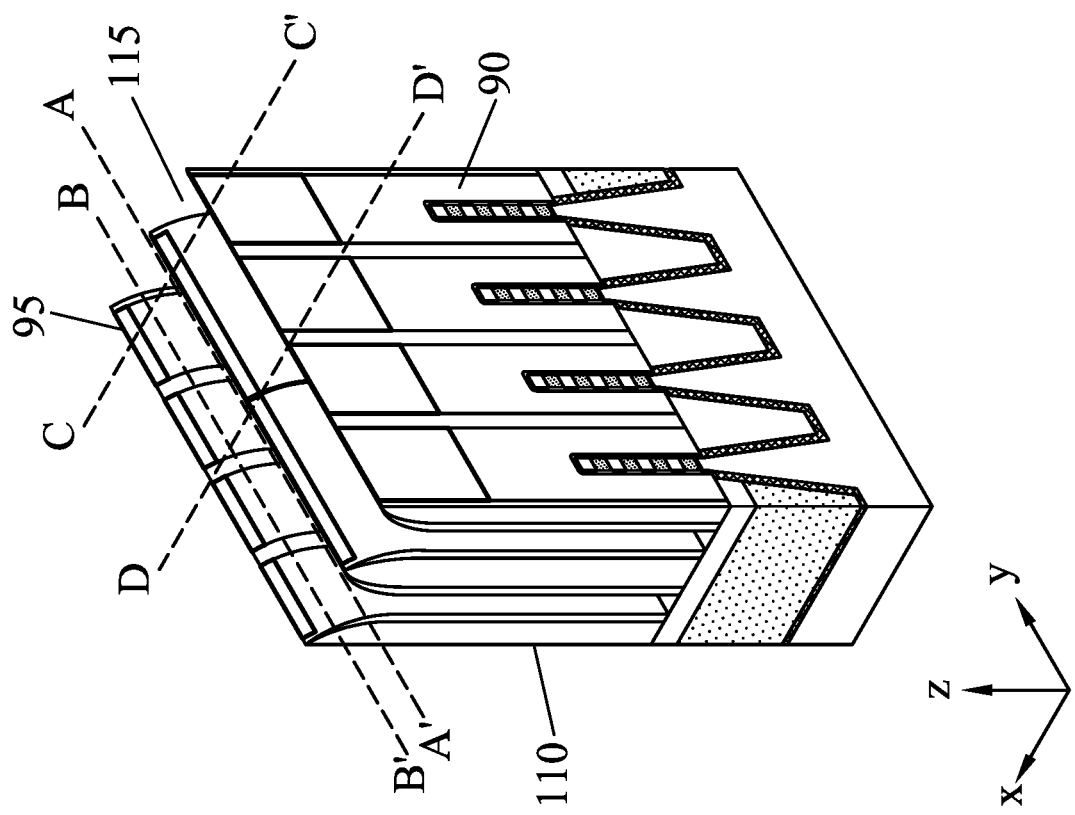
FIG. 14B
FIG. 14C
FIG. 14A

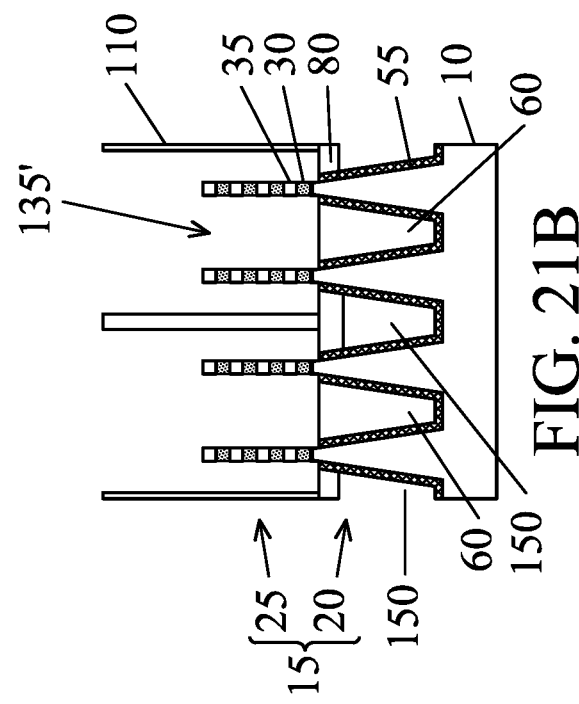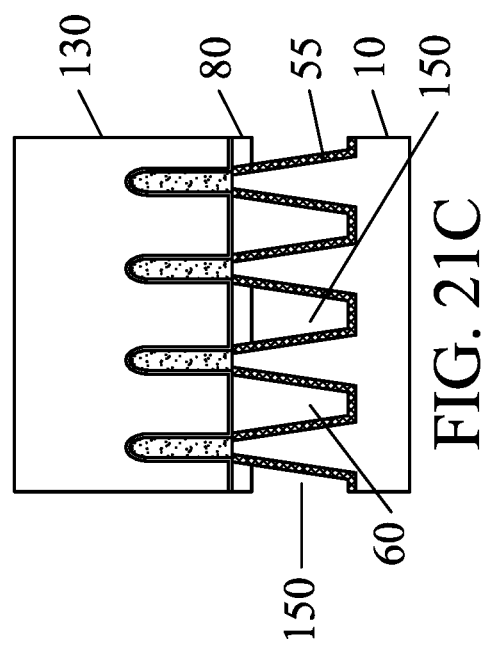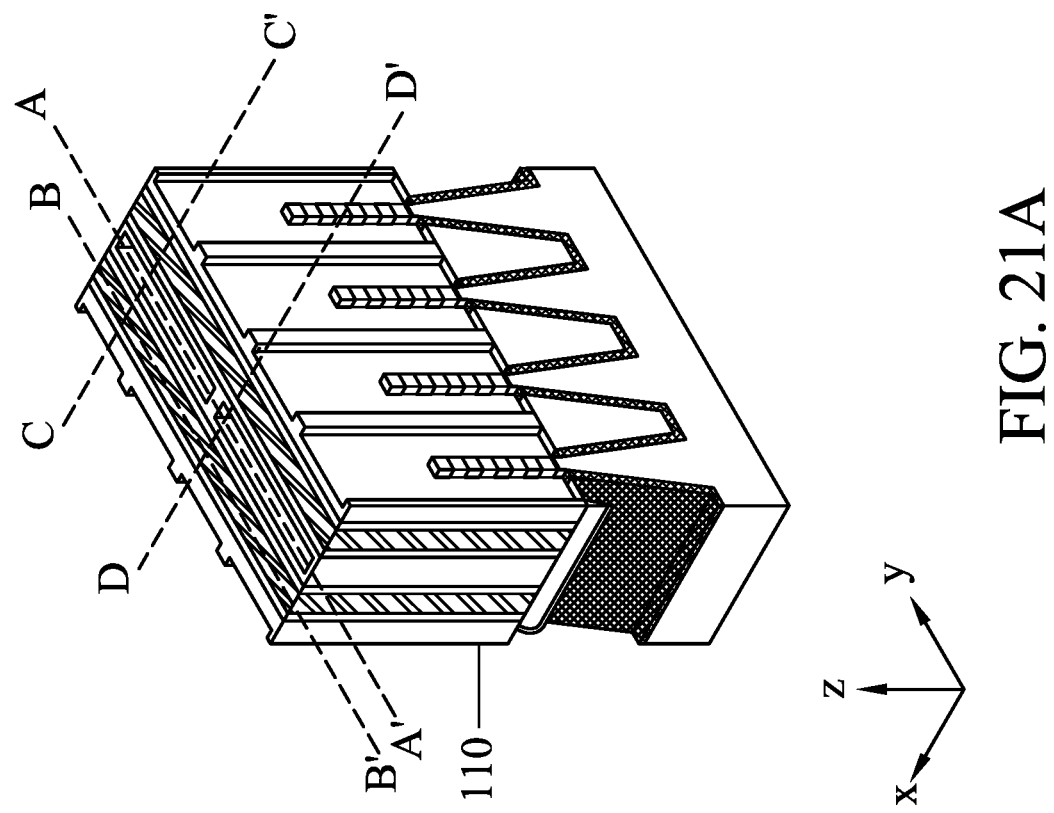
FIG. 21B
FIG. 21C
FIG. 21A

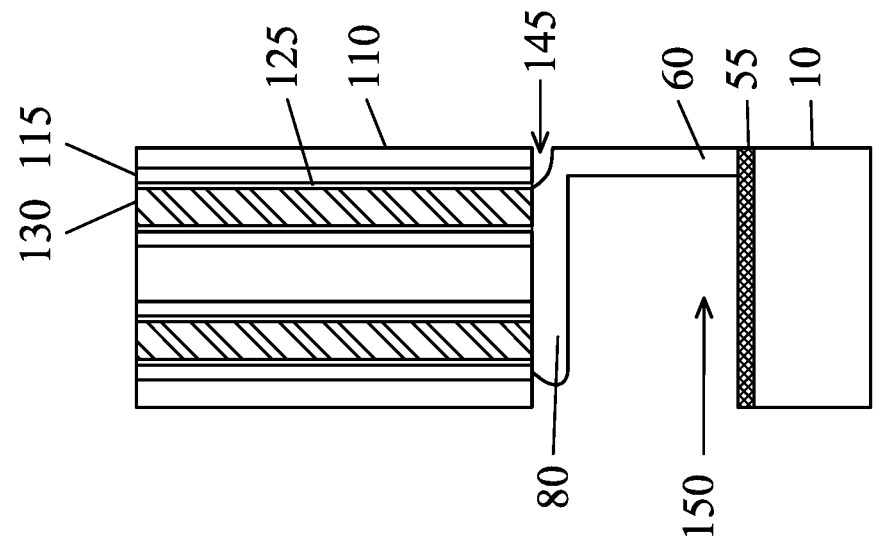
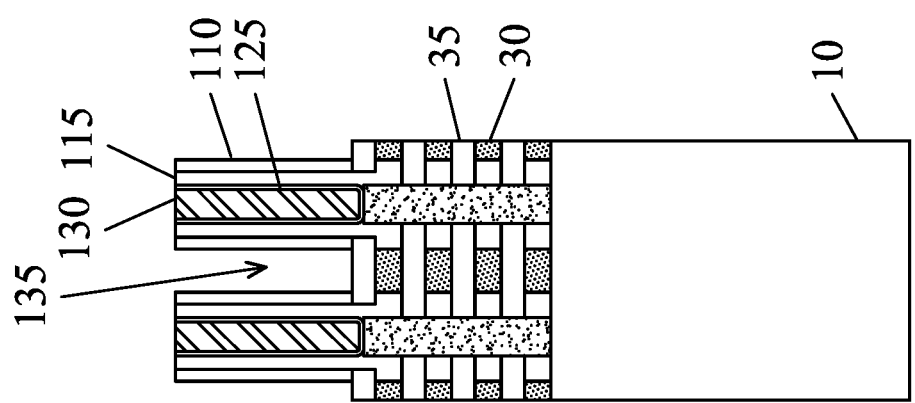
FIG. 21E
FIG. 21D

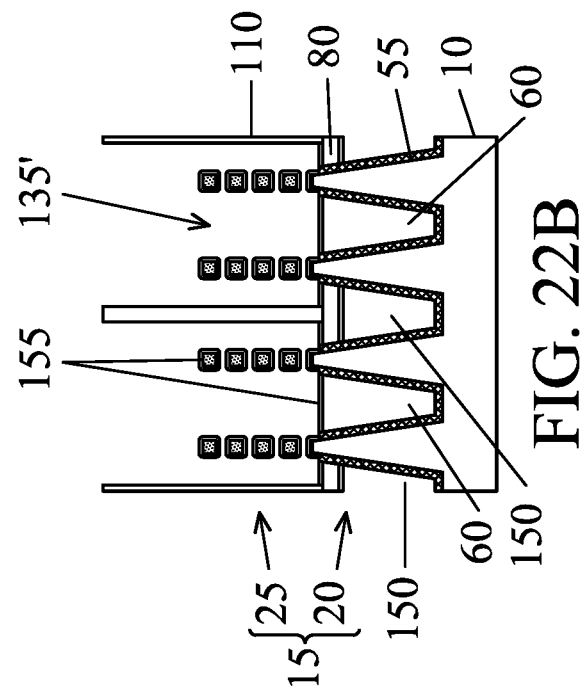
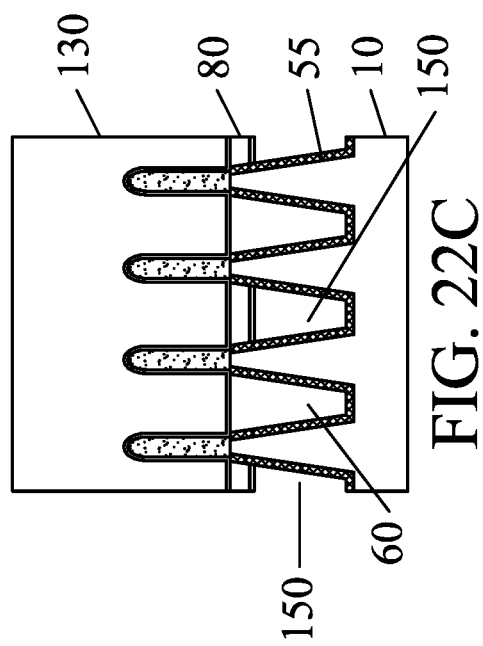
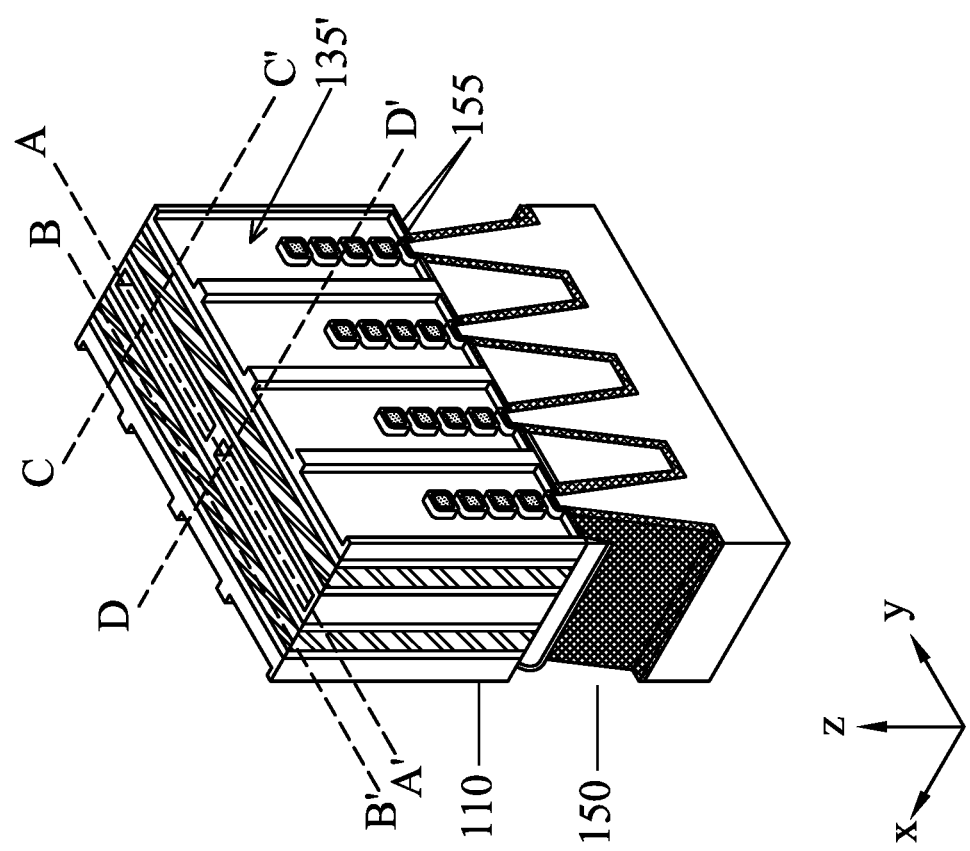
FIG. 22B
FIG. 22C
FIG. 22A

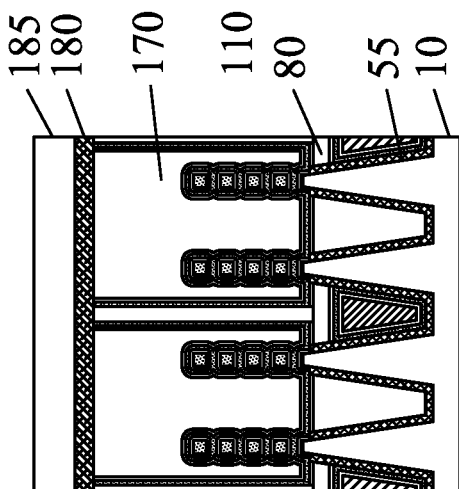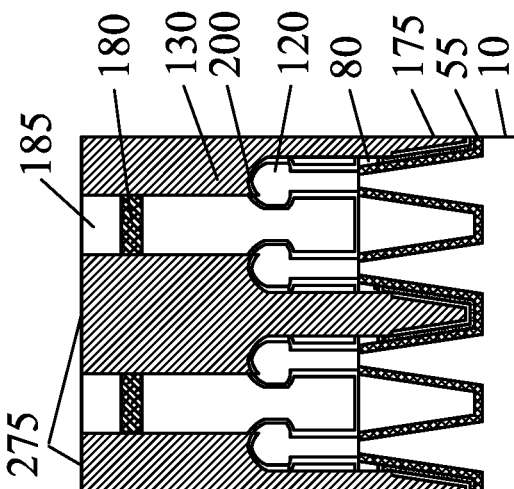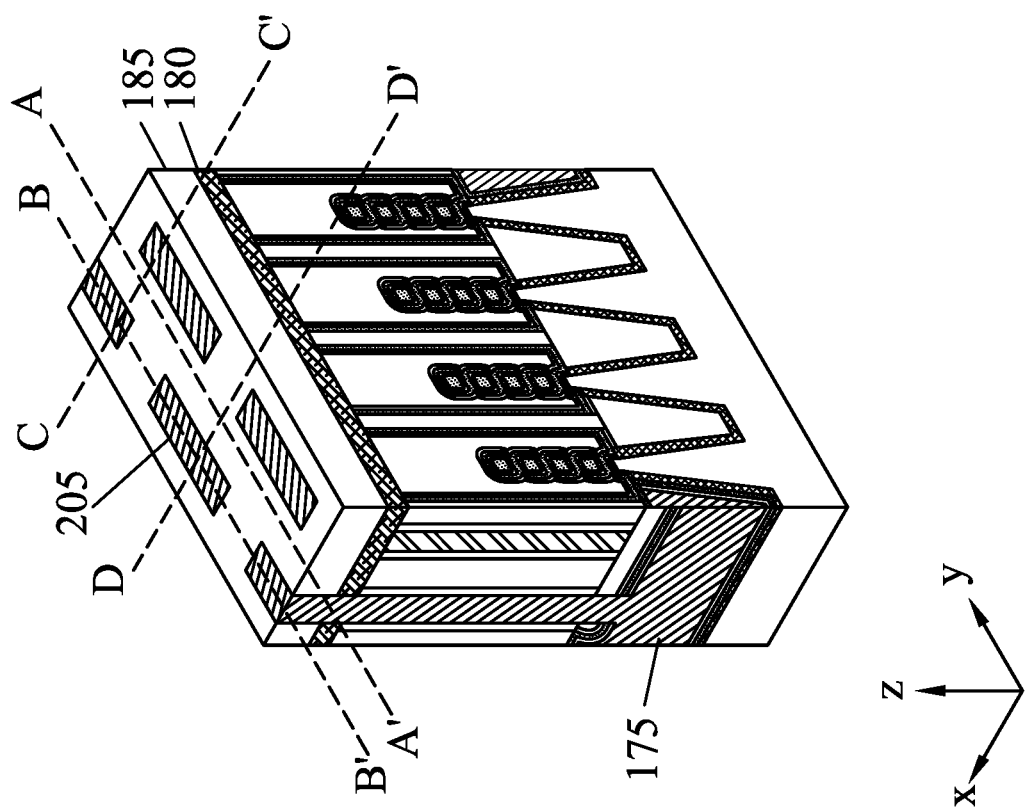
FIG. 26A
FIG. 26B
FIG. 26C

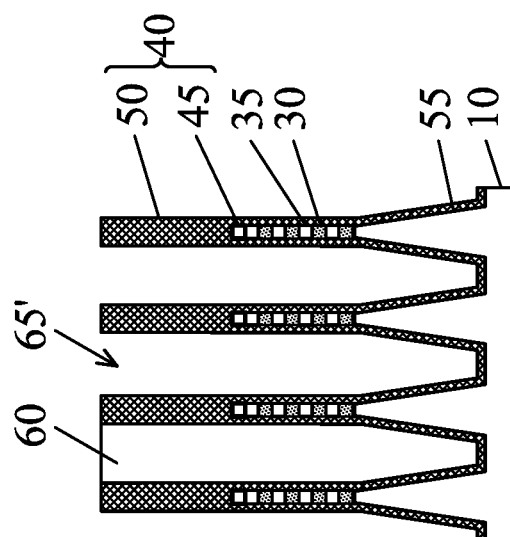
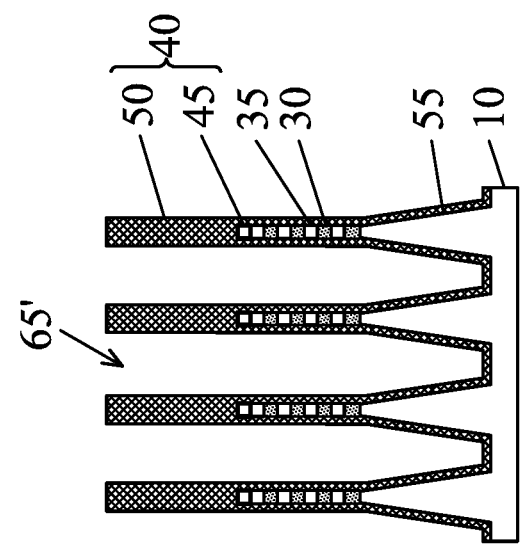
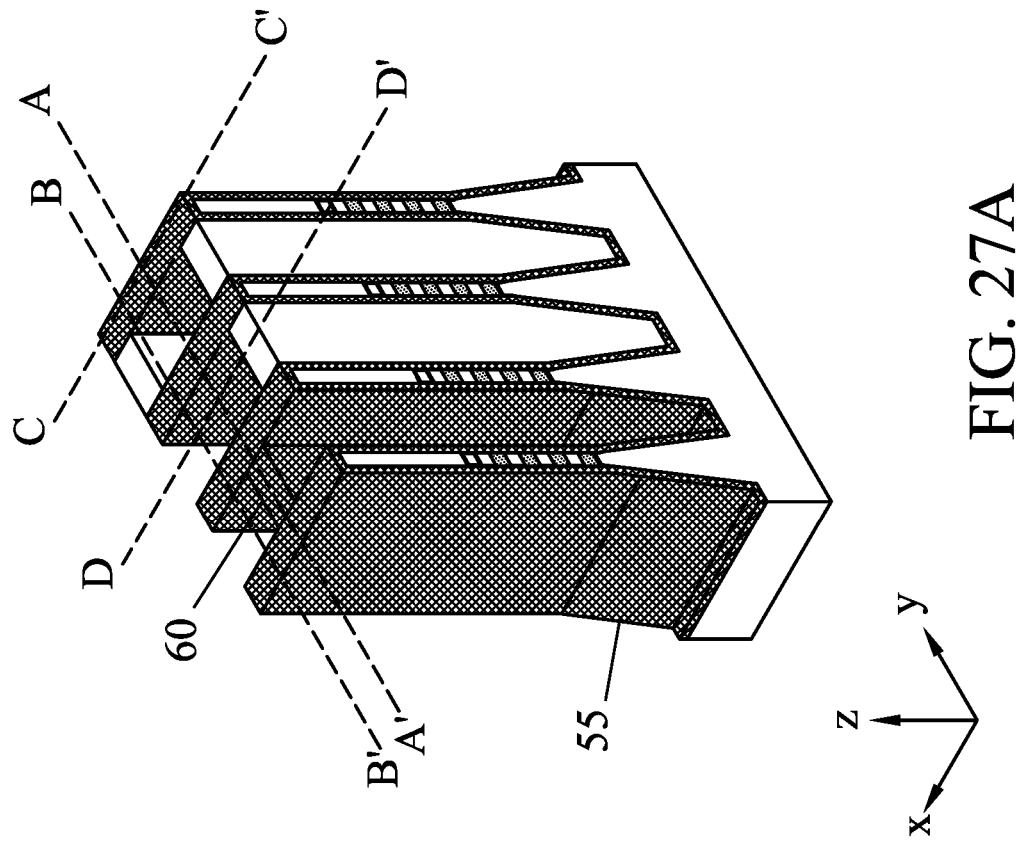
FIG. 27B
FIG. 27C
FIG. 27A

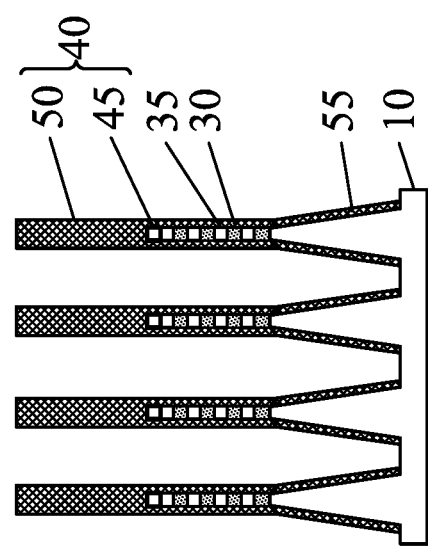
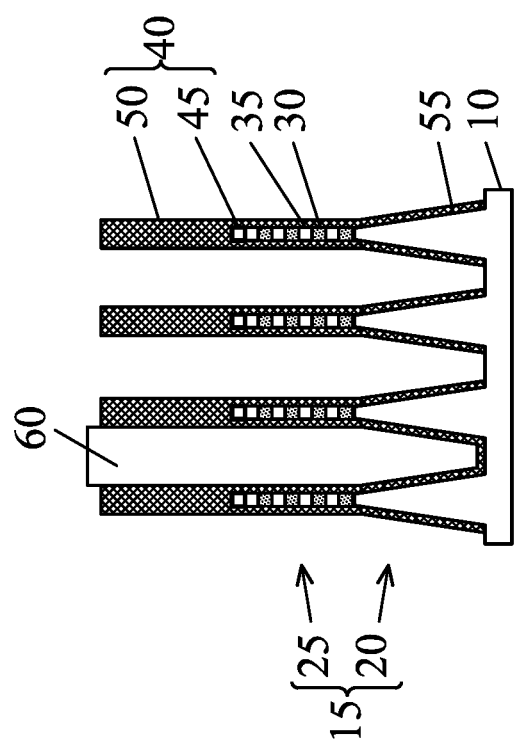
FIG. 28B
FIG. 28C
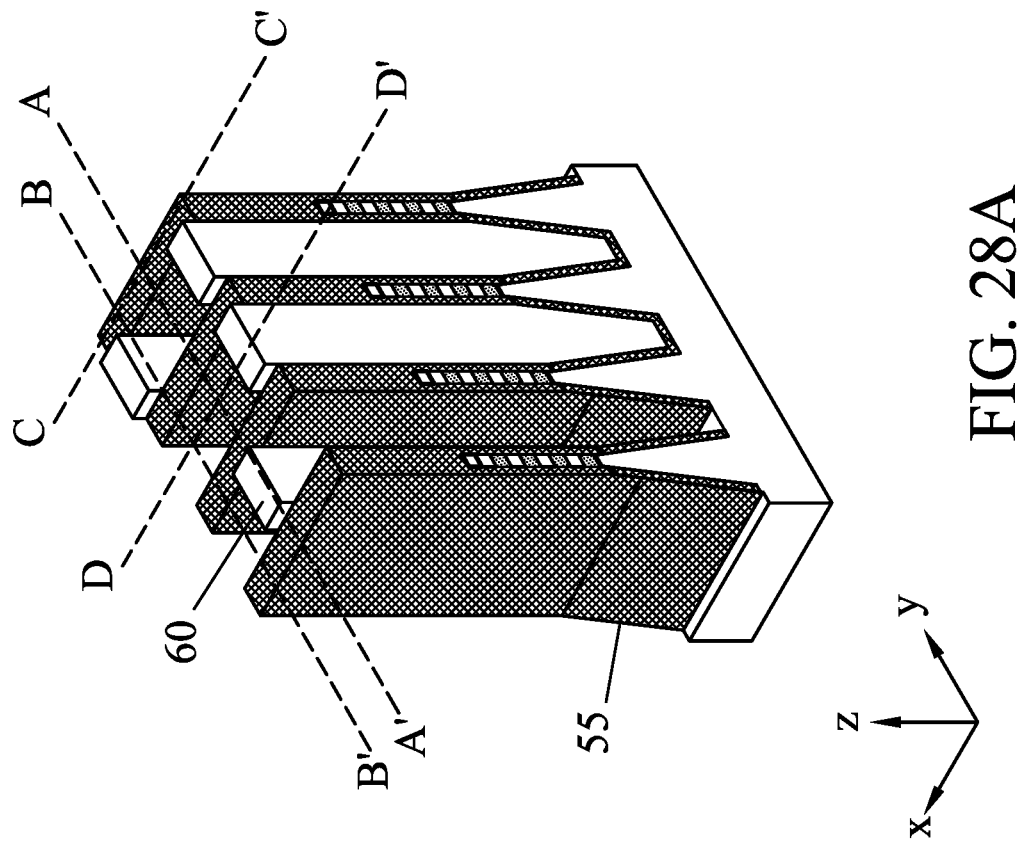
FIG. 28A

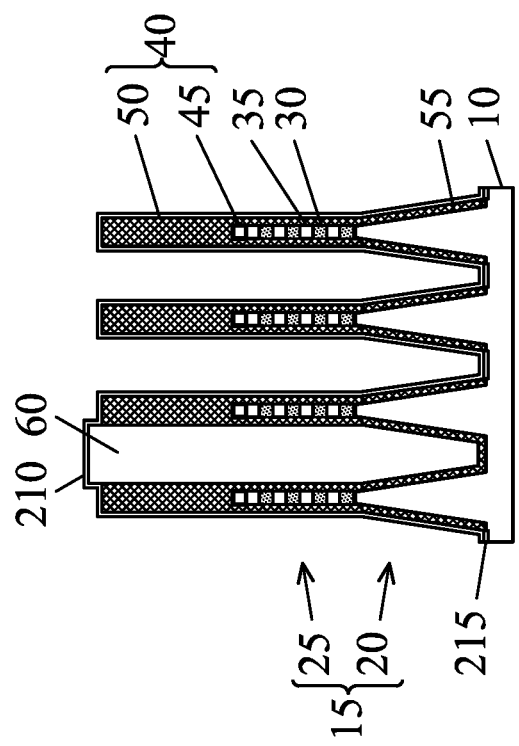
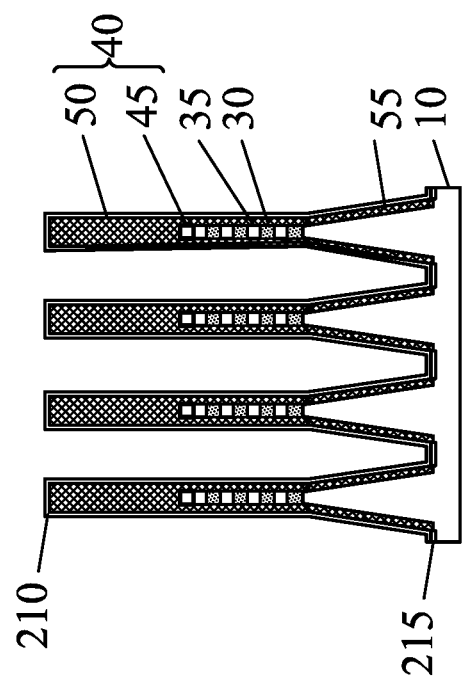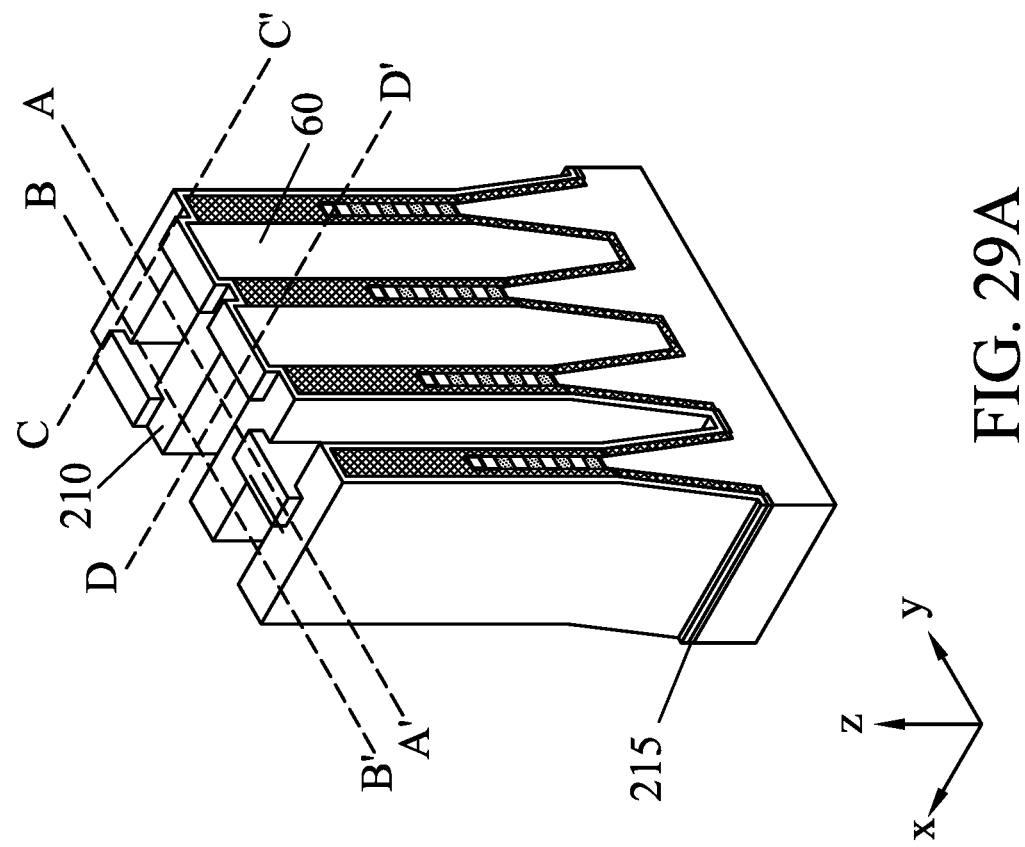
FIG. 29B
FIG. 29C
FIG. 29A

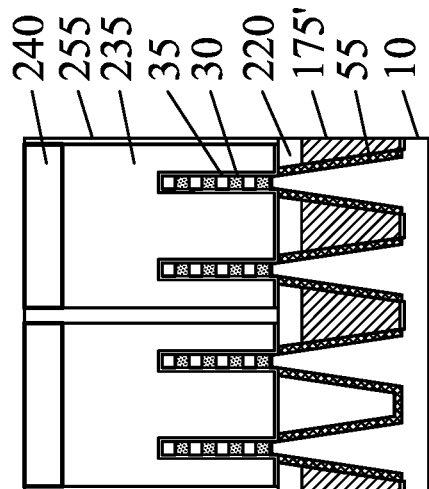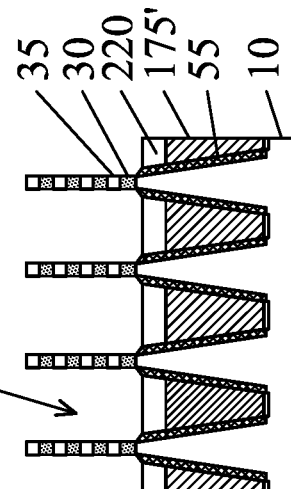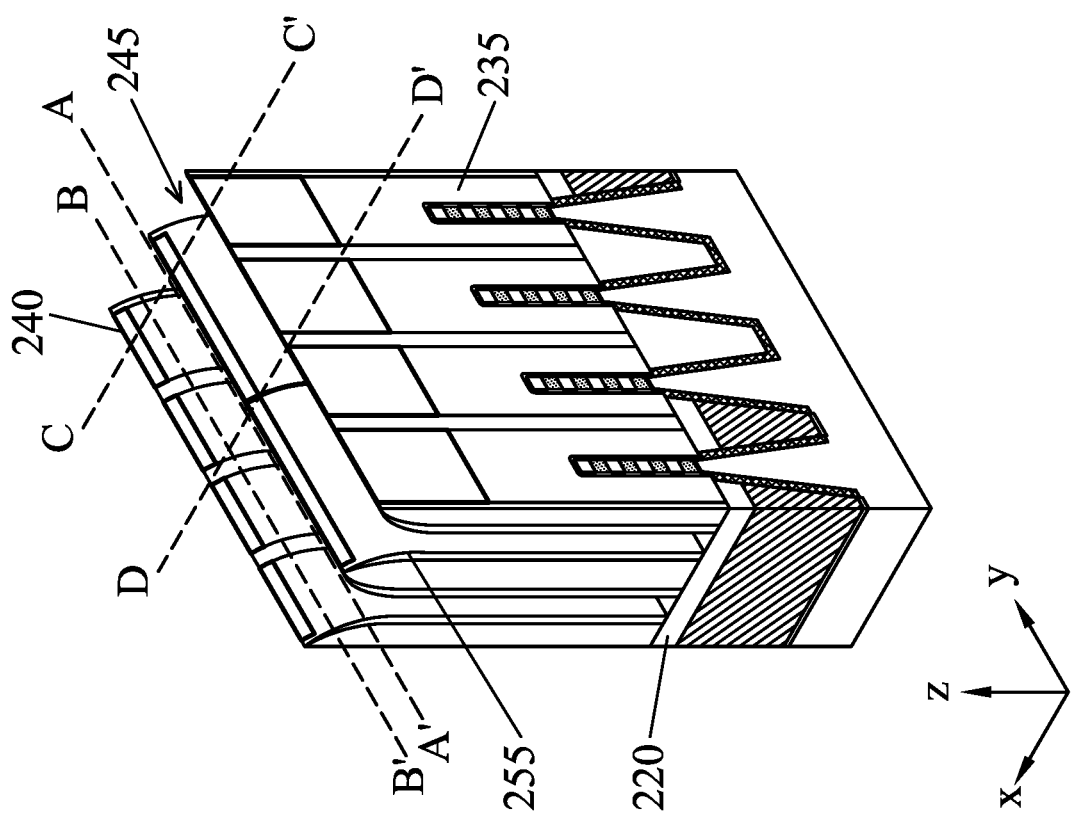
FIG. 36B
FIG. 36C
FIG. 36A

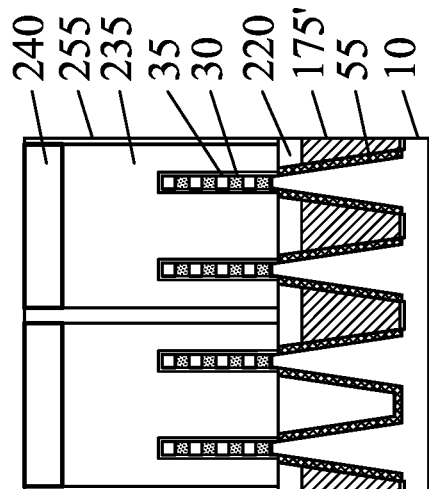
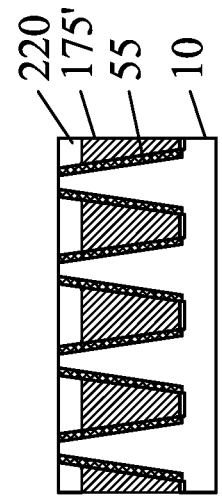
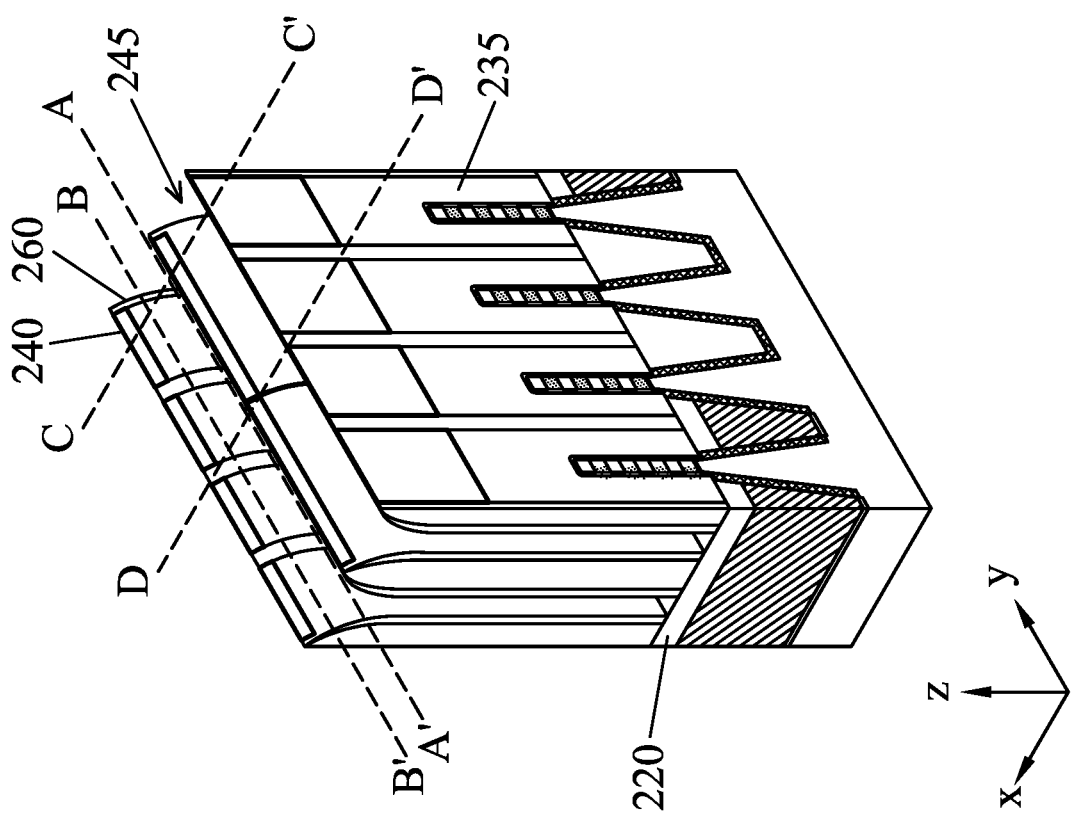
FIG. 38B
FIG. 38C
FIG. 38A

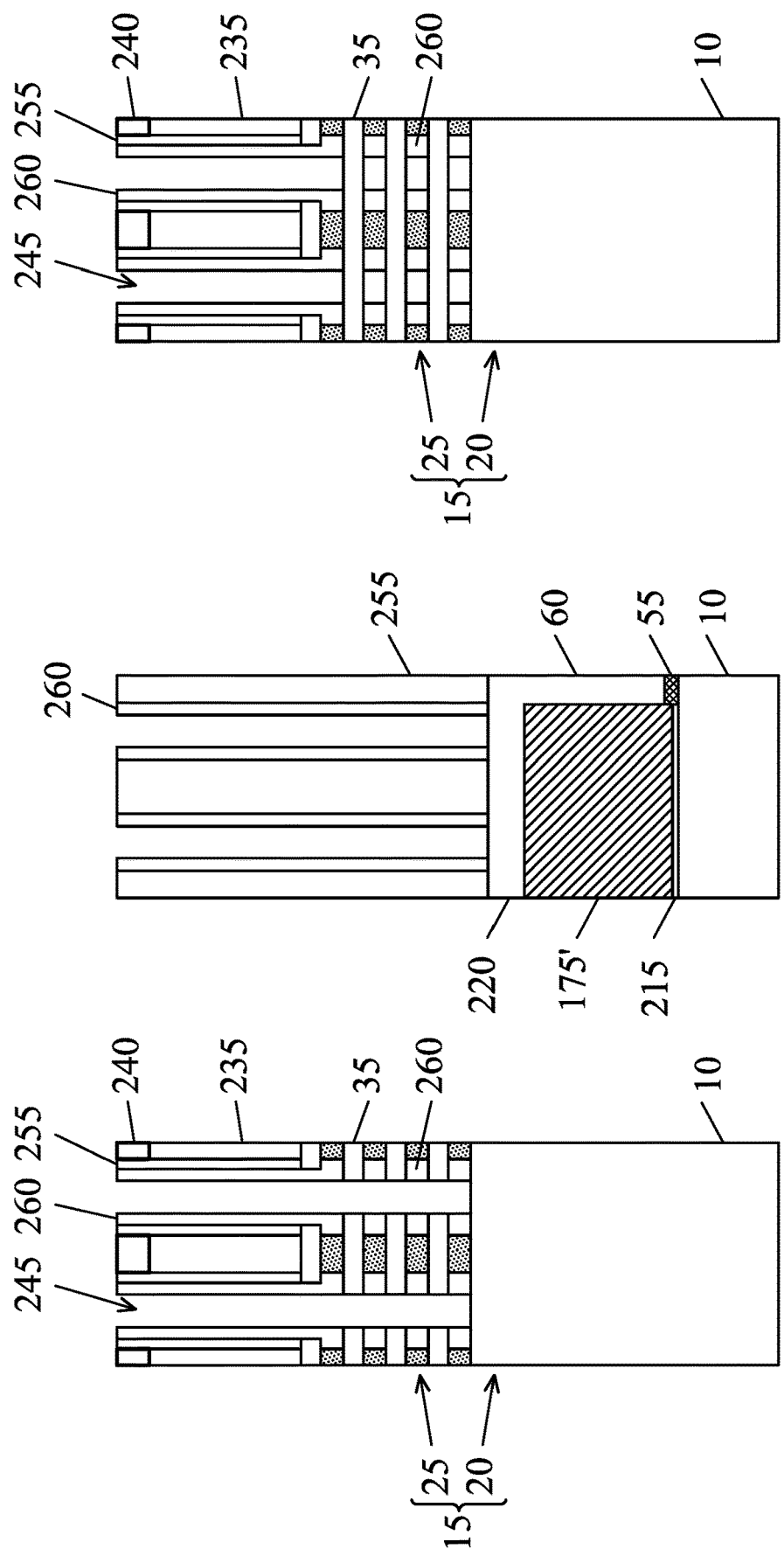

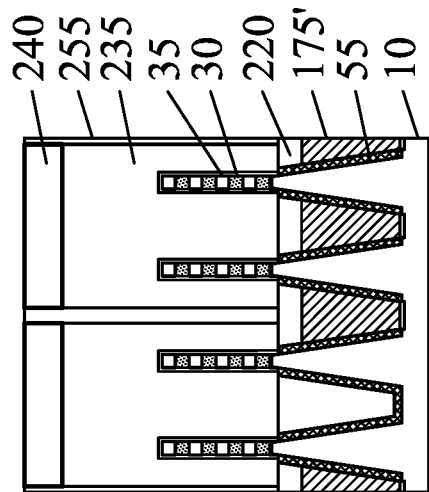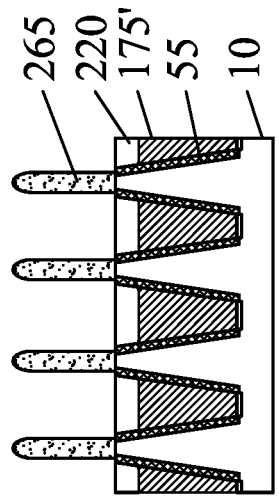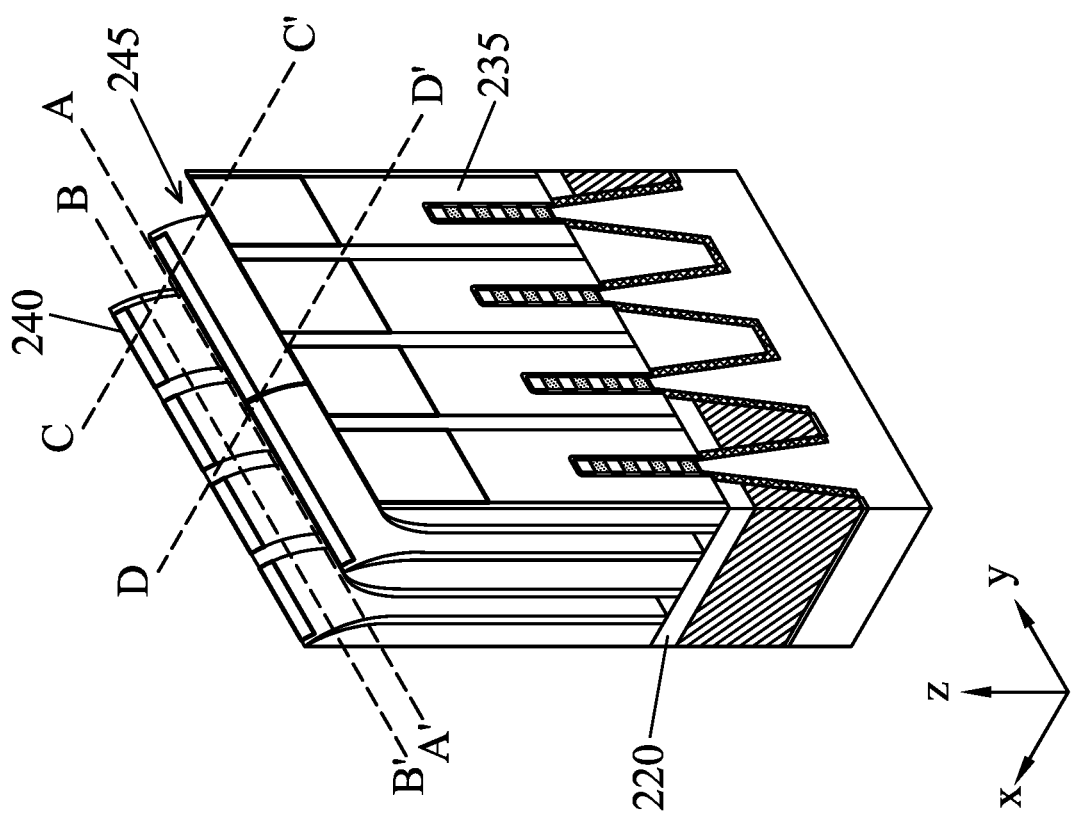
FIG. 39B
FIG. 39C
FIG. 39A

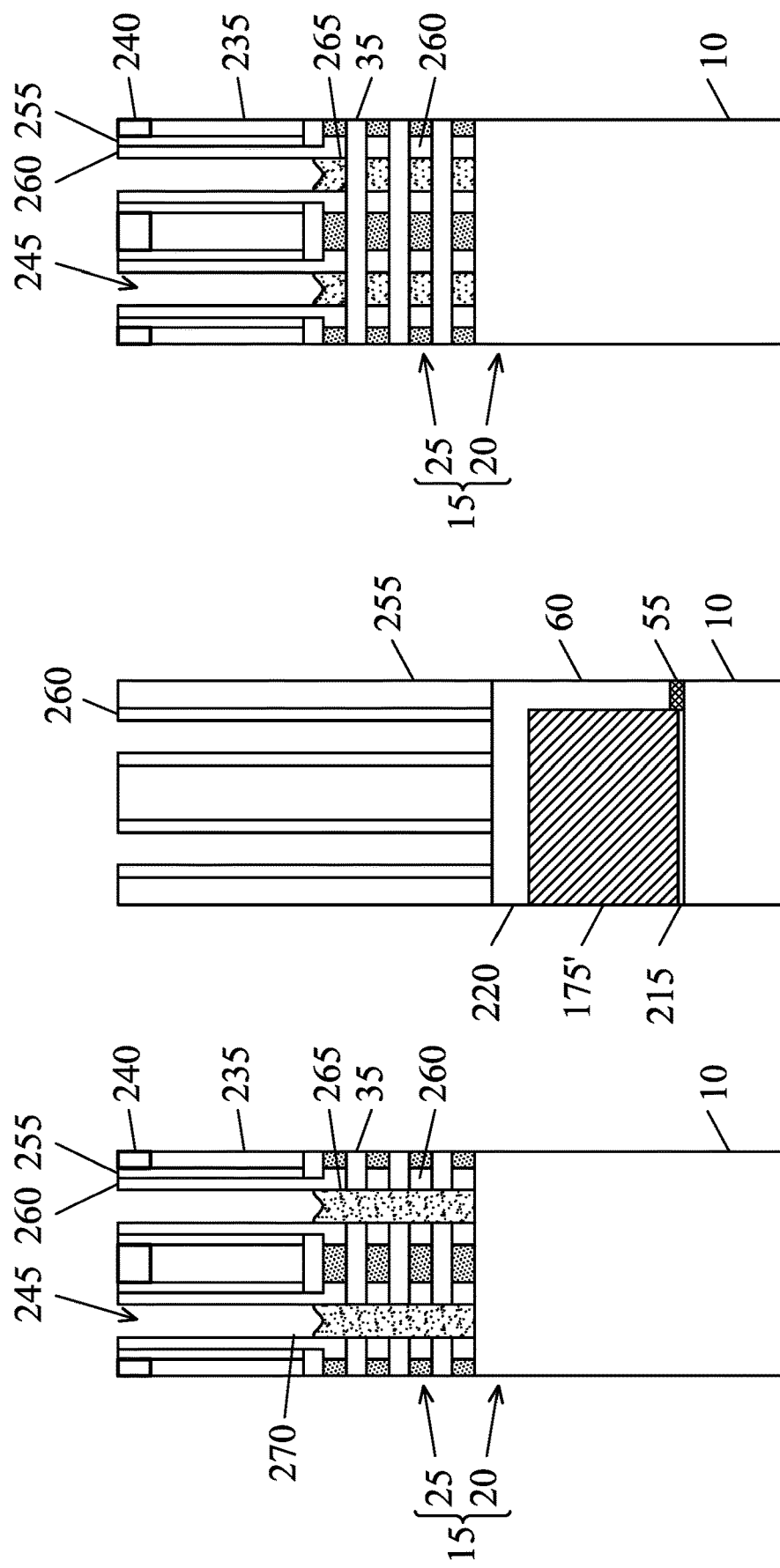

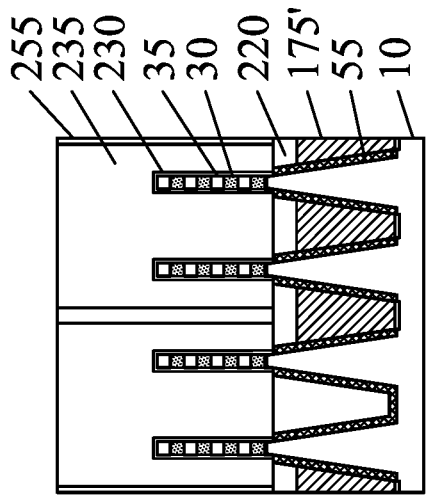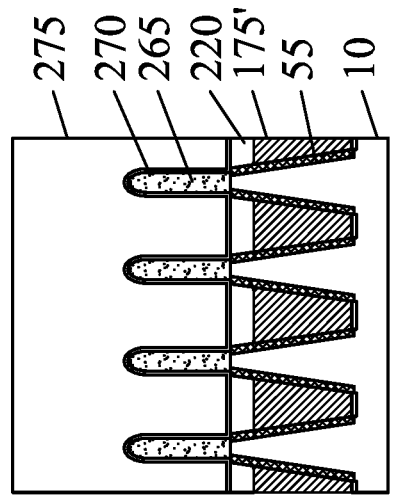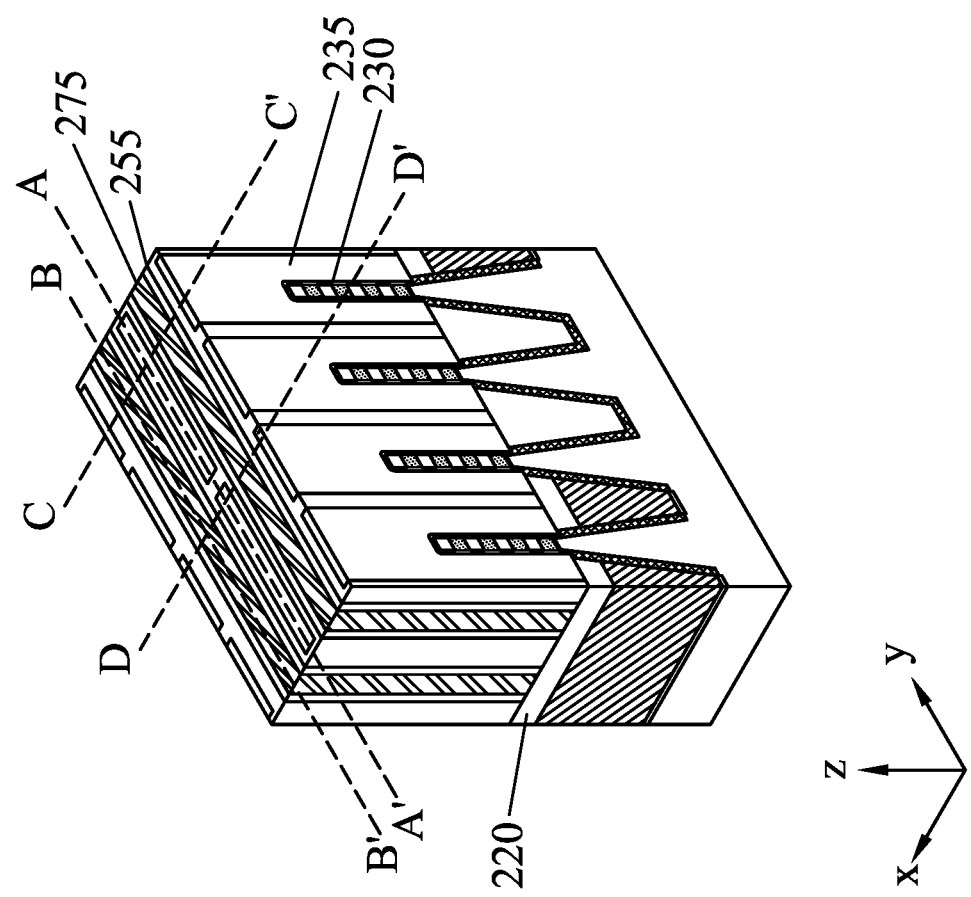
FIG. 40B
FIG. 40C
FIG. 40A

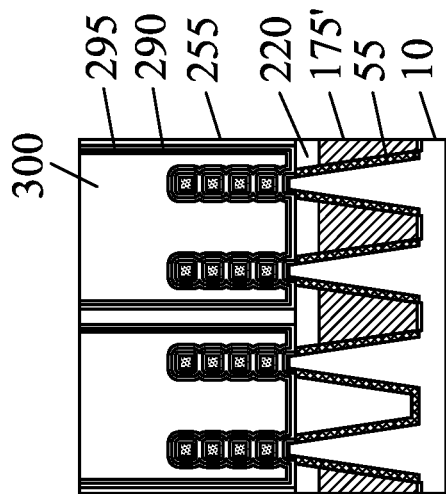
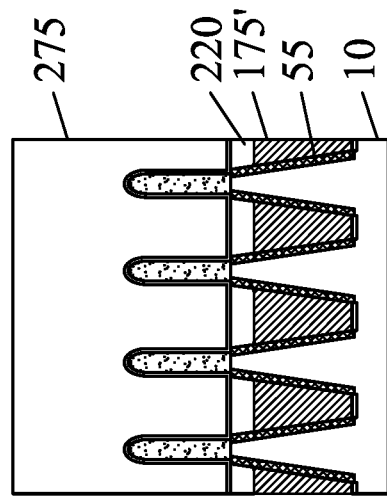
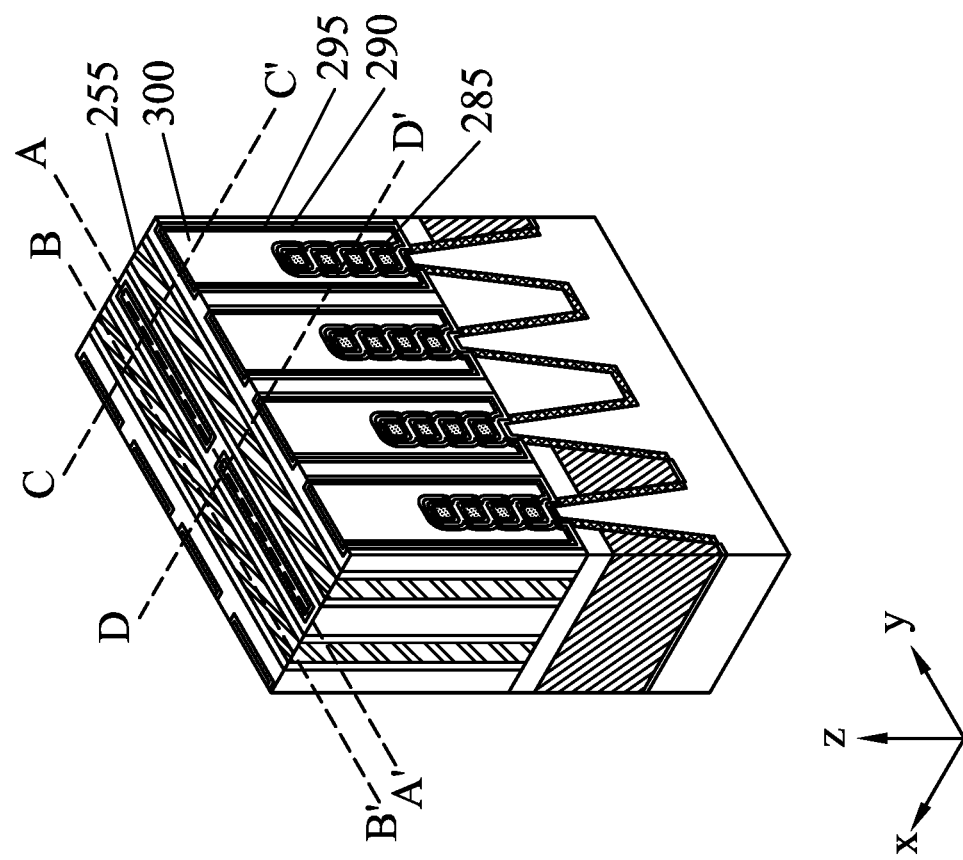
FIG. 43B
FIG. 43C
FIG. 43A

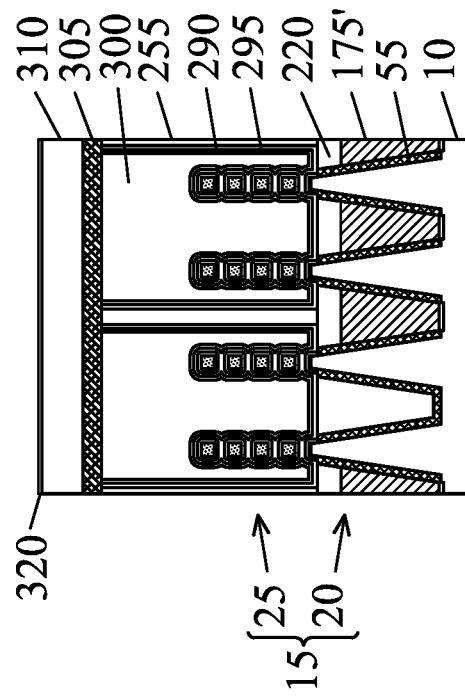
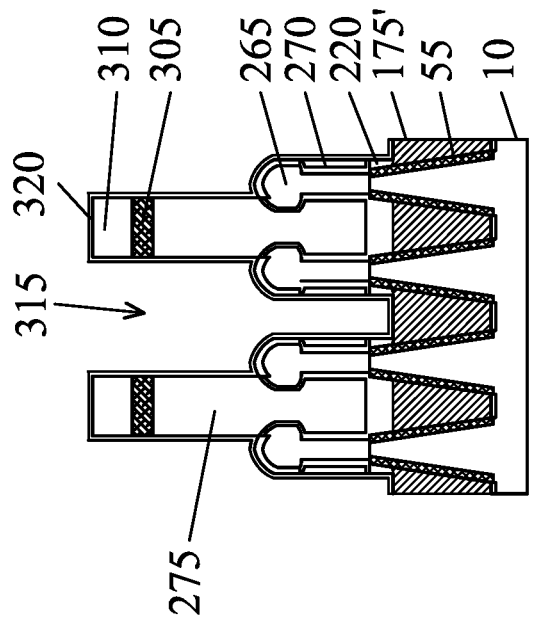
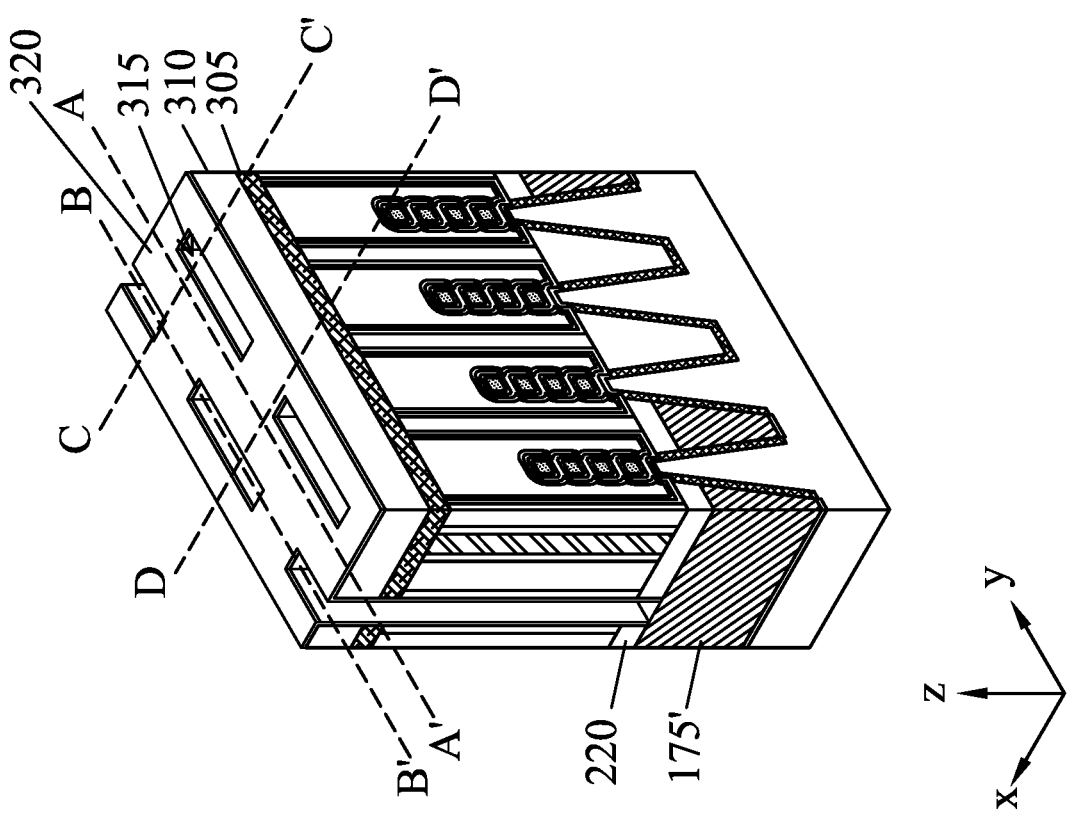
FIG. 45B
FIG. 45C
FIG. 45A

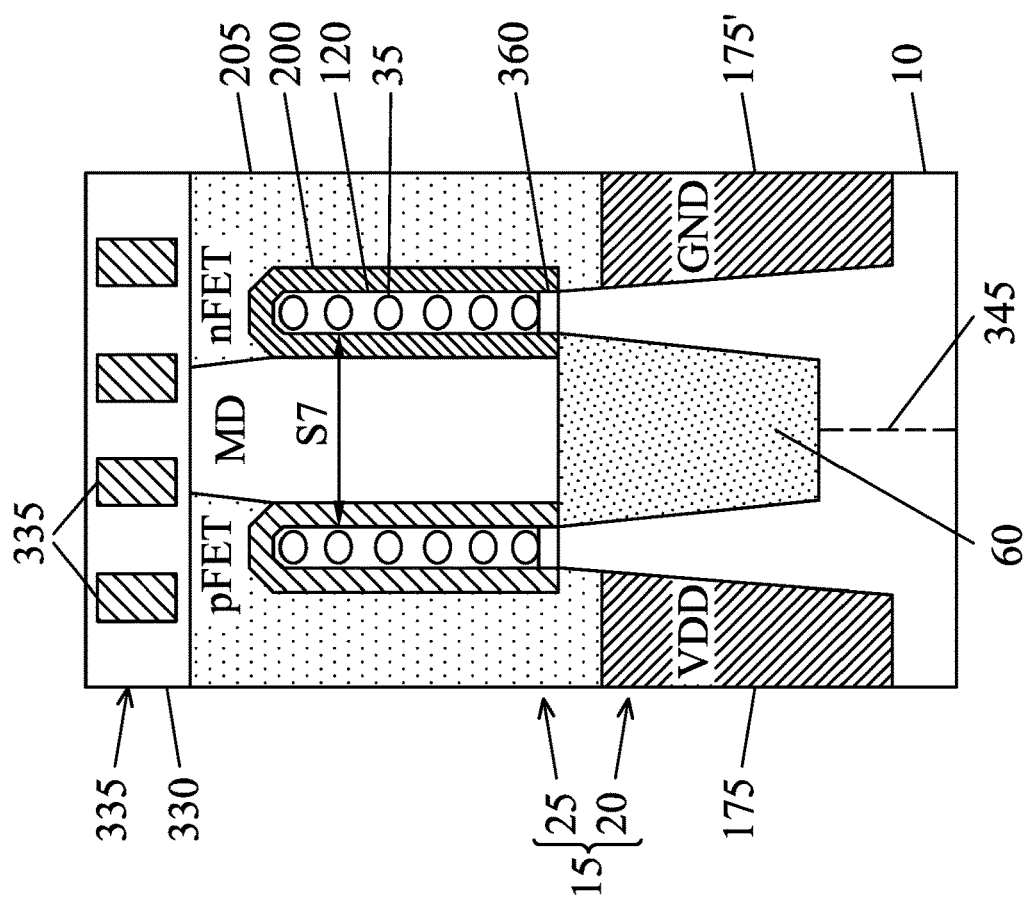
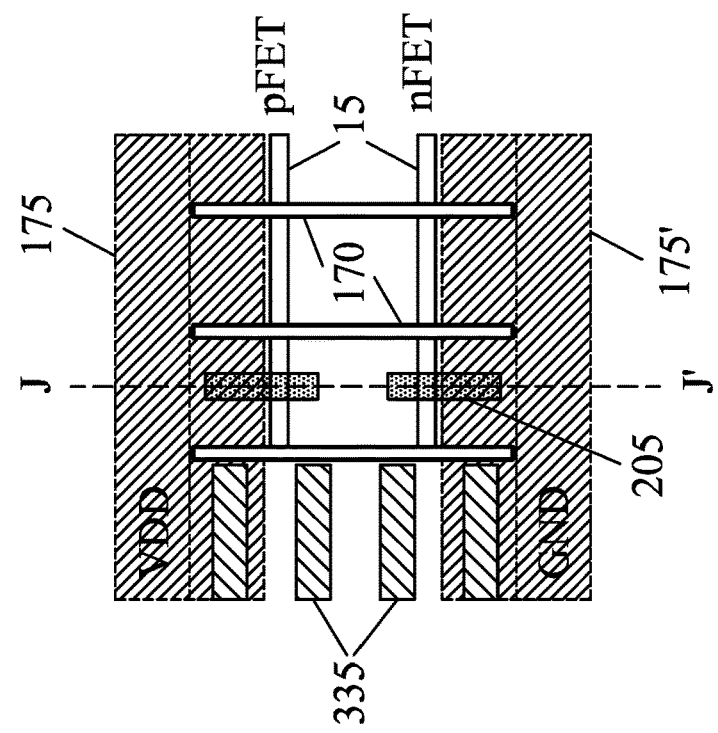
FIG. 51B
FIG. 51A

METHOD OF MANUFACTURING A SEMICONDUCTOR DEVICE AND A SEMICONDUCTOR DEVICE

CROSS-REFERENCE TO RELATED APPLICATION

This application is a continuation application of U.S. patent application Ser. No. 17/706,362, filed Mar. 28, 2022, which is a continuation application of U.S. patent application Ser. No. 17/114,347, filed Dec. 7, 2020, now U.S. Pat. No. 11,289,384, which is a divisional application of U.S. patent application Ser. No. 16/281,679, filed Feb. 21, 2019, now U.S. Pat. No. 10,861,750, which claims priority to U.S. Provisional Patent Application No. 62/693,180, filed Jul. 2, 2018, the entire disclosures of each of which are incorporated herein by reference.

TECHNICAL FIELD

The disclosure relates to a method of manufacturing semiconductor integrated circuits, and more particularly to method of manufacturing semiconductor devices including fin field effect transistors (FinFETs) and/or gate-all-around (GAA) FETs, and semiconductor devices.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (FinFET) and a gate-all-around (GAA) FET. In a FinFET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. The fourth side, the bottom part of the channel is further away from the gate electrode and thus is not under close gate control. In contrast, in a GAA FET, all side surfaces of the channel region are surrounded by the gate electrode. As transistor dimensions are continually scaled down to sub 10-15 nm technology nodes, further improvements of FinFETs and GAA FETs are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-3E show views of one of the various stages of manufacturing a GAA FET semiconductor device according to embodiments of the present disclosure. FIG. 3A is an isometric view. FIG. 3B is a cross-sectional view taken along line A-A' of FIG. 3A. FIG. 3C is a cross-sectional view taken along line B-B' of FIG. 3A. FIG. 3D is a cross-sectional view taken along line C-C' of FIG. 3A. FIG. 3E is a cross-sectional view taken along line D-D' of FIG. 3A.

FIG. 4A is an isometric view. FIG. 4B is a cross-sectional view taken along line A-A' of FIG. 4A. FIG. 4C is a cross-sectional view taken along line B-B' of FIG. 4A. FIG. 4D is a cross-sectional view taken along line C-C' of FIG. 4A. FIG. 4E is a cross-sectional view taken along line D-D' of FIG. 4A.

FIG. 5A is an isometric view. FIG. 5B is a cross-sectional view taken along line A-A' of FIG. 5A. FIG. 5C is a cross-sectional view taken along line B-B' of FIG. 5A. FIG. 5D is a cross-sectional view taken along line C-C' of FIG. 5A. FIG. 5E is a cross-sectional view taken along line D-D' of FIG. 5A.

FIG. 6A is an isometric view. FIG. 6B is a cross-sectional view taken along line A-A' of FIG. 6A. FIG. 6C is a cross-sectional view taken along line B-B' of FIG. 6A. FIG. 6D is a cross-sectional view taken along line C-C' of FIG. 6A. FIG. 6E is a cross-sectional view taken along line D-D' of FIG. 6A.

FIGS. 7A-7E show views of one of the various stages of manufacturing a GAA FET semiconductor device according to embodiments of the present disclosure. FIG. 7A is an isometric view. FIG. 7B is a cross-sectional view taken along line A-A' of FIG. 7A. FIG. 7C is a cross-sectional view taken along line B-B' of FIG. 7A. FIG. 7D is a cross-sectional view taken along line C-C' of FIG. 7A. FIG. 7E is a cross-sectional view taken along line D-D' of FIG. 7A.

FIGS. 8A-8E show views of one of the various stages of manufacturing a GAA FET semiconductor device according to embodiments of the present disclosure. FIG. 8A is an isometric view. FIG. 8B is a cross-sectional view taken along line A-A' of FIG. 8A. FIG. 8C is a cross-sectional view taken along line B-B' of FIG. 8A. FIG. 8D is a cross-sectional view taken along line C-C' of FIG. 8A. FIG. 8E is a cross-sectional view taken along line D-D' of FIG. 8A.

FIG. 9A is an isometric view. FIG. 9B is a cross-sectional view taken along line A-A' of FIG. 9A. FIG. 9C is a cross-sectional view taken along line B-B' of FIG. 9A. FIG. 9D is a cross-sectional view taken along line C-C' of FIG. 9A. FIG. 9E is a cross-sectional view taken along line D-D' of FIG. 9A.

FIGS. 10A-10E show views of one of the various stages of manufacturing a GAA FET semiconductor device according to embodiments of the present disclosure. FIG. 10A is an isometric view. FIG. 10B is a cross-sectional view taken along line A-A' of FIG. 10A. FIG. 10C is a cross-sectional view taken along line B-B' of FIG. 10A. FIG. 10D is a cross-sectional view taken along line C-C' of FIG. 10A. FIG. 10E is a cross-sectional view taken along line D-D' of FIG. 10A.

FIGS. 11A-11E show views of one of the various stages of manufacturing a GAA FET semiconductor device according to embodiments of the present disclosure. FIG. 11A is an isometric view. FIG. 11B is a cross-sectional view taken along line A-A' of FIG. 11A. FIG. 11C is a cross-sectional view taken along line B-B' of FIG. 11A. FIG. 11D is a cross-sectional view taken along line C-C' of FIG. 11A. FIG. 11E is a cross-sectional view taken along line D-D' of FIG. 11A.

FIGS. 12A-12E show views of one of the various stages of manufacturing a GAA FET semiconductor device according to embodiments of the present disclosure. FIG. 12A is an isometric view. FIG. 12B is a cross-sectional view taken along line A-A' of FIG. 12A. FIG. 12C is a cross-sectional view taken along line B-B' of FIG. 12A. FIG. 12D is a cross-sectional view taken along line C-C' of FIG. 12A. FIG. 12E is a cross-sectional view taken along line D-D' of FIG. 12A.

FIGS. 13A-13F show views of one of the various stages of manufacturing a GAA FET semiconductor device according to embodiments of the present disclosure. FIG. 13A is an isometric view. FIG. 13B is a cross-sectional view taken along line A-A' of FIG. 13A. FIG. 13C is a cross-sectional view taken along line B-B' of FIG. 13A. FIG. 13D is a cross-sectional view taken along line C-C' of FIG. 13A. FIG. 13E is a cross-sectional view taken along line D-D' of FIG. 13A. FIG. 13F is a cross-sectional view of another embodiment taken along line C-C' of FIG. 13A.

FIGS. 14A-14F show views of one of the various stages of manufacturing a GAA FET semiconductor device according to embodiments of the present disclosure. FIG. 14A is an isometric view. FIG. 14B is a cross-sectional view taken along line A-A' of FIG. 14A. FIG. 14C is a cross-sectional view taken along line B-B' of FIG. 14A. FIG. 14D is a cross-sectional view taken along line C-C' of FIG. 14A. FIG. 14E is a cross-sectional view taken along line D-D' of FIG. 14A. FIG. 13F is a cross-sectional view of another embodiment taken along line C-C' of FIG. 14A.

FIG. 15A is an isometric view. FIG. 15B is a cross-sectional view taken along line A-A' of FIG. 15A. FIG. 15C is a cross-sectional view taken along line B-B' of FIG. 15A. FIG. 15D is a cross-sectional view taken along line C-C' of FIG. 15A. FIG. 15E is a cross-sectional view taken along line D-D' of FIG. 15A.

FIGS. 16A-17E show views of one of the various stages of manufacturing a GAA FET semiconductor device according to embodiments of the present disclosure. FIG. 16A is an isometric view.

FIGS. 17A-17E show views of one of the various stages of manufacturing a GAA FET semiconductor device according to embodiments of the present disclosure. FIG. 17A is an isometric view. FIG. 17B is a cross-sectional view taken along line A-A' of FIG. 17A. FIG. 17C is a cross-sectional view taken along line B-B' of FIG. 17A. FIG. 17D is a cross-sectional view taken along line C-C' of FIG. 17A. FIG. 17E is a cross-sectional view taken along line D-D' of FIG. 17A.

FIG. 18A is an isometric view. FIG. 18B is a cross-sectional view taken along line A-A' of FIG. 18A. FIG. 18C is a cross-sectional view taken along line B-B' of FIG. 18A. FIG. 18D is a cross-sectional view taken along line C-C' of FIG. 18A. FIG. 18E is a cross-sectional view taken along line D-D' of FIG. 18A.

FIG. 19A is an isometric view. FIG. 19B is a cross-sectional view taken along line A-A' of FIG. 19A. FIG. 19C is a cross-sectional view taken along line B-B' of FIG. 19A. FIG. 19D is a cross-sectional view taken along line C-C' of FIG. 19A. FIG. 19E is a cross-sectional view taken along line D-D' of FIG. 19A.

FIG. 20A is an isometric view. FIG. 20B is a cross-sectional view taken along line A-A' of FIG. 20A. FIG. 20C is a cross-sectional view taken along line B-B' of FIG. 20A. FIG. 20D is a cross-sectional view taken along line C-C' of FIG. 20A. FIG. 20E is a cross-sectional view taken along line D-D' of FIG. 20A.

FIGS. 21A-21E show views of one of the various stages of manufacturing a GAA FET semiconductor device according to embodiments of the present disclosure. FIG. 21A is an isometric view. FIG. 21B is a cross-sectional view taken along line A-A' of FIG. 21A. FIG. 21C is a cross-sectional view taken along line B-B' of FIG. 21A. FIG. 21D is a cross-sectional view taken along line C-C' of FIG. 21A. FIG. 21E is a cross-sectional view taken along line D-D' of FIG. 21A.

FIGS. 22A-22E show views of one of the various stages of manufacturing a GAA FET semiconductor device according to embodiments of the present disclosure. FIG. 22A is an isometric view. FIG. 22B is a cross-sectional view taken along line A-A' of FIG. 22A. FIG. 22C is a cross-sectional view taken along line B-B' of FIG. 22A. FIG. 22D is a cross-sectional view taken along line C-C' of FIG. 22A. FIG. 22E is a cross-sectional view taken along line D-D' of FIG. 22A.

FIG. 23A is an isometric view. FIG. 23B is a cross-sectional view taken along line A-A' of FIG. 23A. FIG. 23C is a cross-sectional view taken along line B-B' of FIG. 23A. FIG. 23D is a cross-sectional view taken along line C-C' of FIG. 23A. FIG. 23E is a cross-sectional view taken along line D-D' of FIG. 23A.

FIG. 24A is an isometric view. FIG. 24B is a cross-sectional view taken along line A-A' of FIG. 24A. FIG. 24C is a cross-sectional view taken along line B-B' of FIG. 24A. FIG. 24D is a cross-sectional view taken along line C-C' of FIG. 24A. FIG. 24E is a cross-sectional view taken along line D-D' of FIG. 24A.

FIG. 25A is an isometric view. FIG. 25B is a cross-sectional view taken along line A-A' of FIG. 25A. FIG. 25C is a cross-sectional view taken along line B-B' of FIG. 25A. FIG. 25D is a cross-sectional view taken along line C-C' of FIG. 25A. FIG. 25E is a cross-sectional view taken along line D-D' of FIG. 25A.

FIGS. 26A-26E show views of one of the various stages of manufacturing a GAA FET semiconductor device according to embodiments of the present disclosure. FIG. 26A is an isometric view. FIG. 26B is a cross-sectional view taken along line A-A' of FIG. 26A. FIG. 26C is a cross-sectional view taken along line B-B' of FIG. 26A. FIG. 26D is a cross-sectional view taken along line C-C' of FIG. 26A. FIG. 26E is a cross-sectional view taken along line D-D' of FIG. 26A.

FIGS. 27A-27E show views of one of the various stages of manufacturing a GAA FET semiconductor device according to embodiments of the present disclosure. FIG. 27A is an isometric view. FIG. 27B is a cross-sectional view taken along line A-A' of FIG. 27A. FIG. 27C is a cross-sectional view taken along line B-B' of FIG. 27A. FIG. 27D is a cross-sectional view taken along line C-C' of FIG. 27A. FIG. 27E is a cross-sectional view taken along line D-D' of FIG. 27A.

FIGS. 28A-28E show views of one of the various stages of manufacturing a GAA FET semiconductor device according to embodiments of the present disclosure. FIG. 28A is an isometric view. FIG. 28B is a cross-sectional view taken along line A-A' of FIG. 28A. FIG. 28C is a cross-sectional view taken along line B-B' of FIG. 28A. FIG. 28D is a cross-sectional view taken along line C-C' of FIG. 28A. FIG. 28E is a cross-sectional view taken along line D-D' of FIG. 28A.

FIGS. 29A-29E show views of one of the various stages of manufacturing a GAA FET semiconductor device according to embodiments of the present disclosure. FIG. 29A is an isometric view. FIG. 29B is a cross-sectional view taken along line A-A' of FIG. 29A. FIG. 29C is a cross-sectional view taken along line B-B' of FIG. 29A. FIG. 29D is a cross-sectional view taken along line C-C' of FIG. 29A. FIG. 29E is a cross-sectional view taken along line D-D' of FIG. 29A.

FIG. 30A is an isometric view. FIG. 30B is a cross-sectional view taken along line A-A' of FIG. 30A. FIG. 30C is a cross-sectional view taken along line B-B' of FIG. 30A. FIG. 30D is a cross-sectional view taken along line C-C' of FIG. 30A. FIG. 30E is a cross-sectional view taken along line D-D' of FIG. 30A.

FIG. 31A is an isometric view. FIG. 31B is a cross-sectional view taken along line A-A' of FIG. 31A. FIG. 31C is a cross-sectional view taken along line B-B' of FIG. 31A. FIG. 31D is a cross-sectional view taken along line C-C' of FIG. 31A. FIG. 31E is a cross-sectional view taken along line D-D' of FIG. 31A.

FIG. 32A is an isometric view. FIG. 32B is a cross-sectional view taken along line A-A' of FIG. 32A. FIG. 32C is a cross-sectional view taken along line B-B' of FIG. 32A. FIG. 32D is a cross-sectional view taken along line C-C' of FIG. 32A. FIG. 32E is a cross-sectional view taken along line D-D' of FIG. 32A.

FIG. 33A is an isometric view. FIG. 33B is a cross-sectional view taken along line A-A' of FIG. 33A. FIG. 33C is a cross-sectional view taken along line B-B' of FIG. 33A. FIG. 33D is a cross-sectional view taken along line C-C' of FIG. 33A. FIG. 33E is a cross-sectional view taken along line D-D' of FIG. 33A.

FIG. 34A is an isometric view. FIG. 34B is a cross-sectional view taken along line A-A' of FIG. 34A. FIG. 34C is a cross-sectional view taken along line B-B' of FIG. 34A. FIG. 34D is a cross-sectional view taken along line C-C' of FIG. 34A. FIG. 34E is a cross-sectional view taken along line D-D' of FIG. 34A.

FIG. 35A is an isometric view. FIG. 35B is a cross-sectional view taken along line A-A' of FIG. 35A. FIG. 35C is a cross-sectional view taken along line B-B' of FIG. 35A. FIG. 35D is a cross-sectional view taken along line C-C' of FIG. 35A. FIG. 35E is a cross-sectional view taken along line D-D' of FIG. 35A.

FIGS. 36A-36E show views of one of the various stages of manufacturing a GAA FET semiconductor device according to embodiments of the present disclosure. FIG. 36A is an isometric view. FIG. 36B is a cross-sectional view taken along line A-A' of FIG. 36A. FIG. 36C is a cross-sectional view taken along line B-B' of FIG. 36A. FIG. 36D is a cross-sectional view taken along line C-C' of FIG. 36A. FIG. 36E is a cross-sectional view taken along line D-D' of FIG. 36A.

FIG. 37A is an isometric view. FIG. 37B is a cross-sectional view taken along line A-A' of FIG. 37A. FIG. 37C is a cross-sectional view taken along line B-B' of FIG. 37A. FIG. 37D is a cross-sectional view taken along line C-C' of FIG. 37A. FIG. 37E is a cross-sectional view taken along line D-D' of FIG. 37A.

FIGS. 38A-38E show views of one of the various stages of manufacturing a GAA FET semiconductor device according to embodiments of the present disclosure. FIG. 38A is an isometric view. FIG. 38B is a cross-sectional view taken along line A-A' of FIG. 38A. FIG. 38C is a cross-sectional view taken along line B-B' of FIG. 38A. FIG. 38D is a cross-sectional view taken along line C-C' of FIG. 38A. FIG. 38E is a cross-sectional view taken along line D-D' of FIG. 38A. FIG. 38F is a cross-sectional view of another embodiment taken along line C-C' of FIG. 38A.

FIGS. 39A-39E show views of one of the various stages of manufacturing a GAA FET semiconductor device according to embodiments of the present disclosure. FIG. 39A is an isometric view. FIG. 39B is a cross-sectional view taken along line A-A' of FIG. 39A. FIG. 39C is a cross-sectional view taken along line B-B' of FIG. 39A. FIG. 39D is a cross-sectional view taken along line C-C' of FIG. 39A. FIG.

39E is a cross-sectional view taken along line D-D' of FIG. 39A. FIG. 39F is a cross-sectional view of another embodiment taken along line C-C' of FIG. 39A.

FIGS. 40A-40E show views of one of the various stages of manufacturing a GAA FET semiconductor device according to embodiments of the present disclosure. FIG. 40A is an isometric view. FIG. 40B is a cross-sectional view taken along line A-A' of FIG. 40A. FIG. 40C is a cross-sectional view taken along line B-B' of FIG. 40A. FIG. 40D is a cross-sectional view taken along line C-C' of FIG. 40A. FIG. 40E is a cross-sectional view taken along line D-D' of FIG. 40A.

FIG. 41A is an isometric view. FIG. 41B is a cross-sectional view taken along line A-A' of FIG. 41A. FIG. 41C is a cross-sectional view taken along line B-B' of FIG. 41A. FIG. 41D is a cross-sectional view taken along line C-C' of FIG. 41A. FIG. 41E is a cross-sectional view taken along line D-D' of FIG. 41A.

FIG. 42A is an isometric view. FIG. 42B is a cross-sectional view taken along line A-A' of FIG. 42A. FIG. 42C is a cross-sectional view taken along line B-B' of FIG. 42A. FIG. 42D is a cross-sectional view taken along line C-C' of FIG. 42A. FIG. 42E is a cross-sectional view taken along line D-D' of FIG. 42A.

FIGS. 43A-43E show views of one of the various stages of manufacturing a GAA FET semiconductor device according to embodiments of the present disclosure. FIG. 43A is an isometric view. FIG. 43B is a cross-sectional view taken along line A-A' of FIG. 43A. FIG. 43C is a cross-sectional view taken along line B-B' of FIG. 43A. FIG. 43D is a cross-sectional view taken along line C-C' of FIG. 43A. FIG. 43E is a cross-sectional view taken along line D-D' of FIG. 43A.

FIG. 44A is an isometric view. FIG. 44B is a cross-sectional view taken along line A-A' of FIG. 44A. FIG. 44C is a cross-sectional view taken along line B-B' of FIG. 44A. FIG. 44D is a cross-sectional view taken along line C-C' of FIG. 44A. FIG. 44E is a cross-sectional view taken along line D-D' of FIG. 44A.

FIGS. 45A-45E show views of one of the various stages of manufacturing a GAA FET semiconductor device according to embodiments of the present disclosure. FIG. 45A is an isometric view. FIG. 45B is a cross-sectional view taken along line A-A' of FIG. 45A. FIG. 45C is a cross-sectional view taken along line B-B' of FIG. 45A. FIG. 45D is a cross-sectional view taken along line C-C' of FIG. 45A. FIG. 45E is a cross-sectional view taken along line D-D' of FIG. 45A.

FIG. 46A is an isometric view. FIG. 46B is a cross-sectional view taken along line A-A' of FIG. 46A. FIG. 46C is a cross-sectional view taken along line B-B' of FIG. 46A. FIG. 46D is a cross-sectional view taken along line C-C' of FIG. 46A. FIG. 46E is a cross-sectional view taken along line D-D' of FIG. 46A.

FIG. 51A is a plan view of a semiconductor device according to an embodiment of present disclosure. FIG. 51B is a cross-sectional view taken along line J-J' of FIG. 51A.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In the present disclosure, a method for fabricating a GAA FET and a stacked channel FET are provided. It is noted that in the present disclosure, a source and a drain are interchangeably used and the structures thereof are substantially the same.

Semiconductor devices may include multiple metal tracks, including power rails, such a positive voltage rail (VDD) and a ground rail (GND); and multiple signal lines. Increasing the number of metal tracks can reduce the complexity of placement and routing on a chip, and improve the density of the chip. In some semiconductor devices, the power rails and signal lines are located in the first metallization layer (M0) over the active device. As semiconductor device size shrinks, however, space for metal tracks, such as power rails and signal lines decreases. Thus, it is a challenge to both reduce the semiconductor device size and increase the number of metal tracks.

Figure 1:
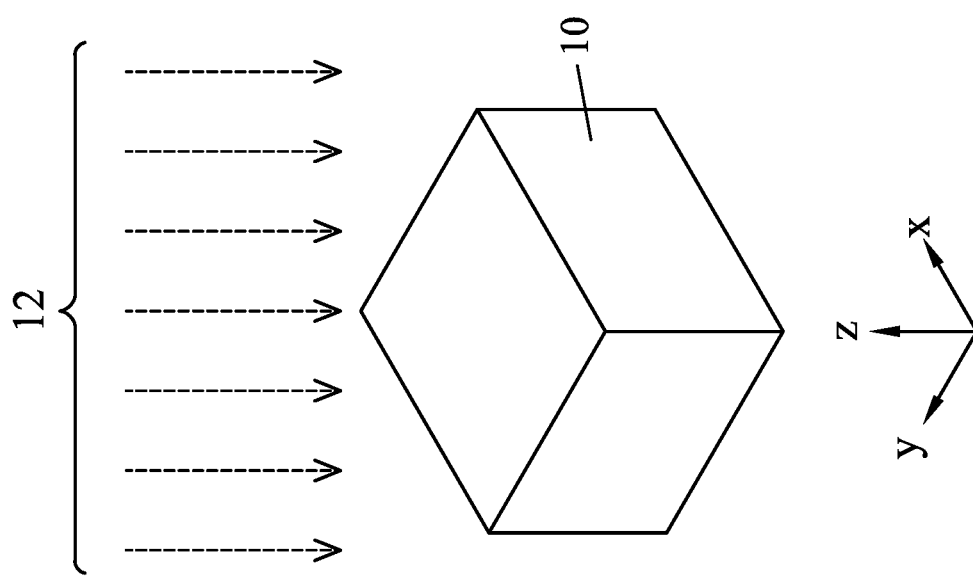
FIG. 1 shows an isometric view of one of the various stages of manufacturing a GAA FET semiconductor device according to embodiments of the present disclosure.

FIGS. 1-26E illustrate a method of manufacturing a semiconductor device according to embodiments of the present disclosure. As shown in FIG. 1, impurity ions (dopants) 12 are implanted into a silicon substrate 10 to form a well region. The ion implantation is performed to prevent a punch-through effect. In one embodiment, substrate 10 includes a single crystalline semiconductor layer on at least its surface. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In one embodiment, the substrate 10 is made of Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 includes silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer. In some embodiments of the present disclosure, the substrate 10 includes various regions that have been suitably doped with impurities (e.g., p-type or n-type conductivity). The dopants 12 are, for example, boron ($BF_2$) for an n-type FinFET and phosphorus for a p-type FinFET.

Figure 2:
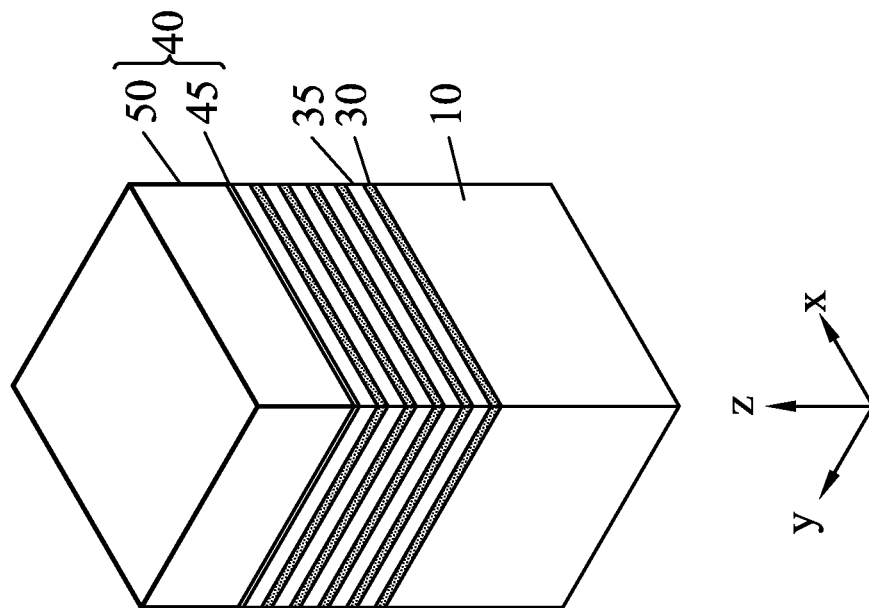
FIG. 2 shows an isometric view of one of the various stages of manufacturing a GAA FET semiconductor device according to embodiments of the present disclosure.

In FIG. 2, an alternating stack of first semiconductor layers 30 and second semiconductor layers 35 made of different materials are formed over the substrate 10. The first semiconductor layers 30 and the second semiconductor layers 35 are formed of materials having different lattice constants, and include one or more layers of Si, Ge, SiGe, GaAs, InSb, GaP, GaSb, InAlAs, InGaAs, GaSbP, GaAsSb or InP in some embodiments of the present disclosure.

In some embodiments, the first semiconductor layers 30 and the second semiconductor layers 35 are formed of Si, a Si compound, SiGe, Ge or a Ge compound. In one embodiment, the first semiconductor layers 30 are $Si_{1-x}Ge_x$, where x is more than about 0.3, or Ge (x=1.0) and the second semiconductor layers 35 are Si or $Si_{1-y}Ge_y$, where y is less than about 0.4 and x>y. In this disclosure, an "M" compound" or an "M based compound" means the majority of the compound is M.

In another embodiment, the second semiconductor layers 35 are $Si_{1-y}Ge_y$, where y is more than about 0.3, or Ge, and the first semiconductor layers 30 are Si or $Si_{1-x}Ge_x$, where x is less than about 0.4 and x<y. In yet other embodiments, the first semiconductor layer 30 is made of $Si_{1-x}Ge_x$, where x is in a range from about 0.3 to about 0.8, and the second semiconductor layer 35 is made of $Si_{1-x}Ge_x$, where x is in a range from about 0.1 to about 0.4.

FIG. 2 shows five layers of the first semiconductor layer 30 and second semiconductor layer 35. However, the number of the layers are not limited to five, and may be as small as 1 (one layer each) in some embodiments, or 2 to 10 layers of each of the first and second semiconductor layers. By adjusting the numbers of the stacked layers, a driving current of the GAA FET device can be adjusted.

The first semiconductor layers 30 and the second semiconductor layers 35 are epitaxially formed over the substrate 10. The thickness of the first semiconductor layers 30 may be equal to, greater than, or less than that of the second semiconductor layers 30, and is in a range from about 2 nm to about 40 nm in some embodiments, in a range from about 3 nm to about 30 nm in other embodiments, and in a range of about 5 nm to about 10 nm in other embodiments. The thickness of the second semiconductor layers 35 is in a range from about 2 nm to about 40 nm in some embodiments, in a range from about 3 nm to about 30 nm in other embodiments, and in a range of about 5 nm to about 10 nm in other embodiments. In some embodiments, the bottom first semiconductor layer 30 (the closest layer to the substrate 10) is thicker than the remaining first semiconductor layers 30. The thickness of the bottom first semiconductor layer 30 is in a range from about 10 nm to about 40 nm in some embodiments, or is in a range from about 10 nm to about 30 nm in other embodiments.

Further, as shown in FIG. 2, a hard mask layer 40 is formed over the stacked first and second semiconductor layers 30, 35. In some embodiments, the hard mask layer 40 includes a first mask layer 45 and a second mask layer 50. The first mask layer 45 is a pad oxide layer made of a silicon oxide in some embodiments. The first mask layer 45 may be formed by thermal oxidation. The second mask layer 50 is made of a silicon nitride in some embodiments. The second mask layer 50 may be formed by chemical vapor deposition (CVD), including low pressure CVD (LPCVD) and plasma enhanced CVD (PECVD); physical vapor deposition (PVD), including sputtering; atomic layer deposition (ALD); or other suitable process.

Figure 3E:
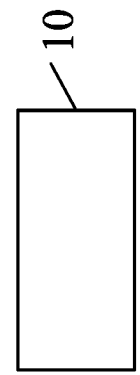
Figure 3D:
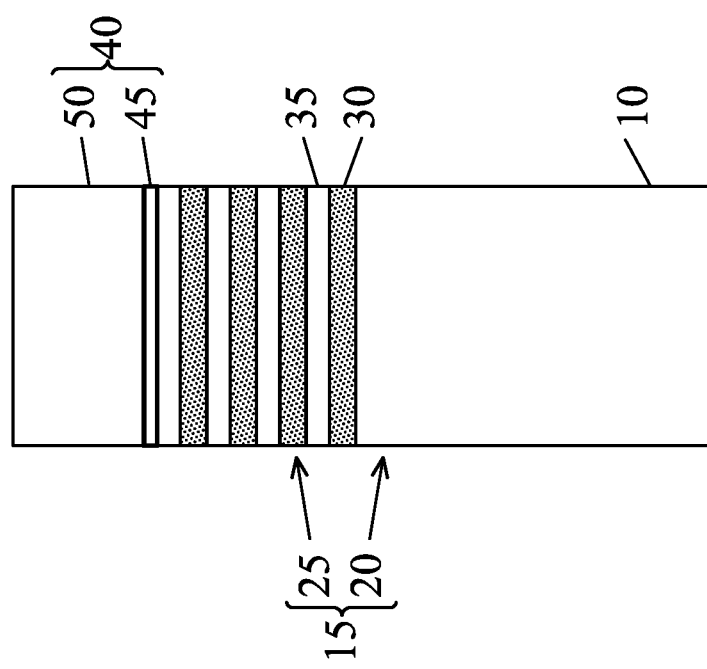
Figure 4B:
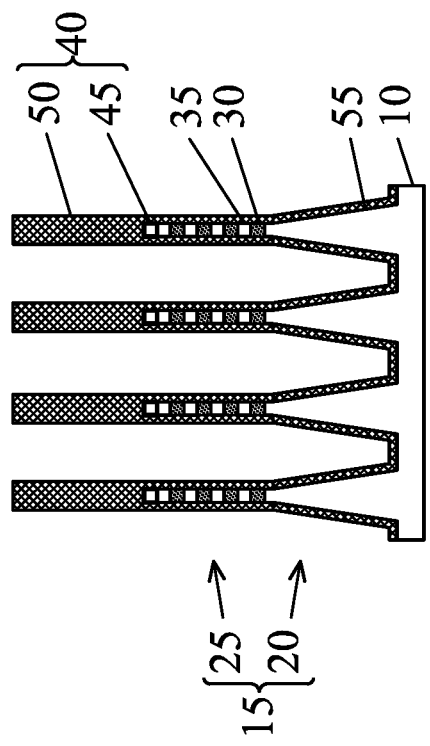
FIGS. 4A-4E show views of one of the various stages of manufacturing a GAA FET semiconductor device according to embodiments of the present disclosure.
Figure 4C:
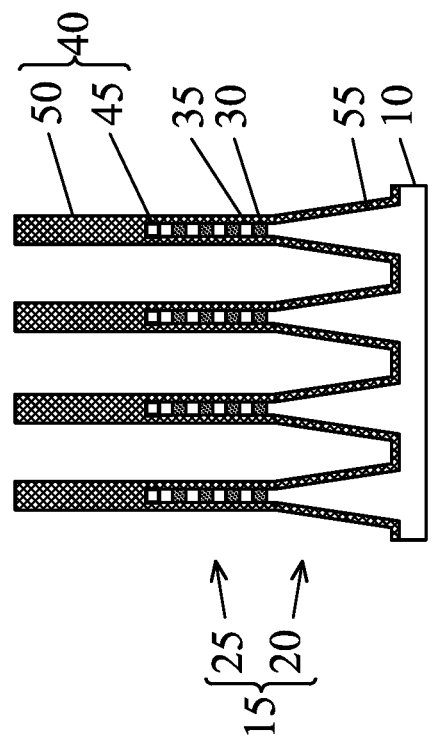
Figure 4A:
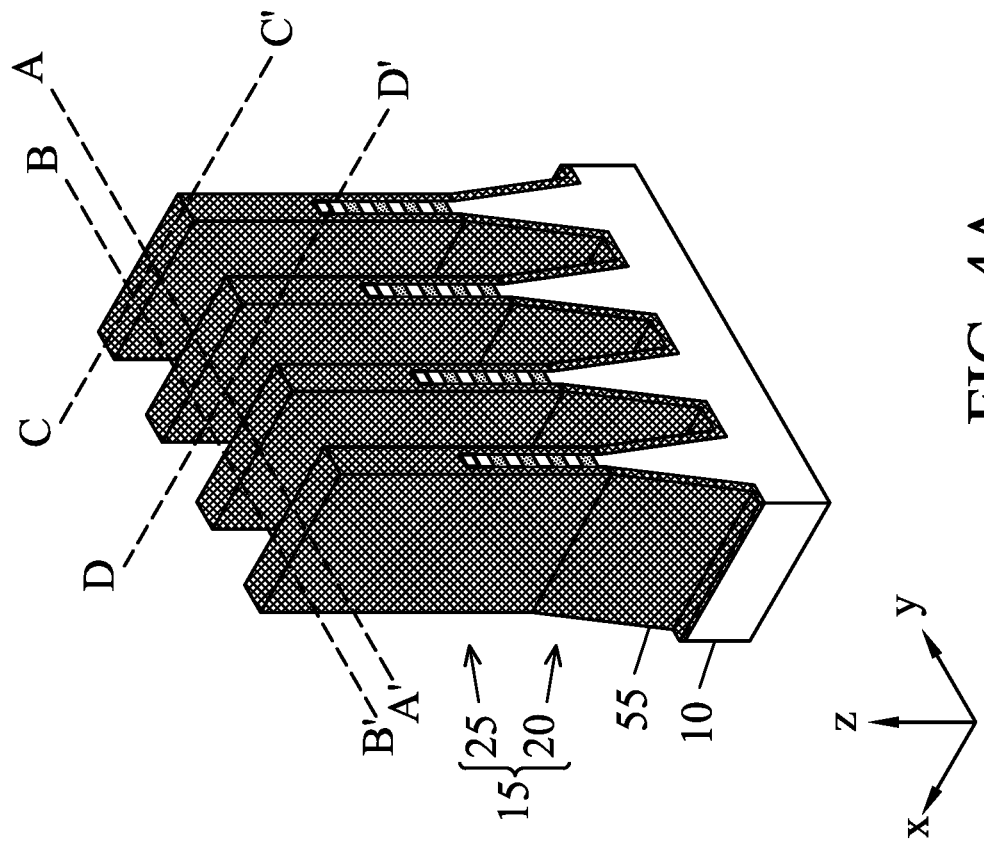
Figure 4E:
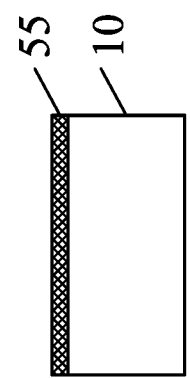
Figure 4D:
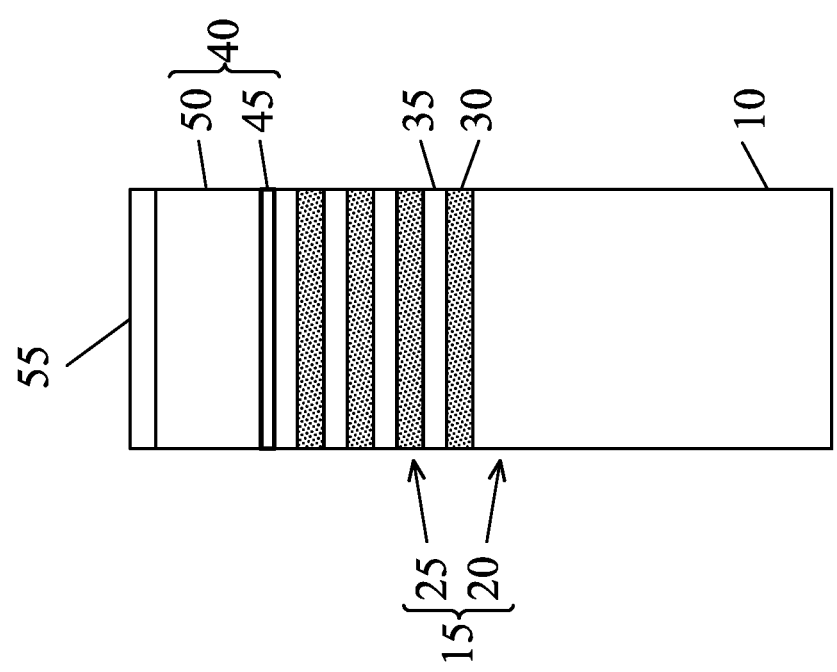
Figure 5B:
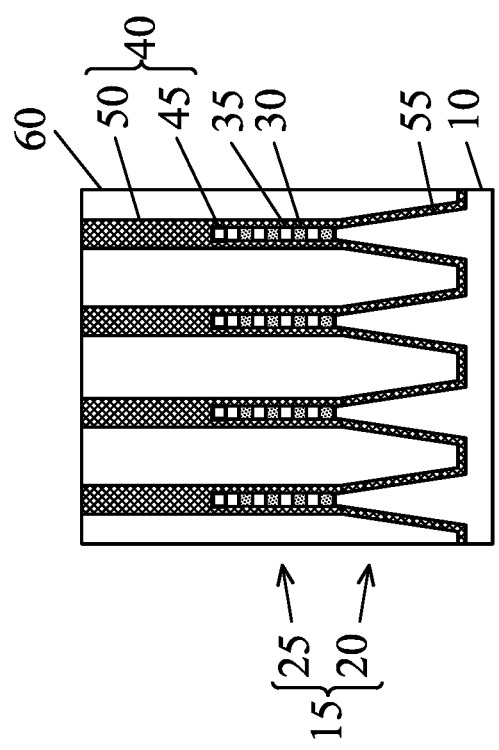
FIGS. 5A-5E show views of one of the various stages of manufacturing a GAA FET semiconductor device according to embodiments of the present disclosure.
Figure 5C:
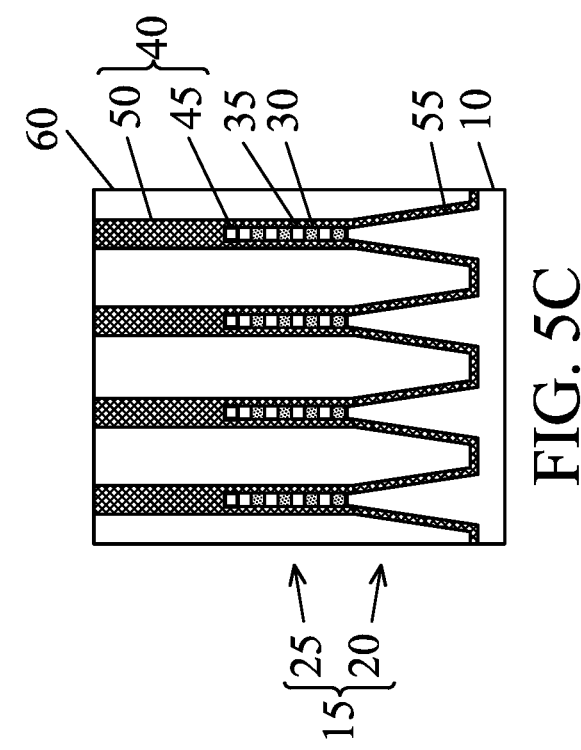
Figure 5A:
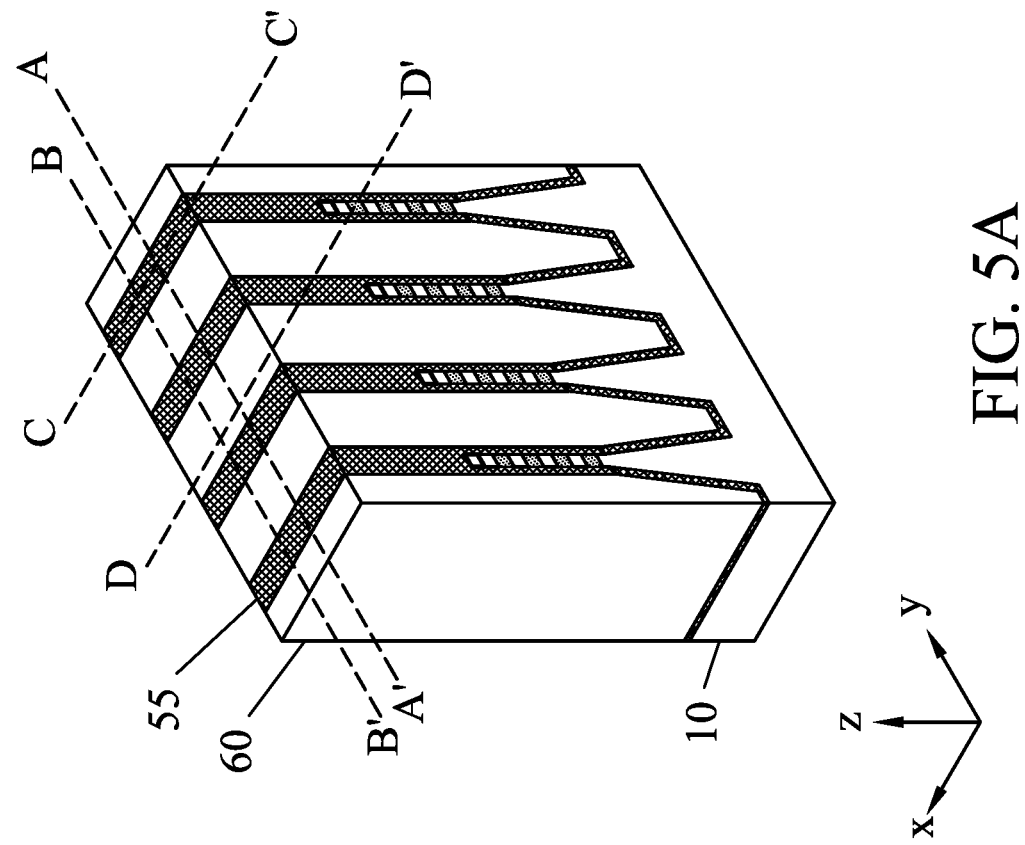
Figure 5E:
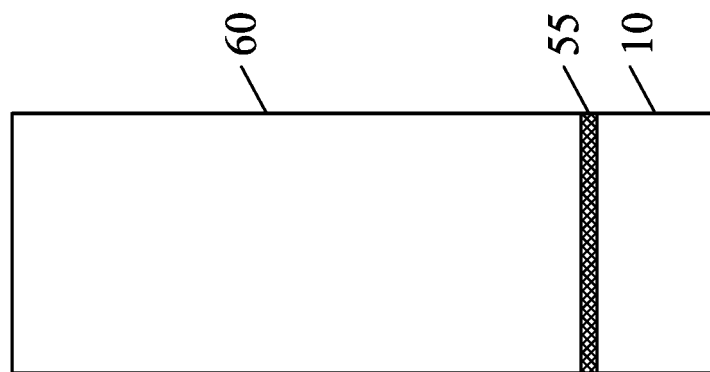
Figure 5D:
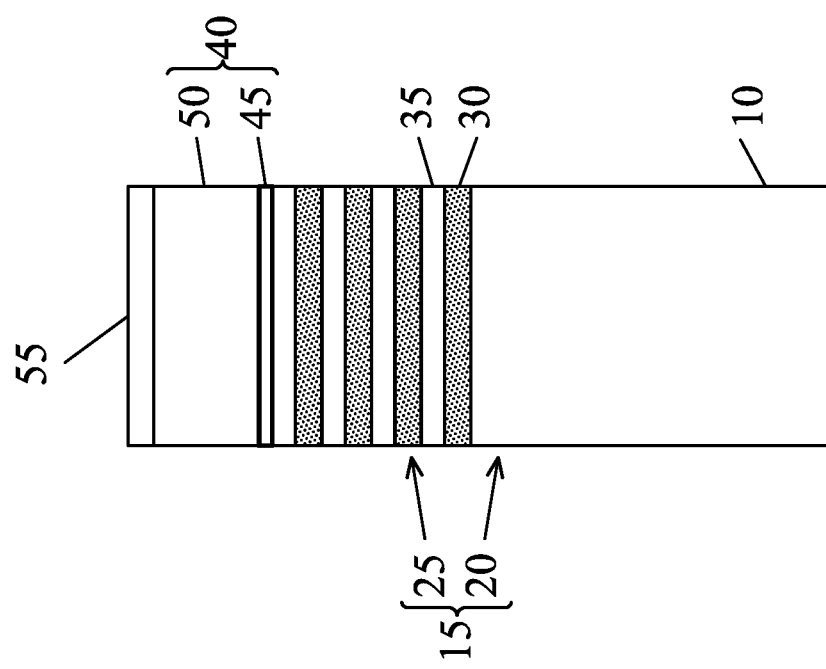

The hard mask layer 40 is patterned into a mask pattern by using patterning operations including photolithography and etching. Next, as shown in FIGS. 3A-3E the stacked layers of the first and second semiconductor layers 30, 35 and the underlying substrate 10 are patterned by using the patterned mask layer, thereby the stacked layers and a portion of the substrate are formed into fin structures 15 extending in the X direction. In FIGS. 3A-3C, four fin structures 15 are arranged in the Y direction. But the number of the fin structures is not limited to four, and may be as small as one or two, or more four. In some embodiments, one or more dummy fin structures are formed on both sides of the fin structures 15 to improve pattern fidelity in the patterning operations. As shown in FIGS. 3A-3E, the fin structures 15 have upper portions 25 constituted by the stacked first and second semiconductor layers 30, 35, which will form the channel regions; and lower portions 20, which are the well regions.

In FIGS. 3A-26E, the A drawings are isometric views of sequential operations of manufacturing a semiconductor device. The B drawings are cross-sectional views taken along line A-A' of the A drawings. The B drawings are taken along the gate region of the semiconductor device in the Y direction. The C drawings are cross-sectional views taken long line B-B' of the A drawings. The C drawings are taken along the source/drain regions of the semiconductor device in the Y direction. The D drawings are cross-sectional views taken along line C-C' of the A drawings. The D drawings are taken along the fin structures of the semiconductor device in the X-direction. The E drawings are cross-sectional views taken along line D-D' of the A drawings. The E drawings are cross-sectional views taken along a gate cut in the X direction.

The width W1 of the upper portion 25 of the fin structure 15 along the Y direction is in a range from about 4 nm to about 40 nm in some embodiments, in a range from about 5 nm to about 30 nm in other embodiments, and in a range from about 6 nm to about 20 nm in other embodiments. The space Si between adjacent fin structures about the bottom part of the upper portion 25 ranges from about 20 nm to about 80 nm in some embodiments, and ranges from about 30 nm to about 60 nm in other embodiments. The height H1 along the Z direction of the fin structure 15 is in a range from about 75 nm to about 300 nm in some embodiments, and ranges from about 100 nm to about 200 nm in other embodiments.

The stacked fin structure 15 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the stacked fin structure 15.

An insulating liner layer 55 is subsequently formed over the hard mask layer 40, fin structures 15, and substrate 10, as shown in FIGS. 4A-4E. The insulating liner layer 55 conformally covers the hard mask layer 40, fin structures 15, and substrate in some embodiments. In an embodiment, the insulating liner layer 55 is made of a nitride, such as silicon nitride, a silicon nitride-based material (e.g., SiON, SiCN, or SiOCN), or a carbon nitride. The insulating liner layer 55 may be formed by CVD, LPCVD, PECVD, PVD, ALD, or other suitable process. The thickness of the insulating liner layer 55 ranges from about 1 nm to about 20 nm in some embodiments. In some embodiments, the thickness of insulating liner layer ranges from about 3 nm to about 15 nm. In some embodiments, the insulating liner layer 55 includes two or layers of different material.

After the insulating liner layer 55 is formed, a first insulating material layer 60 including one or more layers of insulating material is formed over the substrate so that the fin structures are fully embedded in the insulating layer. The insulating material for the first insulating material layer 60 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surface of the insulating liner layer 55 is exposed from the first insulating material layer 60, as shown in FIGS. 5A-5E.

Figure 6B:
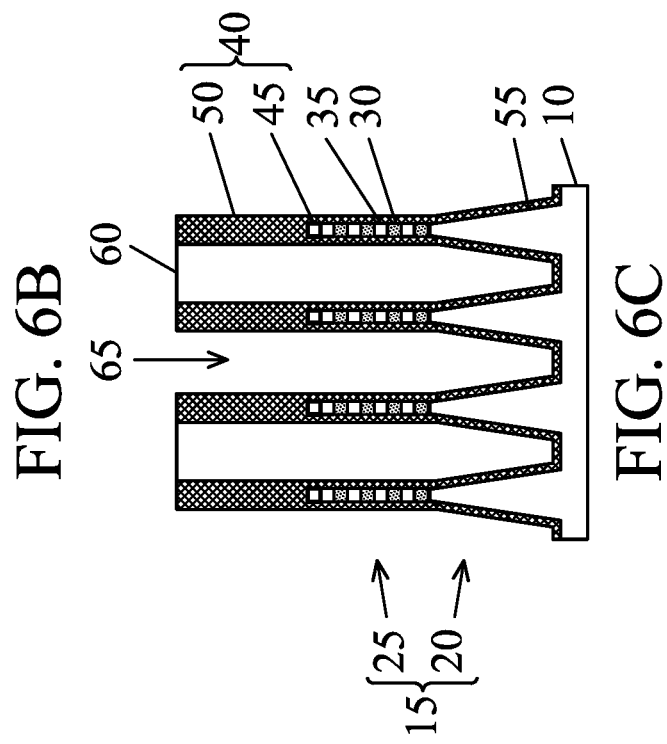
FIGS. 6A-6E show views of one of the various stages of manufacturing a GAA FET semiconductor device according to embodiments of the present disclosure.
Figure 6C:
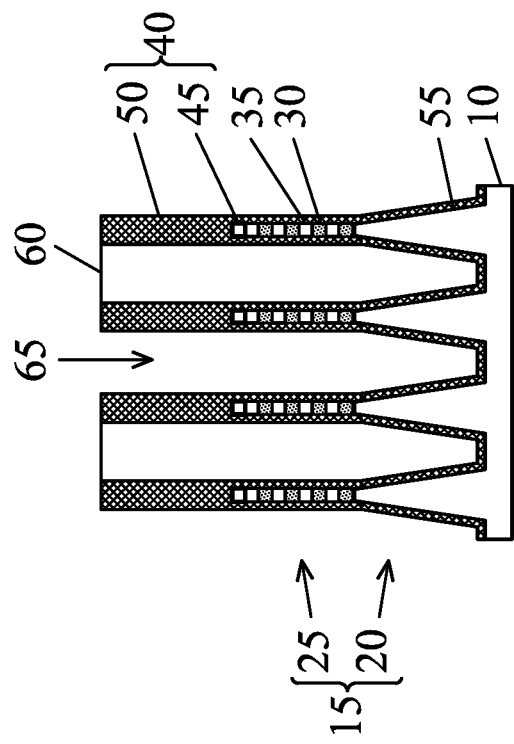
Figure 6A:
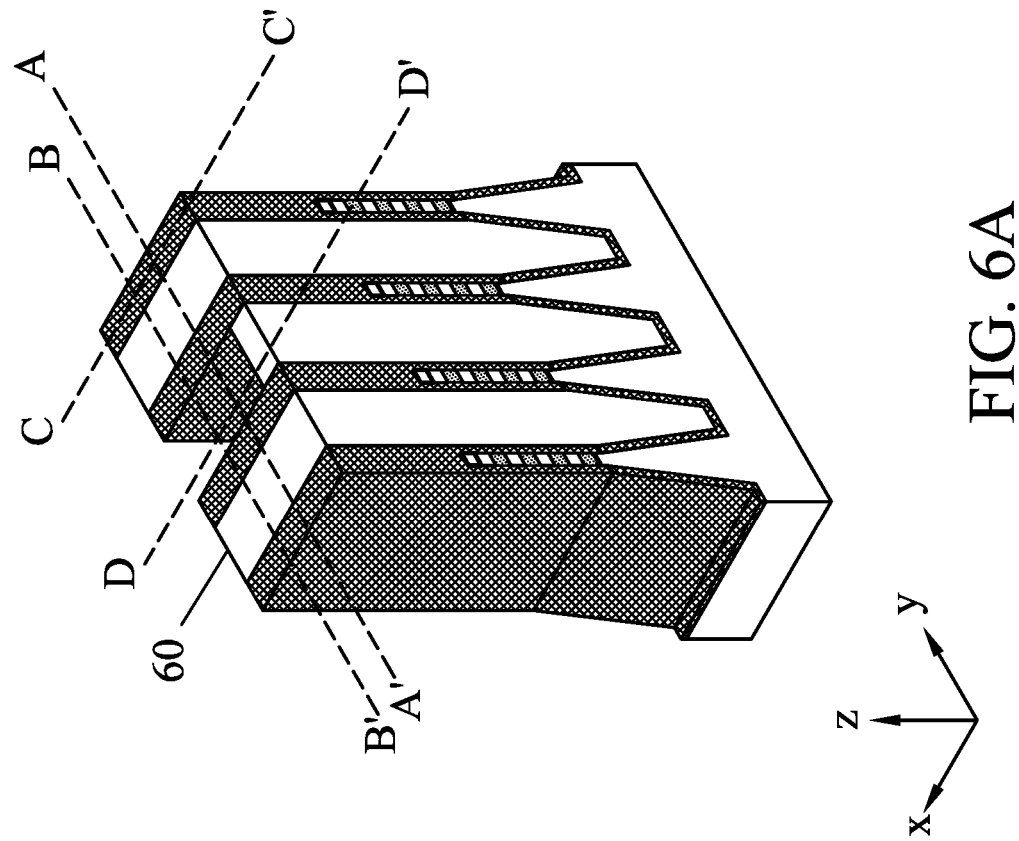
Figure 6E:
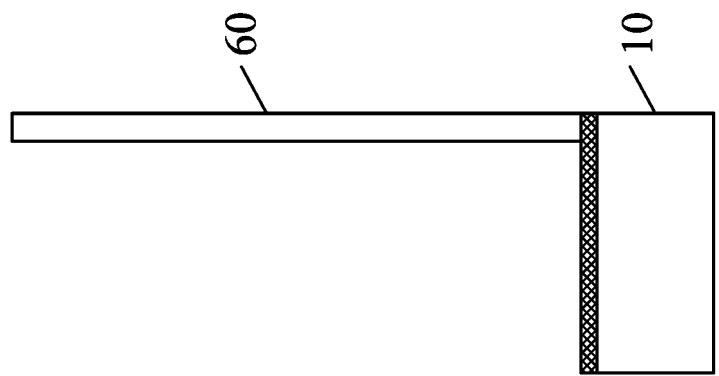
Figure 6D:
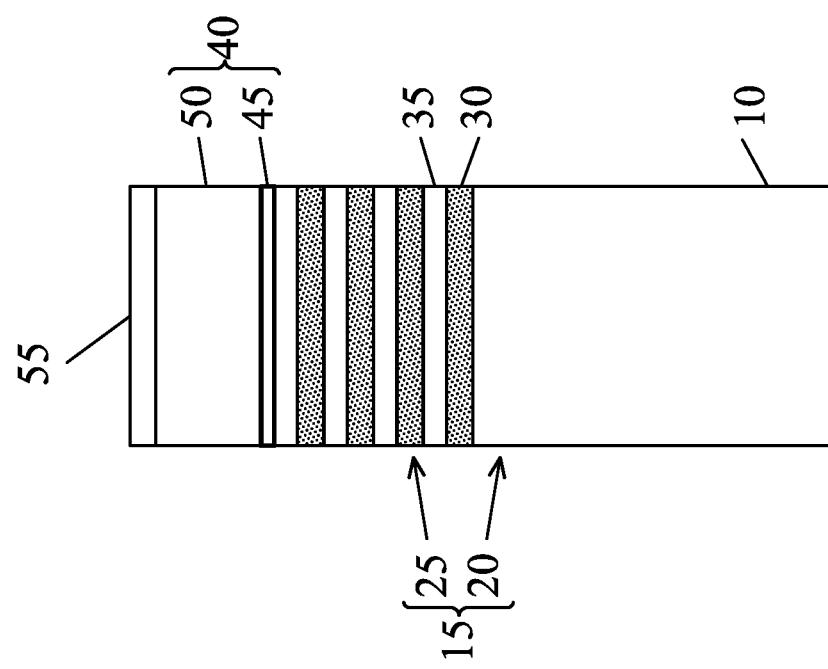
Figure 7E:
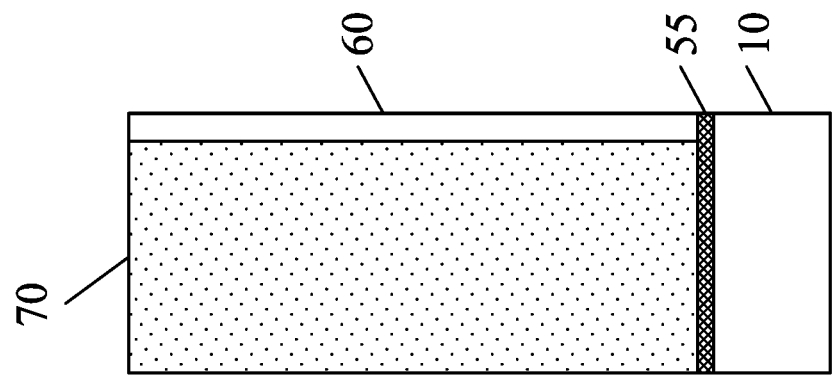
Figure 7D:
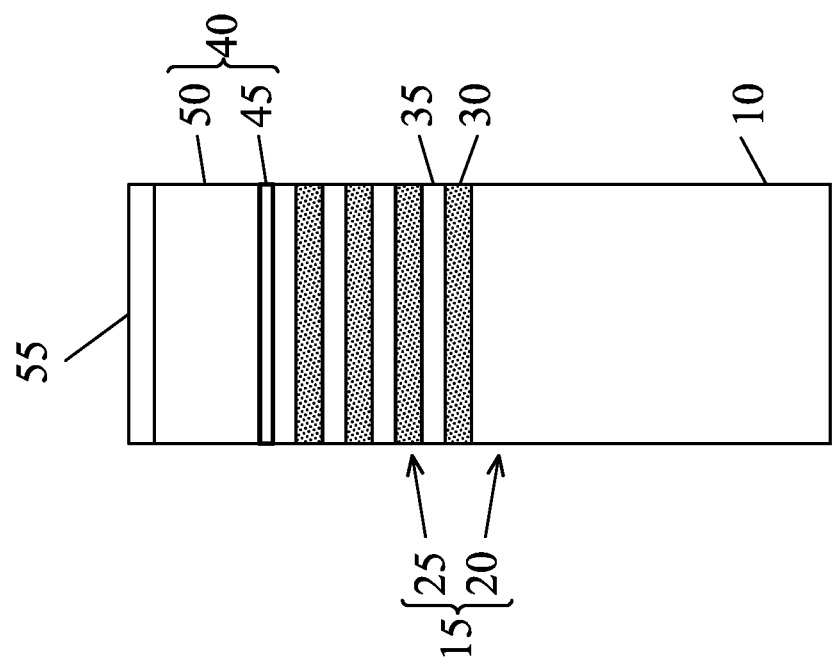
Figure 8E:
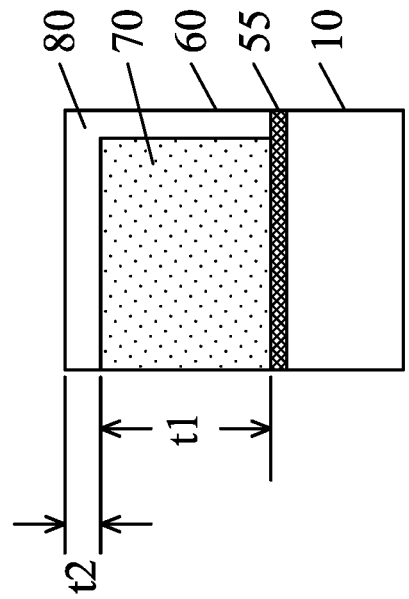
Figure 8D:
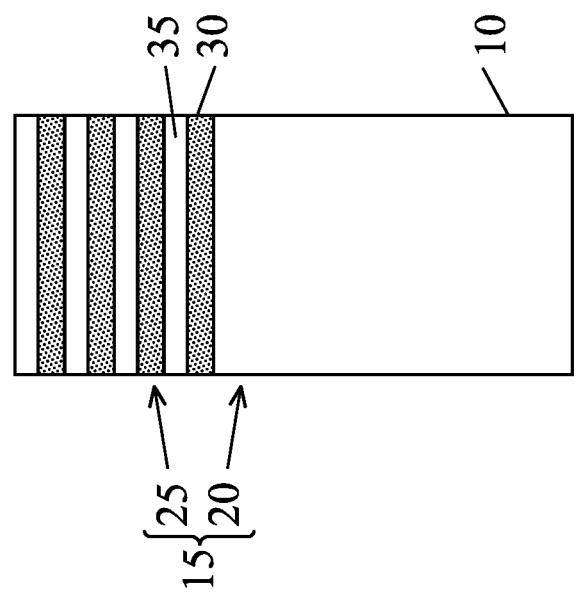
Figure 9B:
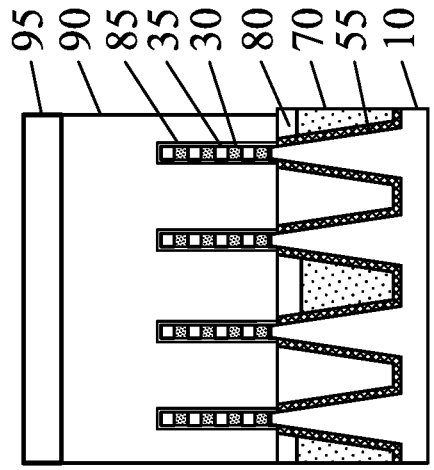
FIGS. 9A-9E show views of one of the various stages of manufacturing a GAA FET semiconductor device according to embodiments of the present disclosure.
Figure 9C:
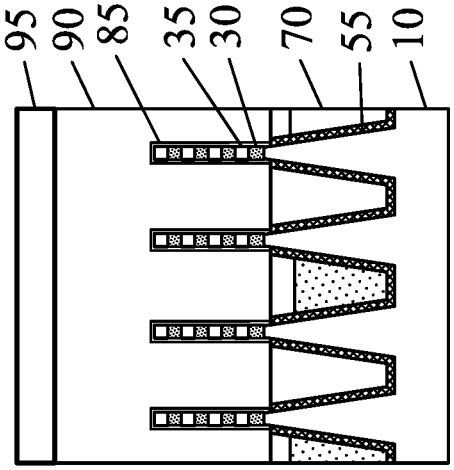
Figure 9A:
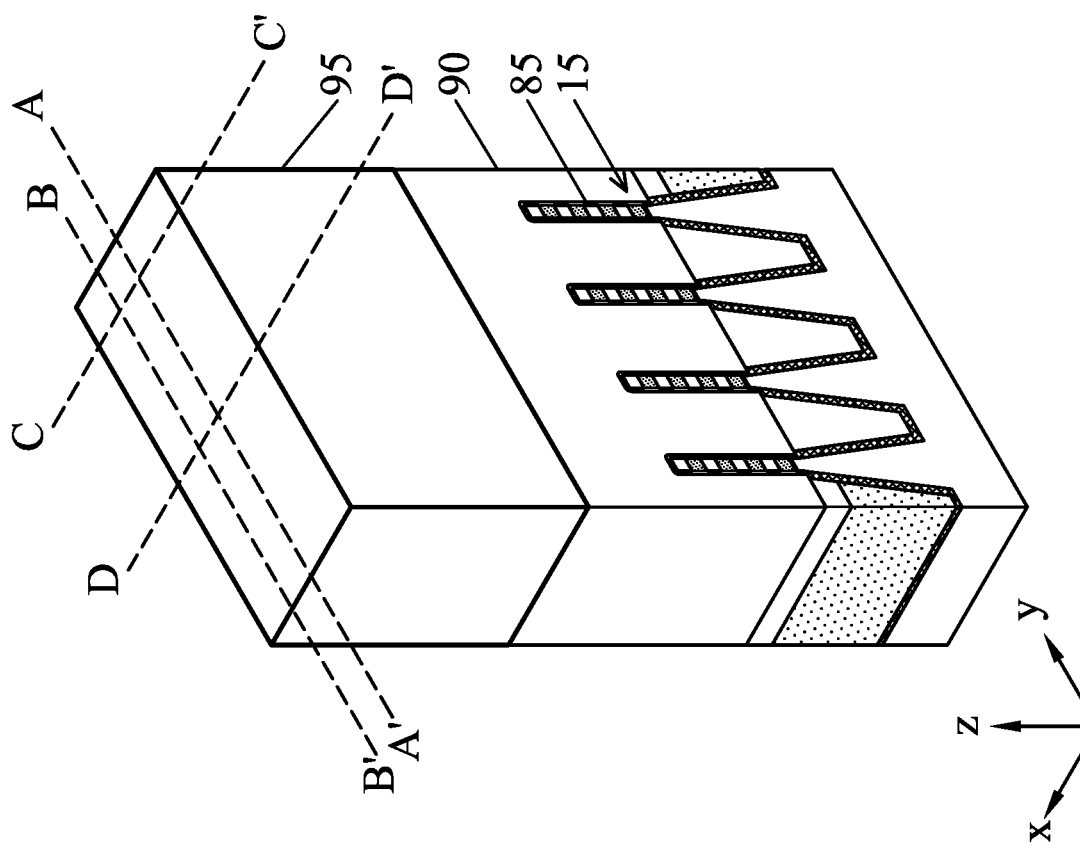
Figure 9E:
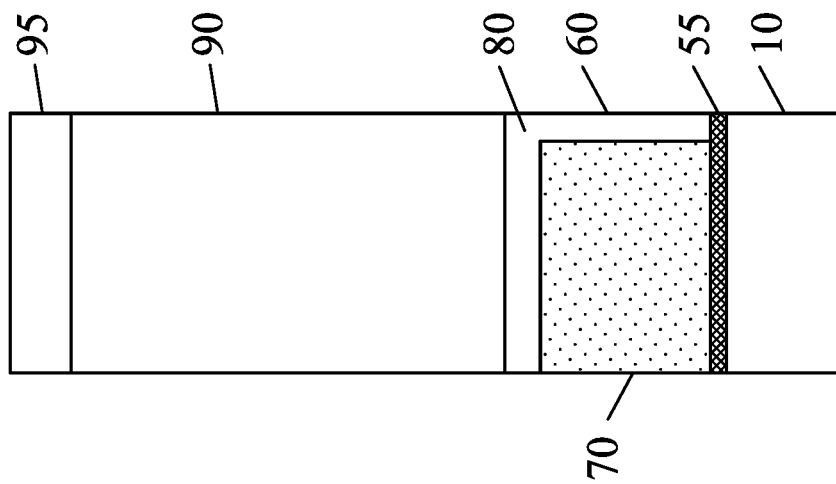
Figure 9D:
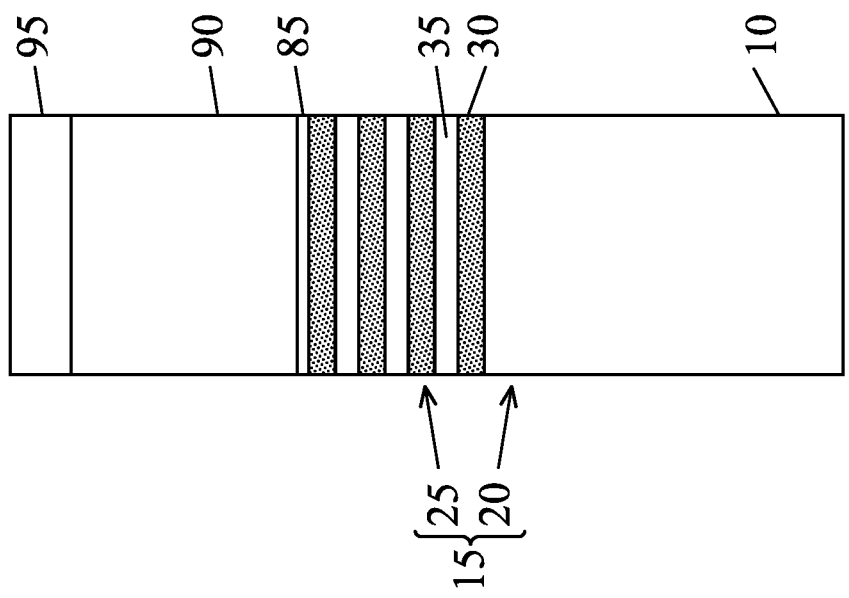
Figure 10E:
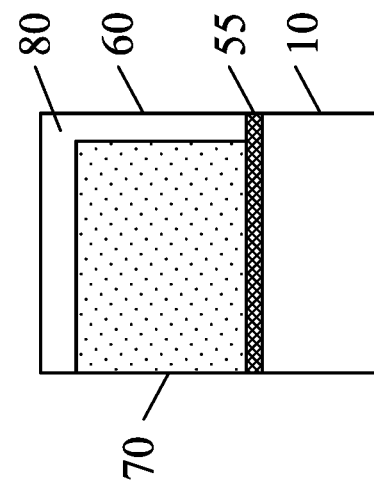
Figure 10D:
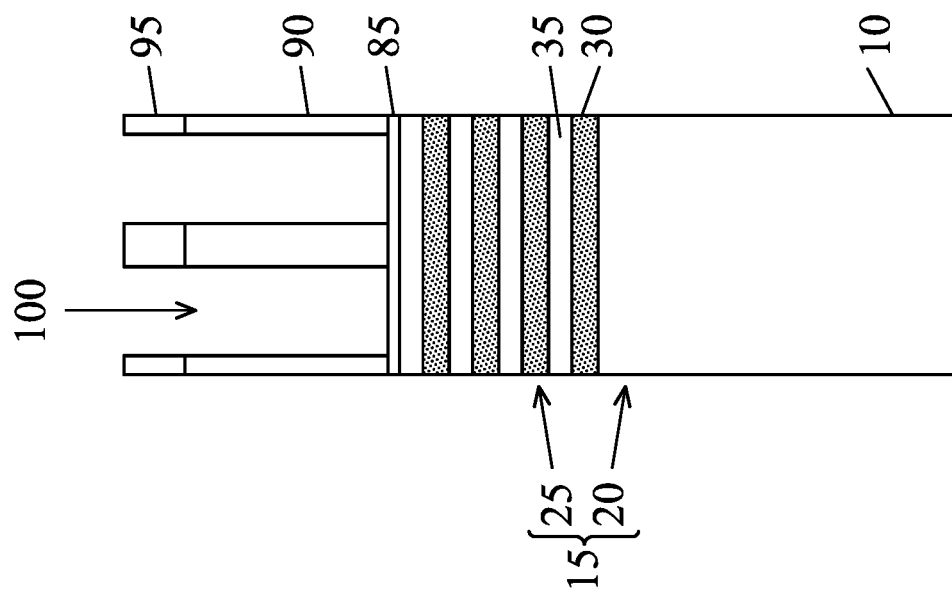
Figure 12E:
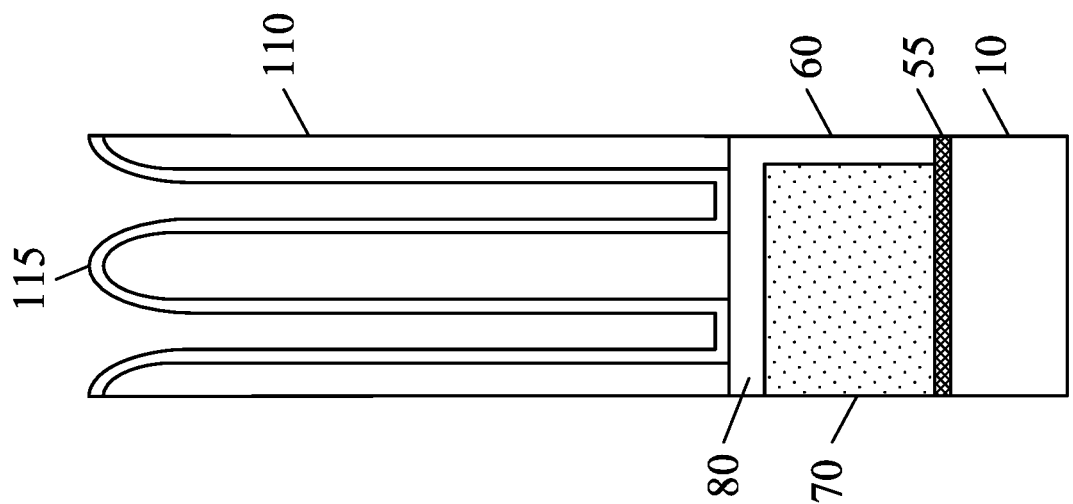
Figure 12D:
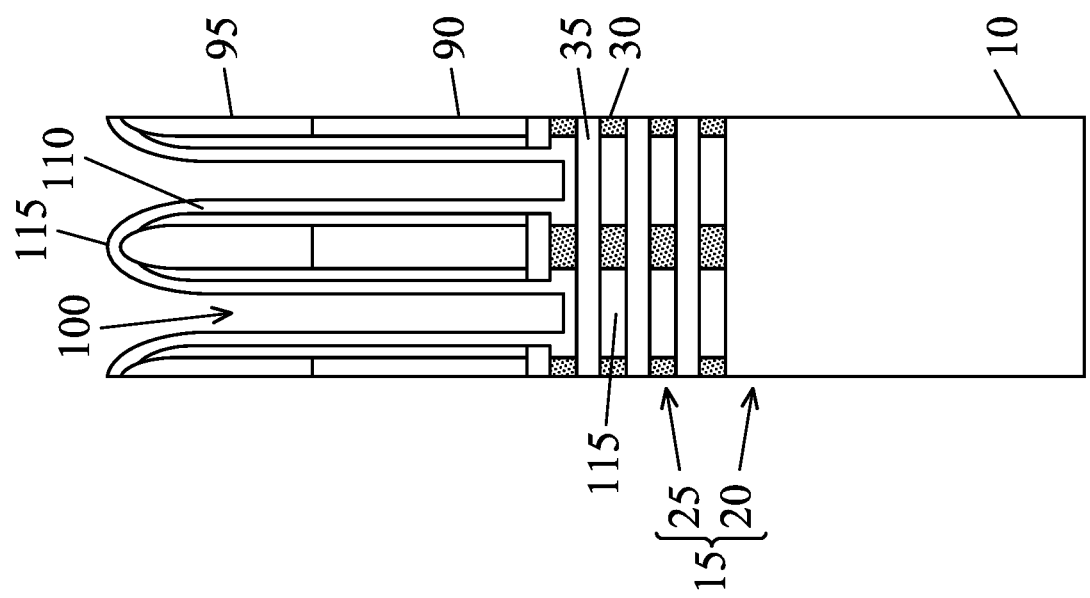

Then, as shown in FIGS. 6A-6E, a portion of the first insulating material layer 60 is recessed to form first recess openings 65 exposing the insulating liner layer 55 between adjacent fin structures 15. The present disclosure is not limited to removing portions of the insulating material layer 60 from between every other pair of adjacent fin structures, as shown in FIGS. 6A-6C. Suitable photolithographic and etching operations are used to remove the portions of the insulating material 60 from between the fin structures 15.

Adverting to FIGS. 7A-7E, the first recess openings 65 are subsequently filled with a first sacrificial material to form a first sacrificial layer 70. In some embodiments, planarization operation, such as a CMP operation or an etchback operation is performed after the sacrificial material is deposited. In some embodiments, the first sacrificial material is electrically conductive. In some embodiments, the sacrificial material is polycrystalline silicon (polysilicon), amorphous silicon, polycrystalline germanium, or amorphous germanium.

The first sacrificial layer 70 and first insulating material layer 60 are subsequently recess-etched to expose the upper channel region of the fin structures 15. In some embodiments, the first sacrificial layer 70 and first insulating layer 60 are recessed etched to a thickness t1 in the Z-direction ranging from about 30 nm to about 80 nm. In other embodiments, the thickness t1 in the Z-direction of the first sacrificial layer 70 and first insulating layer 60 after the recess etch is about 40 nm to about 60 nm. The recessed-etched first insulating layer 60 is also known as an isolation insulating layer. A second insulating material layer is subsequently deposited over the fin structures 15 filling the space between adjacent fin structures 15. After deposition of the second insulating material layer the device is planarized, such as by CMP or an etchback operation. The hard mask layer 40 is removed, the second insulating material layer is recessetched to expose the upper channel region 25 of the fin structures 15, and the insulating liner layer 55 is removed from the upper channel region 25 of the fin structure by suitable etching operations, thereby forming second recess openings 75. Suitable etching operations include anisotropic or isotropic plasma etching and wet etching techniques. A portion of the second insulating material layer 80 remains over the previously recess-etched sacrificial layer 70, as shown in FIGS. 8A-8E. The thickness t2 of the remaining portion of the second insulating material layer 80 ranges from about 2 nm to about 20 nm in some embodiments. In some embodiments, the thickness t2 of the remaining portion of the second insulating material layer 80 over the first sacrificial layer 70 ranges from about 5 nm to about 15 nm.

In some embodiments, the second recess openings 75 are formed by etching the first sacrificial layer 70 to a thickness t1 and then forming the second insulating material layer 80 fully covering the fin structures 15. Chemical-mechanical polishing is performed to planarize the device and then the second insulating layer 80 is etched back to a thickness t2 covering the first sacrificial layer 70. The hard mask layer 40 and is removed by suitable etching operations and the insulating liner layer 55 is removed from the upper portions 25 of the fin structures 15 by suitable etching operations.

As shown in FIGS. 9A-9E, a sacrificial gate dielectric layer 85 is formed over the upper portions 25 of the fin structures 15. The second recess openings 75 are subsequently filled with a conductive material to form a sacrificial conductive layer 90. In some embodiments, the second conductive layer 90 is a sacrificial gate electrode layer, which will be subsequently removed.

The sacrificial gate dielectric layer 85 includes one or more layers of insulating material, such as a silicon oxidebased material. In one embodiment, silicon oxide formed by CVD is used. The thickness of the sacrificial gate dielectric layer 85 is in a range from about 1 nm to about 5 nm in some embodiments.

The sacrificial gate dielectric layer 85 and sacrificial gate electrode layer 90 form a sacrificial gate structure. The sacrificial gate structure is formed by first blanket depositing the sacrificial gate dielectric layer over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD; PVD; ALD, or other suitable process. Subsequently, a first upper insulating layer 95 is formed over the sacrificial gate electrode layer 90. The first upper insulating layer 95 may include one or more layers and may be formed by CVD, PVD, ALD, or other suitable process.

Next, a patterning operation is performed on the upper insulating layer 95 using suitable photolithographic and etching operations. The pattern in the upper insulating layer 95 is subsequently transferred to the sacrificial gate electrode layer 90 and the sacrificial gate dielectric layer 85 using suitable etching operations, as shown in FIGS. 10A-10E. The etching operations form openings 100 extending in the Y direction that expose the source/drain regions. The etching operations also form gate cut openings 105 extending in the X direction across the sacrificial gate structures. The etching operations removes the sacrificial gate electrode layer 90 and the sacrificial gate dielectric layer 85 in the exposed areas, thereby leaving a sacrificial gate structure overlying the channel region of the semiconductor device. The sacrificial gate structure includes the sacrificial gate dielectric layer 85 and the remaining sacrificial gate electrode layer 90 (e.g., polysilicon).

After the sacrificial gate structure is formed, one or more sidewall spacer layers 110 is formed over the exposed fin structures 15 and the sacrificial gate structures 85, 90. The sidewall spacer layer 110 is deposited in a conformal manner so it is formed to have substantially equal thicknesses on vertical surfaces, such as the sidewalls, horizontal surfaces, and the top of the sacrificial gate structure, respectively. In some embodiments, the sidewall spacer layer 110 has a thickness in a range from about 2 nm to about 20 nm, in other embodiments, the sidewall spacer layer has a thickness in a range from about 5 nm to about 15 nm.

In some embodiments, the sidewall spacer layer 110 includes a first sidewall spacer layer and a second sidewall spacer layer. The first sidewall spacer layer may include an oxide, such as silicon oxide or any other suitable dielectric material, and the second sidewall spacer layer may include one or more of $Si_3N_4$, SiON, and SiCN or any other suitable dielectric material. The first sidewall spacer layer and the second sidewall spacer layer are made of different materials in some embodiments so they can be selectively etched. The first sidewall spacer layer and the second sidewall spacer layer can be formed by ALD or CVD, or any other suitable method. In some embodiments, the sidewall spacer layer 110 substantially fills the gate cut openings 105.

Then, as shown in FIGS. 11A-11E, the sidewall spacer layer 110 is subjected to anisotropic etching to remove the sidewall spacer layer formed over the upper insulating layer 95 and the source/drain regions of the fin structures 15, and the second insulating material layer 80. As shown in FIG. 11D, the anisotropic etching operation removes a portion of the uppermost first and second semiconductor layers 30, 35 in some embodiments. In some embodiments, the sidewall spacer layer 110 filled in the gate cut openings 105 is not etched and remains in the gate cut openings 105.

Next, the first semiconductor layers 30 in the source/drain regions of the fin structures 15 are removed using a suitable etching operation. The first semiconductor layers 30 and the second semiconductor layers 35 are made of different materials having different etch selectivities. Therefore, a suitable etchant for the first semiconductor layer 30 does not substantially etch the second semiconductor layer 35. For example, when the first semiconductor layers 30 are Si and the second semiconductor layers 35 are Ge or SiGe, the first semiconductor layers 30 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. On the other hand, when the first semiconductor layers 30 are SiGe or Ge and the second semiconductor layers 35 Si, the first semiconductor layers 30 can be selectively removed using a wet etchant such as, but not limited to, $HF:HNO_3$ solution, $HF:CH_3COOH:HNO_3$, or $H_2SO_4$ solution and $HF:H_2O_2:CH_3COOH$. In some embodiments, a combination of dry etching techniques and wet etching techniques are used to remove the first semiconductor layers 30.

After removing the first semiconductor layers 30 in the source/drain regions an inner spacer layer 115 is formed over the sidewall spacer layer 110, second semiconductor layers 35 in the source/drain regions, the upper insulating layer 95, and the second insulating material layer 80, as shown in FIGS. 12A-12E. The inner spacer layer 115 is deposited in a conformal manner, and wraps around the second semiconductor layers 35. In some embodiments, the inner spacer layer 115 has a thickness in a range from about 3 nm to about 15 nm, in other embodiments, the inner spacer layer 115 has a thickness in a range from about 5 nm to about 12 nm. In some embodiments, the inner spacer layer 115 substantially fills the space between adjacent second semiconductor layers 35. In some embodiments, the inner spacer layer 115 includes an oxide, such as silicon oxide or a nitride, such as $Si_3N_4$, SiON, and SiCN, or any other suitable dielectric material, including aluminum oxide. The inner spacer layer 115 can be formed by ALD or CVD, or any other suitable process.

Next, the inner spacer layer 115 and second semiconductor layers 35 are recess etched using a suitable etching operation extending the openings 100, as shown in FIGS. 13A-13E. As shown in FIG. 13D, the recess etch extends through the second semiconductor layers 35 in some embodiments. In another embodiment, the second semiconductor layers 35 are not etched, and only the inner spacer layer 115 is etched, as shown in FIG. 13F. FIG. 13F is a cross-sectional view taken along line C-C' of FIG. 13A.

Figure 14F:
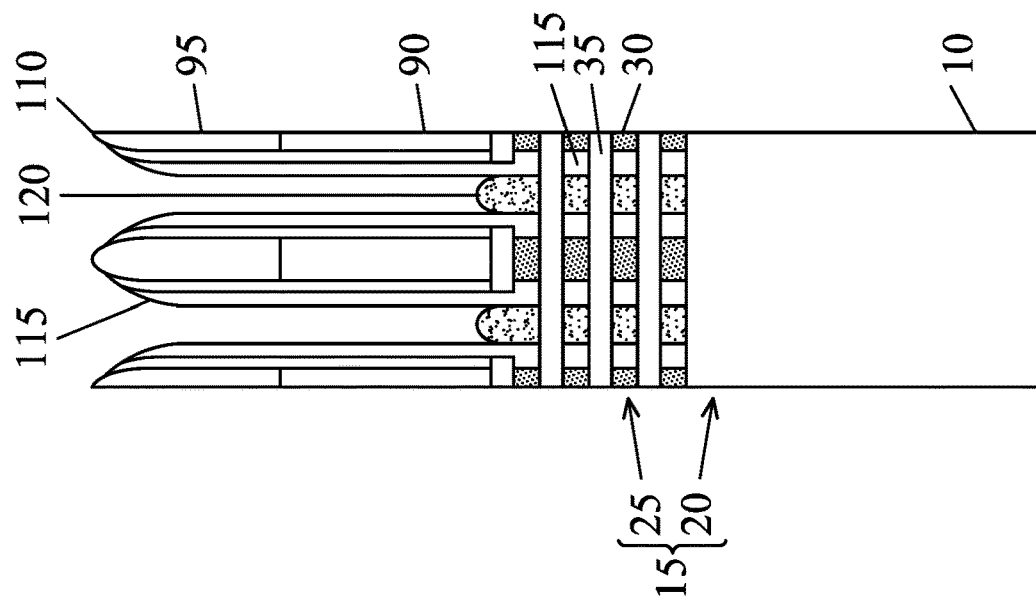
Figure 14E:
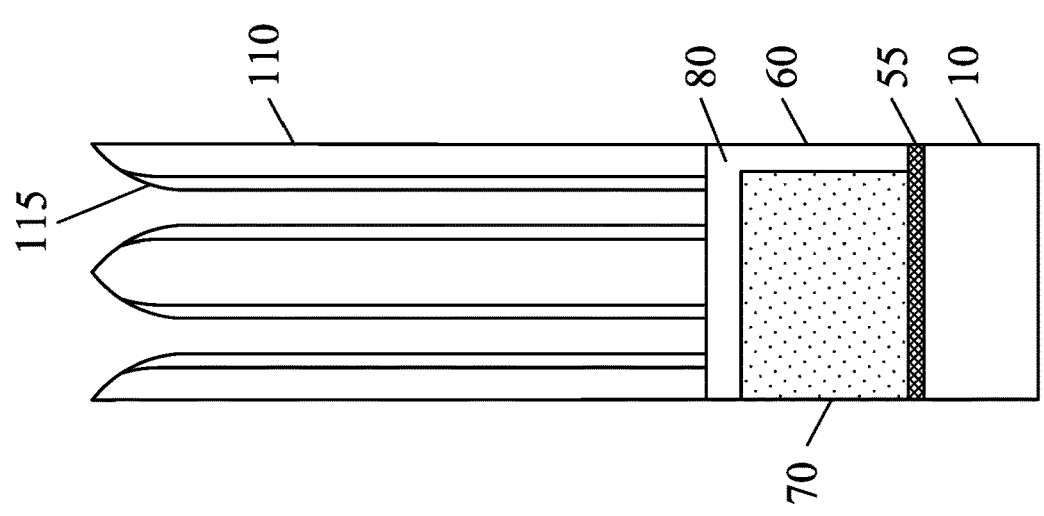
Figure 14D:
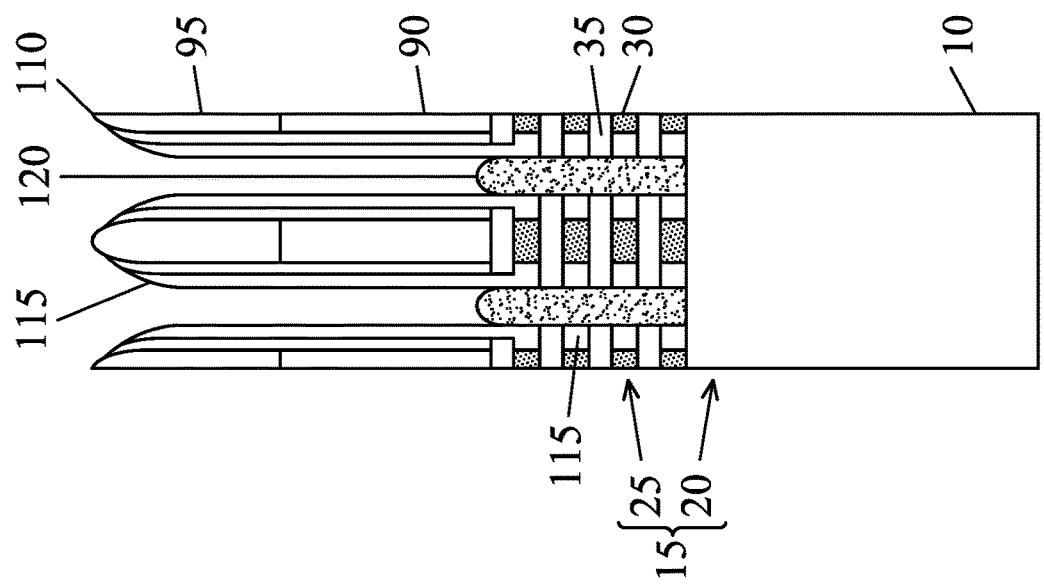
Figure 15B:
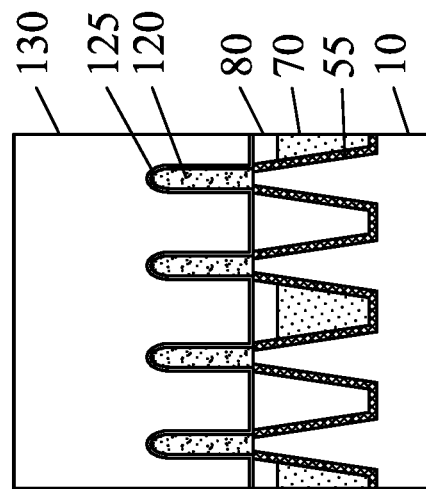
FIGS. 15A-15E show views of one of the various stages of manufacturing a GAA FET semiconductor device according to embodiments of the present disclosure.
Figure 15C:
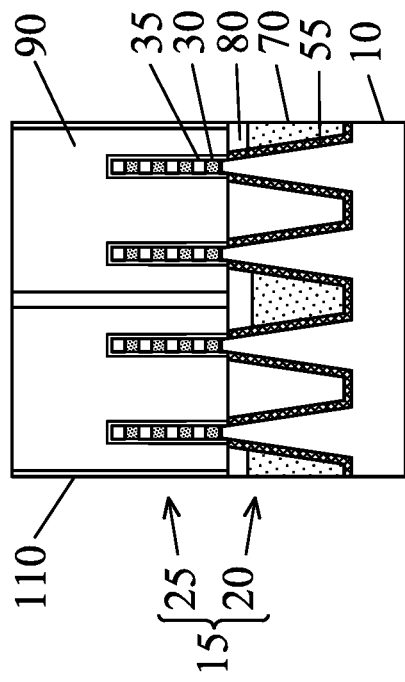
Figure 15A:
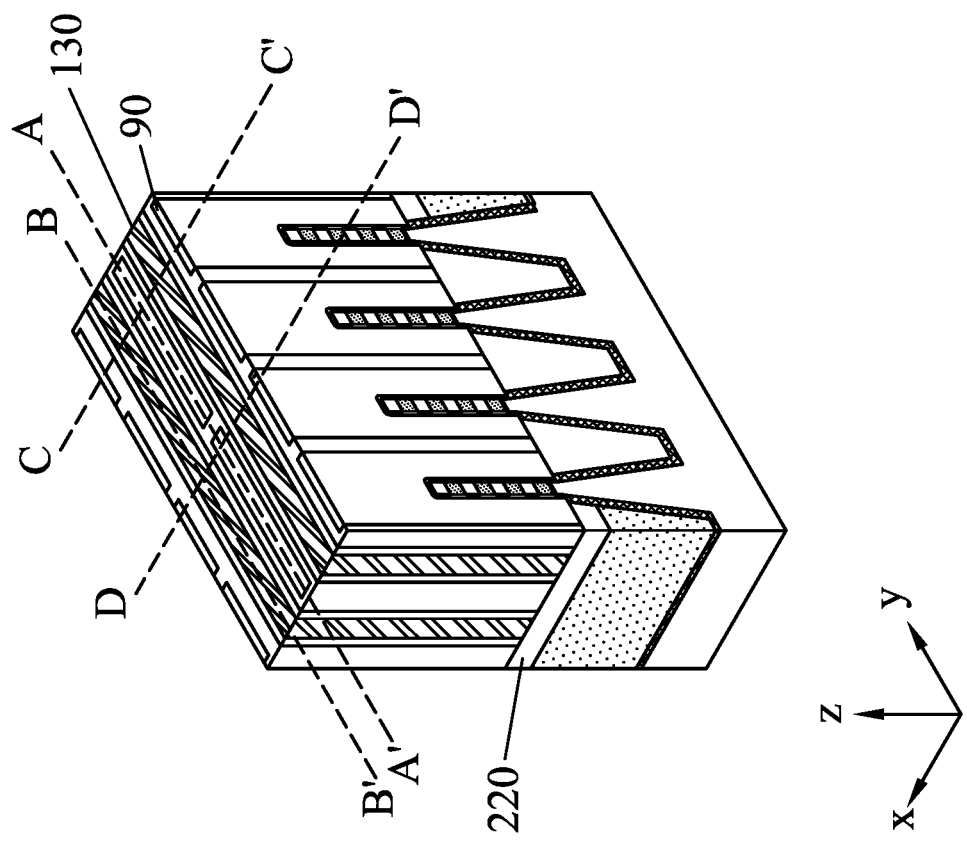
Figure 15E:
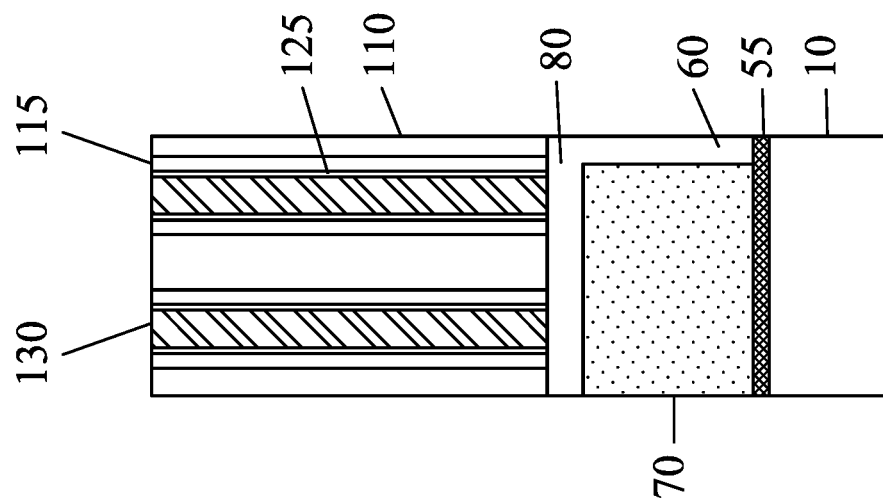
Figure 15D:
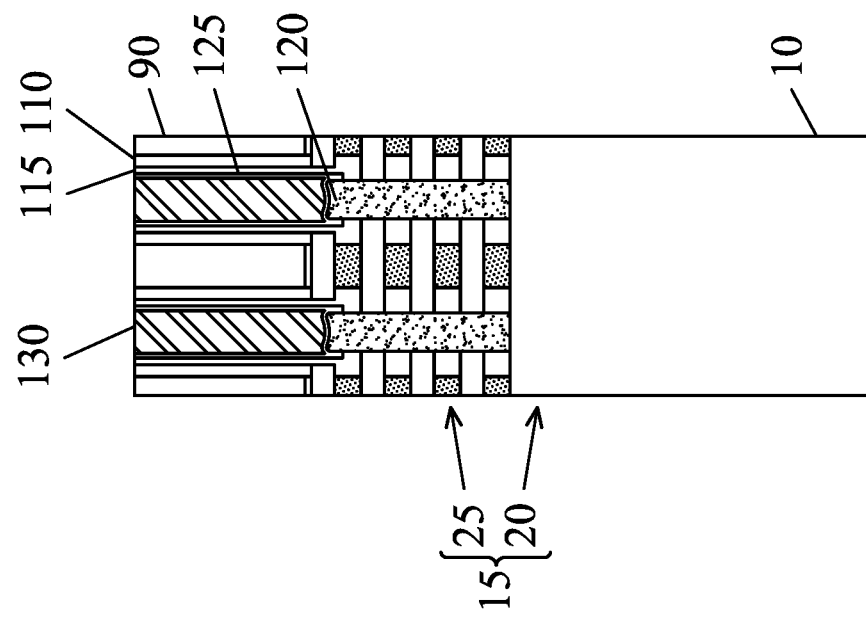
Figure 16B:
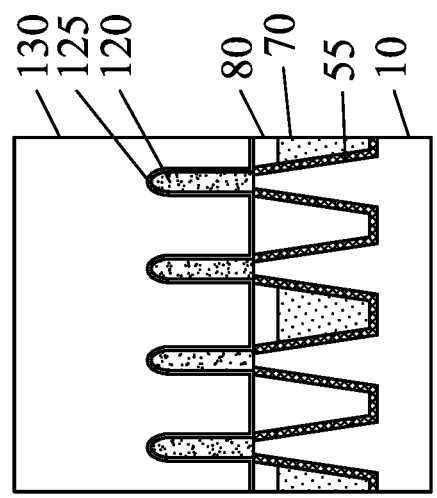
FIG. 16B is a cross-sectional view taken along line A-A' of FIG. 16A.
Figure 16C:
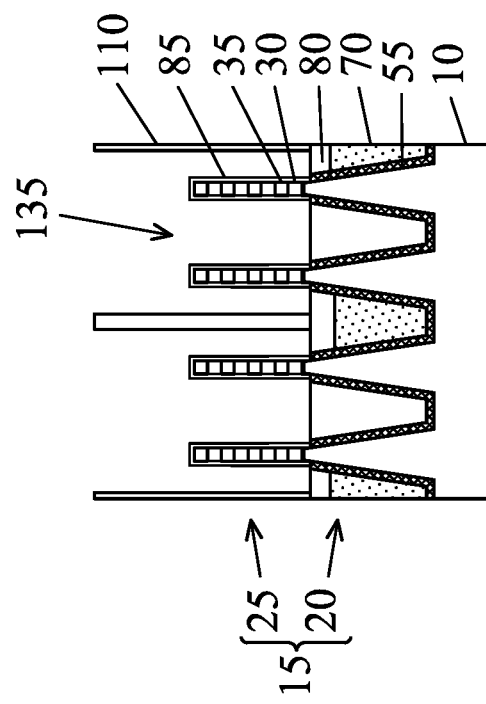
FIG. 16C is a cross-sectional view taken along line B-B' of FIG. 16A.
Figure 16A:
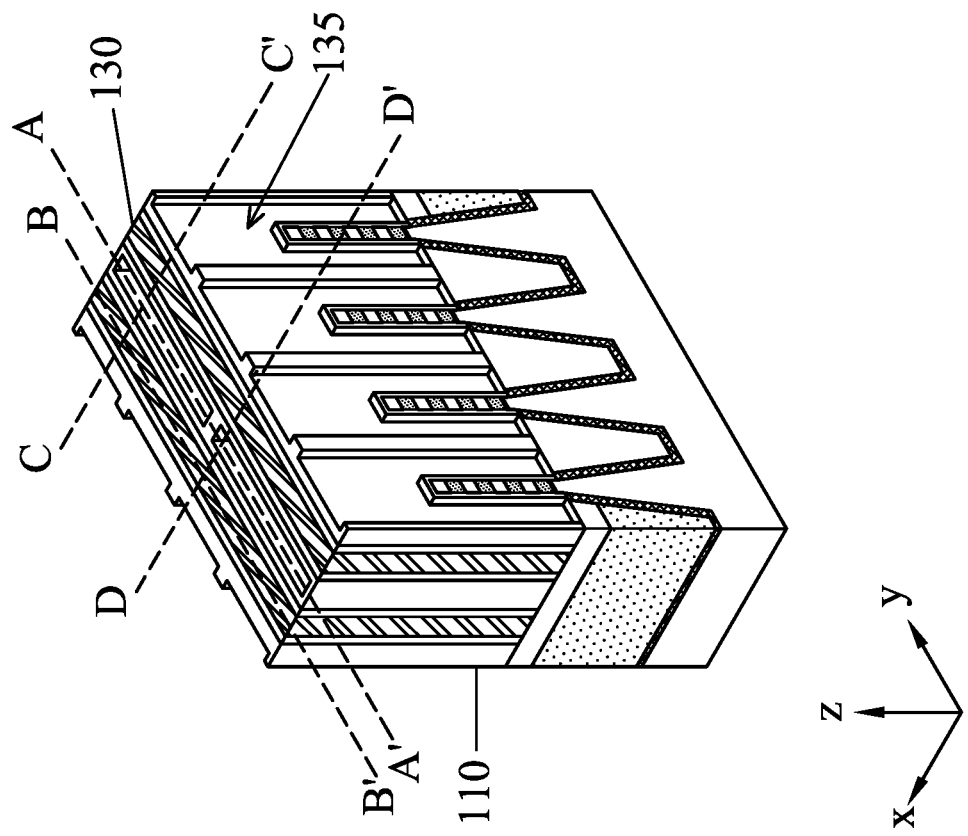
Figure 16E:
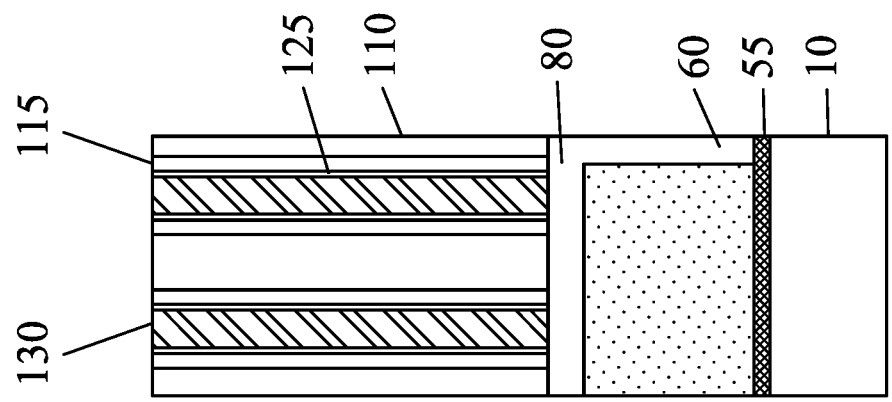
FIG. 16E is a cross-sectional view taken along line D-D' of FIG. 16A.
Figure 16D:
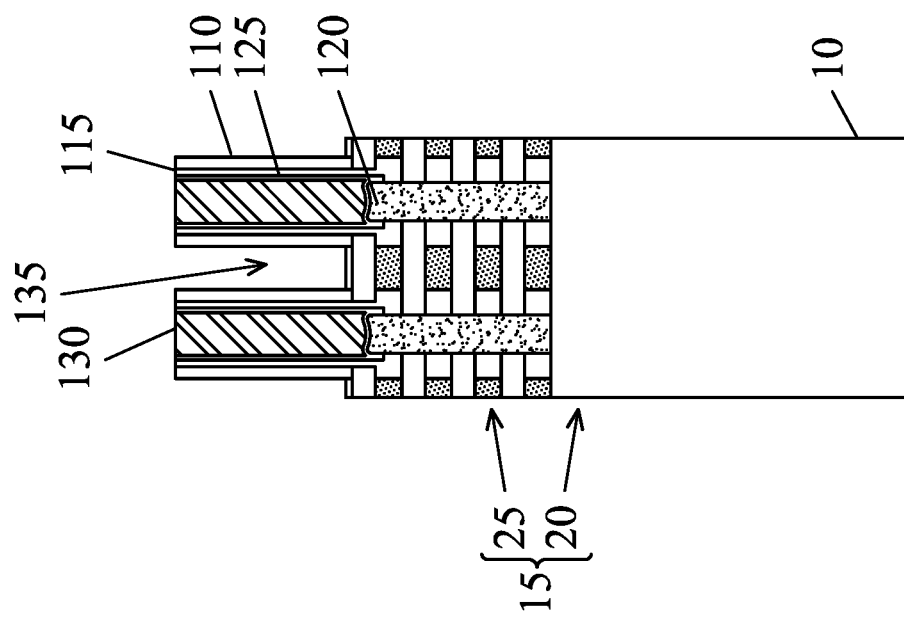
FIG. 16D is a cross-sectional view taken along line C-C' of FIG. 16A.
Figure 17B:
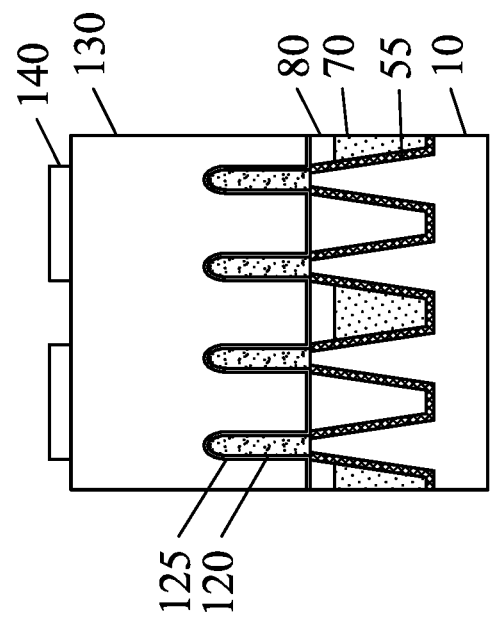
Figure 17C:
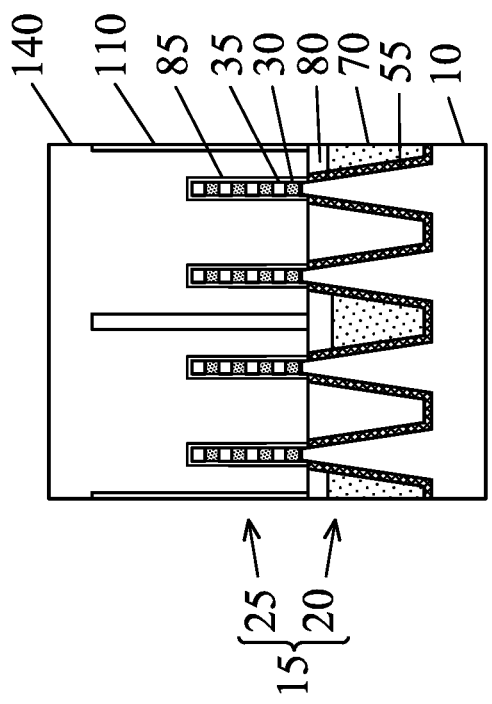
Figure 17A:
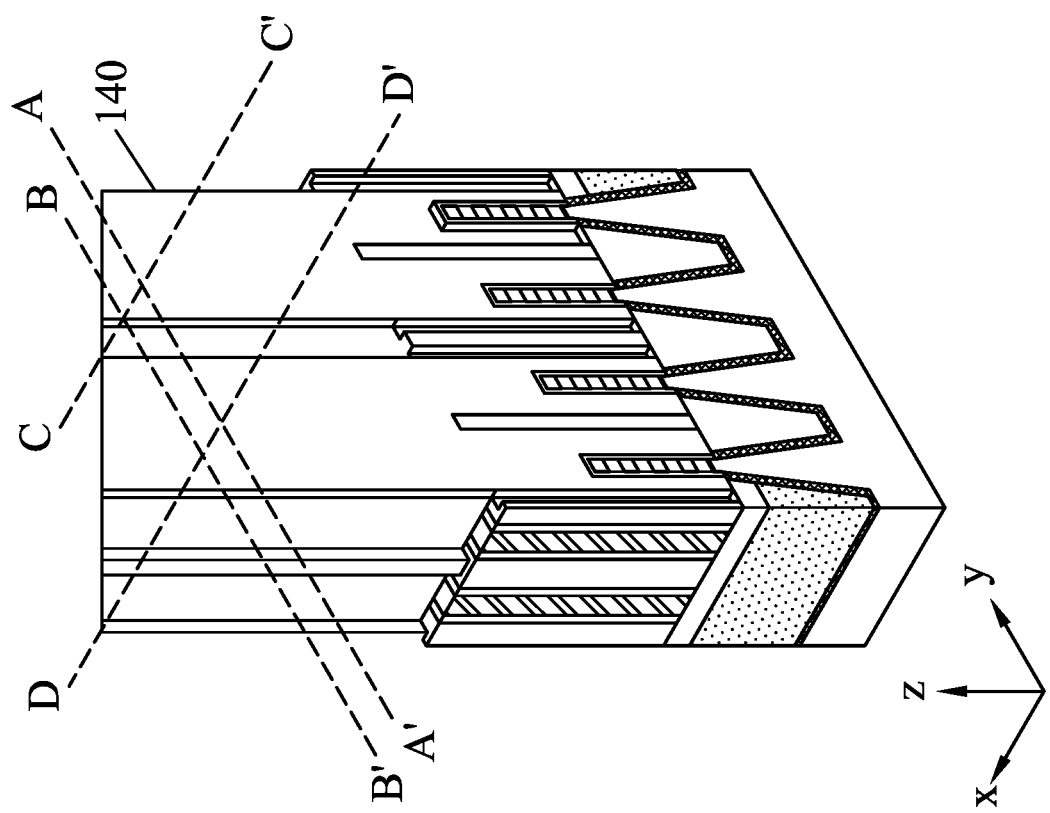
Figure 17E:
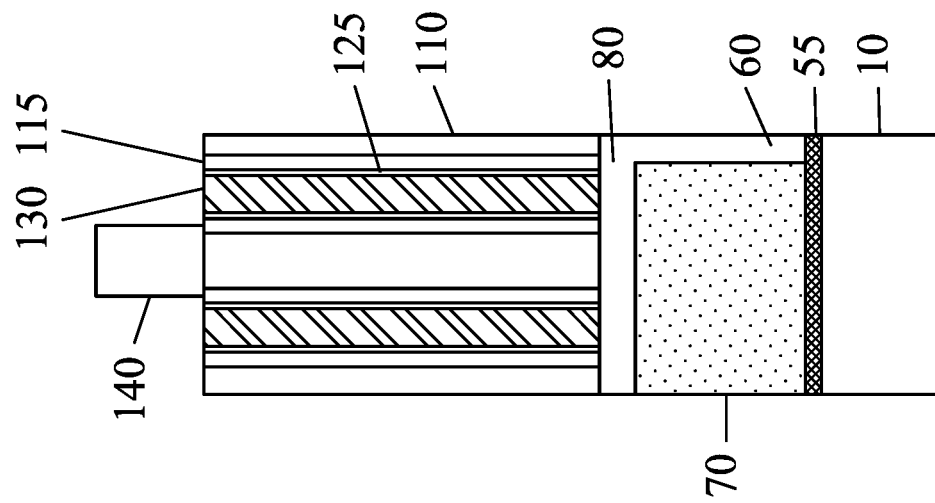
Figure 17D:
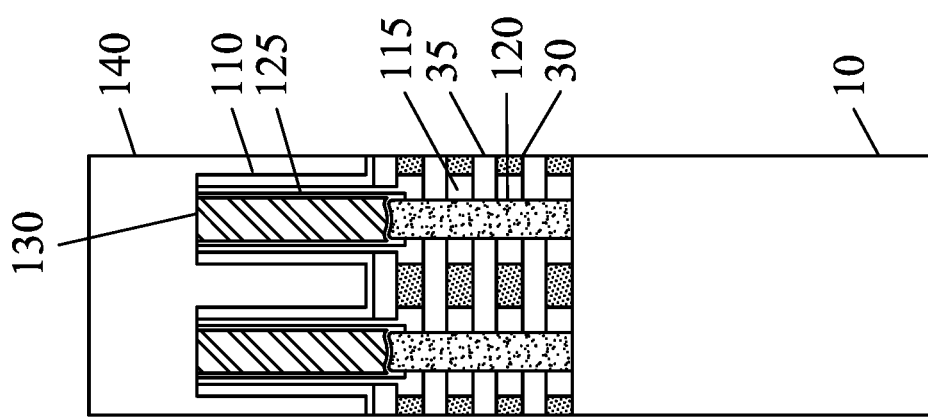

Subsequently, a source/drain epitaxial layer 120 is formed in the openings 100, as shown in FIGS. 14A-14E. The source/drain epitaxial layer 120 includes one or more layers of Si, SiP, SiC and SiCP for an n-channel FET or Si, SiGe, Ge for a p-channel FET. For the P-channel FET, boron (B) may also be contained in the source/drain. The source/drain epitaxial layers 120 are formed by an epitaxial growth method using CVD, ALD or molecular beam epitaxy (MBE). As shown in FIG. 14C, the source/drain epitaxial layers 120 grow on the fin structures. In another embodiment, the source/drain epitaxial layers 120 wrap around exposed portions of the second semiconductor layers 35, as shown in FIG. 14F. FIG. 14F is a cross-sectional view taken along line C-C' of FIG. 14A. In some embodiments, the grown source/drain epitaxial layers 120 on adjacent fin structures merge with each other. In some embodiments, the source/drain epitaxial layer 120 has a diamond shape, a hexagonal shape, other polygonal shapes, or a semi-circular shape in cross section.

Subsequently, a contact etch stop layer (CESL) 125 is formed on the source/drain layer 120 and sidewalls of the openings 100 and then an interlayer dielectric (ILD) layer 130 is formed substantially filling the openings 100 over the source/drain regions, as shown in FIGS. 15A-15E. The CESL 125 overlying the source/drain regions has a thickness of about 1 nm to about 15 nm in some embodiments. The CESL 125 may include $Si_3N_4$, SiON, SiCN or any other suitable material, and may be formed by CVD, PVD, or ALD. The materials for the ILD layer 130 include compounds comprising Si, O, C, and/or H, such as silicon oxide, SiCOH and SiOC. Organic materials, such as polymers, may be used for the ILD layer 130. After the ILD layer 130 is formed, a planarization operation, such as chemical-mechanical polishing (CMP), is performed, so that the top portion of the sacrificial gate electrode layer 90 is exposed. The CMP also removes a portion of the sidewall spacer layer 110, and the upper insulating layer 95 covering the upper surface of the sacrificial gate electrode layer 90.

Then, the sacrificial gate electrode layer 90 is removed, thereby forming a gate space 135, in which the channel regions of the fin structures 15 are exposed, as shown in FIGS. 16A-16E. The ILD layer 130 protects the source/drain layers 120 during the removal of the sacrificial gate structures. The sacrificial gate electrode layer 90 can be removed using plasma dry etching and/or wet etching. When the sacrificial gate electrode layer 90 is polysilicon and the ILD layer 130 is silicon oxide, a wet etchant such as a tetramethylammonium hydroxide (TMAH) solution can be used to selectively remove the sacrificial gate electrode layer 90.

After the sacrificial gate electrode layer 90 is removed, the device is masked using a patterned photoresist and/or bottom anti-reflective coating (B ARC) layer 140, as shown in FIGS. 17A-17E. The photoresist and/or BARC is patterned using suitable photolithographic techniques.

Figure 18B:
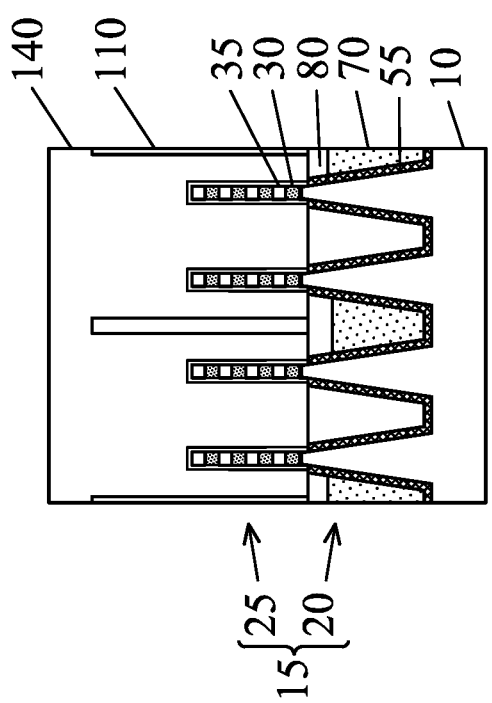
FIGS. 18A-18E show views of one of the various stages of manufacturing a GAA FET semiconductor device according to embodiments of the present disclosure.
Figure 18C:
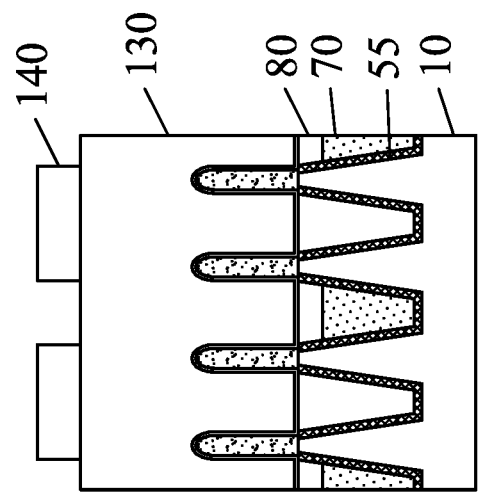
Figure 18A:
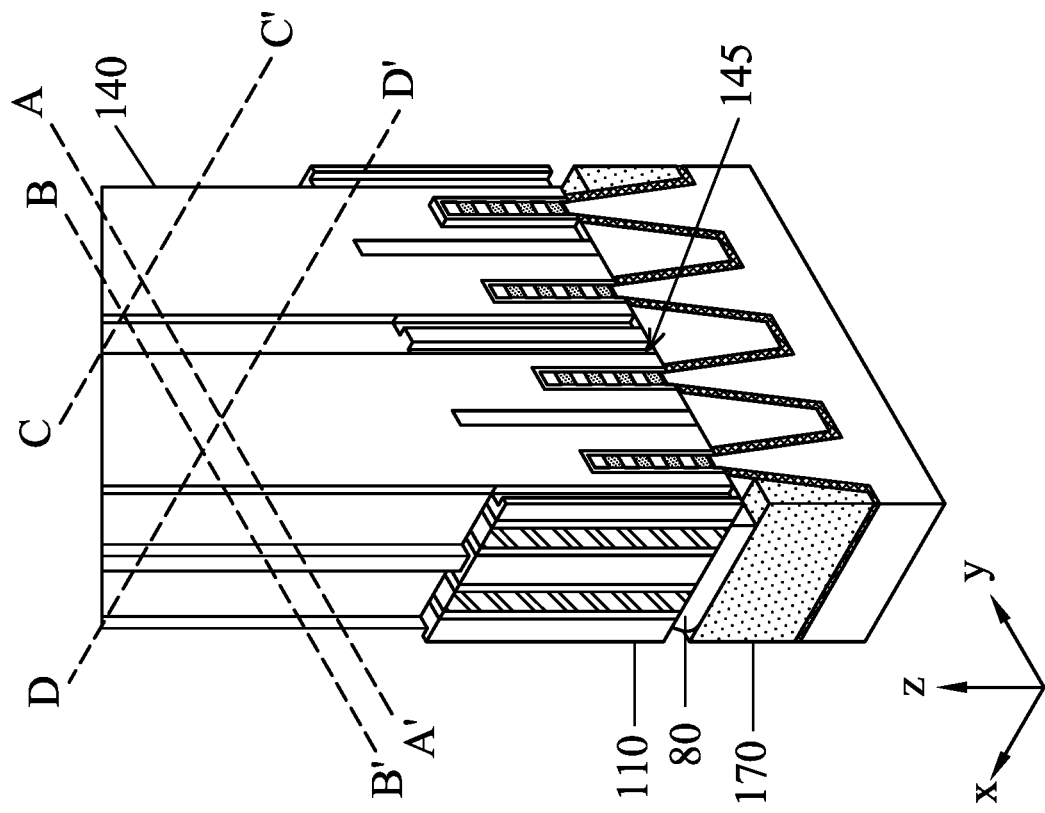
Figure 18E:
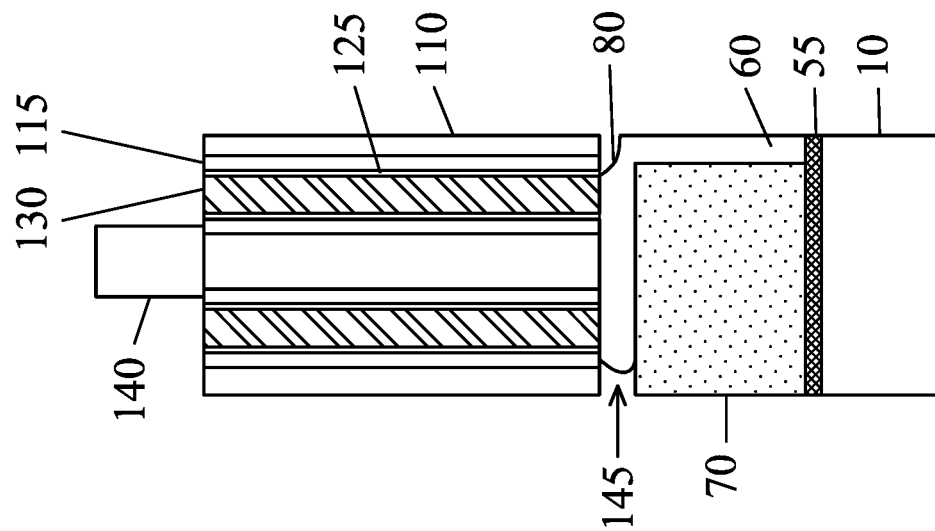
Figure 18D:
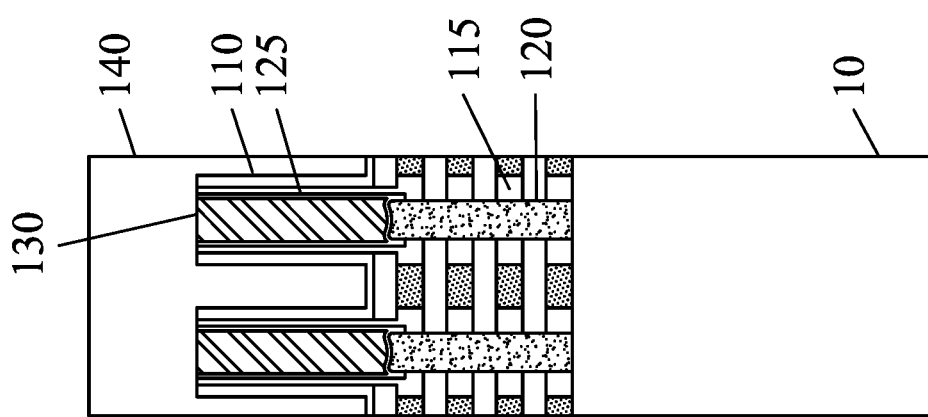
Figure 19B:
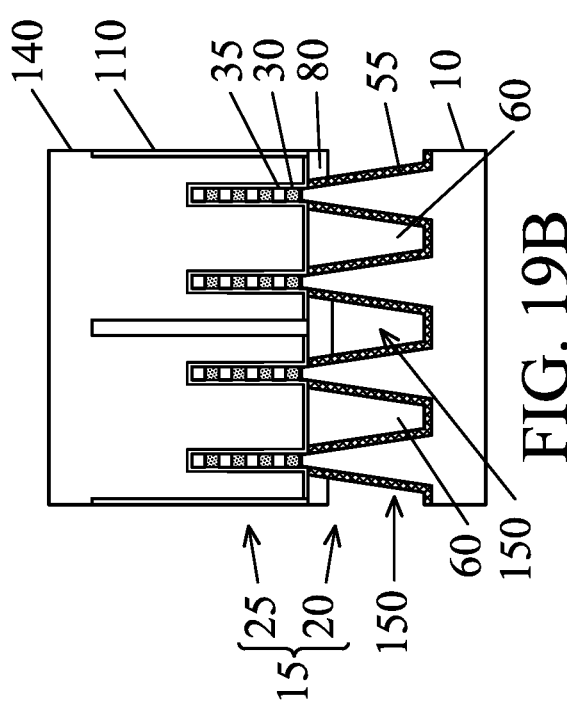
FIGS. 19A-19E show views of one of the various stages of manufacturing a GAA FET semiconductor device according to embodiments of the present disclosure.
Figure 19C:
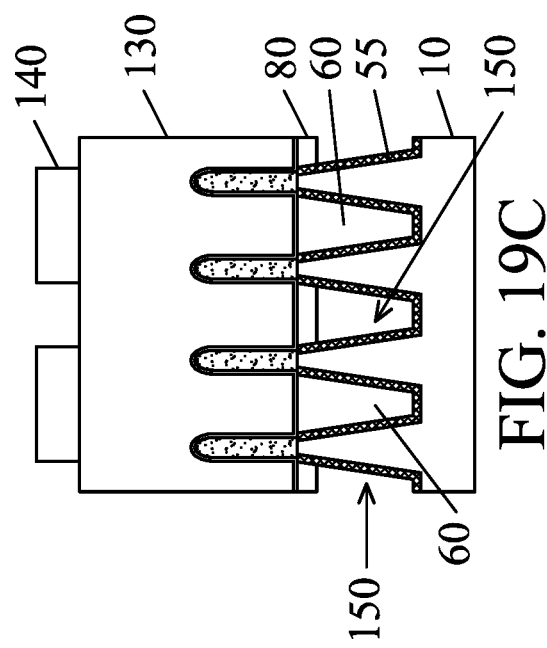
Figure 19A:
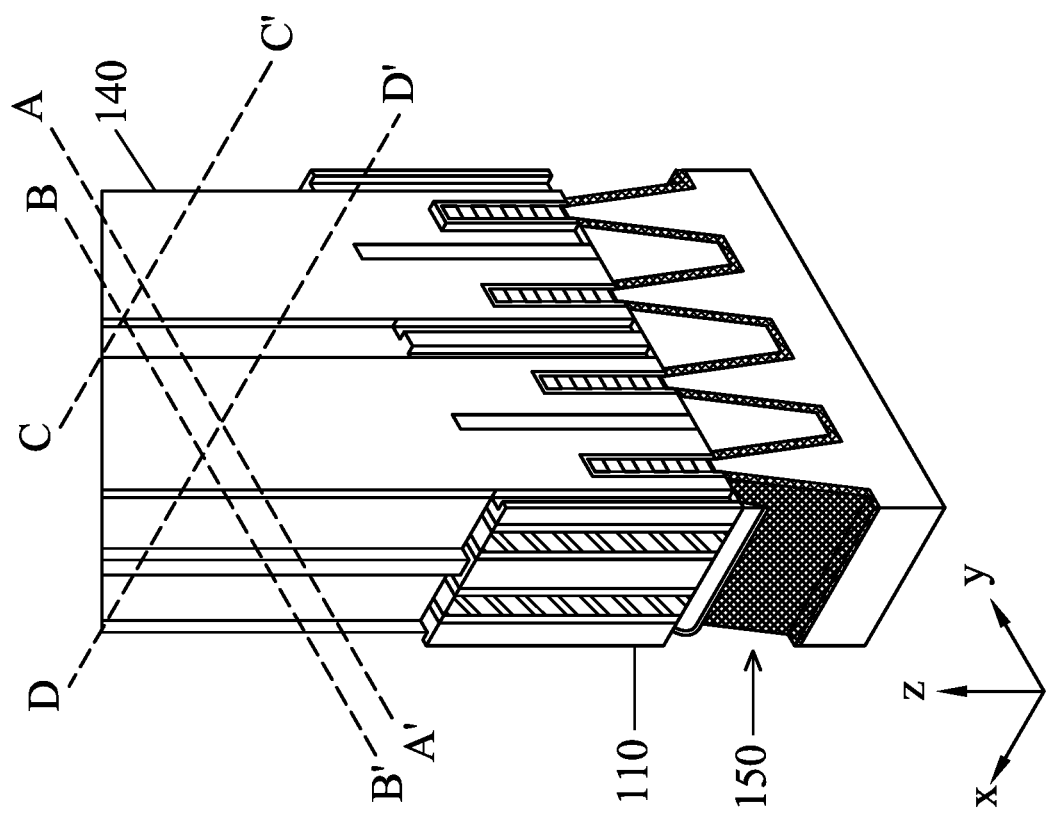
Figure 19E:
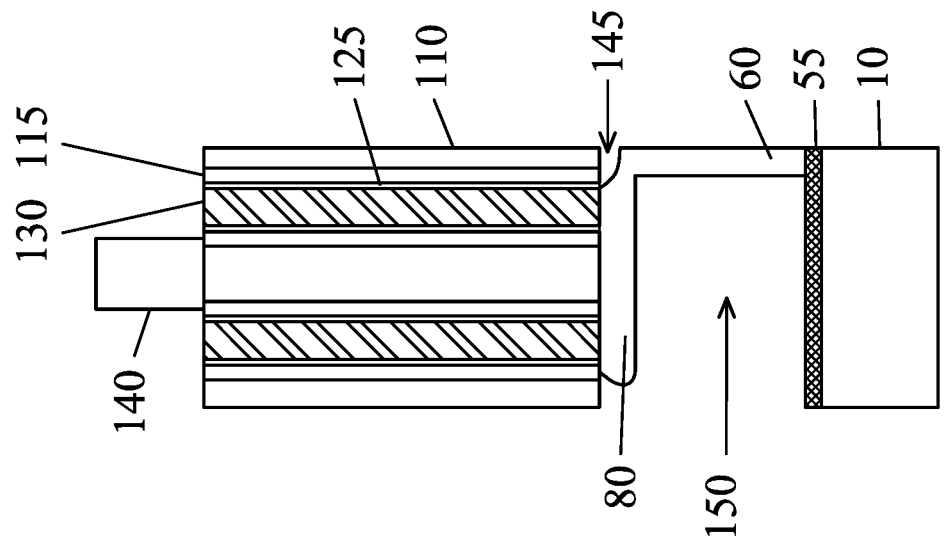
Figure 19D:
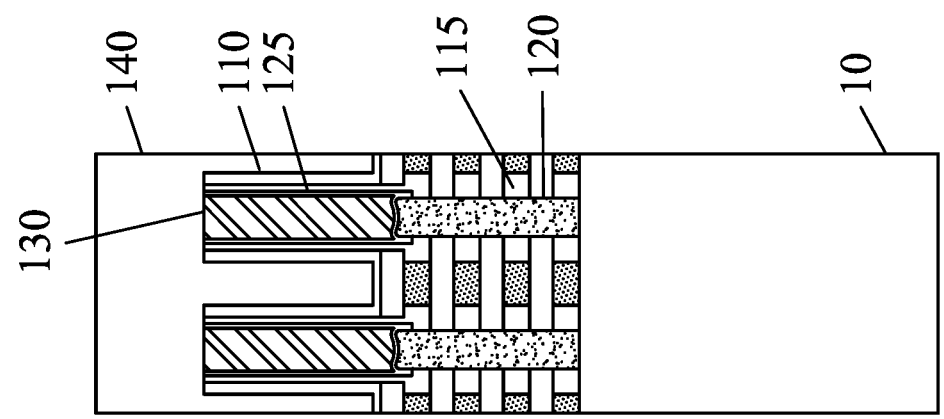
Figure 20B:
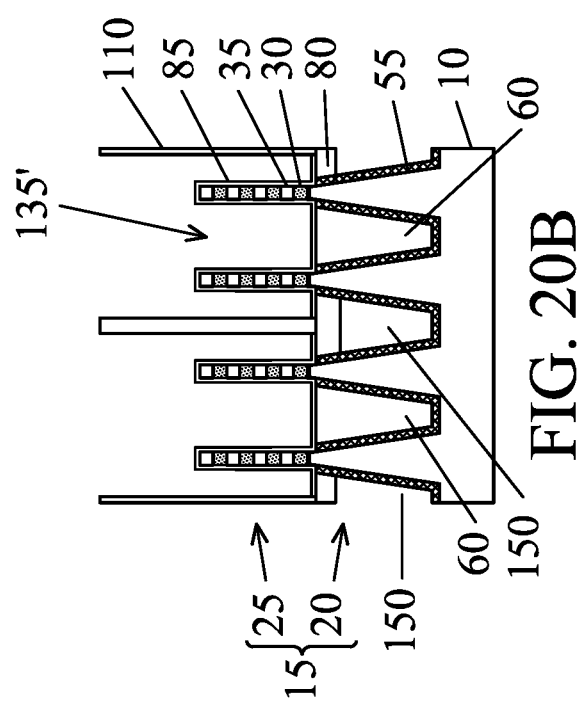
FIGS. 20A-20E show views of one of the various stages of manufacturing a GAA FET semiconductor device according to embodiments of the present disclosure.
Figure 20C:
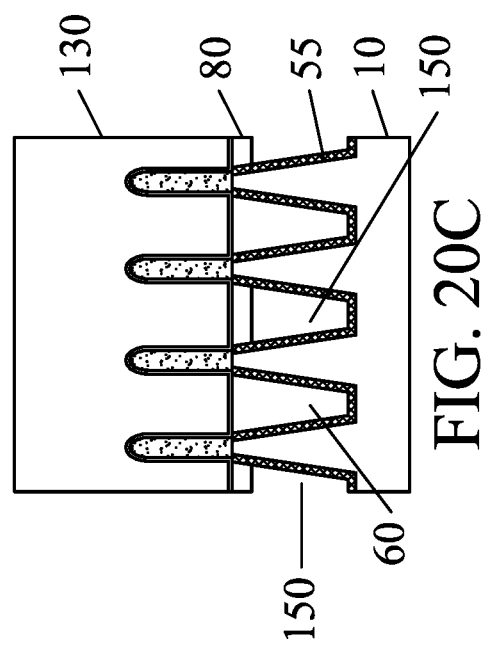
Figure 20A:
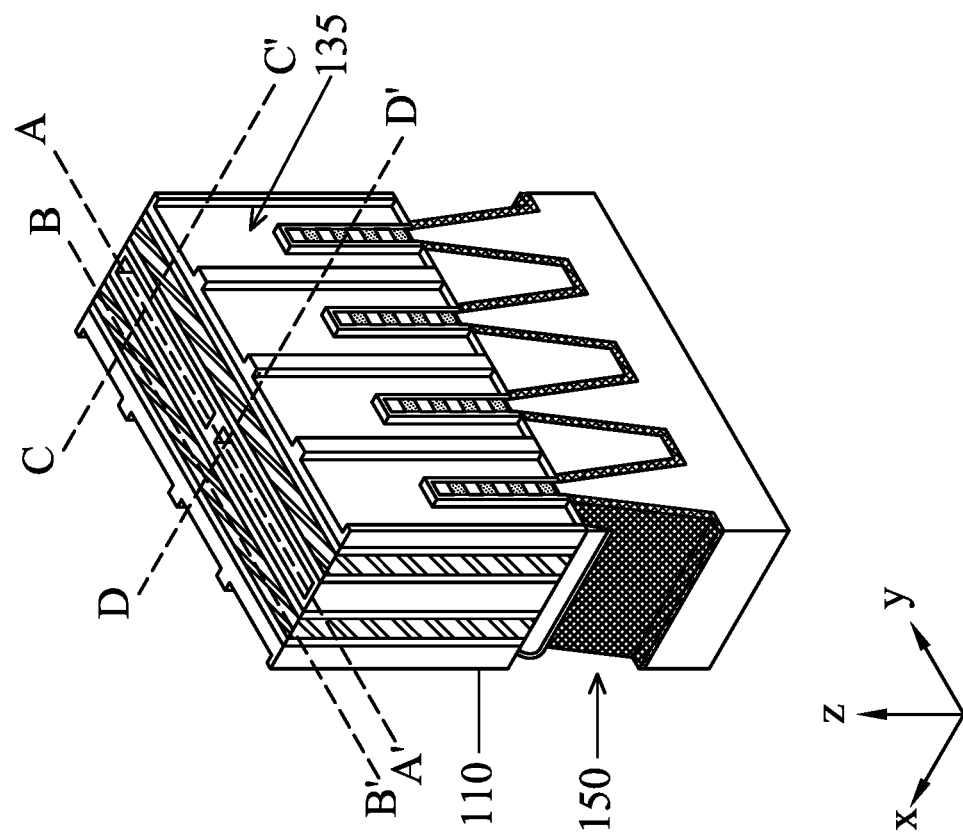
Figure 20E:
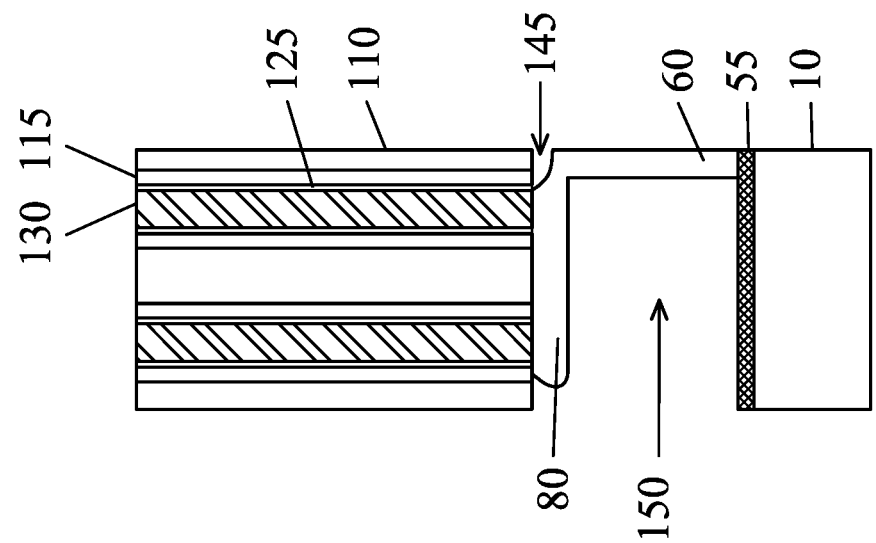
Figure 20D:
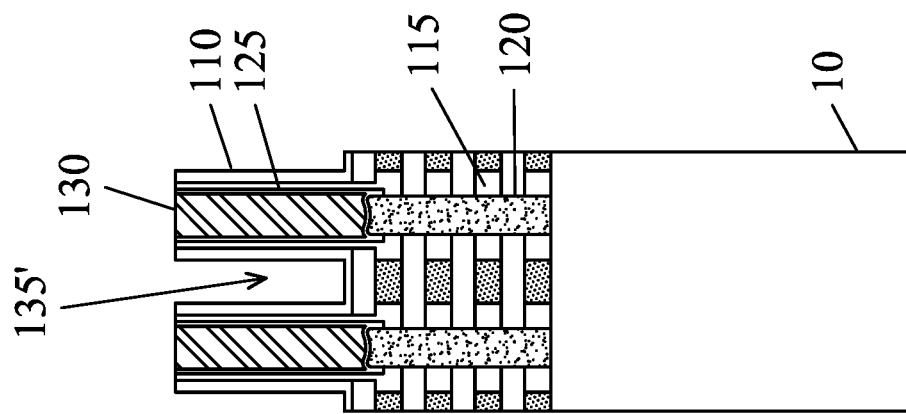
Figure 22E:
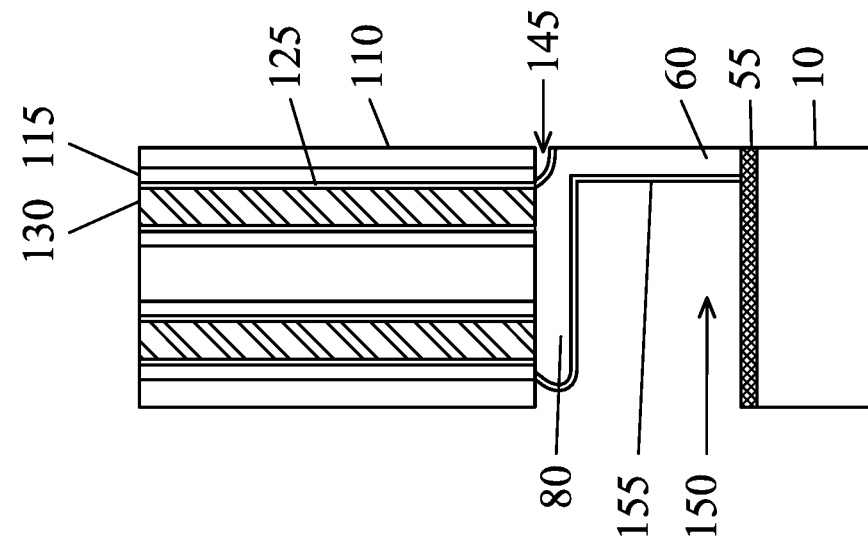
Figure 22D:
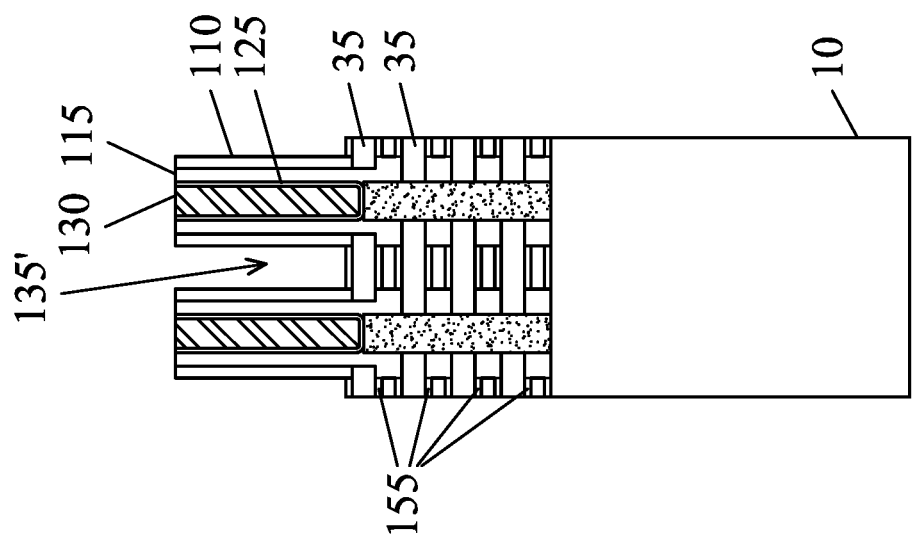
Figure 23B:
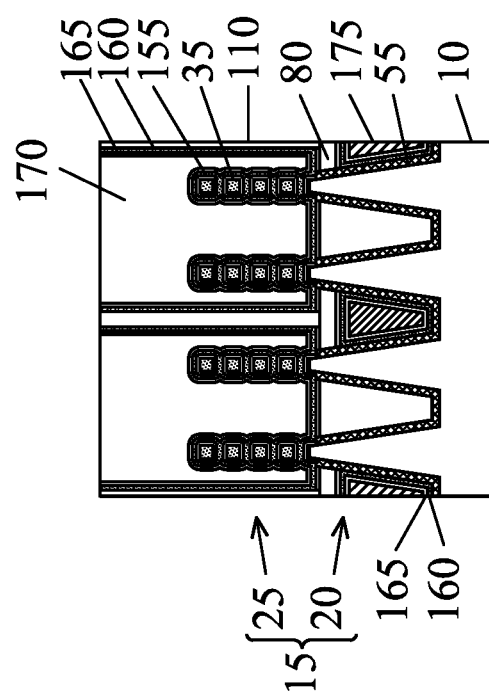
FIGS. 23A-23E show views of one of the various stages of manufacturing a GAA FET semiconductor device according to embodiments of the present disclosure.
Figure 23C:
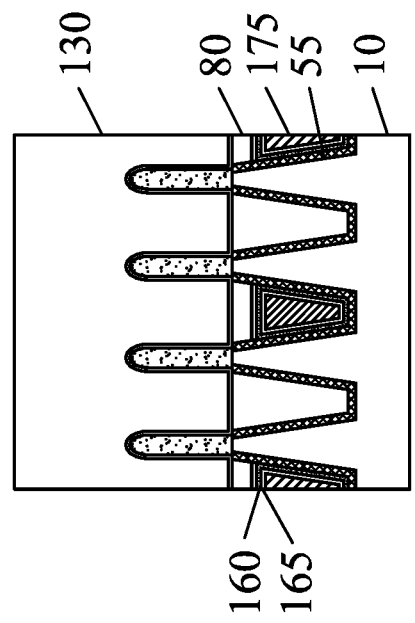
Figure 23A:
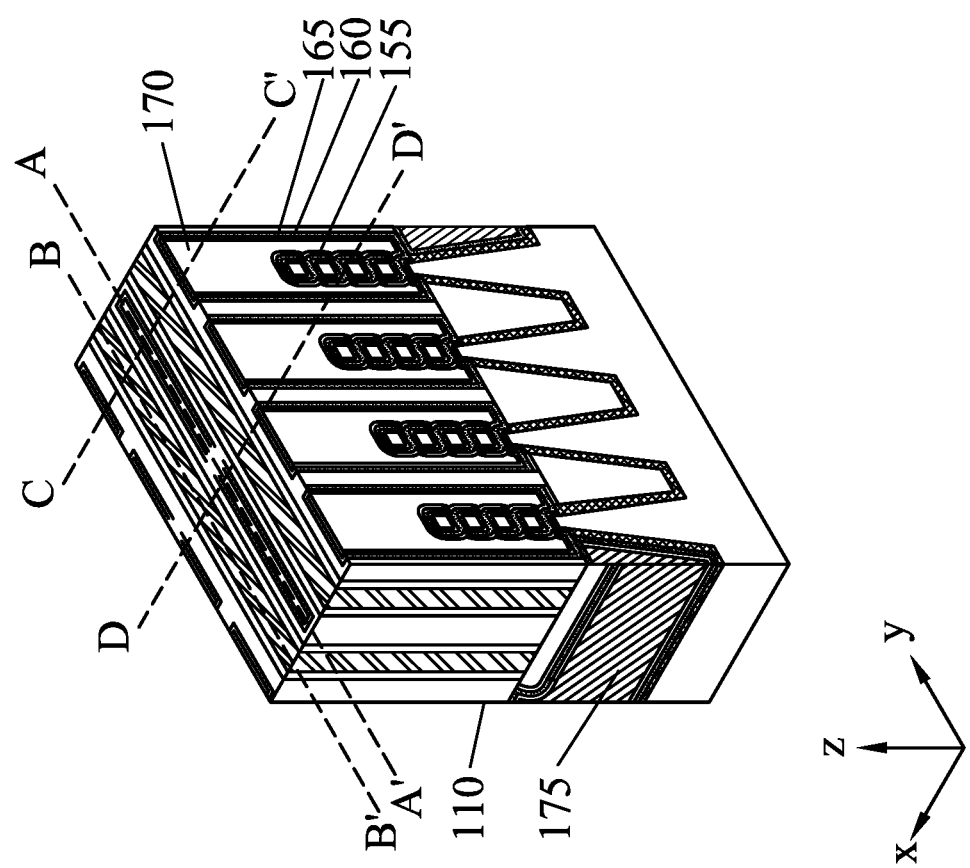
Figure 23E:
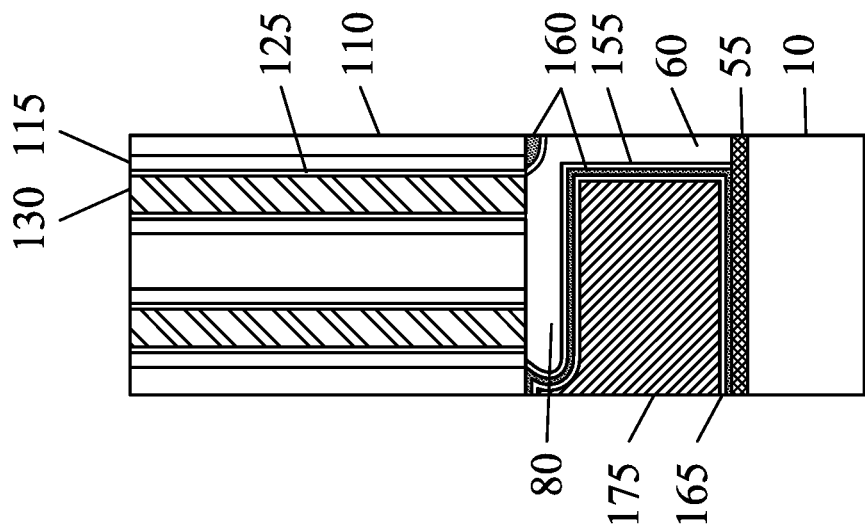
Figure 23D:
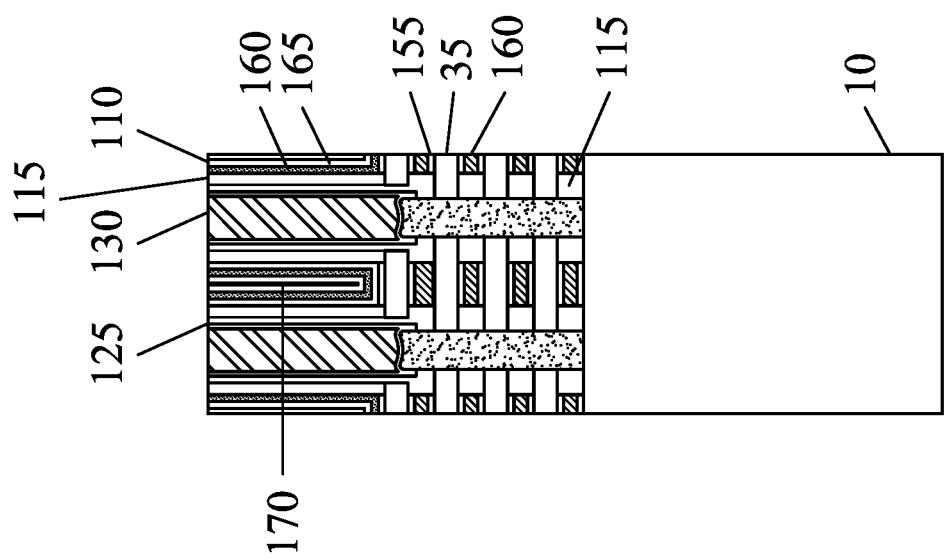
Figure 24B:
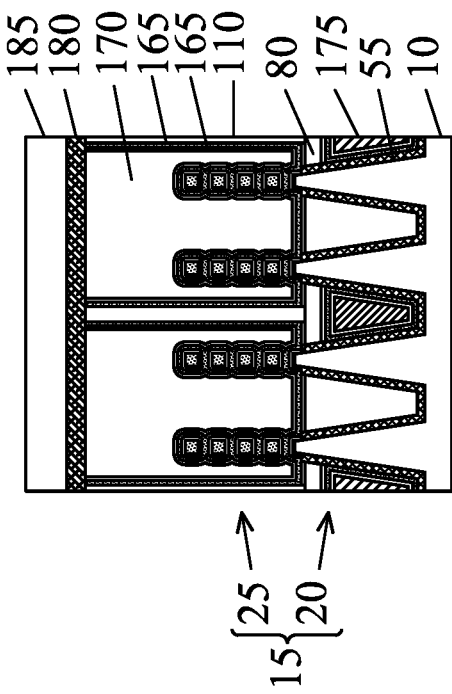
FIGS. 24A-24E show views of one of the various stages of manufacturing a GAA FET semiconductor device according to embodiments of the present disclosure.
Figure 24C:
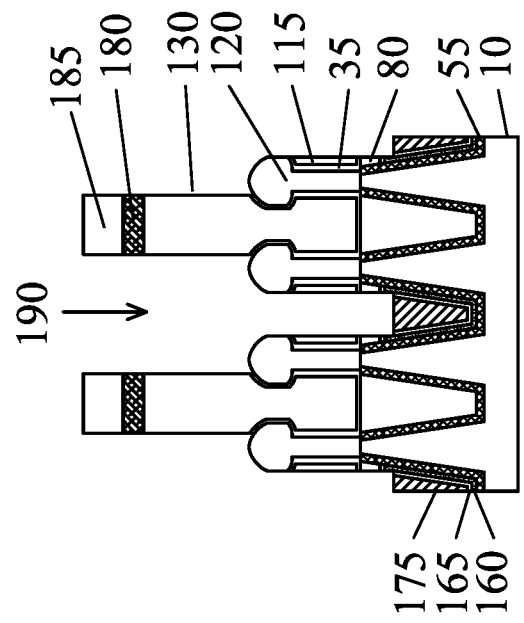
Figure 24A:
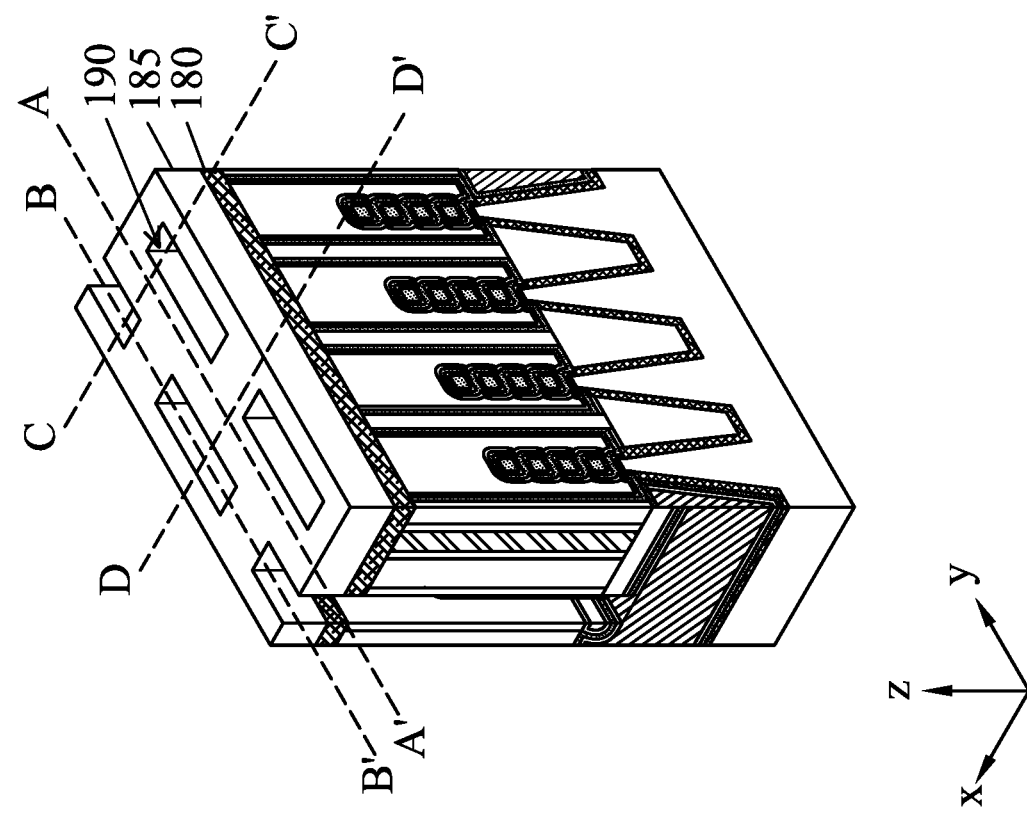
Figure 24E:
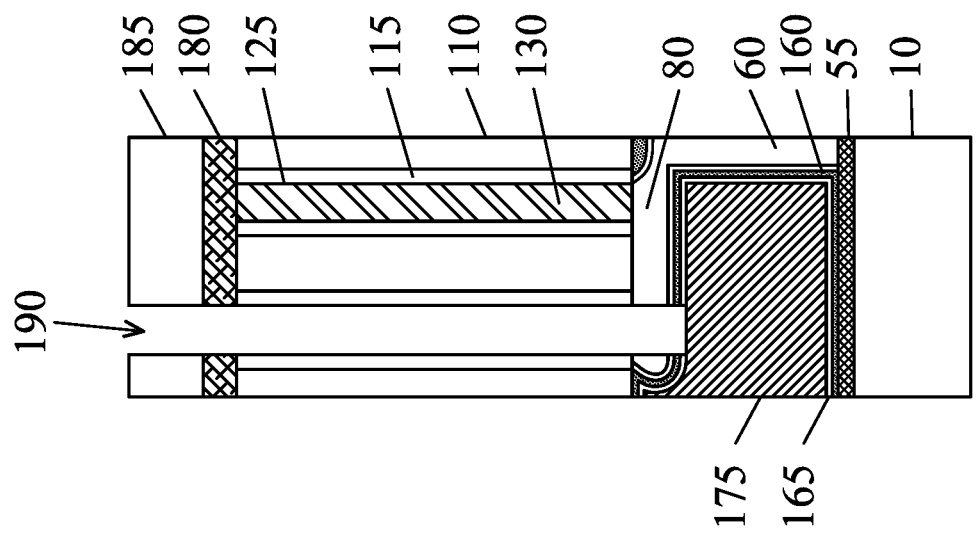
Figure 24D:
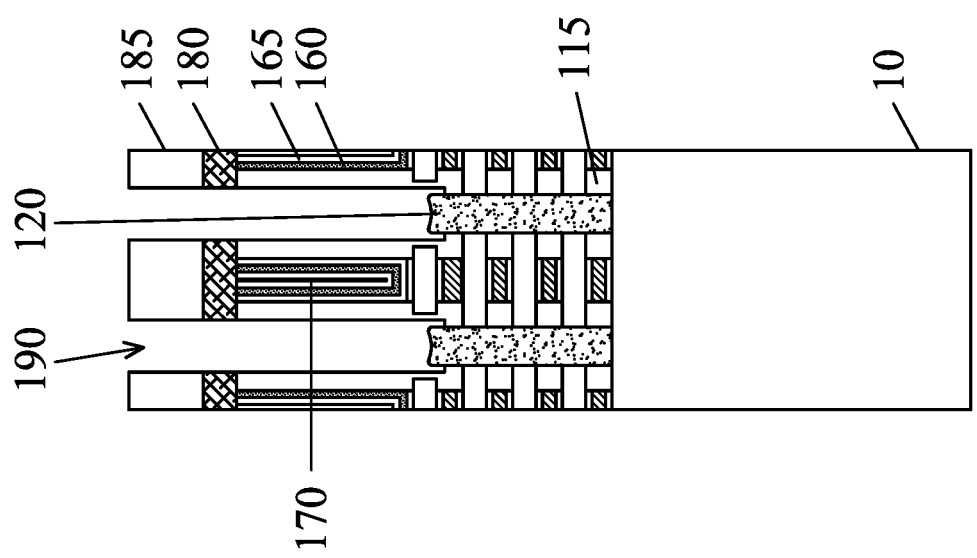
Figure 25B:
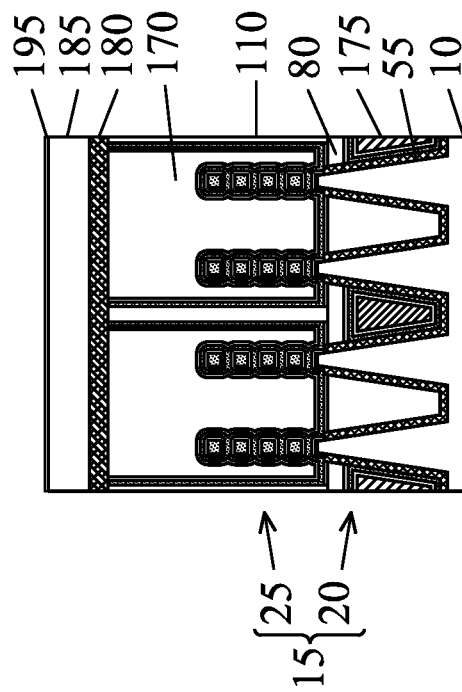
FIGS. 25A-25E show views of one of the various stages of manufacturing a GAA FET semiconductor device according to embodiments of the present disclosure.
Figure 25C:
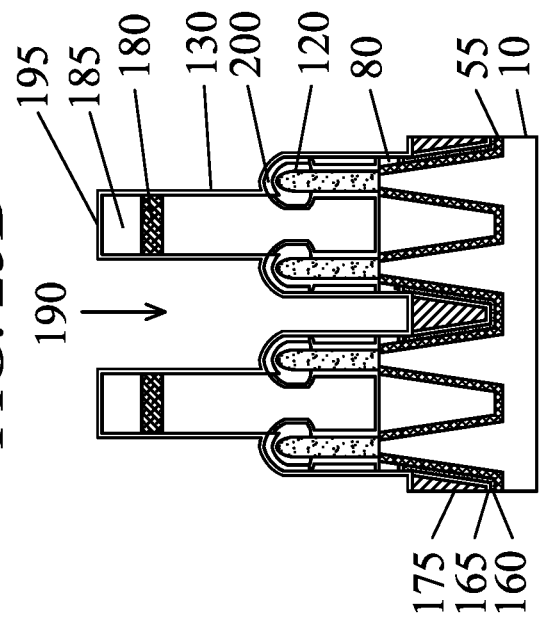
Figure 25A:
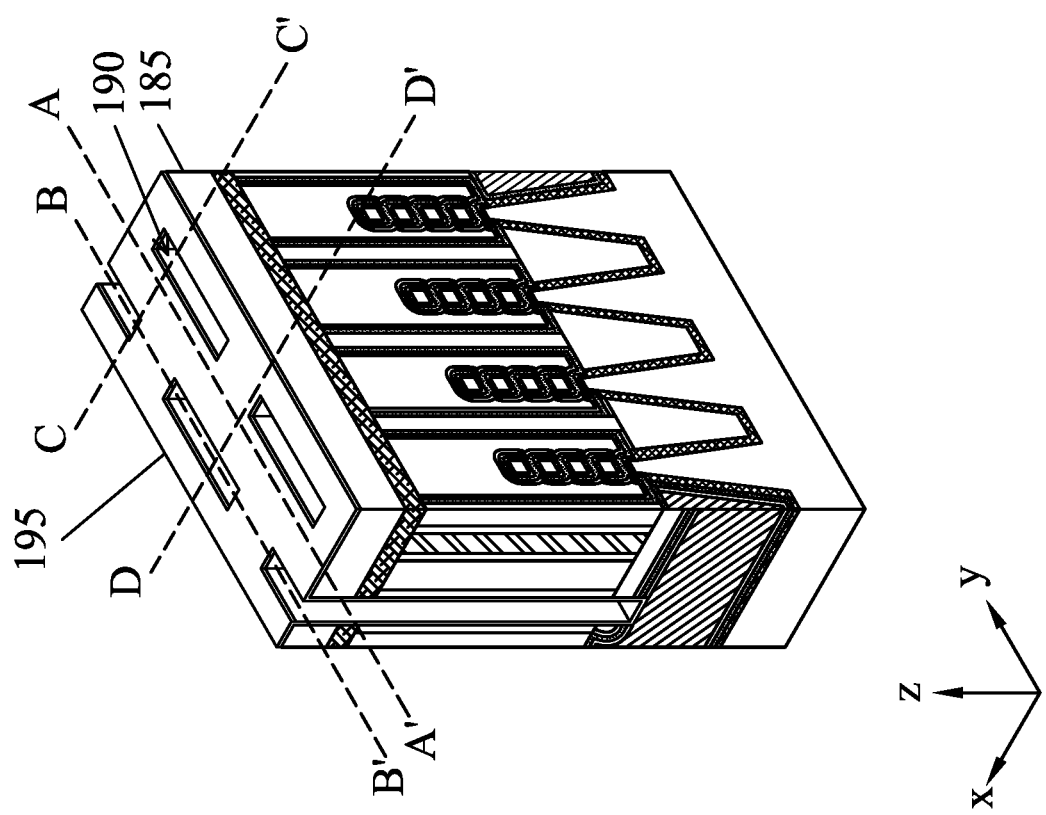
Figure 25E:
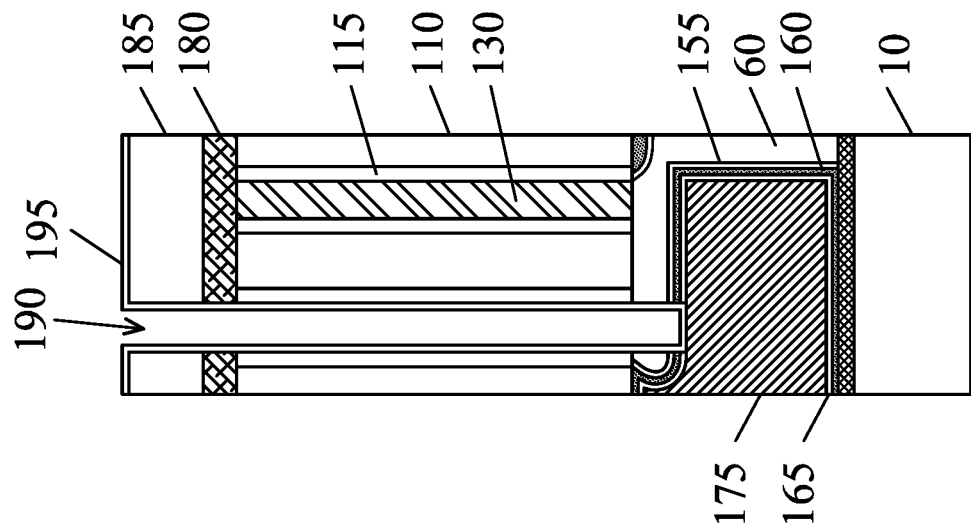
Figure 25D:
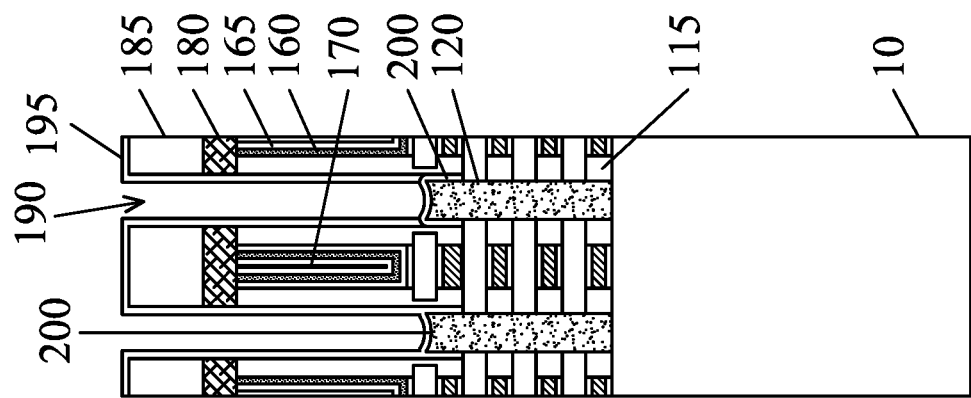
Figure 26E:
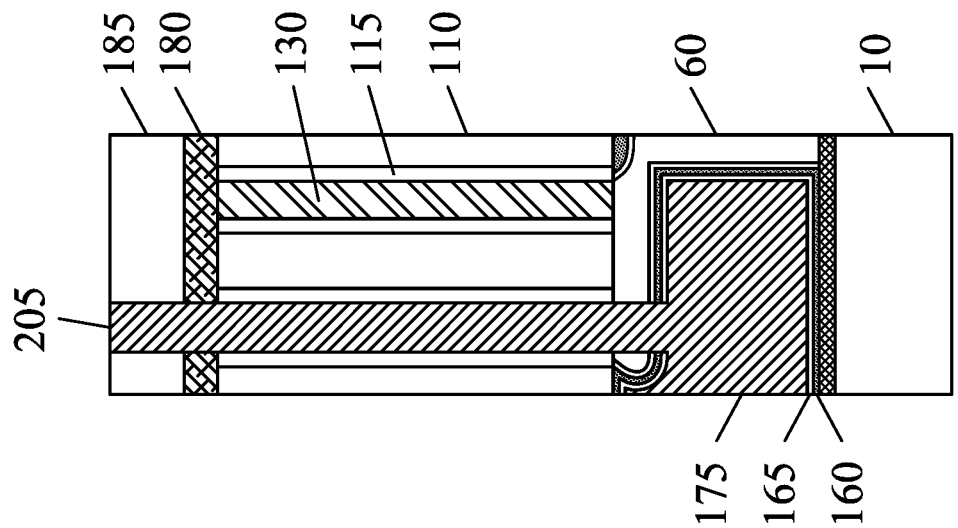
Figure 26D:
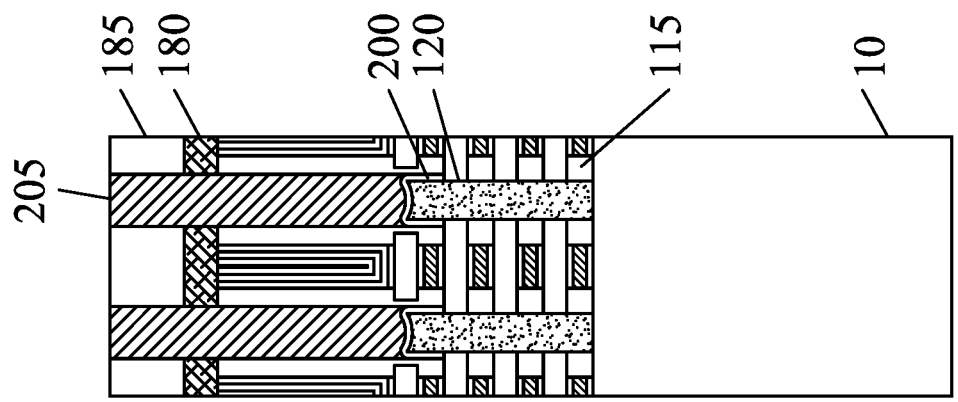
Figure 27E:
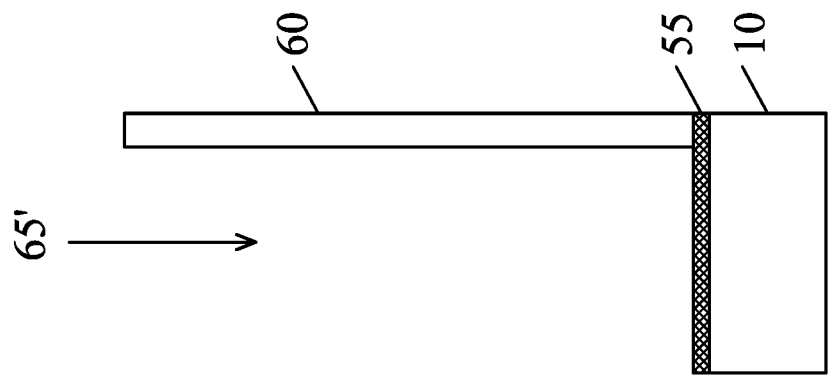
Figure 27D:
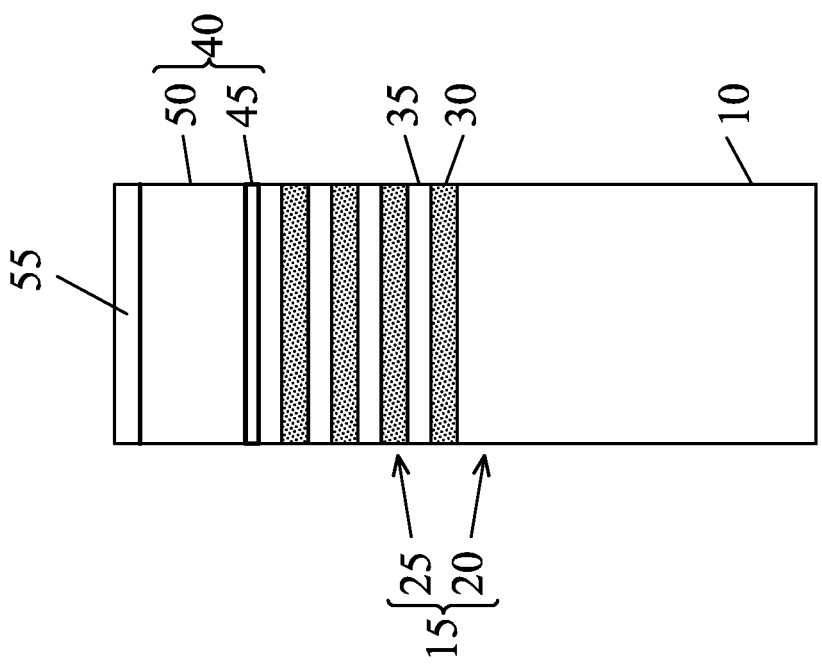
Figure 28E:
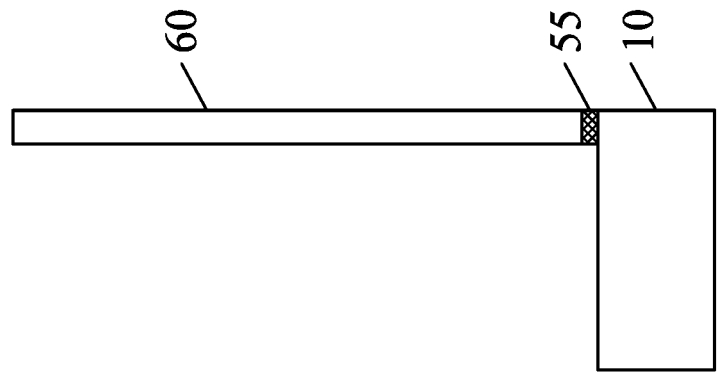
Figure 28D:
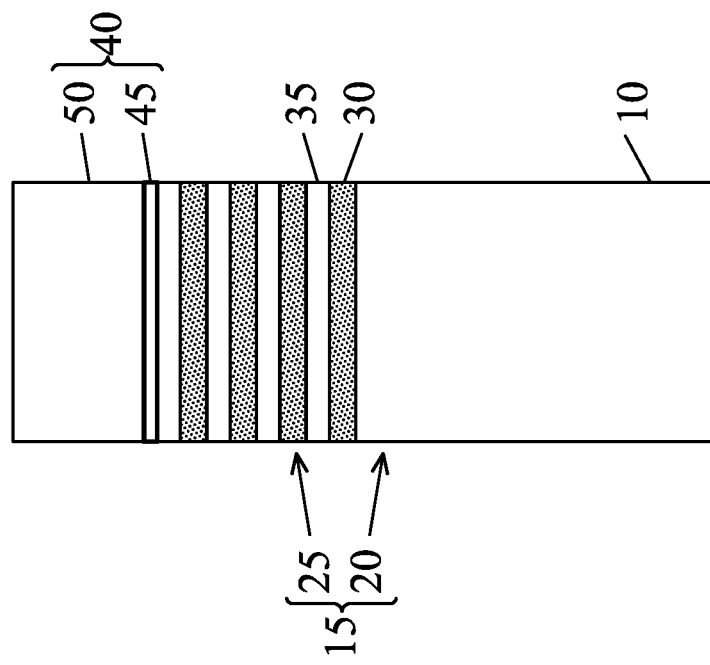
Figure 29E:
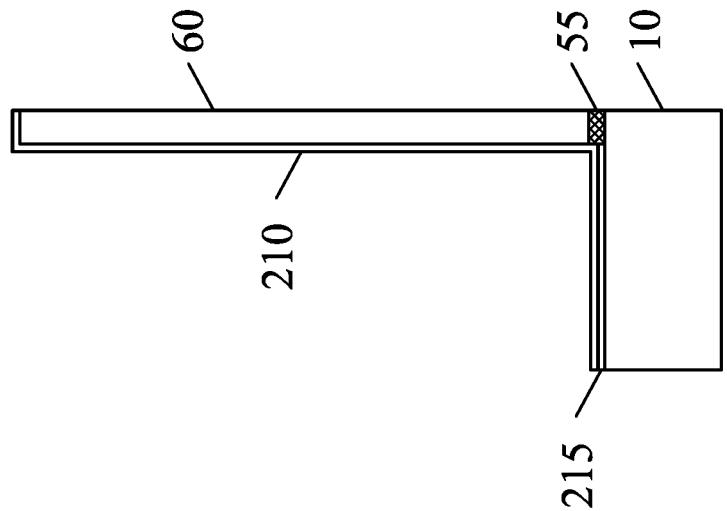
Figure 29D:
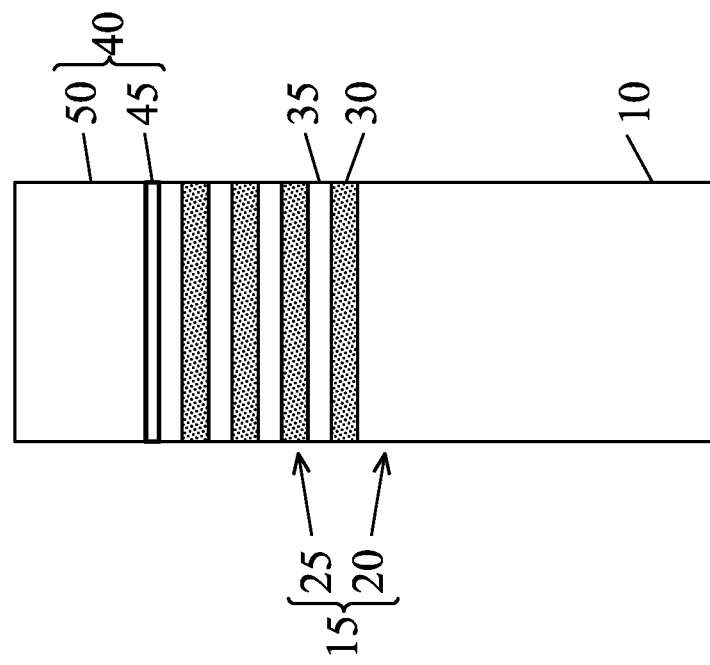
Figure 30B:
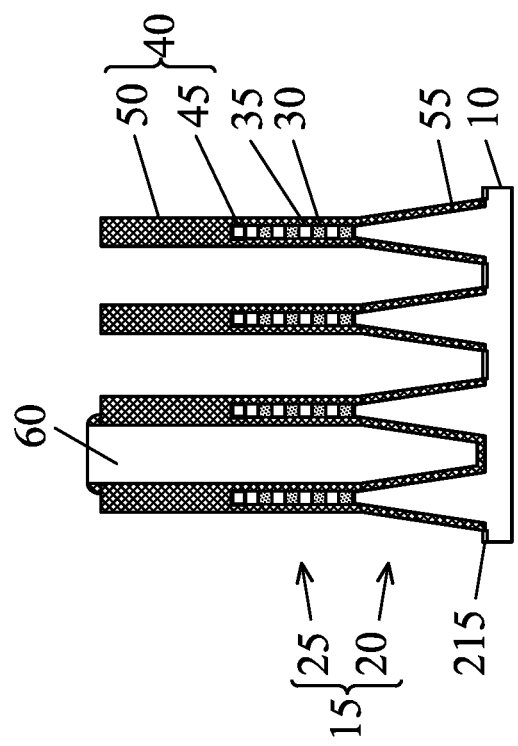
FIGS. 30A-30E show views of one of the various stages of manufacturing a GAA FET semiconductor device according to embodiments of the present disclosure.
Figure 30C:
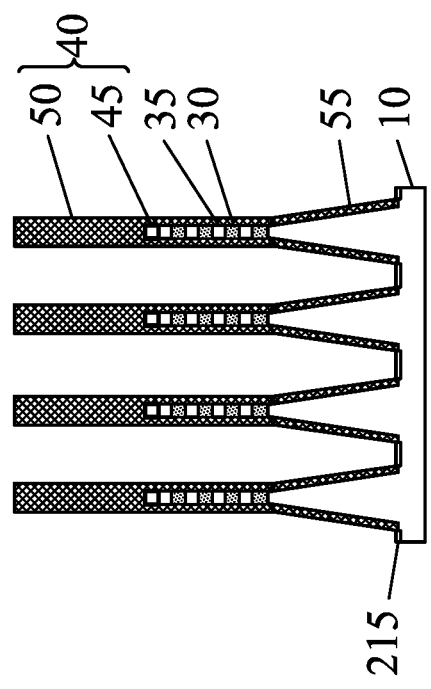
Figure 30A:
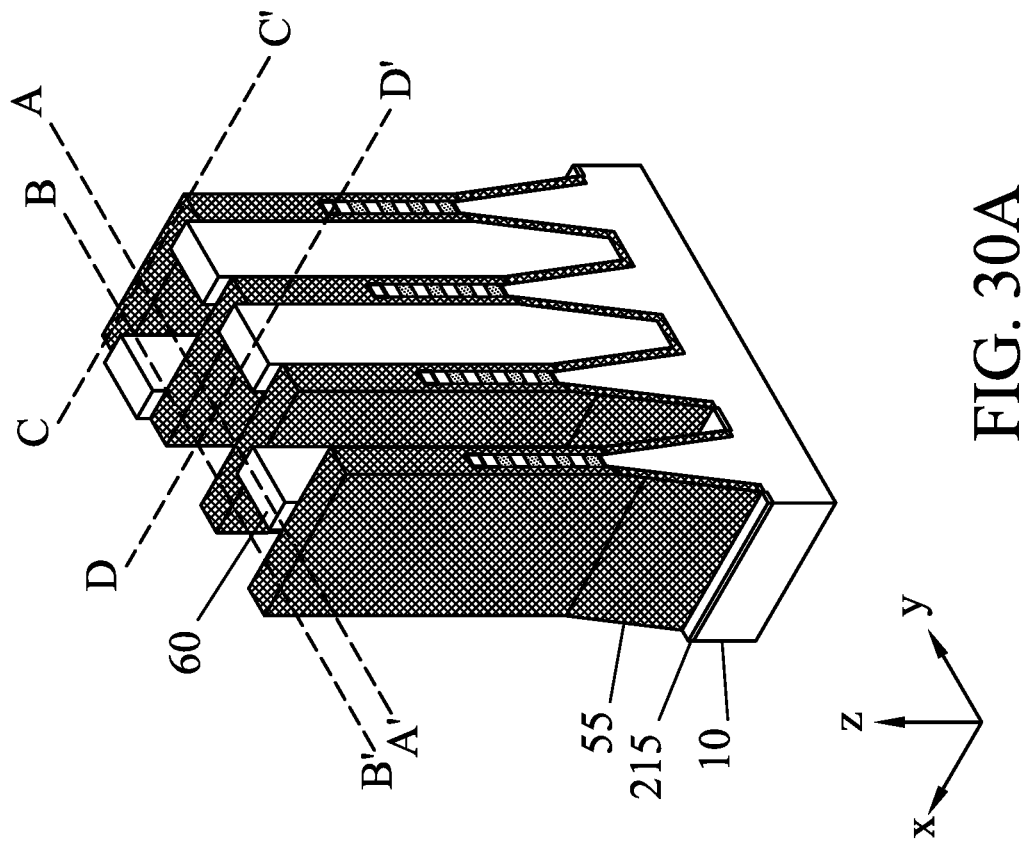
Figure 30E:
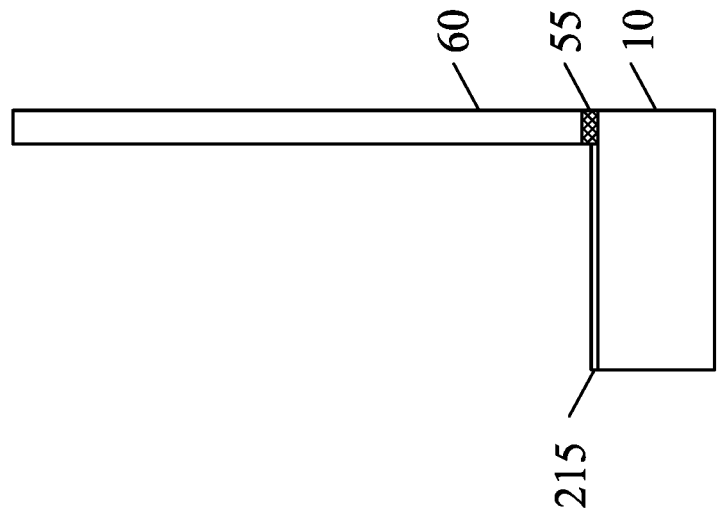
Figure 30D:
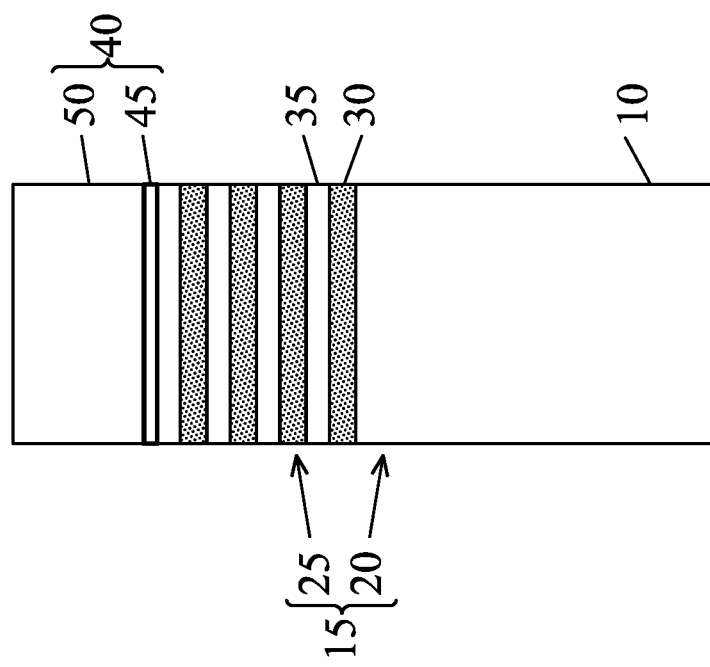
Figure 31B:
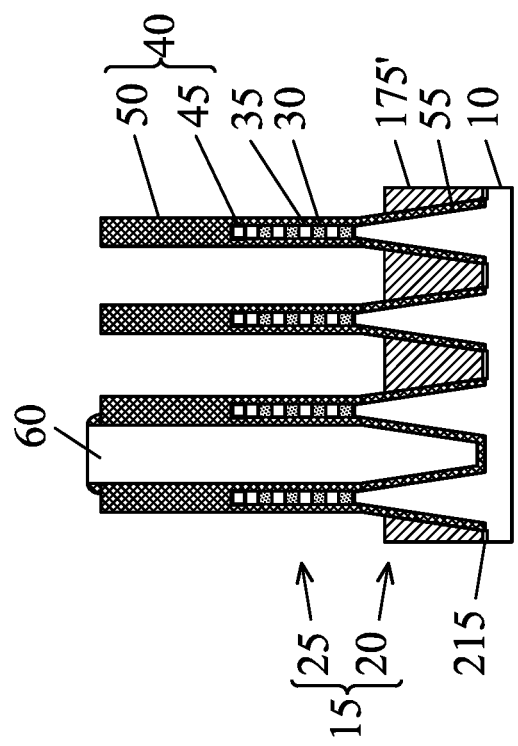
FIGS. 31A-31E show views of one of the various stages of manufacturing a GAA FET semiconductor device according to embodiments of the present disclosure.
Figure 31C:
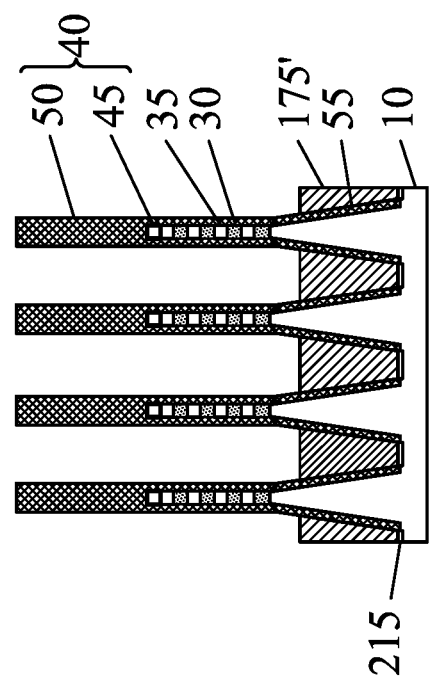
Figure 31A:
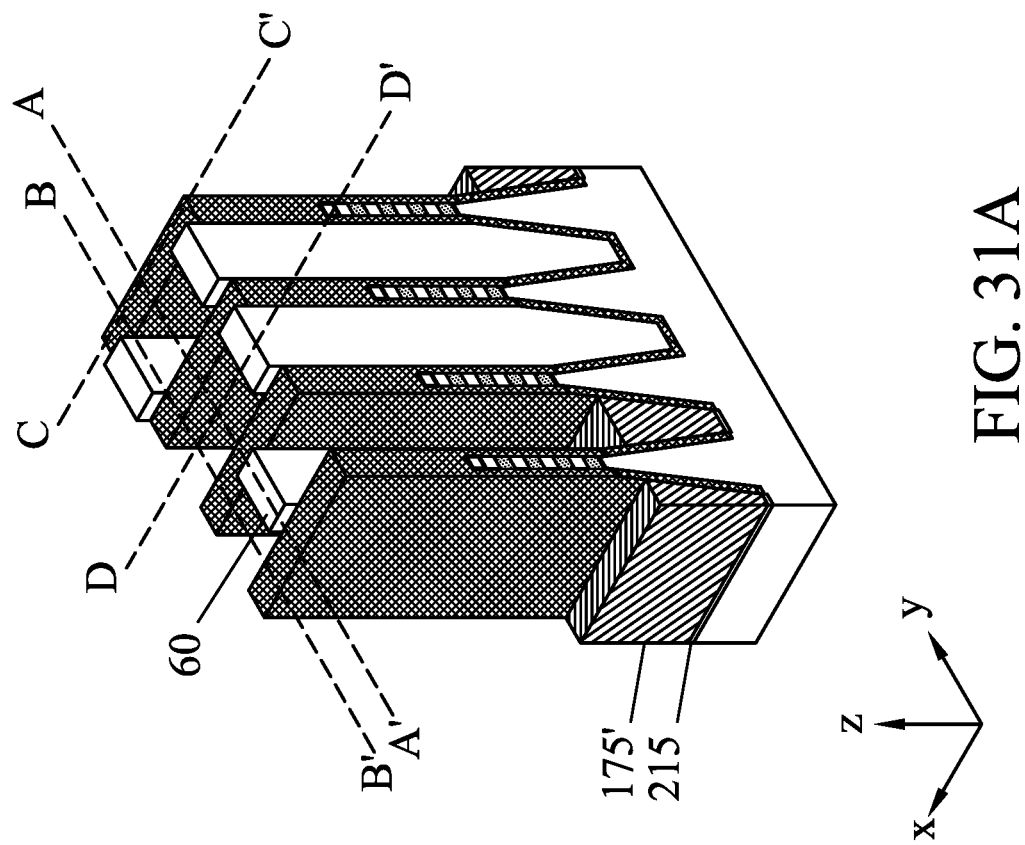
Figure 31E:
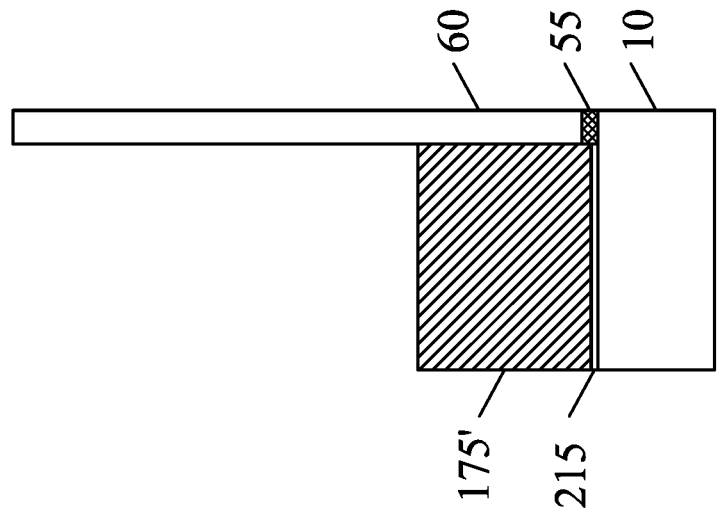
Figure 31D:
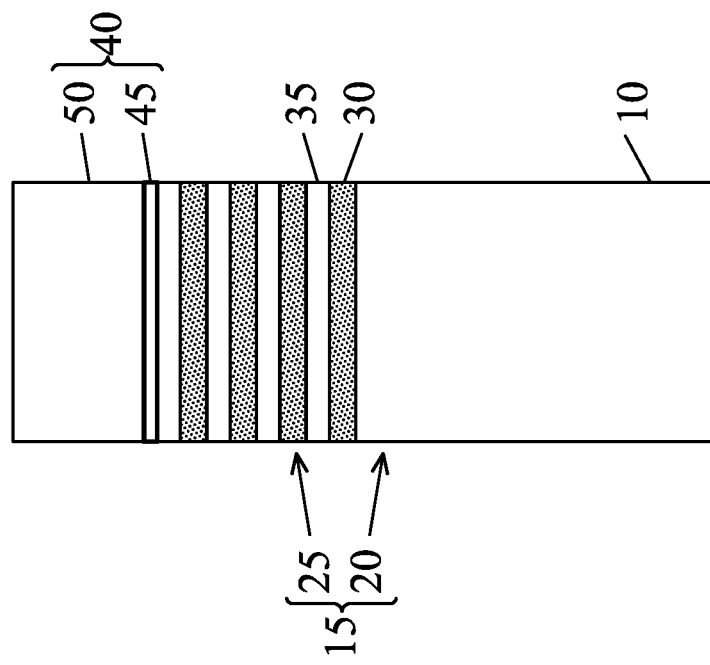
Figure 32B:
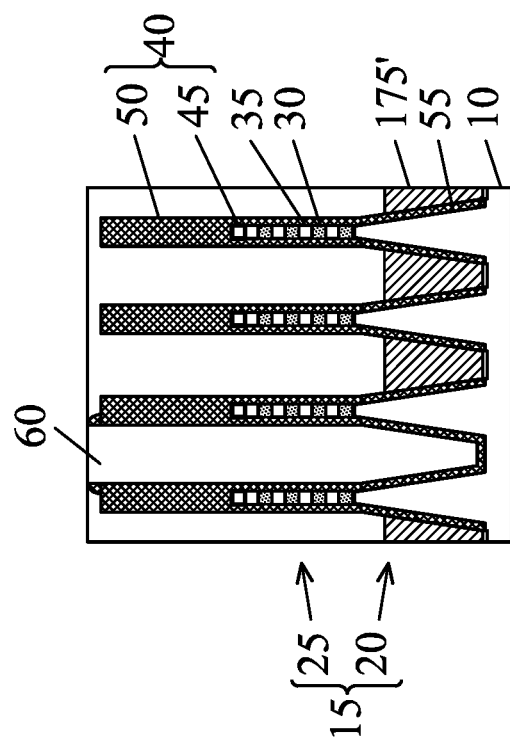
FIGS. 32A-32E show views of one of the various stages of manufacturing a GAA FET semiconductor device according to embodiments of the present disclosure.
Figure 32C:
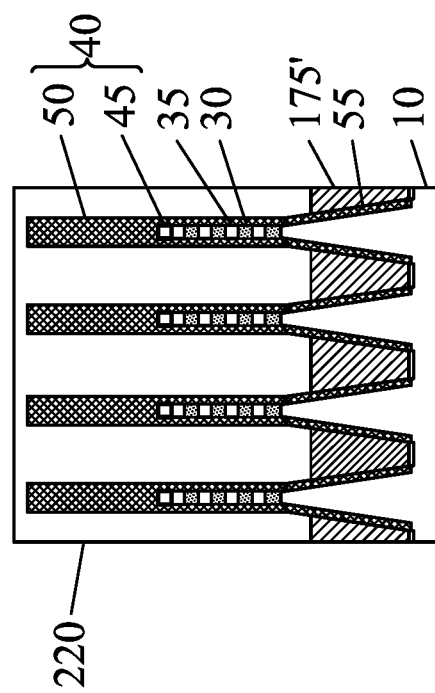
Figure 32A:
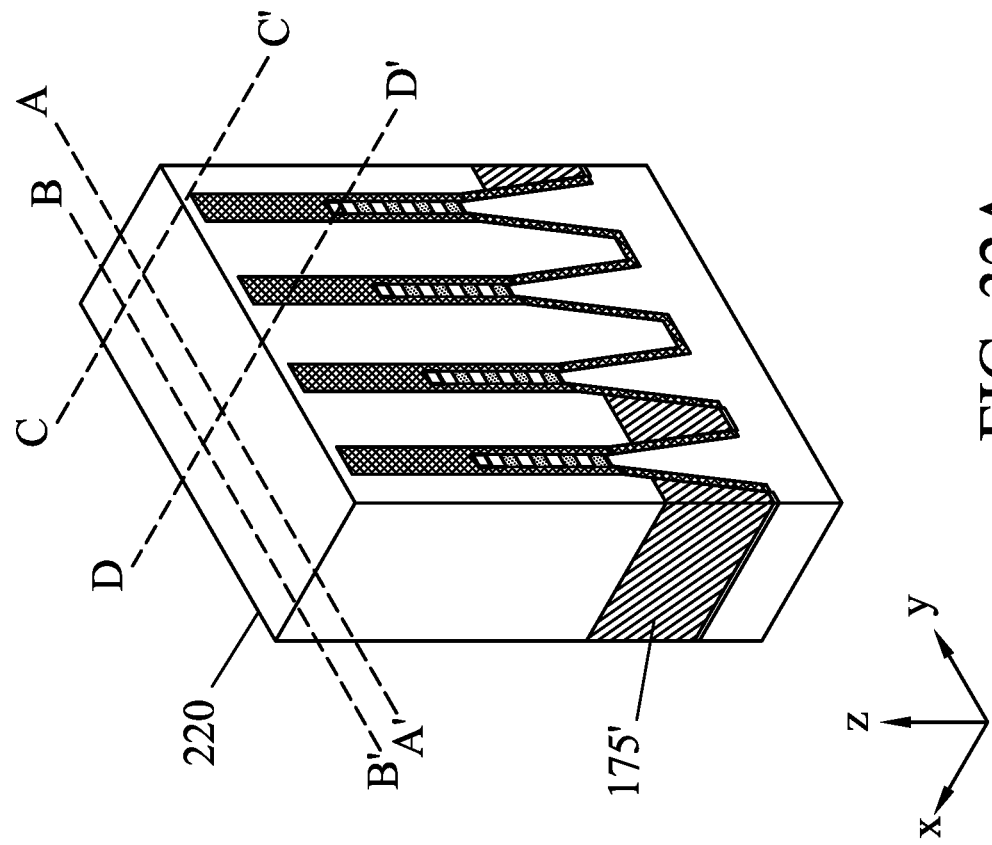
Figure 32E:
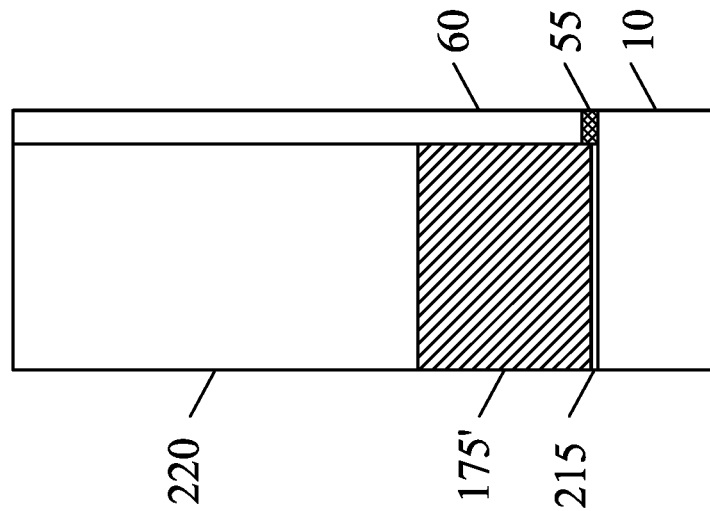
Figure 32D:
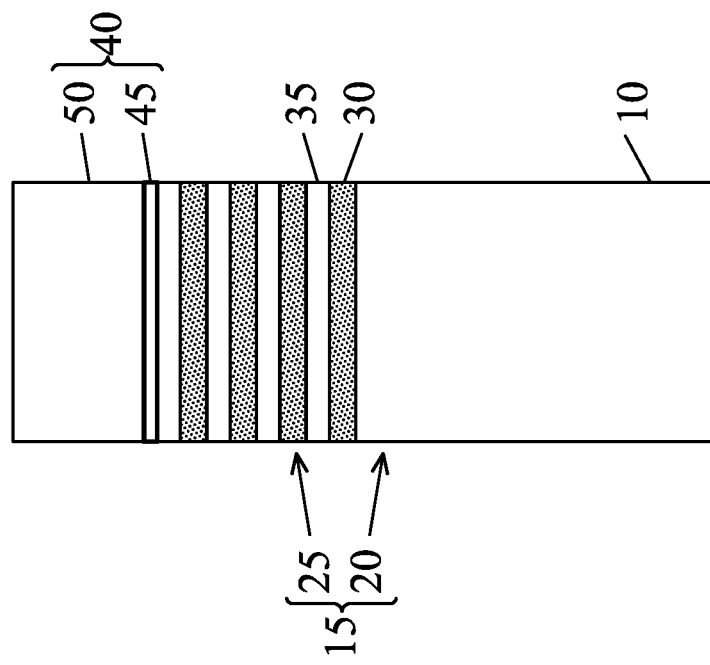
Figure 33B:
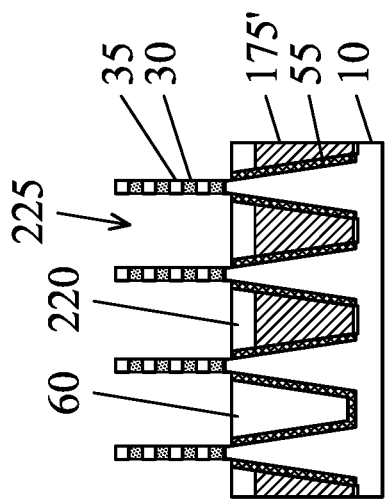
FIGS. 33A-33E show views of one of the various stages of manufacturing a GAA FET semiconductor device according to embodiments of the present disclosure.
Figure 33C:
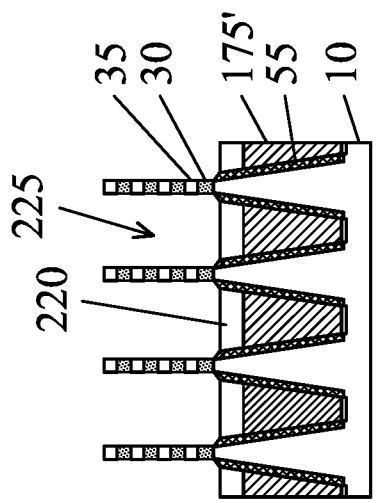
Figure 33A:
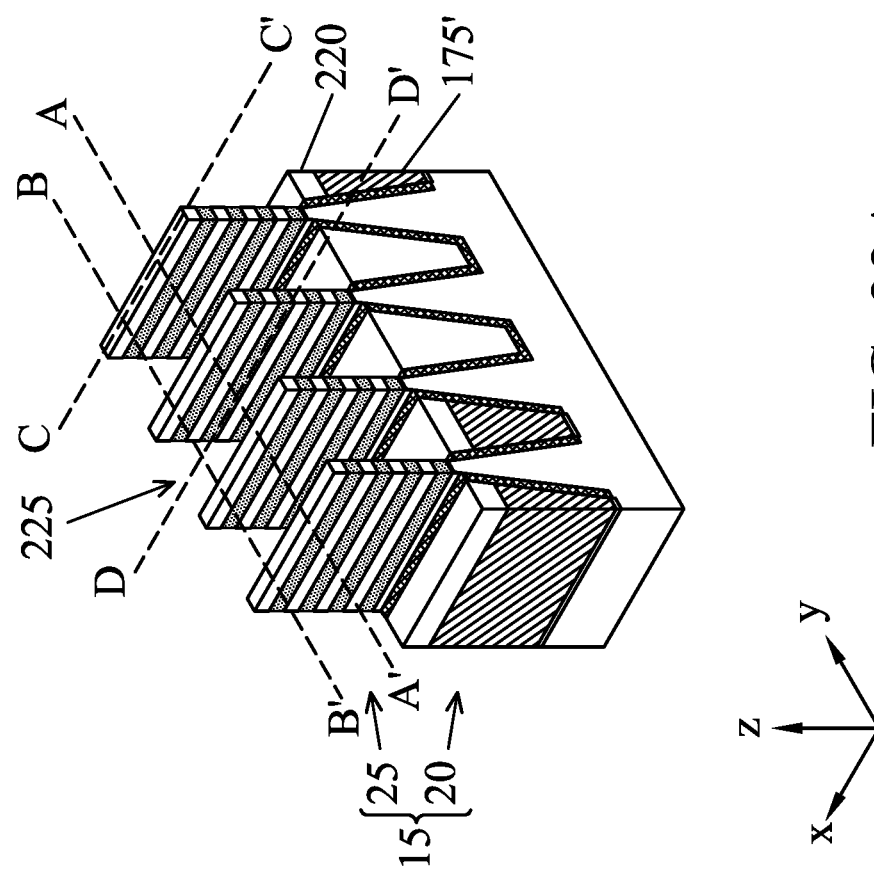
Figure 33E:
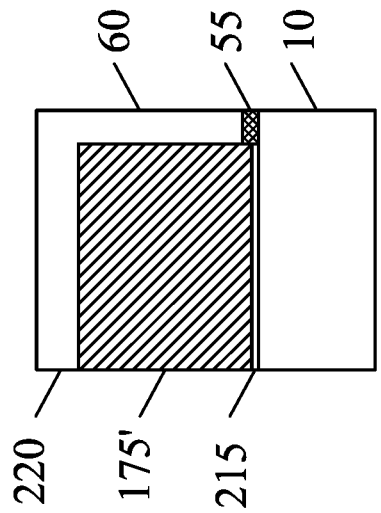
Figure 33D:
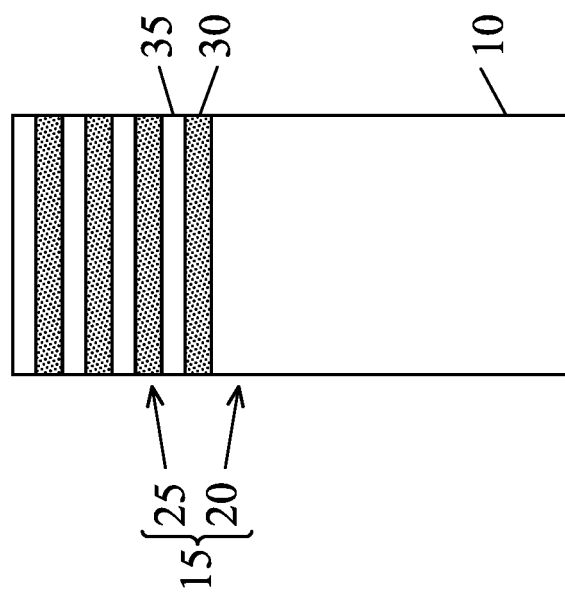
Figure 34A:
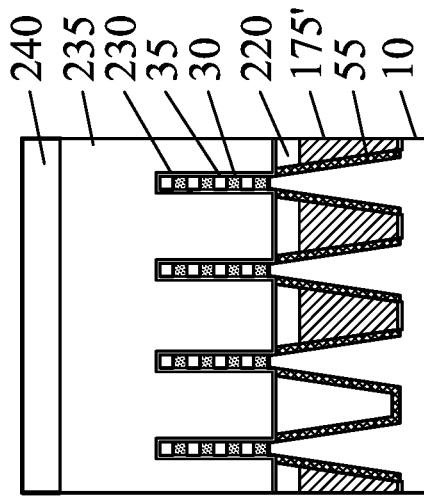
FIGS. 34A-34E show views of one of the various stages of manufacturing a GAA FET semiconductor device according to embodiments of the present disclosure.
Figure 34B:
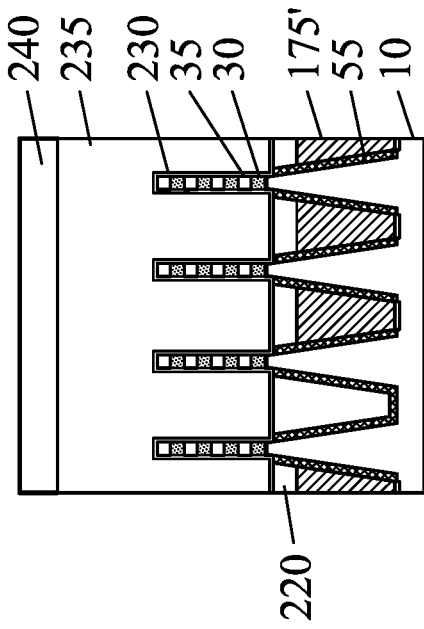
Figure 34C:
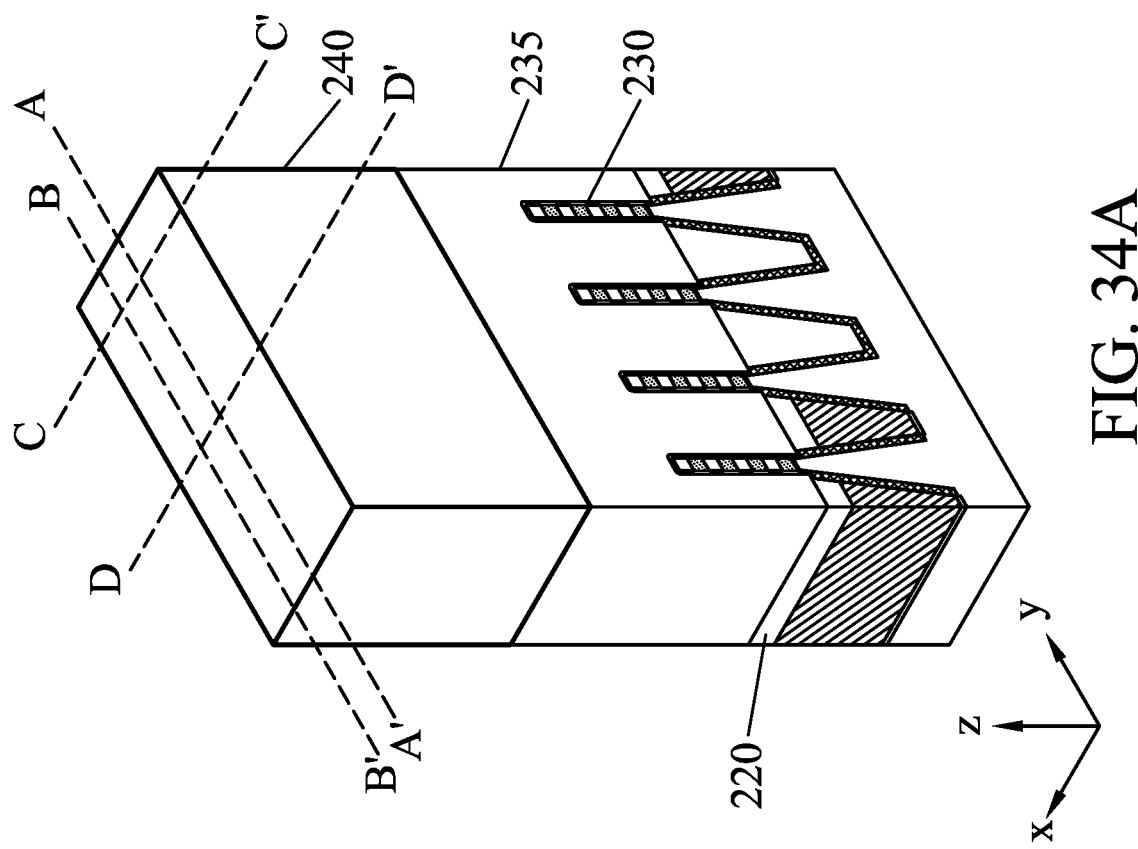
Figure 34E:
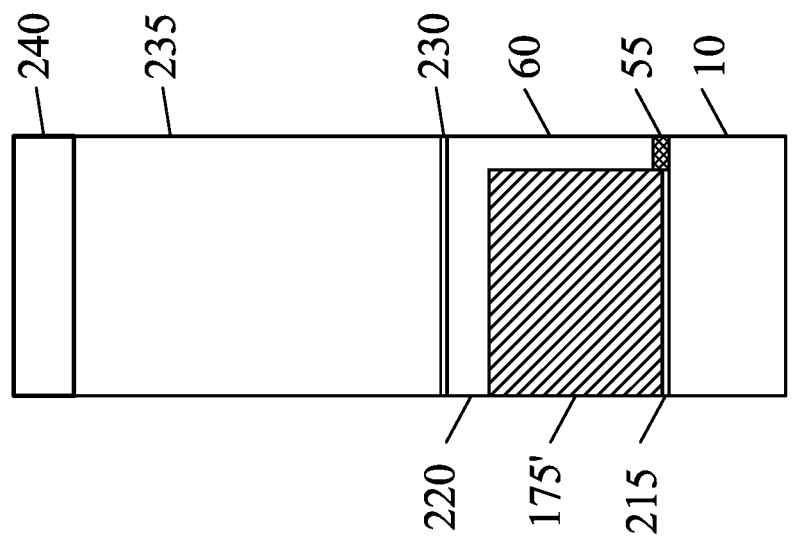
Figure 34D:
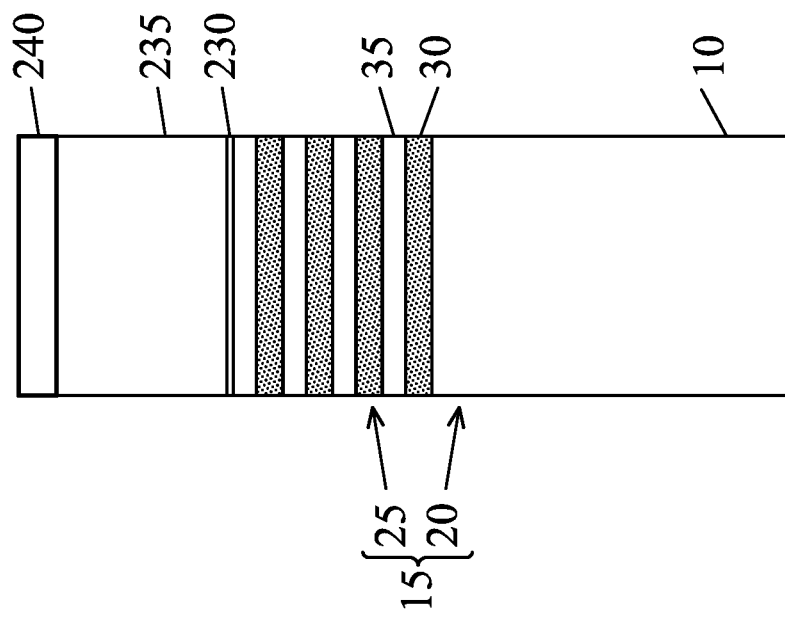
Figure 35B:
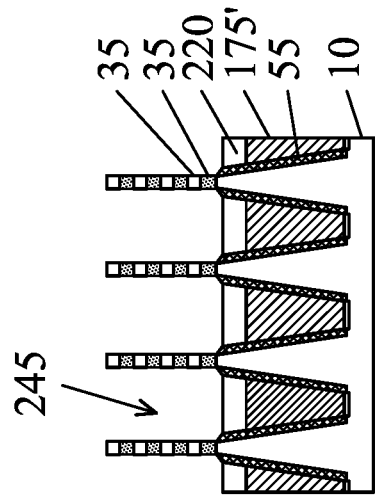
FIGS. 35A-35E show views of one of the various stages of manufacturing a GAA FET semiconductor device according to embodiments of the present disclosure.
Figure 35C:
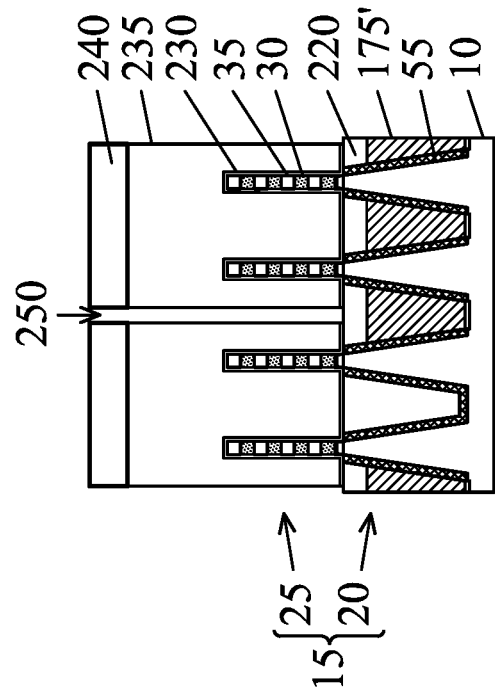
Figure 35A:
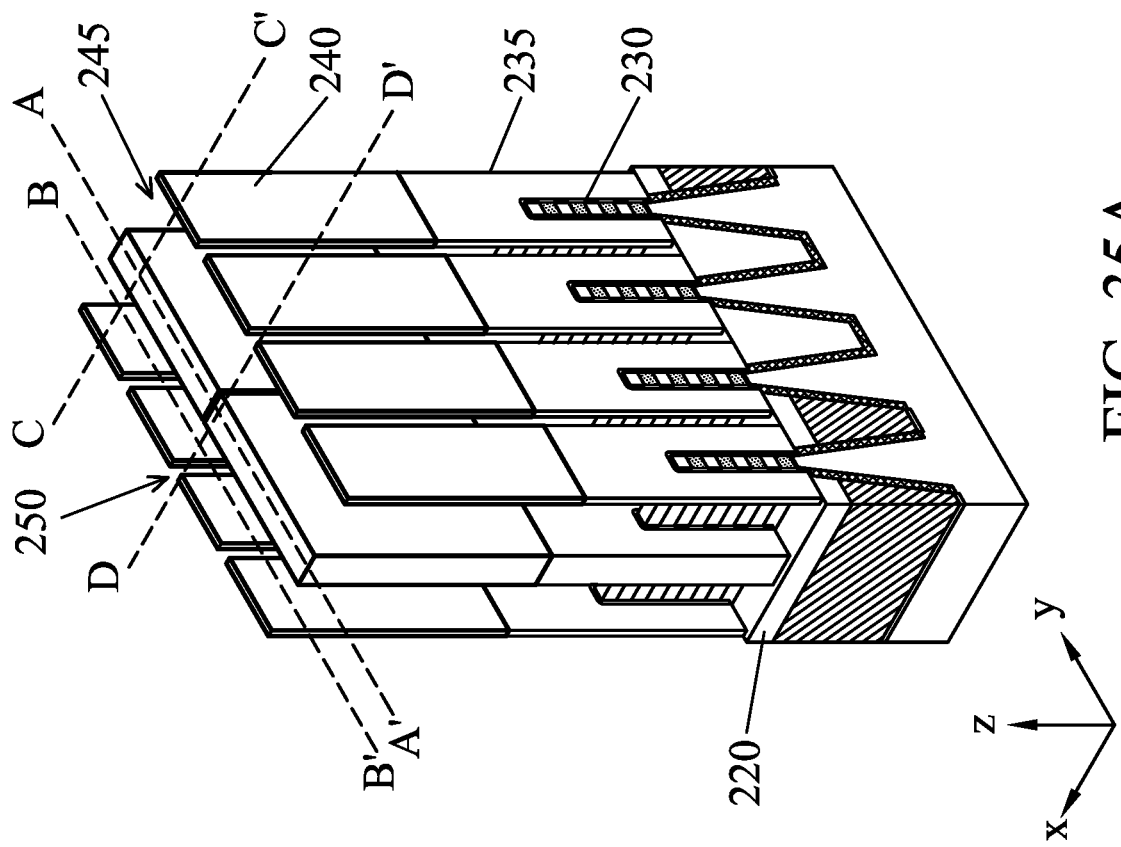
Figure 35E:
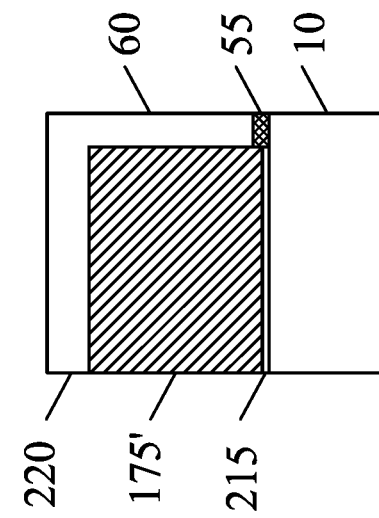
Figure 35D:
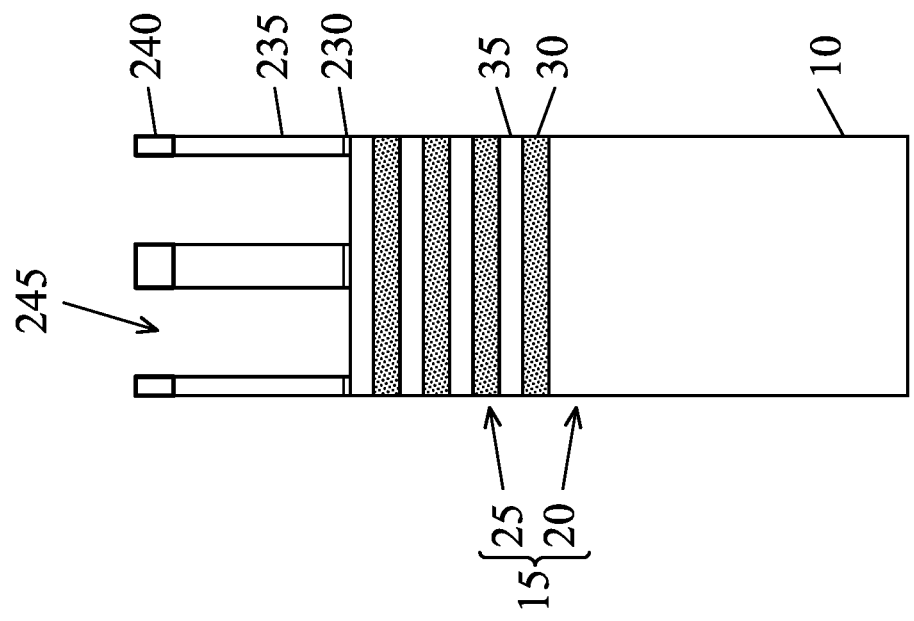

Using the patterned photoresist and/or BARC layer 140 as a mask, the second insulating material layer 80 is selectively etched using a suitable etching operation, as shown in FIGS. 18A-18E. In some embodiments, a HF-based etchant or a buffered oxide etch ($NH_4F$:HF solution) is used to selectively etch a silicon oxide second insulating material layer 80. The second insulating material layer etch undercuts the sidewall spacer layer 110 and the inner spacer layer 115, as shown in FIGS. 18A and 18E, to form second insulating material layer recesses 145. The second insulating material layer recesses 145 provide an opening that expose a portion of the first sacrificial layers 70.

The first sacrificial layers 70 are subsequently removed from under between the well regions 20 of the fin structures by a suitable etching operation, as shown in FIGS. 19A-19E forming voids 150 under the second material insulating layers 80. For example, if the first sacrificial layers 70 are polysilicon a TMAH solution may be used to remove the first sacrificial layers 70. In other embodiments, $NH_4OH$ or KOH solutions are used to remove the first sacrificial layers 70.

As shown in FIGS. 20A-20E, the patterned photoresist and/or BARC layer 140 is subsequently removed to form a gate space 135'. In some embodiments, the patterned photoresist and/or BARC layer 140 is removed by a suitable photoresist stripping or plasma ashing operation.

Then, the sacrificial gate dielectric layer 85 is removed from the gate space 135', as shown in FIGS. 21A-21E in some embodiments. The sacrificial gate dielectric layer 85 can be removed by using suitable plasma dry etching and/or wet etching operations.

Adverting to FIGS. 22A-22E, the first semiconductor layers 30 are removed in the channel regions 25 of the fin structure 15 using a suitable etching operation to form a semiconductor nanowires made of the second semiconductor layers 35. The first semiconductor layers 30 and the second semiconductor layers 35 are made of different materials having different etch selectivities. Therefore, a suitable etchant for the first semiconductor layer 30 does not substantially etch the second semiconductor layer 35. For example, when the first semiconductor layers 30 are Si and the second semiconductor layers 35 are Ge or SiGe, the first semiconductor layers 30 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. On the other hand, when the first semiconductor layers 30 are SiGe or Ge and the second semiconductor layers 35 Si, the first semiconductor layers 30 can be selectively removed using a wet etchant such as, but not limited to, $HF:HNO_3$ solution, $HF:CH_3COOH:HNO_3$, or $H_2SO_4$ solution and $HF:H_2O_2:CH_3COOH$. In some embodiments, a combination of dry etching techniques and wet etching techniques are used to remove the first semiconductor layers 30.

The cross sectional shape of the semiconductor nanowires 35 in the channel region 25 are shown as rectangular, but can be any polygonal shape (triangular, diamond, etc.), polygonal shape with rounded corners, circular, or oval (vertically or horizontally).

After the semiconductor nanowires of the second semiconductor layers 30 are formed, a gate dielectric layer 155 is formed around each of the channel region nanowires 30, as shown in FIGS. 22A-22E. In certain embodiments, the gate dielectric layer 155 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 155 includes an interfacial layer formed between the channel layers and the dielectric material. In some embodiments, the gate dielectric layer 155 is also formed on exposed portions of the second insulating material layer 80.

The gate dielectric layer 155 may be formed by CVD, ALD, or any suitable method. In one embodiment, the gate dielectric layer 155 is formed using a highly conformal deposition process such as ALD in order to ensure the formation of a gate dielectric layer having a uniform thickness around each channel layers. The thickness of the gate dielectric layer 155 is in a range from about 1 nm to about 6 nm in some embodiments.

After the gate dielectric layer 155 is formed, a gate electrode layer 170 is formed over the gate dielectric layer 155 in the gate space 135', in some embodiments, as shown in FIGS. 23A-23E. The gate electrode layer 170 is formed on the gate dielectric layer 155 to surround each nanowire 25. The material used to form the gate electrode layer 170 is also used to form power rails 175 in the void 150 between the well regions 20 of the fin structures 15 in some embodiments. The gate electrode layer 170 and power rails 175 are formed simultaneously in some embodiments. In other embodiments, one of the gate electrode layer 170 and the power rails 175 is formed before the other of the gate electrode layer 170 or power rails 175 are formed.

The gate electrode layer 170 and power rails 175 include one or more layers of conductive material, such as aluminum, copper, titanium, tantalum, tungsten, cobalt, molybdenum, tantalum nitride, nickel silicide, cobalt silicide, TiN, TaN, TiAl, TiAlN, TaCN, TaC, TaSiN, metal alloys, other suitable materials, and/or combinations thereof.

The gate electrode layer 170 and power rails may be formed by CVD, ALD, electro-plating, or other suitable method. The gate electrode layer 170 is also deposited over the upper surface of the ILD layer 130 in some embodiments, and then the portion of the gate electrode layer formed over the ILD layer 130 is planarized by using, for example, CMP, until the top surface of the ILD layer 130 is revealed.

In some embodiments of the present disclosure, one or more barrier layers 160 are interposed between the gate dielectric layer 155 and the gate electrode 170, and between the gate dielectric layer 155 and the insulating liner layer 155, and the power rail 175. The barrier layer 160 is made of a conductive material such as a single layer of TiN or TaN or a multilayer of both TiN and TaN.

In some embodiments of the present disclosure, one or more work function adjustment layers 165 are interposed between the gate dielectric layer 115 or barrier layer 165 and the gate electrode layer 170, and between the gate dielectric layer 115 or barrier layer and the insulating liner layer and the power rail 175. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For an n-channel FET, one or more of TaN, TaAlC, TiN, TiC, Co, TiAl, HfTi, TiSi and TaSi is used as the work function adjustment layer, and for a p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers as the gate electrode layer 170.

A metal etch stop layer (MESL) 180 and cap insulating layer 185 are subsequently formed over the ILD layer 130 and the gate electrode layer 170, as shown in FIGS. 24A-24E. The cap insulating layer 185 is formed over the MESL 180.

Contact holes 190 are formed in the cap insulating layer 185 using suitable photolithographic and etching techniques. The contact holes are extended into the MESL 180 and ILD layer 130 by using dry etching. Suitable etching operations are further used to extend the contact holes through the second insulating material layer 80, and any of the CESL 125, gate dielectric layer 155, barrier layer 160, and work function adjustment layer 165 to expose the power rails 175. The etching operations also removes the CESL 125 covering the source/drain layers 120, thereby exposing the source/drain layers 120. In some embodiments, the upper portion of the source/drain layers 120 is also etched.

In some embodiments, a metal layer 195 is deposited over the device, including the cap insulating layer 185, MESL 180, ILD layer 130, source/drain layer 120, and the power rails 175, as shown in FIGS. 25A-25E. The metal layer 195 is one or more layers of W, Co, Ni, Ti, Mo, and Ta in some embodiments. In some embodiments, the metal layer 195 includes a metal layer selected from W, Co, Ni, Ti, Mo, and Ta; and a metal nitride layer selected from tungsten nitride, cobalt nitride, nickel nitride, titanium nitride, molybdenum nitride, and tantalum nitride. The semiconductor device is then subjected to a rapid thermal anneal, whereby the portion of the metal layer 195 over the source/drain layer 120 reacts with silicon in the source/drain layer 120 to form a metal silicide layer 200. In some embodiments, the metal silicide layer 200 formed over the source/drain layer 120 includes one or more of WSi, CoSi, NiSi, TiSi, MoSi, and TaSi. In some embodiments, the metal layer 195 is formed by CVD, PVD, ALD, or other suitable process.

Then, in some embodiments the unreacted metal layer 195, including the metal layer and/or the metal nitride layer is removed from the contact holes 190, and the cap insulating layer 185. The unreacted metal layer 195 can be removed by a suitable etching operation. After removing the unreacted metal layer 195, a conductive material is formed in the contact holes 190 to form a conductive contact 205, as shown in FIGS. 26A-26E. The conductive material includes one or more of Co, Ni, W, Ti, Ta, Cu, Al, TiN, and TaN. The conductive contact 205 may be formed by CVD, ALD, electro-plating, or other suitable method. The conductive material is also deposited over the upper surface of the cap insulating layer 185 in some embodiments, and then the portion of the conductive contact 205 formed over the cap insulating layer 185 is planarized by using, for example, CMP, until the top surface of the cap insulating layer 185 is revealed.

It is understood that the GAA FETs formed according to the disclosed methods undergo further complementary metal oxide semiconductor (CMOS) processes to form various features such as contacts/vias, interconnect metal layers, dielectric layers, passivation layers, metallization layers with signal lines, etc.

FIGS. 27A-46E illustrate a method of manufacturing a semiconductor device according to embodiments of the present disclosure. This method employs the same operations previously disclosed herein regarding FIGS. 1 to 5E. In FIGS. 27A-46E, the A drawings are isometric views of sequential operations of manufacturing a semiconductor device. The B drawings are cross-sectional views taken along line A-A' of the A drawings. The B drawings are taken along the gate region of the semiconductor device in the Y direction. The C drawings are cross-sectional views taken long line B-B' of the A drawings. The C drawings are taken along the source/drain regions of the semiconductor device in the Y direction. The D drawings are cross-sectional views taken along line C-C' of the A drawings. The D drawings are taken along the fin structures of the semiconductor device in the X-direction. The E drawings are cross-sectional views taken along line D-D' of the A drawings. The E drawings are cross-sectional views taken along a cell edge in the X direction.

Starting with the structure of FIGS. 5A-5E, a portion of the first insulating material layer 60 is recessed to form first recess openings 65' exposing the insulating liner layer 55 between adjacent fin structures 15. The present disclosure is not limited to the pattern of removing portions of the insulating material layer 60 as illustrated in FIGS. 27A-27E. Suitable photolithographic and etching operations are used to remove the portions of the insulating material 60 from between the fin structures 15.

Adverting to FIGS. 28A-28E, the insulating liner layer 55 is anisotropically etched to remove a portion of the insulating liner layer 55 over the horizontal surfaces of the substrate 10, thereby exposing the surface of the substrate 10. The insulating liner layer 55 is also removed from the upper surface of the fin structures during the etching operation. In some embodiments, the anisotropic etching is a plasma etching operation.

In some embodiments, a metal layer 210 is deposited over the device, including the fin structures 15, insulating liner layer 55, and substrate 10, as shown FIGS. 29A-29E. The metal layer 210 is one or more layers of W, Co, Ni, Ti, Mo, and Ta in some embodiments. In some embodiments, the metal layer 210 includes a metal layer selected from W, Co, Ni, Ti, Mo, and Ta; and a metal nitride layer selected from tungsten nitride, cobalt nitride, nickel nitride, titanium nitride, molybdenum nitride, and tantalum nitride. The semiconductor device is then subjected to a rapid thermal anneal, whereby the portion of the metal layer 210 over the substrate 10 reacts with silicon in the substrate 10 to form a metal silicide layer 215. The metal silicide layer 215 provides a seed layer for a subsequent selective deposition of a conductive material. In some embodiments, the metal silicide layer 215 formed over the substrate 10 includes one or more of WSi, CoSi, NiSi, TiSi, MoSi, and TaSi. In some embodiments, the metal layer 210 is formed by CVD, PVD, ALD, or other suitable process.

Then, in some embodiments the unreacted metal layer 210, including the metal layer and/or the metal nitride layer is removed from over the fin structures 15 and first insulating material layer 60, as shown in FIGS. 30A-30E. The unreacted metal layer 210 can be removed by as suitable etching operation.

After removing the unreacted metal layer 210, a conductive material is formed in the first recess openings 65' contact holes 190 to form a power rail 175', as shown in FIGS. 31A-31E. The conductive material includes one or more of Co, Ni, W, Ti, Ta, Cu, Al, TiN, and TaN. The power rail 175' may be formed by CVD, PVD, ALD, electro-plating, or other suitable method. In some embodiments, the conductive material is deposited over the upper surface of the fin structures 15, and then the conductive material is planarized by using, for example, CMP. An etchback operation is subsequently performed until the conductive material is reduced to a desired height in between adjacent well regions 20 of adjacent fin structures 15. In other embodiments, the conductive material is deposited in the first recess openings 65' until a desired height of the power rail 175' is achieved.

As shown in FIGS. 32A-32E, a second insulating material layer 220 is subsequently deposited over the fin structures 15 filling the second recess openings 65'. After deposition of the second insulating material layer 220 the device is planarized, such as by CMP or an etchback operation.

Next, the hard mask layer 40 is removed, the second insulating material layer 220 is recess etched to expose the upper channel region 25 of the fin structures 15, and the insulating liner layer 55 is removed from the upper channel region 25 of the fin structure by suitable etching operations, thereby forming second recess openings 225. Suitable etching operations include anisotropic or isotropic plasma etching and wet etching techniques. A portion of the second insulating material layer 220 remains over the previously formed power rails 175' and first insulating material layer 60, as shown in FIGS. 33A-33E. The thickness of the remaining portion of the second insulating material layer 220 over the power rails 175' ranges from about 2 nm to about 20 nm in some embodiments. In some embodiments, the thickness of the remaining portion of the second insulating material layer 220 ranges from about 5 nm to about 15 nm.

As shown in FIGS. 34A-34E, a sacrificial gate dielectric layer 230 is formed over the upper portions 25 of the fin structures. The second recess openings 225 are subsequently filled with a conductive material to form a sacrificial conductive layer 235. In some embodiments, the second conductive layer 235 is a sacrificial gate electrode layer, which will be subsequently removed.

The sacrificial gate dielectric layer 230 includes one or more layers of insulating material, such as a silicon oxide-based material. In one embodiment, silicon oxide formed by CVD is used. The thickness of the sacrificial gate dielectric layer 230 is in a range from about 1 nm to about 5 nm in some embodiments.

The sacrificial gate dielectric layer 230 and sacrificial gate electrode layer 235 form a sacrificial gate structure. The sacrificial gate structure is formed by first blanket depositing the sacrificial gate dielectric layer over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD; PVD; ALD, or other suitable process. Subsequently, a first upper insulating layer 240 is formed over the sacrificial gate electrode layer 90. The first upper insulating layer 240 may be formed by CVD, PVD, ALD, or other suitable process.

Next, a patterning operation is performed on the upper insulating layer 240 using suitable photolithographic and etching operations. The pattern in the upper insulating layer 240 is subsequently transferred to the sacrificial gate electrode layer 235 and the sacrificial gate dielectric layer 230 using suitable etching operations, as shown in FIGS. 35A-35E. The etching operations form openings 245 extending in the Y direction that expose the source/drain regions. The etching operations also form gate cut openings 250 extending in the X direction across the sacrificial gate structures. The etching operations removes the sacrificial gate electrode layer 235 and the sacrificial gate dielectric layer 230 in the exposed areas, thereby leaving a sacrificial gate structure overlying the channel region of the semiconductor device. The sacrificial gate structure includes the sacrificial gate dielectric layer 230, the remaining sacrificial gate electrode layer 235 (e.g., polysilicon).

After the sacrificial gate structure is formed, one or more sidewall spacer layers 255 is formed over the exposed fin structures 15 and the sacrificial gate structures 230, 235, as shown in FIGS. 36A-36E. The sidewall spacer layer 255 is deposited in a conformal manner in some embodiments so as to form to have substantially equal thicknesses on vertical surfaces, such as the sidewalls, horizontal surfaces, and the top of the sacrificial gate structure, respectively. In some embodiments, the sidewall spacer layer 255 has a thickness in a range from about 2 nm to about 20 nm, in other embodiments, the sidewall spacer layer 255 has a thickness in a range from about 5 nm to about 15 nm.

Figure 36E:
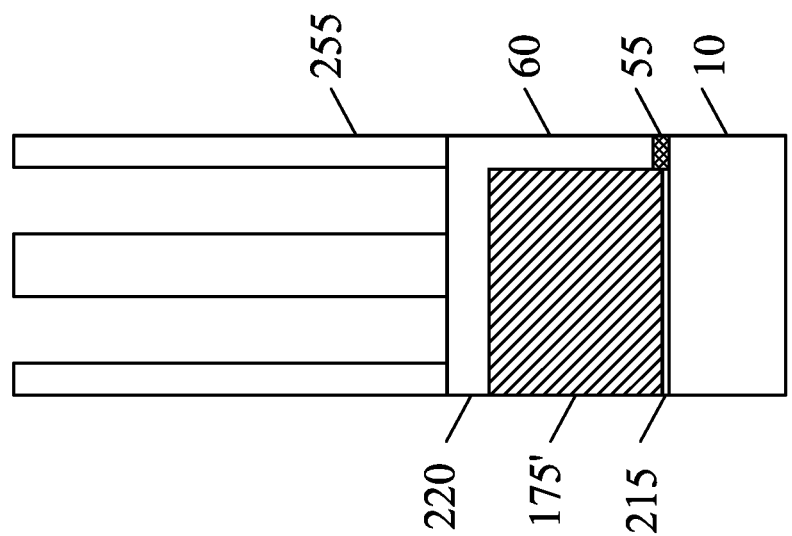
Figure 36D:
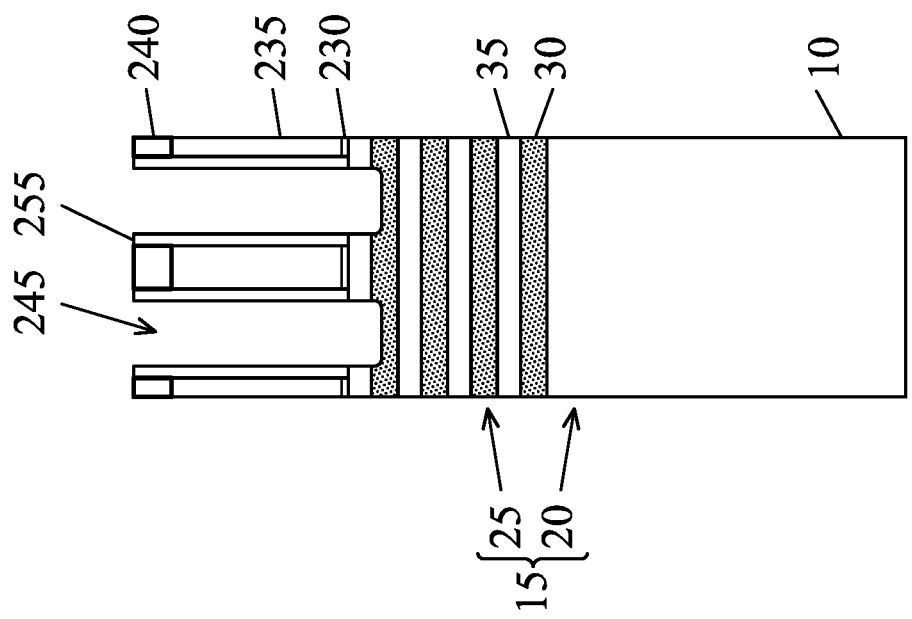
Figure 37B:
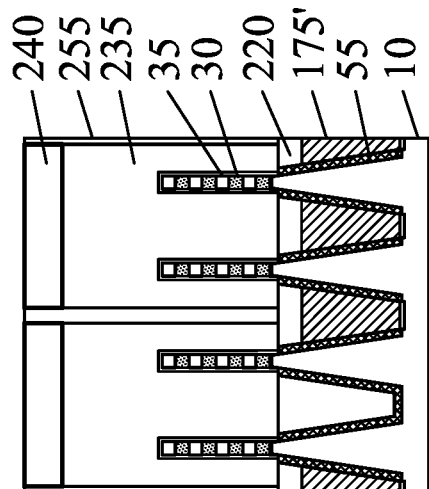
FIGS. 37A-37E show views of one of the various stages of manufacturing a GAA FET semiconductor device according to embodiments of the present disclosure.
Figure 37C:
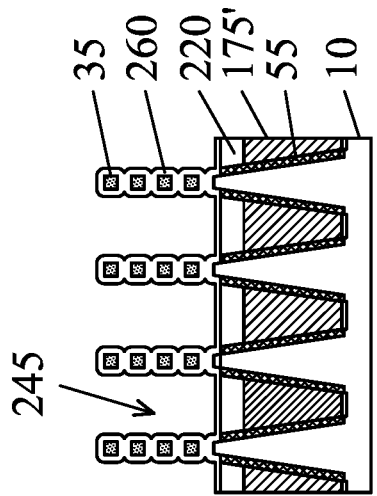
Figure 37A:
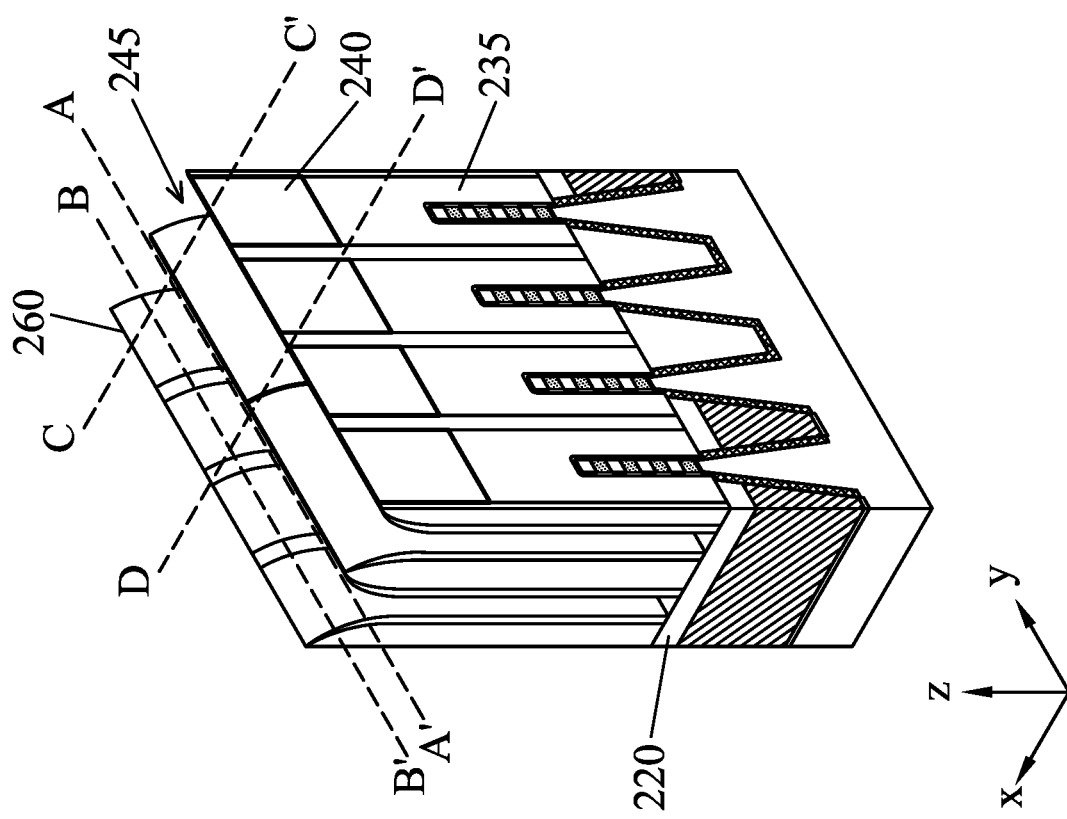
Figure 37E:
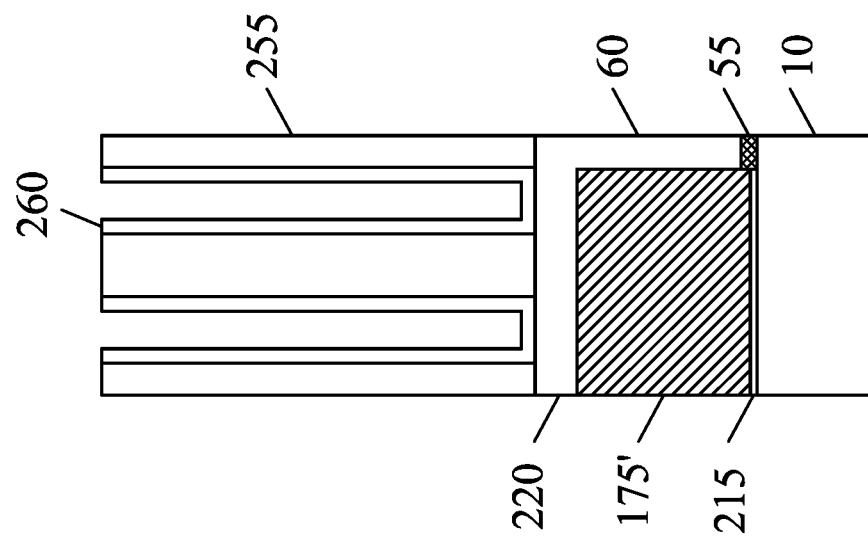
Figure 37D:
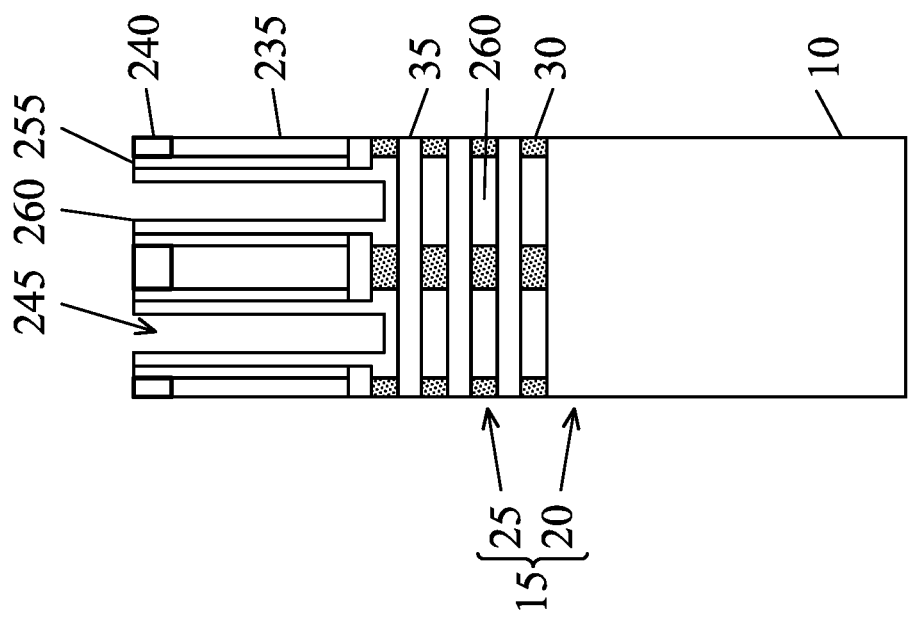
Figure 40E:
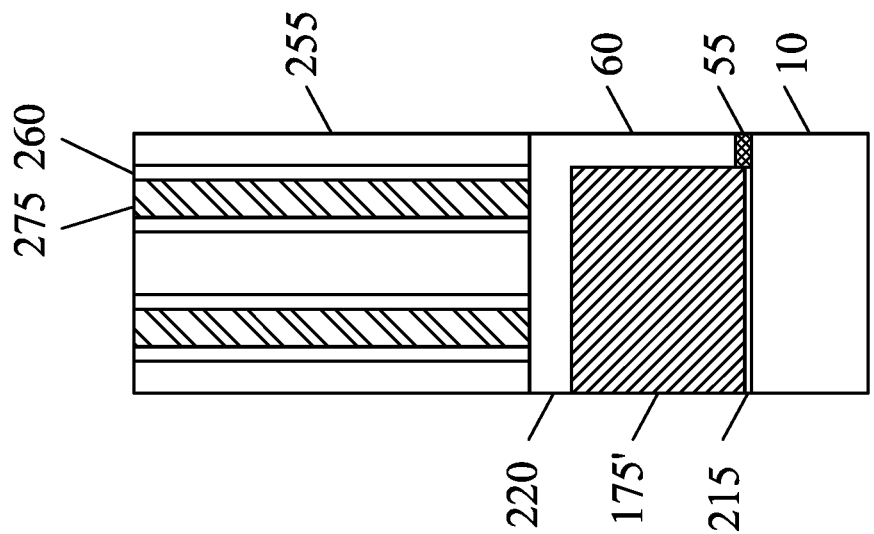
Figure 40D:
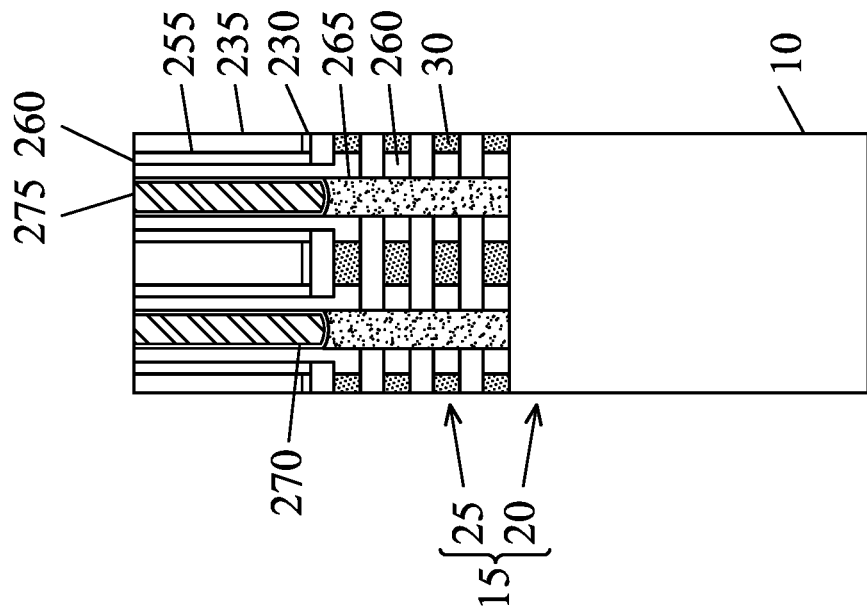
Figure 41B:
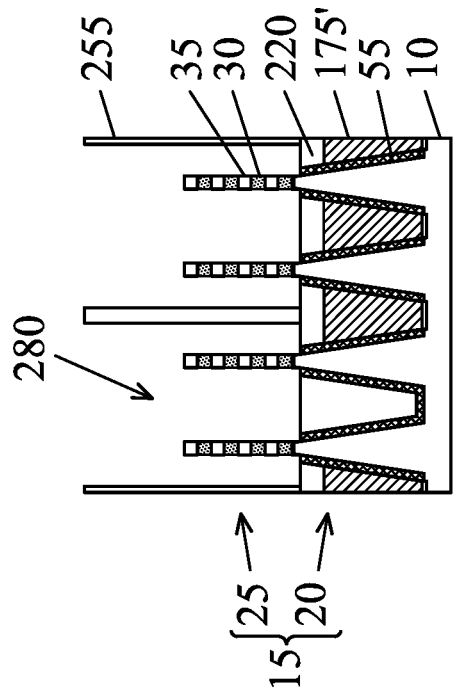
FIGS. 41A-41E show views of one of the various stages of manufacturing a GAA FET semiconductor device according to embodiments of the present disclosure.
Figure 41C:
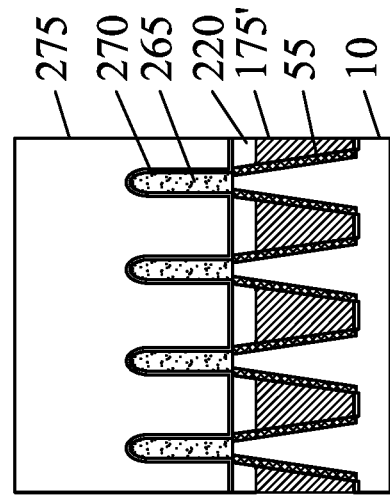
Figure 41A:
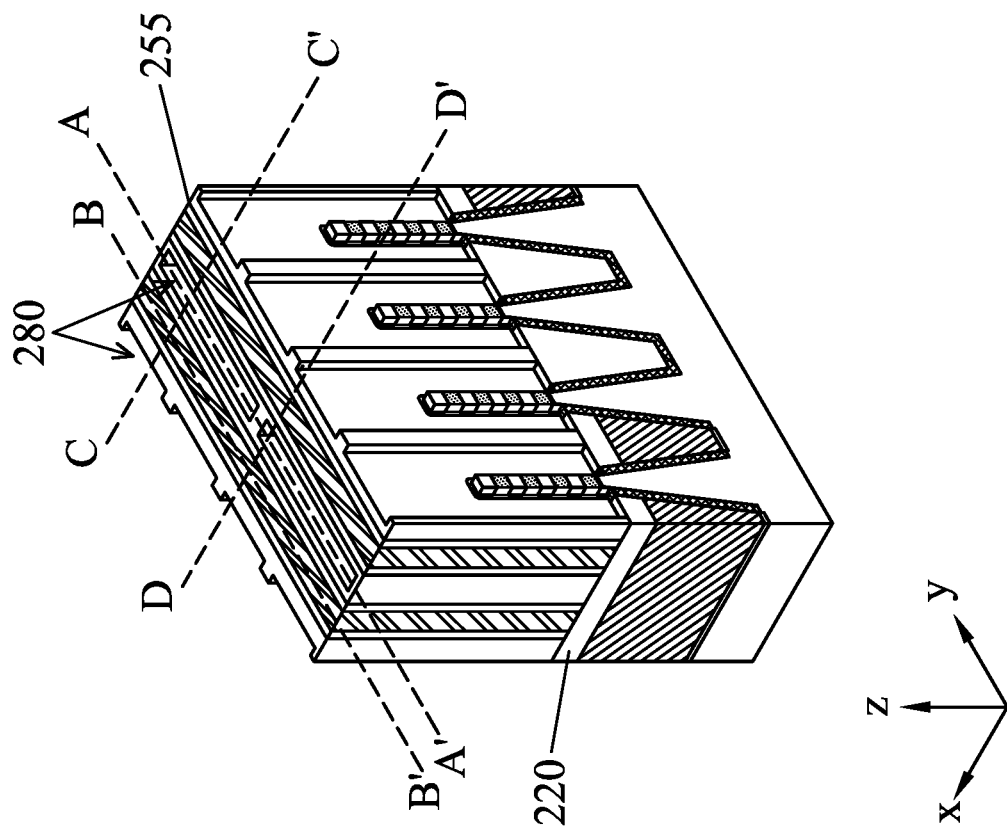
Figure 41E:
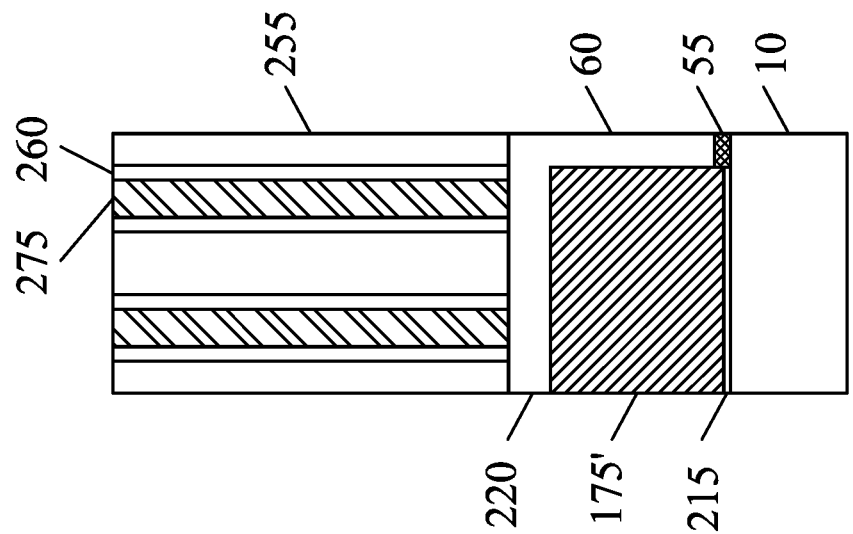
Figure 41D:
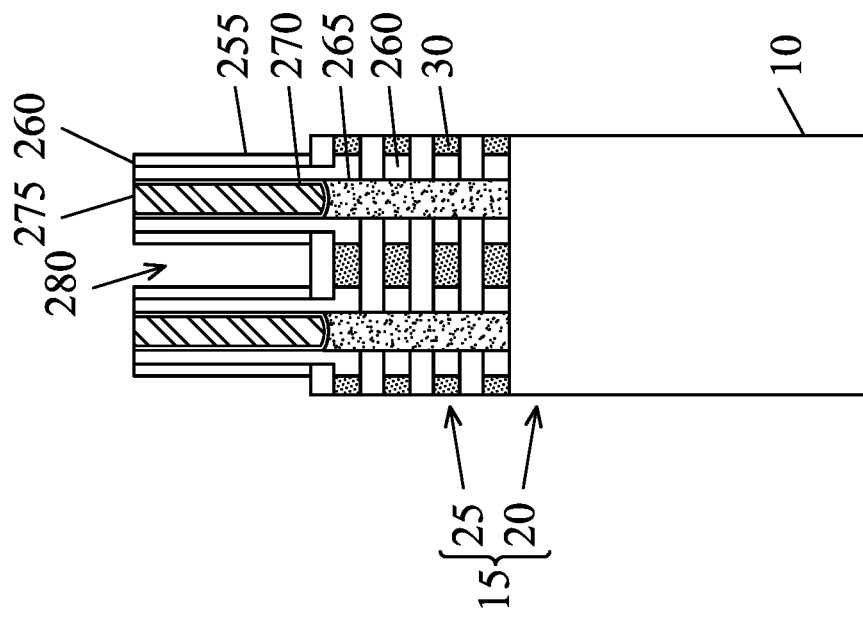
Figure 42B:
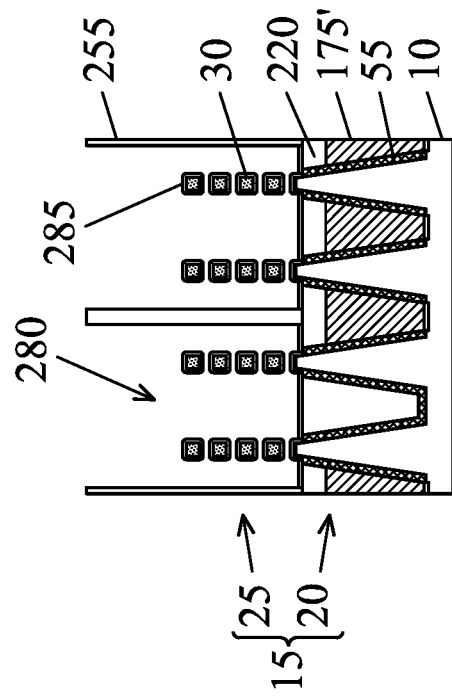
FIGS. 42A-42E show views of one of the various stages of manufacturing a GAA FET semiconductor device according to embodiments of the present disclosure.
Figure 42C:
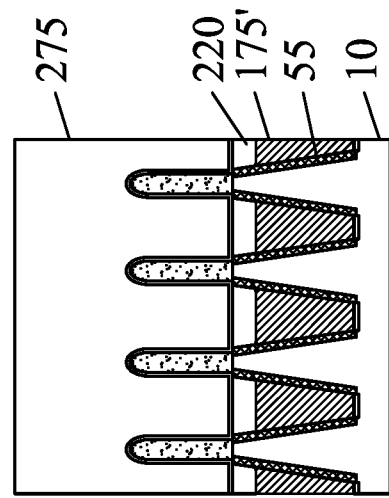
Figure 42A:
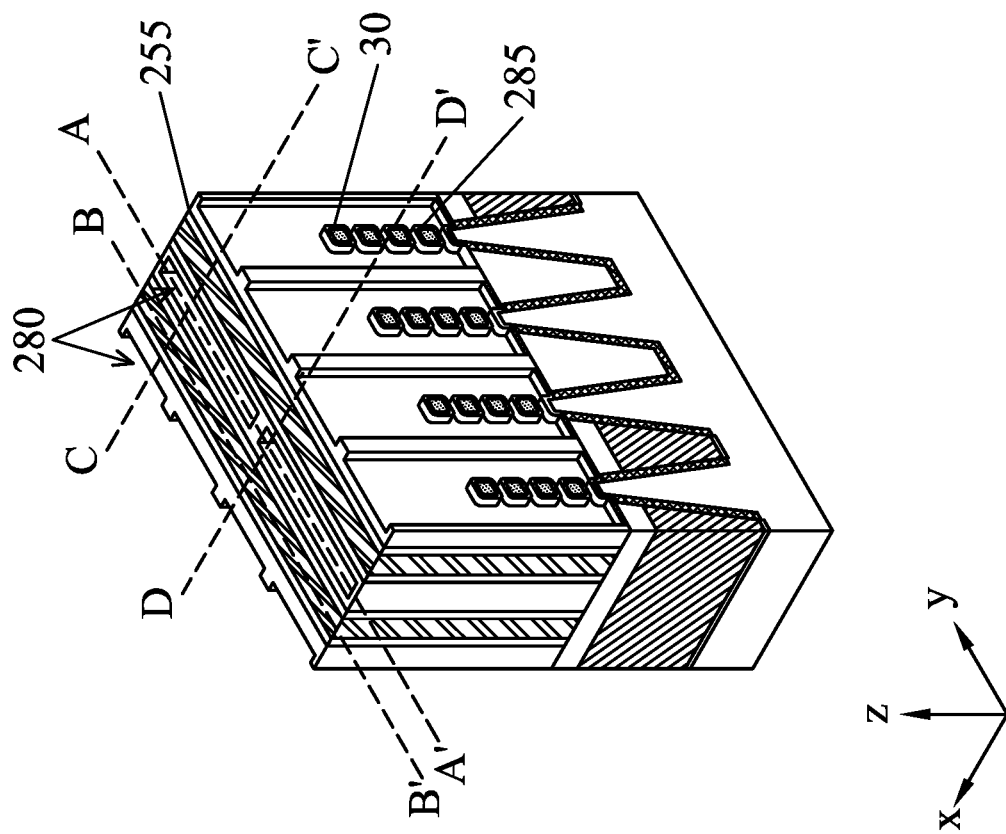
Figure 42E:
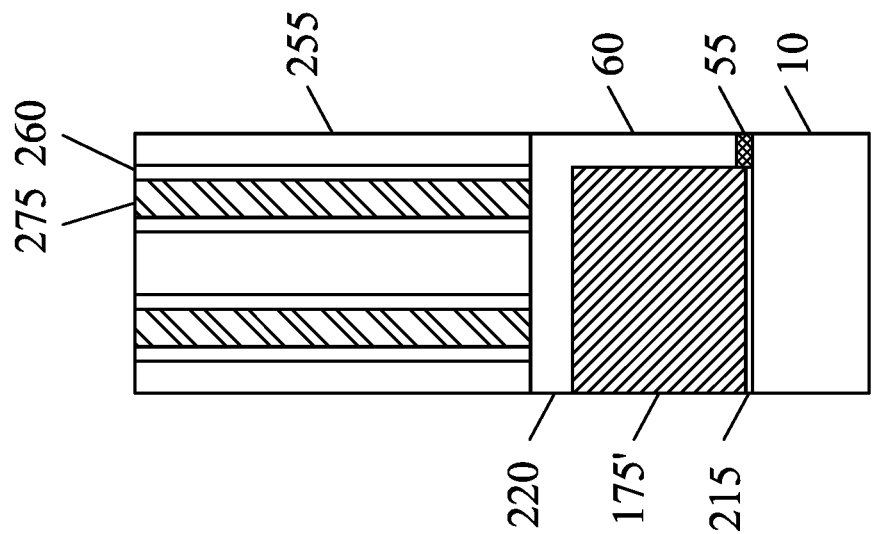
Figure 42D:
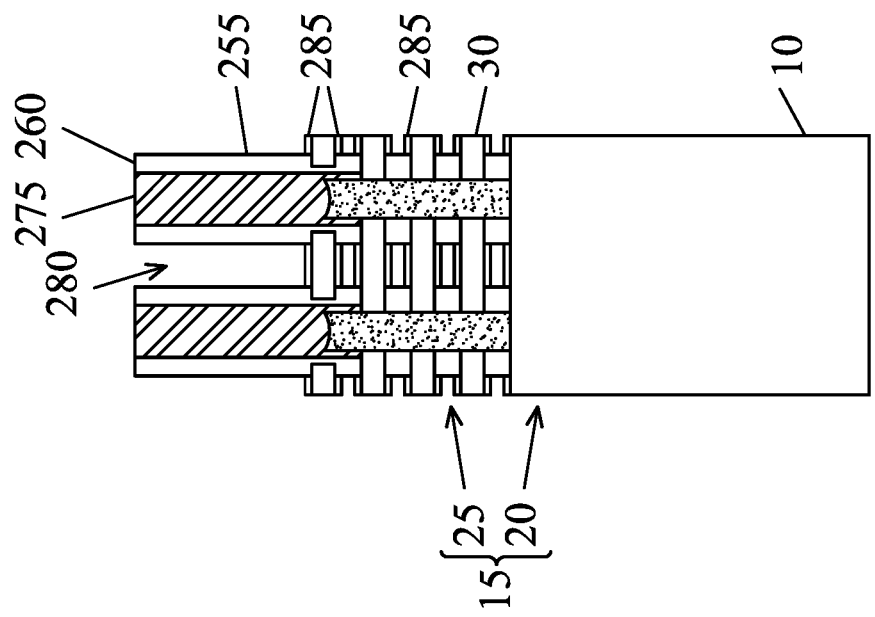
Figure 43E:
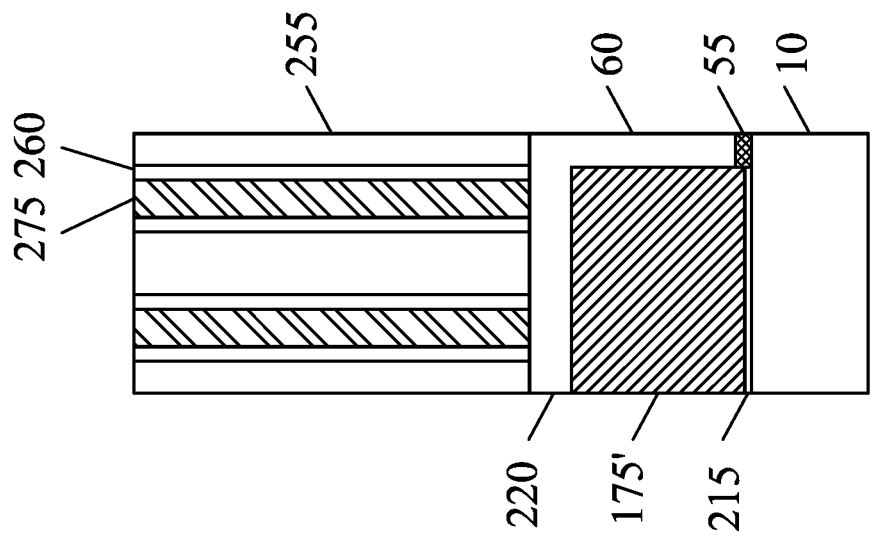
Figure 43D:
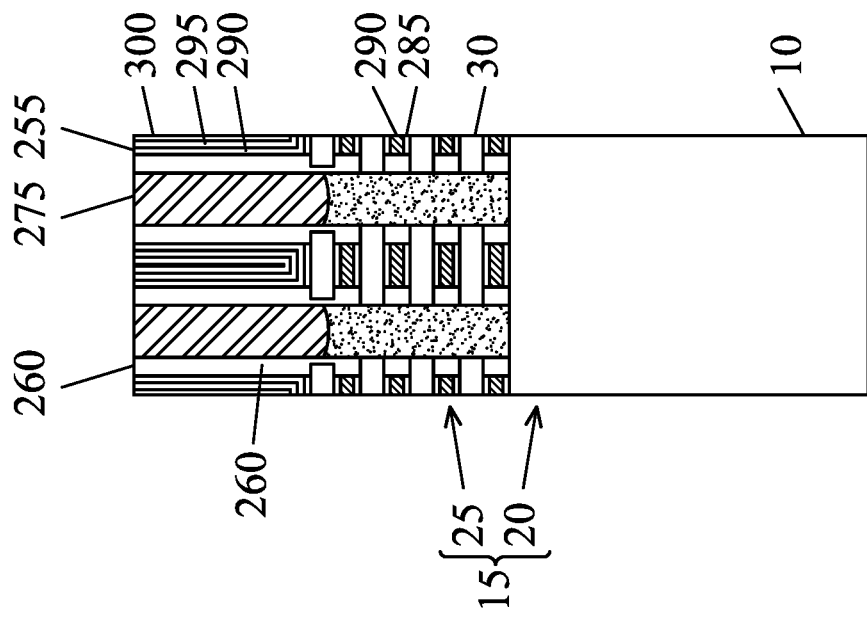
Figure 44B:
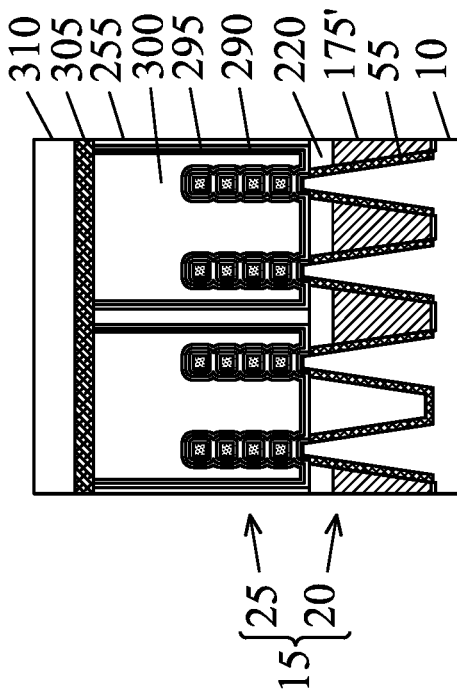
FIGS. 44A-44E show views of one of the various stages of manufacturing a GAA FET semiconductor device according to embodiments of the present disclosure.
Figure 44C:
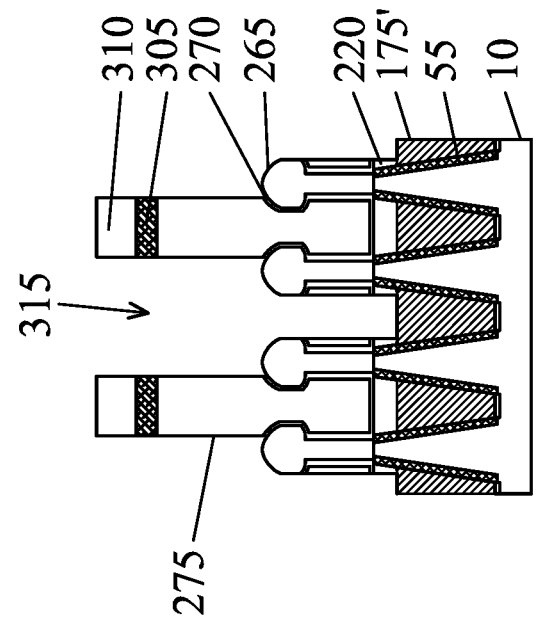
Figure 44A:
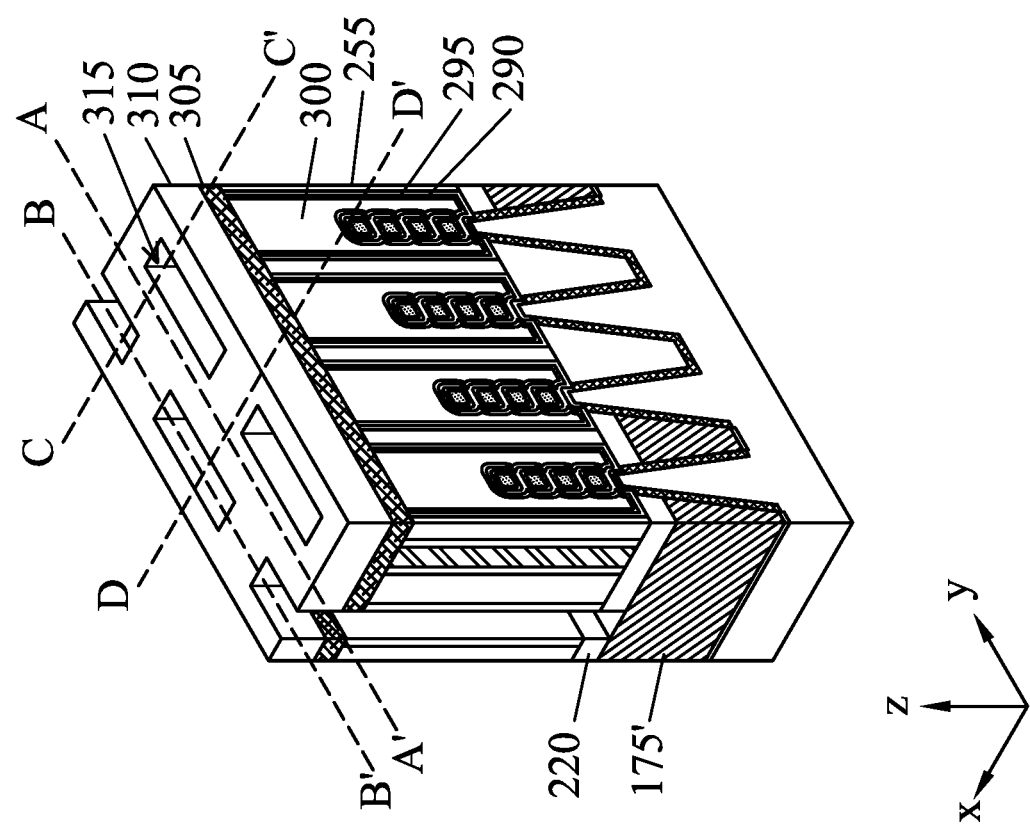
Figure 44E:
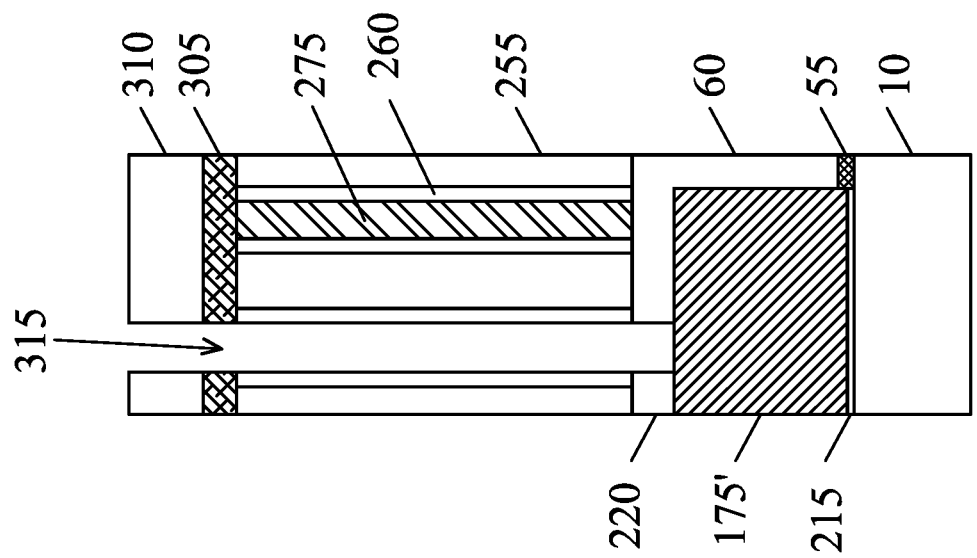
Figure 44D:
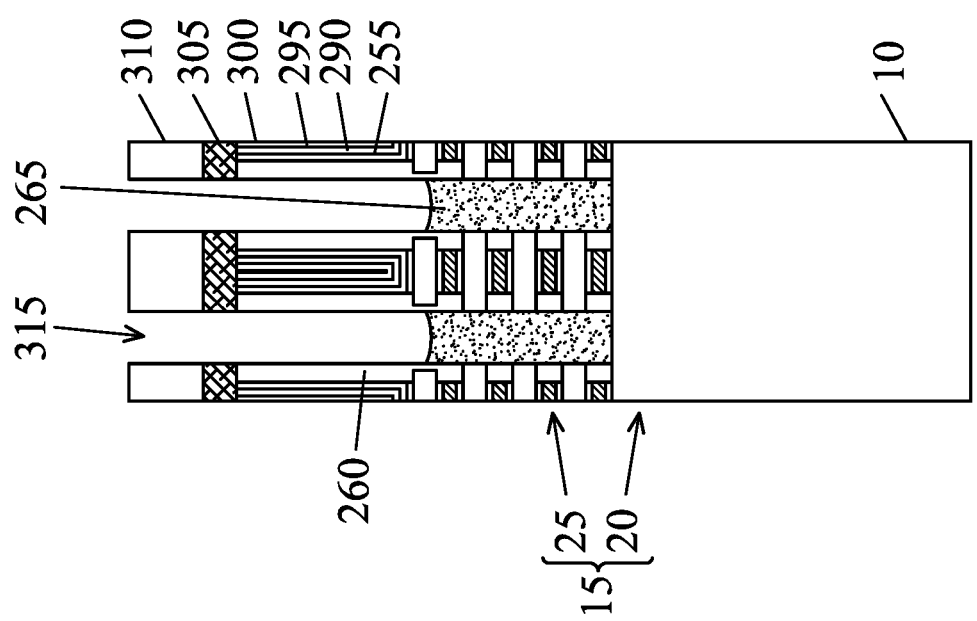
Figure 45E:
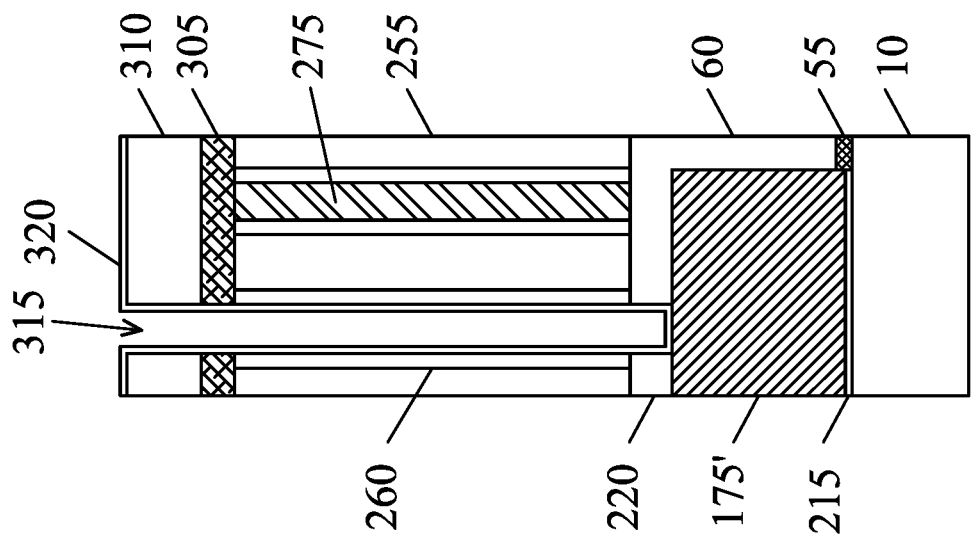
Figure 45D:
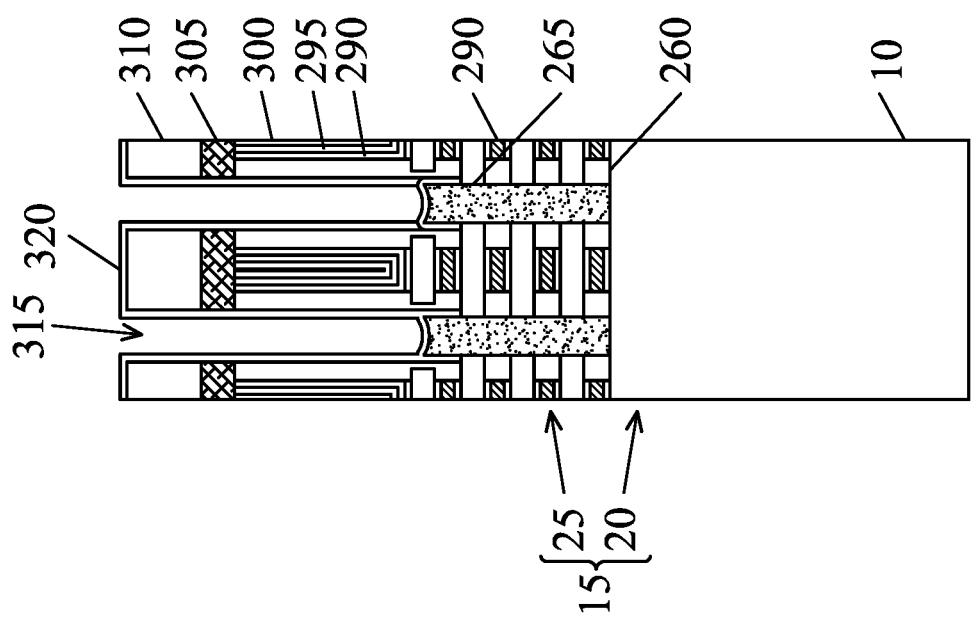
Figure 46B:
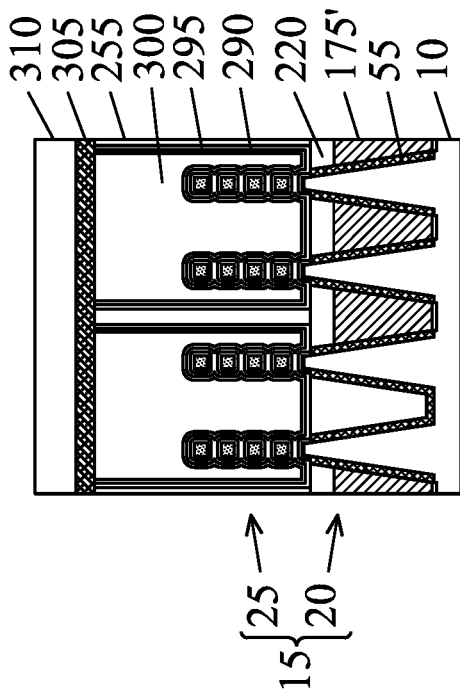
FIGS. 46A-46E show views of one of the various stages of manufacturing a GAA FET semiconductor device according to embodiments of the present disclosure.
Figure 46C:
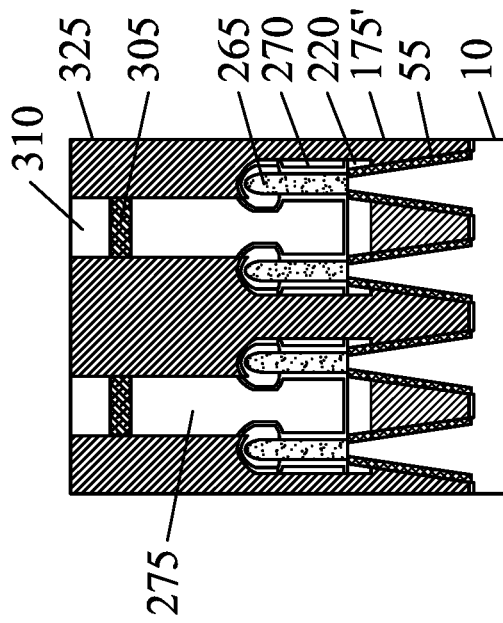
Figure 46A:
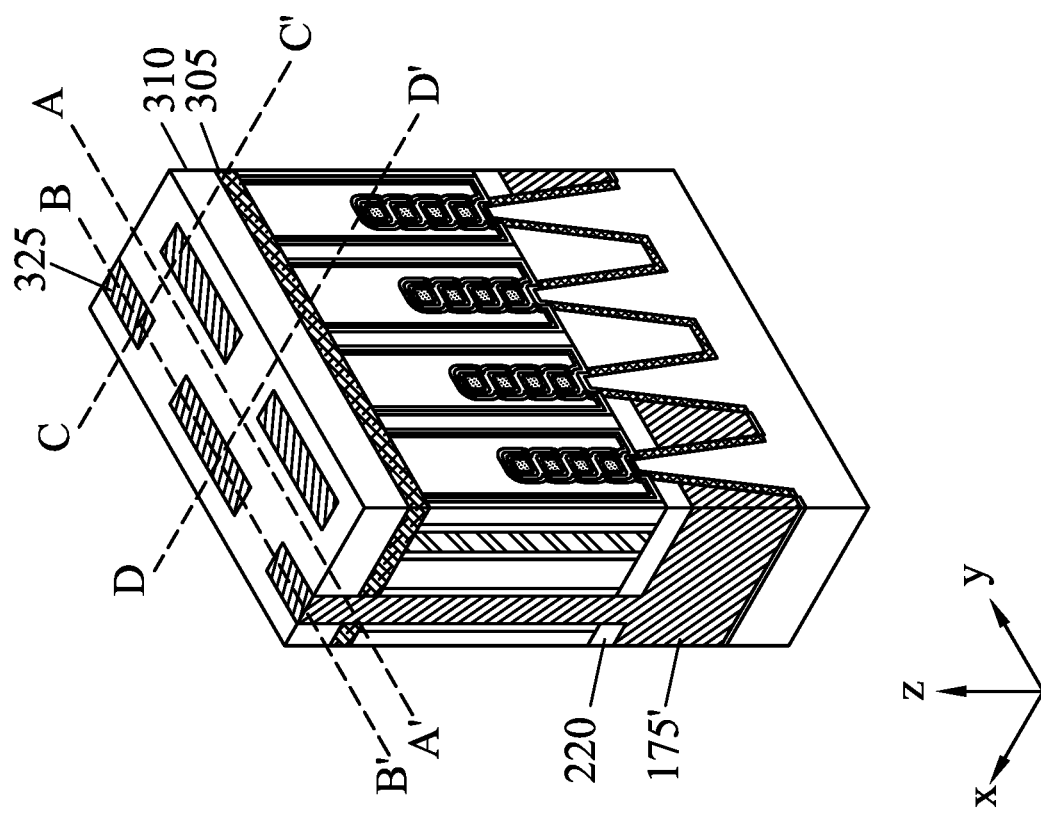
Figure 46E:
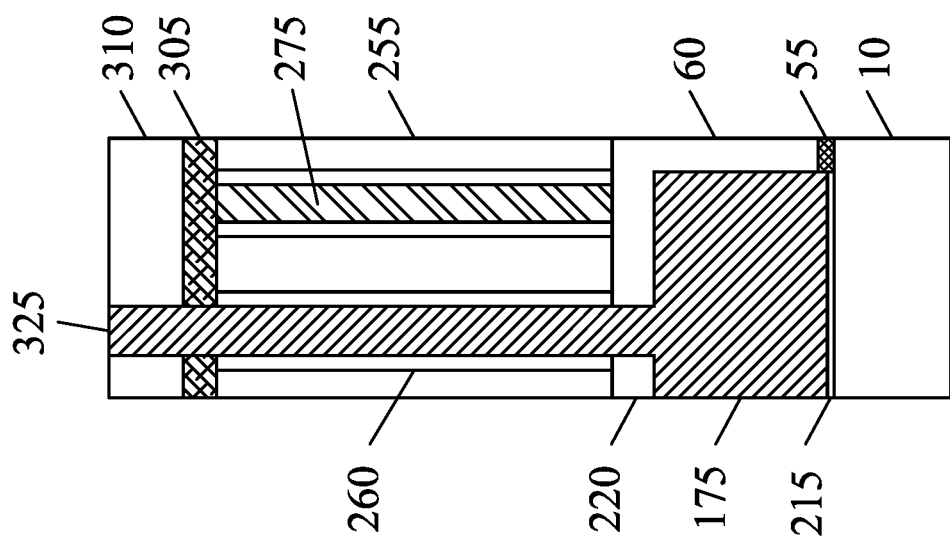
Figure 46D:
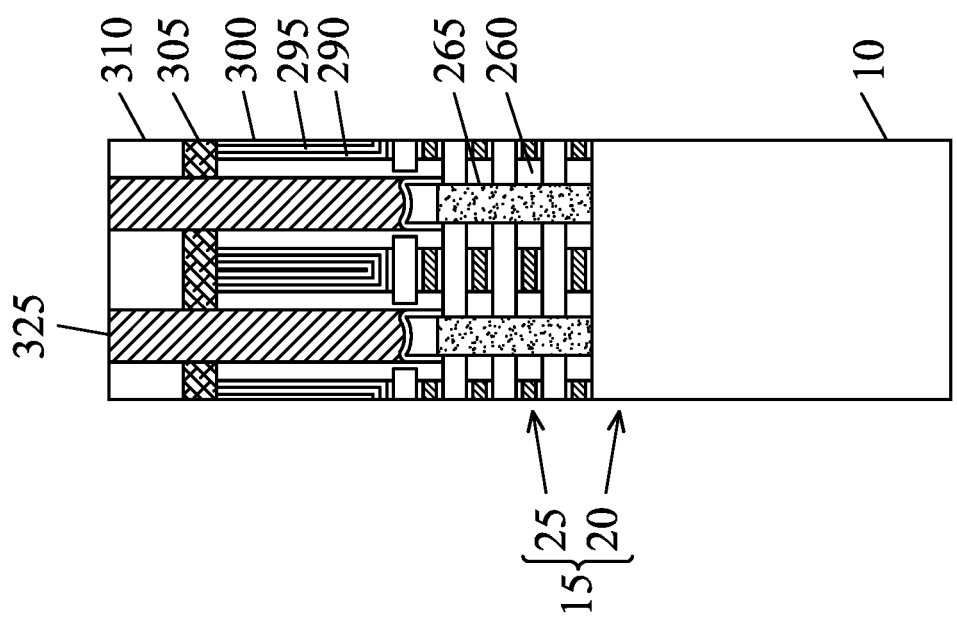

In some embodiments, the sidewall spacer layer 255 includes a first sidewall spacer layer and a second sidewall spacer layer. The first sidewall spacer layer may include an oxide, such as silicon oxide or any other suitable dielectric material, and the second sidewall spacer layer may include one or more of $Si_3N_4$, SiON, and SiCN or any other suitable dielectric material. The first sidewall spacer layer and the second sidewall spacer layer are made of different materials in some embodiments so they can be selectively etched. The first sidewall spacer layer and the second sidewall spacer layer can be formed by ALD or CVD, or any other suitable method. In some embodiments, the sidewall spacer layer 255 substantially fills the gate cut openings 250. Then, as shown in FIGS. 36A-36E, the sidewall spacer layer 225 is subjected to anisotropic etching to remove the sidewall spacer layer formed over the upper insulating layer 240 and the source/drain regions of the fin structures 15, and the second insulating material layer 220. In some embodiments, an upper portion of the sidewall spacer layer 255 is removed by a suitable etching operation to expose a portion of the upper insulating layer 240. In some embodiments, a portion of the uppermost first semiconductor layer 30 and second semiconductor layer 35 may be removed during the etching operations, as shown in FIG. 36D.

Next, the first semiconductor layers 30 in the source/drain regions of the fin structures 15 are removed using a suitable etching operation, as shown in FIGS. 37A-37E. The first semiconductor layers 30 and the second semiconductor layers 35 are made of different materials having different etch selectivities. Therefore, a suitable etchant for the first semiconductor layer 30 does not substantially etch the second semiconductor layer 35. For example, when the first semiconductor layers 30 are Si and the second semiconductor layers 35 are Ge or SiGe, the first semiconductor layers 30 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. On the other hand, when the first semiconductor layers 30 are SiGe or Ge and the second semiconductor layers 35 Si, the first semiconductor layers 30 can be selectively removed using a wet etchant such as, but not limited to, $HF:HNO_3$ solution, $HF:CH_3COOH:HNO_3$, or $H_2SO_4$ solution and $HF:H_2O_2:CH_3COOH$. In some embodiments, a combination of dry etching techniques and wet etching techniques are used to remove the first semiconductor layers 30.

After removing the first semiconductor layers 30 in the source/drain regions an inner spacer layer 260 is formed over the sidewall spacer layer 255, second semiconductor layers 35 in the source/drain regions, the upper insulating layer 240, and the second insulating material layer 220, as shown in FIGS. 37A-37E. The inner spacer layer 260 is deposited in a conformal manner, and wraps around the second semiconductor layers 35. In some embodiments, the inner spacer layer 260 has a thickness in a range from about 2 nm to about 20 nm, in other embodiments, the inner spacer layer 260 has a thickness in a range from about 5 nm to about 15 nm. In some embodiments, the inner spacer layer 260 substantially fills the space between adjacent second semiconductor layers 35. In some embodiments, the inner spacer layer 260 includes an oxide, such as silicon oxide or a nitride, such as $Si_3N_4$, SiON, and SiCN, or any other suitable dielectric material, including aluminum oxide. The inner spacer layer 260 can be formed by ALD or CVD, or any other suitable process.

Next, the inner spacer layer 260 and second semiconductor layers 35 are recess etched using a suitable etching operation extending the openings 245, as shown in FIGS. 38A-38E. As shown in FIG. 38D, the recess etch extends through the second semiconductor layers 35 in some embodiments. In another embodiment, the second semiconductor layers 35 are not etched, and only the inner spacer layer 260 is etched, as shown in FIG. 38F. FIG. 38F is a cross-sectional view taken along line C-C' of the FIG. 38A.

Subsequently, a source/drain epitaxial layer 265 is formed in the openings 245, as shown in FIGS. 39A-39E. The source/drain epitaxial layer 265 includes one or more layers of Si, SiP, SiC and SiCP for an n-channel FET or Si, SiGe, Ge for a p-channel FET. For the P-channel FET, boron (B) may also be contained in the source/drain. The source/drain epitaxial layers 265 are formed by an epitaxial growth method using CVD, ALD or molecular beam epitaxy (MBE). As shown in FIG. 39C, the source/drain epitaxial layers 265 grow on the fin structures. In another embodiment, the source/drain epitaxial layers 265 wrap around the second semiconductor layers 25, as shown in FIG. 39F. FIG. 39F is a cross-sectional view taken along line C-C' of FIG. 39A. In some embodiments, the grown source/drain epitaxial layers 265 on adjacent fin structures merge with each other. In some embodiments, the source/drain epitaxial layer 265 has a diamond shape, a hexagonal shape, other polygonal shapes, or a semi-circular shape in cross section.

Subsequently, a contact etch stop layer (CESL) 270 is formed on the source/drain layer 265 and sidewalls of the openings 245 and then an interlayer dielectric (ILD) layer 275 is formed substantially filling the openings 245 over the source/drain regions, as shown in FIGS. 40A-40E. The CESL 270 overlying the source/drain regions has a thickness of about 1 nm to about 15 nm in some embodiments. The CESL 270 may include $Si_3N_4$, SiON, SiCN or any other suitable material, and may be formed by CVD, PVD, or ALD. The materials for the ILD layer 275 include compounds comprising Si, O, C, and/or H, such as silicon oxide, SiCOH and SiOC. Organic materials, such as polymers, may be used for the ILD layer 275. After the ILD layer 275 is formed, a planarization operation, such as chemical-mechanical polishing (CMP), is performed, so that the top portion of the sacrificial gate electrode layer 235 is exposed. The CMP also removes a portion of the sidewall spacer layer 255, and the upper insulating layer 240 covering the upper surface of the sacrificial gate electrode layer 235.

Then, the sacrificial gate electrode layer 235 and sacrificial gate dielectric layer 230 are removed, thereby forming a gate space 280, in which the channel regions 25 of the fin structures 15 are exposed, as shown in FIGS. 41A-41E. The ILD layer 275 protects the source/drain layers 265 during the removal of the sacrificial gate structures. The sacrificial gate electrode layer 235 and sacrificial gate dielectric layer 230 can be removed using plasma dry etching and/or wet etching. When the sacrificial gate electrode layer 235 is polysilicon and the ILD layer 275 is silicon oxide, a wet etchant such as a tetramethylammonium hydroxide (TMAH) solution can be used to selectively remove the sacrificial gate electrode layer 235.

Adverting to FIGS. 42A-42E, the first semiconductor layers 30 are removed in the channel regions 25 of the fin structure 15 using a suitable etching operation to form a semiconductor nanowires made of the second semiconductor layers 35. The first semiconductor layers 30 and the second semiconductor layers 35 are made of different materials having different etch selectivities. Therefore, a suitable etchant for the first semiconductor layer 30 does not substantially etch the second semiconductor layer 35. For example, when the first semiconductor layers 30 are Si and the second semiconductor layers 35 are Ge or SiGe, the first semiconductor layers 30 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. On the other hand, when the first semiconductor layers 30 are SiGe or Ge and the second semiconductor layers 35 Si, the first semiconductor layers 30 can be selectively removed using a wet etchant such as, but not limited to, $HF:HNO_3$ solution, $HF:CH_3COOH:HNO_3$, or $H_2SO_4$ solution and $HF:H_2O_2:CH_3COOH$. In some embodiments, a combination of dry etching techniques and wet etching techniques are used to remove the first semiconductor layers 30.

The cross sectional shape of the semiconductor nanowires 35 in the channel region 25 are shown as rectangular, but can be any polygonal shape (triangular, diamond, etc.), polygonal shape with rounded corners, circular, or oval (vertically or horizontally).

After the semiconductor nanowires of the second semiconductor layers 30 are formed, a gate dielectric layer 285 is formed around each of the channel region nanowires 30, as shown in FIGS. 42A-42E. In certain embodiments, the gate dielectric layer 285 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 285 includes an interfacial layer formed between the channel layers and the dielectric material. In some embodiments, the gate dielectric layer 285 is also formed on exposed portions of the second insulating material layer 220.

The gate dielectric layer 285 may be formed by CVD, ALD, or any suitable method. In one embodiment, the gate dielectric layer 285 is formed using a highly conformal deposition process such as ALD in order to ensure the formation of a gate dielectric layer having a uniform thickness around each channel layers. The thickness of the gate dielectric layer 285 is in a range from about 1 nm to about 6 nm in some embodiments.

After the gate dielectric layer 285 is formed, a gate electrode layer 300 is formed over the gate dielectric layer 285 in the gate space 280, in some embodiments, as shown in FIGS. 43A-43E. The gate electrode layer 300 is formed on the gate dielectric layer 285 to surround each nanowire 25. The material used to form the gate electrode layer 300 is the same as the material used tor form the power rails 175' in some embodiments.

The gate electrode layer 300 includes one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 300 may be formed by CVD, ALD, electro-plating, or other suitable method. The gate electrode layer 300 is also deposited over the upper surface of the ILD layer 275 in some embodiments, and then the portion of the gate electrode layer formed over the ILD layer 275 is planarized by using, for example, CMP, until the top surface of the ILD layer 275 is revealed.

In some embodiments of the present disclosure, one or more barrier layers 290 are interposed between the gate dielectric layer 285 and the gate electrode 300. The barrier layer 290 is made of a conductive material such as a single layer of TiN or TaN or a multilayer of both TiN and TaN.

In some embodiments of the present disclosure, one or more work function adjustment layers 295 are interposed between the gate dielectric layer 285 or barrier layer 290 and the gate electrode layer 300. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For an n-channel FET, one or more of TaN, TaAlC, TiN, TiC, Co, TiAl, HfTi, TiSi and TaSi is used as the work function adjustment layer, and for a p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers as the gate electrode layer 300.

A metal etch stop layer (MESL) 305 and cap insulating layer 310 are subsequently formed over the ILD layer 275 and the gate electrode layer 300, as shown in FIGS. 44A-44E. The cap insulating layer 310 is formed over the MESL 305.

Contact holes 315 are formed in the cap insulating layer 310 using suitable photolithographic and etching techniques. The contact holes 315 are extended into the MESL 305 and ILD layer 275 by using dry etching. Suitable etching operations are further used to extend the contact holes through the second insulating material layer 220, and any of the CESL 270, gate dielectric layer 285, barrier layer 290, and work function adjustment layer 295 to expose the power rails 175'. The etching operations also removes the CESL 270 covering the source/drain layers 265, thereby exposing the source/drain layers 265. In some embodiments, the upper portion of the source/drain regions 265 is also etched.

In some embodiments, a metal layer 320 is deposited over the device, including the cap insulating layer 310, MESL 305, ILD layer 275, source/drain layer 265, and the power rails 175', as shown FIGS. 45A-45E. The metal layer 320 is one or more layer of W, Co, Ni, Ti, Mo, and Ta in some embodiments. In some embodiments, the metal layer 320 includes a metal layer selected from W, Co, Ni, Ti, Mo, and Ta; and a metal nitride layer selected from tungsten nitride, cobalt nitride, nickel nitride, titanium nitride, molybdenum nitride, and tantalum nitride. The semiconductor device is then subjected to a rapid thermal anneal, whereby the portion of the metal layer 320 over the source/drain layer 265 reacts with silicon in the source/drain layer 265 to form a metal silicide layer 340. In some embodiments, the metal silicide layer 340 formed over the source/drain layer 265 includes one or more of WSi, CoSi, NiSi, TiSi, MoSi, and TaSi.

Then, in some embodiments the unreacted metal layer 320, including the metal layer and/or the metal nitride layer is removed from the contact holes 315, and the cap insulating layer 310. The unreacted metal layer 320 can be removed by a suitable etching operation. After removing the unreacted metal layer 320, a conductive material is formed in the contact holes 315 to form a conductive contact 325, as shown in FIGS. 46A-46E. The conductive material includes one or more of Co, Ni, W, Ti, Ta, Cu, Al, TiN, and TaN. The conductive contact 325 may be formed by CVD, ALD, electro-plating, or other suitable method. The conductive material is also deposited over the upper surface of the cap insulating layer 310 in some embodiments, and then the portion of the conductive contact 325 formed over the cap insulating layer 310 is planarized by using, for example, CMP, until the top surface of the cap insulating layer 310 is revealed.

FIGS. 47A-51B illustrate several embodiments of semiconductor device structures that can be formed according to the disclosed methods of manufacturing a semiconductor device.

Figure 47B:
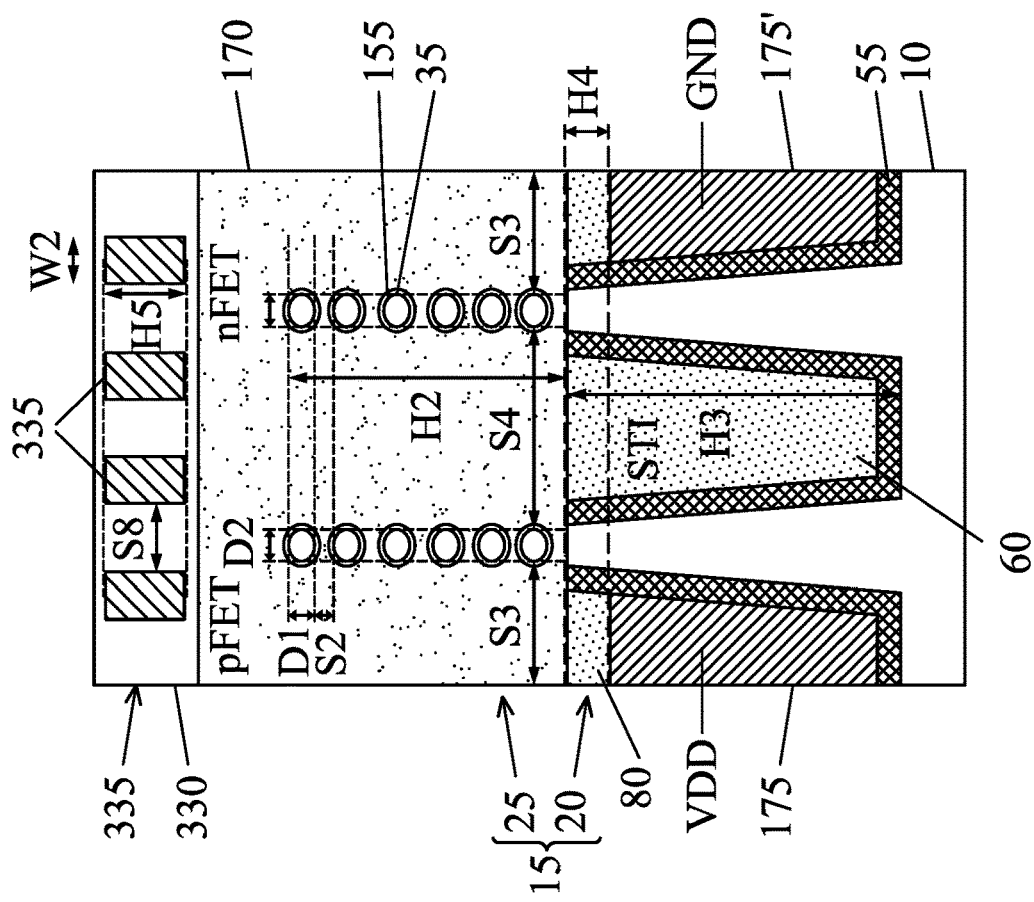
FIG. 47B is a cross-sectional view taken along line E-E' of FIG. 47A.
Figure 47A:
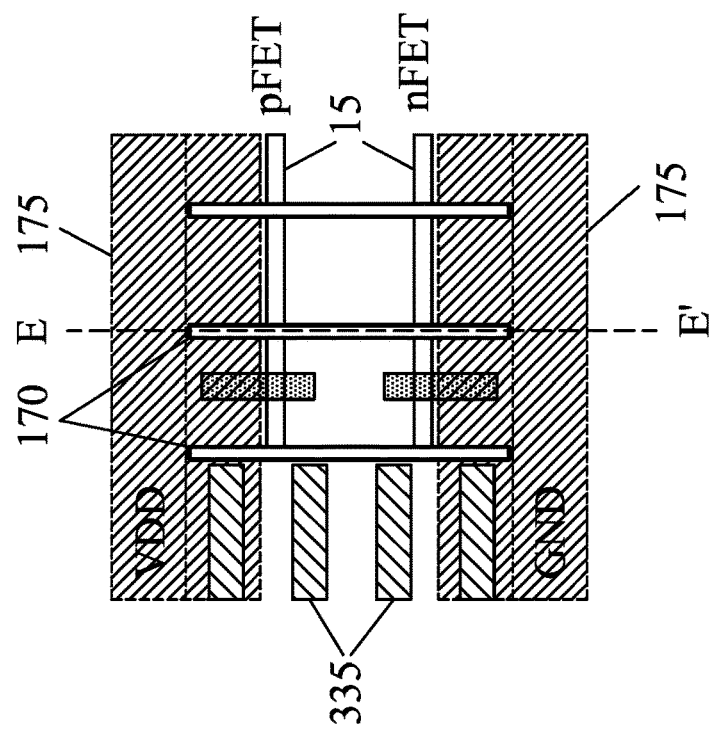
FIG. 47A is a plan view of a semiconductor device according to an embodiment of present disclosure.

FIG. 47A is a plan view of a semiconductor device according to an embodiment of present disclosure. FIG. 47B is a cross-sectional view taken along line E-E' of FIG. 47A, and showing the placement of signal lines 335 in a metallization layer 355 overlying the active device.

FIG. 47A is a schematic plan view of a semiconductor device according to an embodiment of present disclosure showing the relative placement of the power rails 175, signal lines 335, gate electrodes 170, and fin structures 15. As shown in FIGS. 47A and 47B, a metallization layer 355 including signal lines 335 embedded in an insulating layer 330 is formed overlying the semiconductor device active regions. The metallization layers may be formed by suitable photolithography, etching, and material deposition operations. The insulating layer 330 may be made of silicon oxide, silicon nitride, silicon oxide-based material, or silicon nitride-based material. The insulating layer 330 may be formed by CVD, PVD, ALD, or other suitable method. The signal lines 335 include one or more of Co, Ni, W, Ti, Ta, Cu, Al, TiN, and TaN. The signal lines 335 may be formed by CVD, ALD, electro-plating, or other suitable method. In some embodiments, the signal lines 335 include W or Cu. As shown in FIG. 47B the metallization layer 355 is shown directly over the gate electrode layer 170, however, in some embodiments additional layers are located between the gate electrode 170 layer and the metallization layer 355.

Power rails 175 are located between the well regions 20 of adjacent fin structures 15. One of the power rails 175 is a positive voltage rail (VDD) and the other is a ground rail (GND). By locating the power rails below the active region of the semiconductor device between the lower portions 20 of the fin structures 15, additional signal lines 335 can be formed overlying the active region of the semiconductor device. For example, if the power rails were located in the same layer as the signal lines there may be room for only three signal lines. However, by locating the power rails below the active region, four signal lines can be provided instead of only three.

In some embodiments of the disclosure, a complementary metal oxide semiconductor field effect transistor (CMOS-FET) is provided with a pFET and nFET formed on the same substrate 10. As illustrated, the pFET and nFET include a stack of six nanowires 35, but the disclosure is not limited to stacked structures of six nanowires. The pFET and nFET fin structures 15 are separated by an insulating layer 60, also known as a shallow trench isolation (STI). The nanowires 35, are shown as circular in cross section, but the disclosure is not limited to circular cross-section nanowires. The nanowires 35 have thickness (diameter) D1, D2 in a range from about 2 nm to about 40 nm in some embodiments, in a range from about 3 nm to about 30 nm in other embodiments, and in a range of about 5 nm to about 10 nm in other embodiments. The nanowires are spaced apart by distance S2 of about 2 nm to about 40 nm in some embodiments, in a range from about 3 nm to about 30 nm in other embodiments, and in a range of about 5 nm to about 10 nm in other embodiments. In some embodiments, the height H2 of the nanowire stacks ranges from about 20 nm to about 100 nm, in other embodiments the height ranges from about 40 to about 80 nm. The space S4 between adjacent nanowire stacks ranges from about 20 nm to about 80 nm in some embodiments, and from about 30 nm to about 60 nm in other embodiments. In some embodiments, the nanowire stacks are spaced apart from the edge of the gate electrode 170 by a distance S3 ranging from about 5 nm to about 50 nm, and from about 10 nm to about 40 nm in other embodiments.

In some embodiments, the bottom of the gate electrode 170 is located at a height H3 from about 20 nm to about 100 nm from the bottom of the recess in the substrate 10 between adjacent fin structures 15, in other embodiments, the bottom of the gate electrode 170 is located at a height H3 of about 40 nm to about 80 nm.

In some embodiments, the power rails 175 are separated from the gate electrode 170 by an insulating layer 80 having a height H4 ranging from about 2 nm to about 20 nm, and ranging from about 5 nm to about 15 nm in other embodiments. The power rails 175 are separated from the fin structure 15 sidewalls by an insulating liner layer 55 having a thickness of about 1 nm to about 20 nm in some embodiments and a thickness of about 3 nm to about 15 nm in other embodiments. In some embodiments the thickness of the insulating liner layer 55 between the power rails 175 and the fin structure 15 is about 2 nm to about 5 nm.

In some embodiments, the signal lines 335 have a height H5 ranging from about 5 nm to about 50 nm and ranging from about 10 nm to about 25 nm in another embodiment. In some embodiments, the signal lines have a width W2 ranging from about 3 nm to about 40 nm and ranging from about 8 nm to about 20 nm in another embodiment. In some embodiments, the signal lines 335 are spaced apart from each other by a distance S8 ranging from about 5 nm to about 50 nm and ranging from about 10 nm to about 25 nm in another embodiment.

Figure 48B:
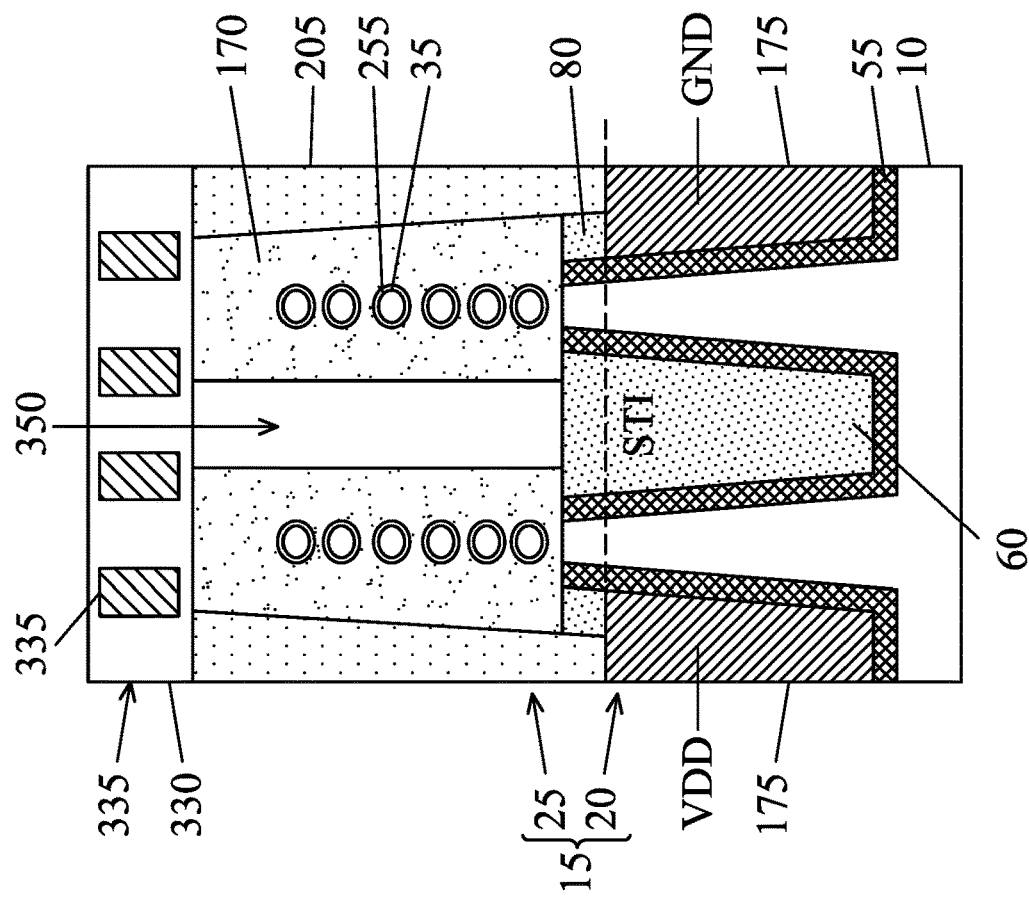
FIG. 48B is a cross-sectional view taken along line F-F' of FIG. 48A.
Figure 48A:
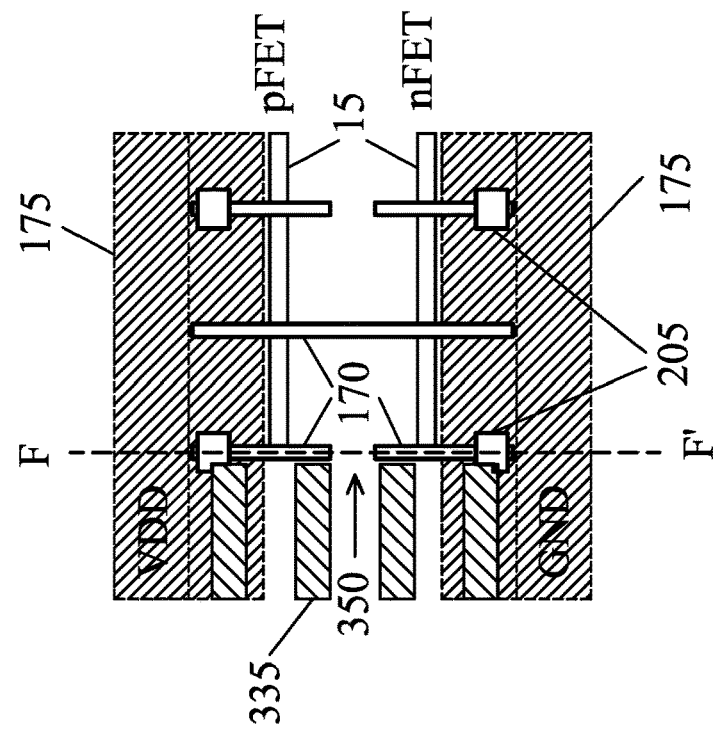
FIG. 48A is a plan view of a semiconductor device according to an embodiment of present disclosure.

FIG. 48A is a plan view of a semiconductor device according to an embodiment of present disclosure. FIG. 48B is a cross-sectional view taken along line F-F' overlying a gate electrode 170 of FIG. 48A, and showing the placement of signal lines 335 in a metallization layer 355 overlying the active device.

FIG. 48A is a schematic plan view of a semiconductor device according to an embodiment of present disclosure showing the relative placement of the power rails 175, signal lines 335, gate electrodes 170, fin structures 15, and conductive contacts 205. As shown in FIGS. 48A and 48B, a metallization layer including signal lines 335 embedded in an insulating layer 330 are formed overlying the semiconductor device active regions. The metallization layer 355 may be formed by suitable photolithography, etching, and material deposition operations. The insulating layer 330 may be made of silicon oxide, silicon nitride, silicon oxide-based material, or silicon nitride-based material. The insulating layer 330 may be formed by CVD, PVD, ALD, or other suitable method. The signal lines 335 include one or more of Co, Ni, W, Ti, Ta, Cu, Al, TiN, and TaN. The signal lines 335 may be formed by CVD, ALD, electro-plating, or other suitable method. In some embodiments, the signal lines 335 include W or Cu. As shown in FIG. 48B the metallization layer 355 is shown directly over the gate electrode layer 170, however, in some embodiments additional layers are located between the gate electrode 170 layer and the metallization layer 355.

Power rails 175 are located between the well regions 20 of adjacent fin structures 15. One of the power rails 175 is a positive voltage rail (VDD) and the other is a ground rail (GND). By locating the power rails below the active region of the semiconductor device between the lower portions 20 of the fin structures 15, additional signal lines 335 can be formed overlying the active region of the semiconductor device. For example, if the power rails were located in the same layer as the signal lines there may be room for only three signal lines. However, by locating the power rails below the active region, four signal lines can be provided instead of only three.

In some embodiments, a CMOSFET is provided where one of the nanowire stacks is a pFET and the other nanowire stack is an nFET formed on the same substrate 10. The pFET and nFET fin structures 15 are separated by an STI 60 and a gap 350 in the gate electrode 170, as shown in FIGS. 48A and 48B. In some embodiments, the conductive contacts 205 are conductive vias contacting the power rails 175 and the gate electrodes 170. Thus, in these embodiments the nFET and pFET are normally off. The conductive contacts 205 are formed a conductive material including one or more of Co, Ni, W, Ti, Ta, Cu, Al, TiN, and TaN. In some embodiments, the conductive contacts 205 are made of W or Cu. In some embodiments, the conductive contacts 205 are conductive vias connecting the power rails 175 to the metallization layer 355. In some embodiments, the conductive contacts 205 are conductive vias connecting the power rails 175 to the signal lines 335 in the metallization layer 355.

Figure 49B:
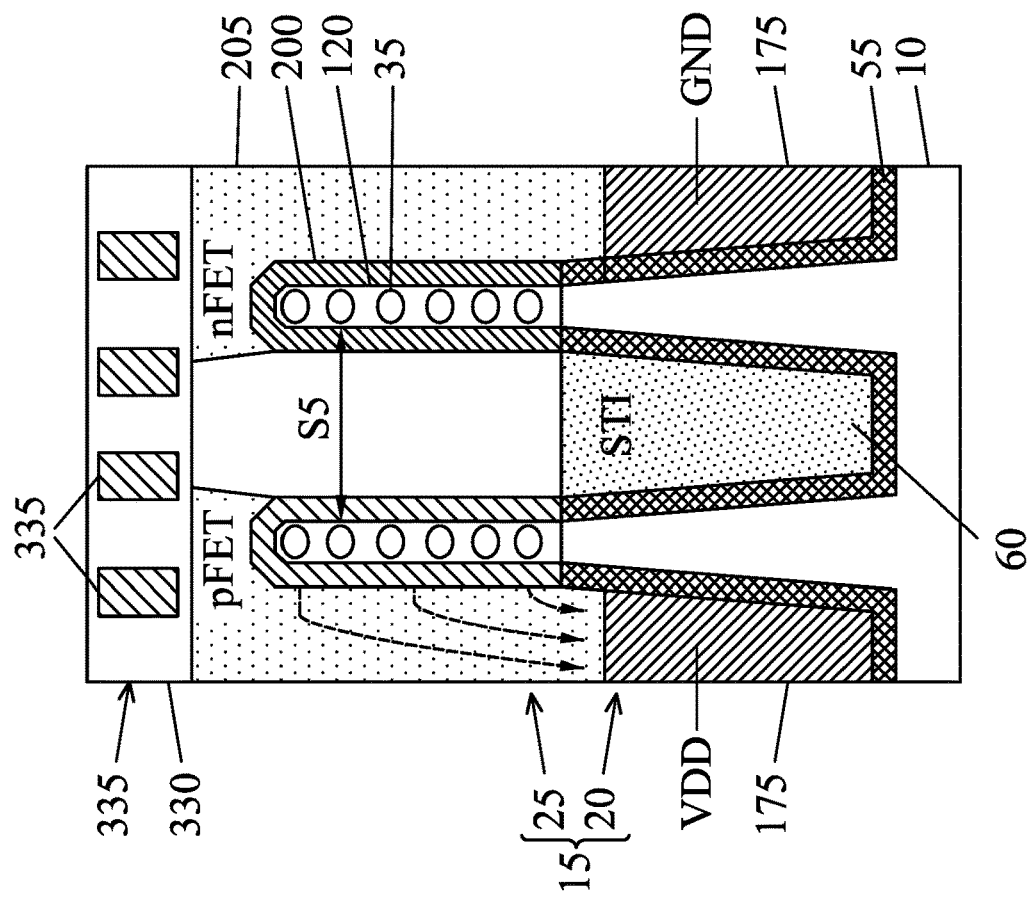
FIG. 49B is a cross-sectional view taken along line G-G' of FIG. 49A.
Figure 49A:
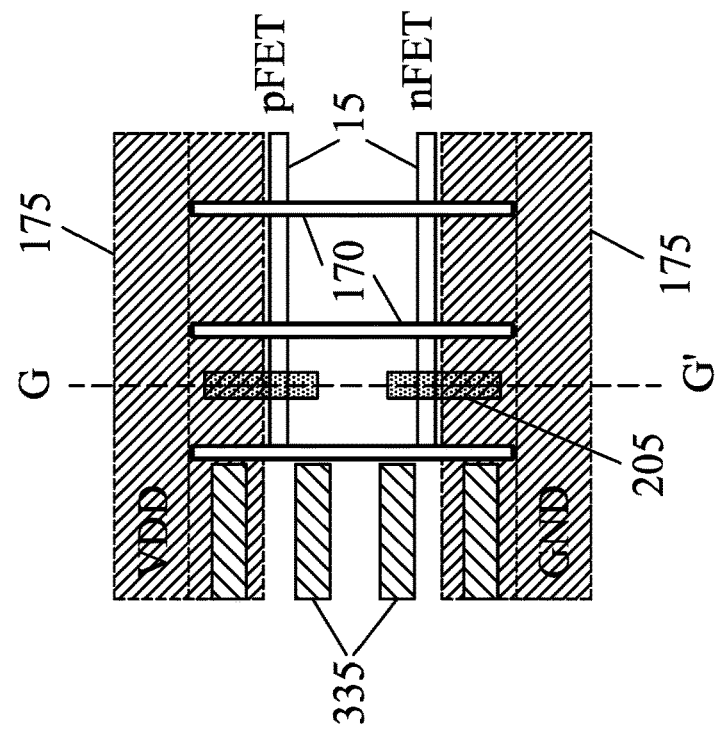
FIG. 49A is a plan view of a semiconductor device according to an embodiment of present disclosure.

FIG. 49A is a plan view of a semiconductor device according to an embodiment of present disclosure. FIG. 49B is a cross-sectional view taken along line G-G' overlying a source/drain region of FIG. 49A, and showing the placement of signal lines 335 in a metallization layer overlying the active device.

FIG. 49A is a schematic plan view of a semiconductor device according to an embodiment of present disclosure showing the relative placement of the power rails 175, signal lines 335, gate electrodes 170, fin structures 15, and conductive contacts 205. As shown in FIGS. 49A and 49B, a metallization layer 355 including signal lines 335 embedded in an insulating layer 330 is formed overlying the semiconductor device active regions. The metallization layer may be formed by suitable photolithography, etching, and material deposition operations. The insulating layer 330 may be made of silicon oxide, silicon nitride, silicon oxide-based material, or silicon nitride-based material. The insulating layer 330 may be formed by CVD, PVD, ALD, or other suitable method. The signal lines 335 include one or more of Co, Ni, W, Ti, Ta, Cu, Al, TiN, and TaN. The signal lines 335 may be formed by CVD, ALD, electro-plating, or other suitable method. In some embodiments, the signal lines 335 include W or Cu. In some embodiments additional layers are located between the conductive contacts 205 and the metallization layer 355.

Power rails 175 are located between the well regions 20 of adjacent fin structures 15. One of the power rails 175 is a positive voltage rail (VDD) and the other is a ground rail (GND). By locating the power rails below the active region of the semiconductor device between the lower portions 20 of the fin structures 15, additional signal lines 335 can be formed overlying the active region of the semiconductor device. By locating the power rails below the active region, four signal lines can be provided instead of only three.

The conductive contacts 205 are connected to the source/drains 120 via silicide layers 200 in some embodiments. The arrows in FIG. 49B show the flow of electrons from the source/drains 120 to the power rails 175. In some embodiments, a dielectric layer is located between the source/drains 120 and conductive contacts and current flows by tunneling. The nanowire stacks of the respective nFET and pFET source/drains are separated by distance S5 of from about 20 nm to about 80 nm in some embodiments, and from about 30 nm to about 60 nm in other embodiments.

Figure 50B:
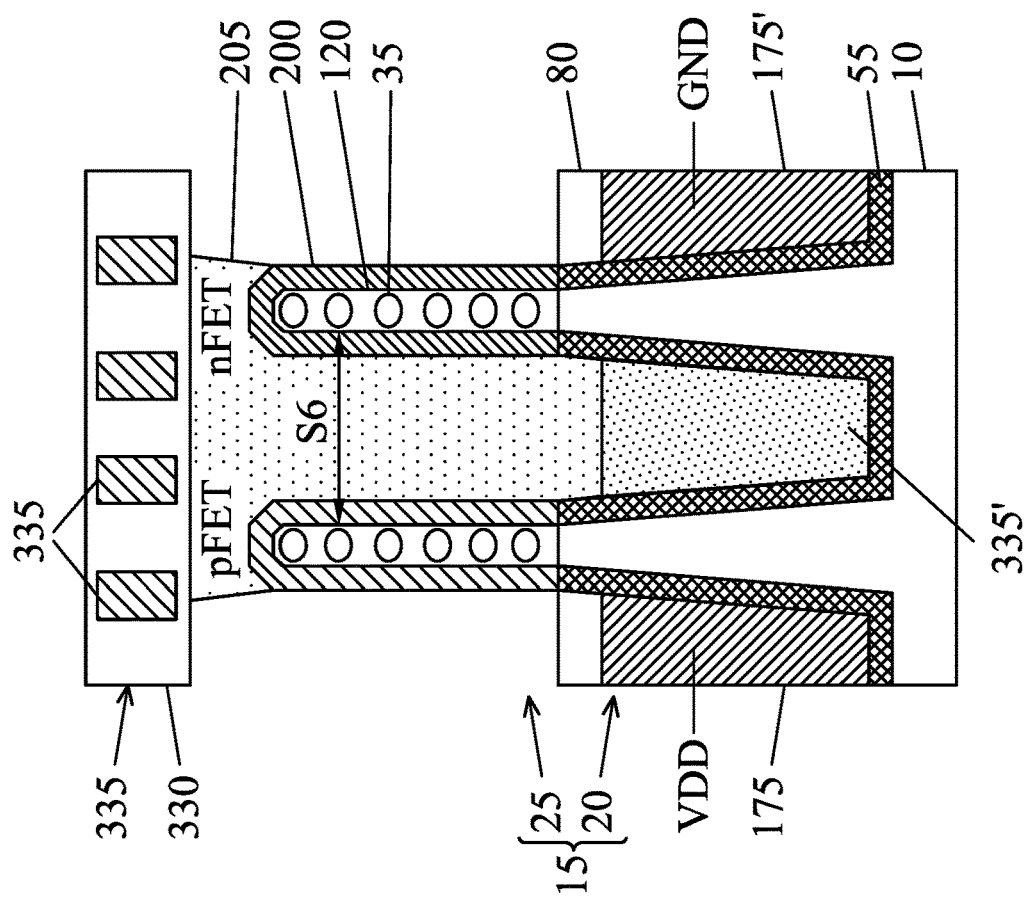
FIG. 50B is a cross-sectional view taken along line H-H' of FIG. 50A.
Figure 50A:
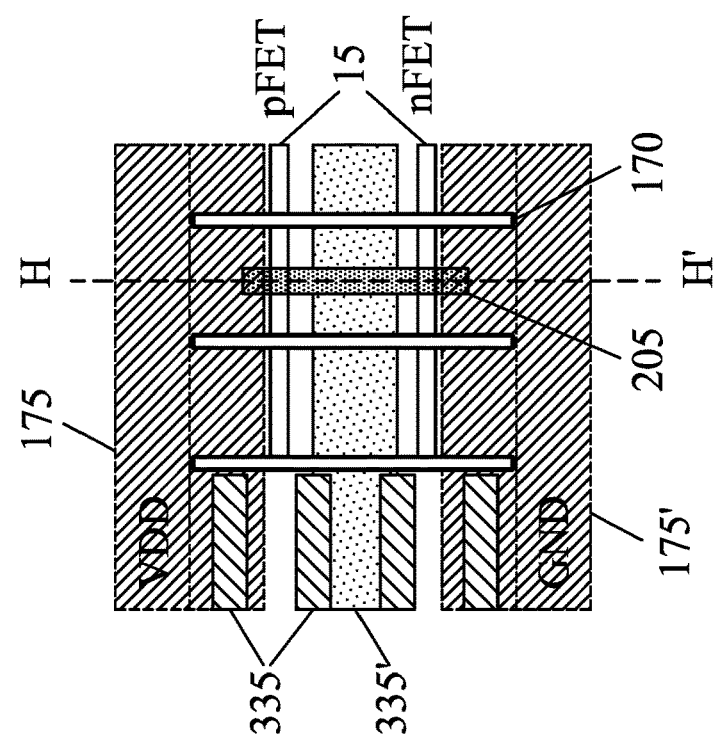
FIG. 50A is a plan view of a semiconductor device according to an embodiment of present disclosure.

FIG. 50A is a plan view of a semiconductor device according to an embodiment of present disclosure. FIG. 50B is a cross-sectional view taken along line H-H' overlying a source/drain of FIG. 50A, and showing the placement of signal lines 335 in a metallization layer overlying the active device.

FIG. 50A is a schematic plan view of a semiconductor device according to an embodiment of present disclosure showing the relative placement of the power rails 175, signal lines 335, 335, gate electrodes 170, fin structures 15, and conductive contacts 205. As shown in FIGS. 50A and 50B, a metallization layer 355 including signal lines 335 embedded in an insulating layer 330 are formed overlying the semiconductor device active regions and between well the regions 20 of the fin structures 15. The metallization layer 355 may be formed by suitable photolithography, etching, and material deposition operations. The insulating layer 330 may be made of silicon oxide, silicon nitride, silicon oxide-based material, or silicon nitride-based material. The insulating layer 330 may be formed by CVD, PVD, ALD, or other suitable method. The signal lines 335, 335' include one or more of Co, Ni, W, Ti, Ta, Cu, Al, TiN, and TaN. The signal lines 335, 335' may be formed by CVD, ALD, electro-plating, or other suitable method. In some embodiments, the signal lines 335, 335' include W or Cu. In some embodiments additional layers are located between the conductive contacts 205 and the metallization layer 355.

Power rails 175 are located between the well regions 20 of adjacent fin structures 15. One of the power rails 175 is a positive voltage rail (VDD) and the other is a ground rail (GND). By locating the power rails 175 and a signal line 335 below the active region of the semiconductor device between the lower portions 20 of the fin structures 15, additional signal lines 335 can be formed overlying the active region of the semiconductor device. For example, if the power rails were located in the same layer as the signal lines there may be room for only three signal lines. However, by locating the power rails and an additional signal line 335' below the active region, five signal lines can be provided instead of only three. The signal line 335' located between the lower regions 20 of the fin structure 15 are separated from the fin structure by an insulating liner layer 55.

In some embodiments, a CMOSFET is provided where one of the nanowire stacks is a pFET and the other nanowire stack is an nFET formed on the same substrate 10. In some embodiments, the source/drains of the pFET and nFET share a common conductive contact 205, as shown in FIG. 50B, where the common conductive contact 205 also contacts the signal line 335 provided between the lower portions 20 of adjacent fin structures 15. In some embodiments, the nanowire stacks of the respective nFET and pFET source/drains are separated by distance S6 of from about 20 nm to about 80 nm in some embodiments, and from about 30 nm to about 60 nm in other embodiments.

FIG. 51A is a plan view of a semiconductor device according to an embodiment of present disclosure. FIG. 51B is a cross-sectional view taken along line J-J' overlying a source/drain of FIG. 51A, and showing the placement of signal lines 335 in a metallization layer overlying the active device.

FIG. 51A is a schematic plan view of a semiconductor device according to an embodiment of present disclosure showing the relative placement of the power rails 175, signal lines 335, gate electrodes 170, fin structures 15, and conductive contacts 205. As shown in FIGS. 51A and 51B, a metallization layer 355 comprising signal lines 335 embedded in an insulating layer 330 are formed overlying the semiconductor device active regions and between well the regions 20 of the fin structures 15. The metallization layer may be formed by suitable photolithography, etching, and material deposition operations. The insulating layer 330 may be made of silicon oxide, silicon nitride, silicon oxide-based material, or silicon nitride-based material. The insulating layer 330 may be formed by CVD, PVD, ALD, or other suitable method. The signal lines 335 include one or more of Co, Ni, W, Ti, Ta, Cu, Al, TiN, and TaN. The signal lines 335 may be formed by CVD, ALD, electro-plating, or other suitable method. In some embodiments, the signal lines 335 include W or Cu. In some embodiments additional layers are located between the conductive contacts 205 and the metallization layer 355. Power rails 175 are located between the well regions 20 of adjacent fin structures 15. One of the power rails 175 is a positive voltage rail (VDD) and the other is a ground rail (GND). By locating the power rails 175 below the active region of the semiconductor device between the lower portions 20 of the fin structures 15, additional signal lines 335 can be formed overlying the active region of the semiconductor device. For example, if the power rails were located in the same layer as the signal lines there may be room for only three signal lines. However, by locating the power rails 175 below the active region, four signal lines can be provided instead of only three.

In some embodiments, a CMOSFET is provided where one of the nanowire stacks is a pFET and the other nanowire stack is an nFET formed on the same substrate 10. In some embodiments, a source/drain insulating layer 360 is formed between the lower portion 20 of the fin structure 15 and the source/drains 120 of the nFET and pFET, as shown in FIG. 51B. The source/drain insulating layer 360 is formed of an oxide or nitride in some embodiments to a thickness of about 2 nm to about 20 nm. In other embodiments, the thickness of the source/drain insulating layer 360 ranges from about 5 nm to about 10 nm. In embodiments including the source/drain insulating layer 360, the insulating liner layer 55 between the power rail 175 and the fin structure 15 is not necessary. Thus, the cross sectional area of the power rail 175 can be increased and the overall resistance of the device can be reduced. Reference No. 345 designates CMOSFET well PN junction. In some embodiments, the nanowire stacks of the respective nFET and pFET source/drains are separated by distance S7 of from about 20 nm to about 80 nm in some embodiments, and from about 30 nm to about 60 nm in other embodiments.

It is understood that the GAA FETs formed according to the disclosed methods undergo further CMOS processes to form various features such as contacts/vias, interconnect metal layers, dielectric layers, passivation layers, metallization layers with signal lines, etc.

Semiconductor devices and methods of manufacturing semiconductor devices according to the present disclosure provide an increased number metal tracks thereby reducing the complexity of placement and routing on a chip, and improving the density of the chip without increasing the size of semiconductor device. Devices according to the present disclosure about 12% to about 14% increased device density on a chip in some embodiments. Devices and methods of manufacturing according to the present disclosure further provide power rails and signal lines of increased cross sectional area thereby reducing resistance of the device. In addition, devices and methods of manufacturing according to the present disclosure provide direct, low-resistance contact between the power rails and the gate electrodes, between power rails and source/drains, and between signal lines and source/drains, thereby reducing the resistance of the device.

An embodiment of the present disclosure is a method of manufacturing a semiconductor device, including forming a plurality of fin structures extending in a first direction over a semiconductor substrate. Each fin structure includes a first region proximate to the semiconductor substrate and a second region distal to the semiconductor substrate. An electrically conductive layer is formed between the first regions of a first adjacent pair of fin structures. A gate electrode structure is formed extending in a second direction substantially perpendicular to the first direction over the fin structure second region, and a metallization layer including at least one conductive line is formed over the gate electrode structure. In an embodiment, the forming a plurality of fin structures includes forming a nanowire structure in the second region of the fin structure. In an embodiment, forming the gate electrode structure includes forming a gate dielectric layer over at least one wire of the nanowire structure; and forming a gate electrode layer over the gate dielectric layer, wherein the gate dielectric layer and the gate electrode layer wrap around the at least one wire of the nanowire structure. In an embodiment, forming an electrically conductive layer includes: forming an insulating material layer between a plurality of adjacent pairs of fin structures, removing the insulating material layer from between at least one pair of adjacent fin structures, and forming the electrically conductive layer between the at least one pair of adjacent fin structures after removing the insulating material layer. In an embodiment, the method includes forming a first insulating layer between the metallization layer and the gate structure and fin structures. In an embodiment, the method includes forming a conductive via in the first insulating layer, wherein the conductive via connects the electrically conductive layer and the metallization layer. In an embodiment, the method includes forming a second insulating layer filling a space between a second adjacent pair of fin structures where no electrically conductive layer is formed. In an embodiment, the method includes forming a third insulating layer between the electrically conductive layer and the first regions of the first pair of adjacent fins. In an embodiment, the method includes forming a fourth insulating layer between the electrically conductive layer and the gate electrode structure.

Another embodiment of the present disclosure is a method of manufacturing a semiconductor device, including forming a first semiconductor layer having a first composition over a semiconductor substrate and forming a second semiconductor layer having a second composition over the first semiconductor layer. Another first semiconductor layer having the first composition is formed over the second semiconductor layer, and another second semiconductor layer having the second composition is formed over the another first semiconductor layer. The first semiconductor layers, second semiconductor layer, and the semiconductor substrate are patterned to form a plurality of fin structures extending in a first direction. The fin structures include a first region adjacent the semiconductor substrate and a second region including the first semiconductor layers and second semiconductor layers. The second region includes a first portion extending along the first direction between a pair of second portions. An insulating liner layer is formed over the fin structures and an isolation insulating layer is formed between the fin structures. The isolation insulating layer is removed from between a first pair of adjacent fin structures. A first conductive layer is formed between the first pair of adjacent fin structures. The insulating liner layer is removed from the first region of the fin structures. The first semiconductor layer is removed from a first portion of the second region of the fin structures thereby forming nanowires comprising the second semiconductor layer. A dielectric layer and a second conductive layer are formed over the first portion of the fin structures surrounding the nanowires thereby forming a gate electrode structure extending in a second direction substantially perpendicular to the first direction. A metallization layer comprising a plurality of conductive lines is formed over gate electrode structure. In an embodiment, before forming the metallization layer, an interlayer dielectric layer is formed over the gate electrode structure. In an embodiment, the method includes forming a conductive via in the interlayer dielectric layer between the metallization layer and the first conductive layer. In an embodiment, the method includes before forming the dielectric layer and the second conductive layer over the first portion of the fin structures: forming a sacrificial gate dielectric layer over the first portion of the fin structures surrounding the nanowires, forming a sacrificial gate electrode layer surrounding the sacrificial gate dielectric layer, and removing the sacrificial gate dielectric layer and the sacrificial gate electrode layer.

Another embodiment of the present disclosure is a method of manufacturing a semiconductor device including forming a plurality of fin structures extending in a first direction over a semiconductor substrate. Each fin structure includes a first region adjacent the semiconductor substrate and a second region overlying the first region, and each fin structure includes a first portion between a pair of second portions extending in the first direction. An isolation insulating region is formed between the first regions of a first adjacent pair of fin structures. An electrically conductive layer is formed between the first regions of a second pair adjacent pair of fin structures. A gate electrode structure extending in a second direction substantially perpendicular to the first direction is formed over the first portion of the fin structure second region. Source/drain regions are formed over the second portions of the fin structure second region. An interlayer dielectric layer over the gate electrode structure, and at least one conductive line is formed over the interlayer dielectric layer. In an embodiment, the method includes forming an insulating liner layer over the fin structures before forming the electrically conductive layer. In an embodiment, the forming a plurality of fin structures includes forming an alternating stack of first semiconductor layers made of a first semiconductor material and second semiconductor layers made of a second semiconductor material, wherein the first semiconductor material and second semiconductor material are different materials. In an embodiment, the method includes removing the first semiconductor layers in the first portion of the fin structures before forming the first gate electrode structure. In an embodiment, the method includes forming conductive vias in interlayer dielectric layer contacting the source/drain regions and the electrically conductive layer. In an embodiment, the method includes forming a contact layer over the source/drain regions. In an embodiment, the method includes forming a source/drain insulating layer over the second portion of the fin structures before forming the source drain/regions.

Another embodiment of the present disclosure is a semiconductor device including a plurality of fin structures extending in a first direction disposed over a semiconductor substrate. Each fin structure includes a first region proximate to the semiconductor substrate and a second region distal to the semiconductor substrate. At least one first electrically conductive layer is disposed between the first regions of an adjacent pair of fins. At least one gate electrode structure extends in a second direction substantially perpendicular to the first direction disposed over a first portion of the fin structure second region, and a metallization layer including at least one conductive line is disposed over the gate electrode structure. In an embodiment, the fin structure second region includes a nanowire structure including a stack of a plurality of nanowires, each nanowire extending substantially parallel to an adjacent nanowire. In an embodiment, the gate electrode structure includes a gate dielectric layer and gate electrode layer, wherein the gate dielectric layer and gate electrode layer wrap around each nanowire. In an embodiment, the first electrically conductive layer includes a power rail and a ground rail. In an embodiment, a conductive via connects the first electrically conductive layer to the metallization layer. In an embodiment, a first insulating layer is disposed between the first electrically conductive layer and the fin structure. In an embodiment, source/drains are disposed over a second portion of the fin structure second region, and a conductive contact connects the at least one first electrically conductive region and the source/drains. In an embodiment, a second insulating layer fills a space between a pair of adjacent fin structures where no electrically conductive layer is formed. In an embodiment, a third insulating layer is disposed between the electrically conductive layer and the gate electrode structure. In an embodiment, source/drain regions are disposed on opposing sides of the gate electrode structure and over the fin structure first regions. In an embodiment, a contact layer is disposed on the source/drain regions. In an embodiment, a fourth insulating layer is disposed between the fin structure first region and the source/drain regions. In an embodiment, the metallization layer includes a plurality of signal lines. In an embodiment, a lower signal line is disposed between adjacent fin structure first regions where no first electrically conductive layer is formed. In an embodiment, a conductive via connects the lower signal line with the metallization layer.

Another embodiment of the present disclosure is a semiconductor device including a plurality of fin structures extending in a first direction disposed over a semiconductor substrate. Each fin structure includes a lower well region and an upper channel region over the well region. The channel region includes one or more nanowires extending substantially parallel to the well region. A gate electrode structure extends in a second direction substantially perpendicular to the first direction disposed over the channel region, and the gate electrode structure wraps around the one or more nanowires. At least one first electrically conductive layer is disposed between the channel regions of adjacent fins extending in the first direction. A plurality of second electrically conductive layers is disposed over the gate electrode structure extending in the first direction. In an embodiment, an insulating liner layer is disposed between the well region and the first conductive layer. In an embodiment, a conductive via is disposed between the first conductive layer and the second conductive layer.

Another embodiment of the present disclosure is a semiconductor device including a plurality of fin structures extending in a first direction disposed over a semiconductor substrate. Each fin structure includes a well region and a nanowire stack disposed over the well region. The nanowire stack includes a plurality of nanowires extending substantially parallel to each other in the first direction. A gate electrode structure extends in a second direction substantially perpendicular to the first direction disposed over the nanowire stack, and the gate electrode structure wraps around each of the nanowires. A power rail extends in the first direction disposed between the well region of a first pair of adjacent fin structures. A ground rail extends in the first direction disposed between the well region of a second pair of adjacent fin structures, and a plurality of signal lines are disposed over the gate electrode structure extending in the first direction. In an embodiment, an insulating layer is disposed between a third pair of fin structures located between the first pair of fin structures and the second pair of fin structures.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

It will be understood that not all advantages have been necessarily discussed herein, no particular advantage is required for all embodiments or examples, and other embodiments or examples may offer different advantages.

What is claimed is:

1. A semiconductor device comprising:
   first well region and a second well region spaced apart from each other extending in a first direction and arranged in a second direction perpendicular to the first direction disposed over a substrate;
   a first stack of spaced-apart semiconductor layers disposed over the first well region and a second stack of spaced-apart semiconductor layers disposed over the second well region,
   wherein the first stack and the second stack are arranged along a third direction perpendicular to the first direction and the second direction, and
   wherein a ratio of a height H2 of the first stack to a distance S4 between the first stack and the second stack (H2/S4) ranges from 0.25 to 5.0;
   a metal track disposed between the first well region and the second well region;
   a gate electrode wrapping around each of the semiconductor layers; and
   an insulating layer disposed between the metal track and the gate electrode along the third direction.

2. The semiconductor device of claim 1, further comprising a gate dielectric layer disposed between each of the semiconductor layers and the gate electrode.

3. The semiconductor device of claim 1, further comprising a ground rail disposed between another adjacent pair of well regions.

4. The semiconductor device of claim 1, further comprising a metallization layer disposed over the gate electrode.

5. The semiconductor device of claim 4, further comprising a conductive via connecting the metallization layer to the metal track.

6. The semiconductor device of claim 1, further comprising a shallow trench isolation filling a space where no electrically conductive layer is formed between a pair of adjacent well regions.

7. The semiconductor device of claim 1, further comprising:
   source/drains disposed over portions of the well regions on opposing sides of the gate electrode.

8. A semiconductor device, comprising:
   a first well region and a second well region spaced apart from each other extending in a first direction and arranged in a second direction perpendicular to the first direction disposed over a substrate;
   a first stack of spaced-apart semiconductor layers disposed over the first well region and a second stack of spaced-apart semiconductor layers disposed over the second well region,
   wherein the first stack and the second stack are arranged along a third direction perpendicular to the first direction and the second direction, and
   a ratio of a thickness D1 of each semiconductor layer to a distance S2 between adjacent semiconductor layer (D1/S2) ranges from 0.05 to 20;
   a gate electrode wrapping around each of the semiconductor layers;
   a power rail extending in the first direction disposed between the first well region and the second well region;
   a plurality of spaced-apart signal lines extending in the first direction and arranged along the second direction disposed over the gate electrode; and
   an insulating layer disposed between the power rail and the gate electrode along the third direction.

9. The semiconductor device of claim 8, wherein a ratio of a width W2 of each signal line to a distance S8 between each signal line (W2/S8) ranges from 0.06 to 8.0.

10. The semiconductor device of claim 8, further comprising an insulating liner layer disposed between the well regions and the power rail.

11. The semiconductor device of claim 9, further comprising a conductive via disposed between the plurality of signal lines and the power rail.

12. The semiconductor device of claim 9, further comprising a gate dielectric layer disposed between each of the semiconductor layers and the gate electrode.

13. The semiconductor device of claim 12, wherein the gate electrode and the gate dielectric layer wraps around each of the semiconductor layers.

14. The semiconductor device of claim 9, further comprising source/drain regions disposed on opposing sides of the gate electrode.

15. The semiconductor device of claim 14, further comprising a contact layer disposed on the source/drain regions.

16. A semiconductor device, comprising:
   a first well region extending in a first direction disposed over a substrate;
   a second well region extending in the first direction disposed over the substrate spaced-apart from the first well region,
   wherein the first well region and the second well region are separated by a first insulating layer;
   a first plurality of semiconductor layers arranged along a second direction perpendicular to the first direction disposed over the first well region;
   a second plurality of semiconductor layers arranged along the second direction disposed over the second well region;
   a first gate electrode wrapping around the first semiconductor layers;
   a second gate electrode wrapping around the second semiconductor layers,
   wherein the first gate electrode and the second gate electrode are separated by a gap along a third direction perpendicular to the first direction and the second direction, a first metal track extending in the first direction disposed alongside the first well region;

a second metal track extending in the first direction disposed alongside the second well region;

a second insulating layer disposed between the first metal track and the first gate electrode and between the second metal track and the second gate electrode; and a plurality of spaced-apart signal lines extending in the first direction and arranged along the third direction disposed over the first gate electrode and the second gate electrode, wherein a ratio of a height H5 of each signal line to a width W2 of each signal line (H5/W2) ranges from 0.13 to 17.0.

17. The semiconductor device of claim 16, further comprising a plurality of signal lines disposed over the first gate electrode and the second gate electrode.

18. The semiconductor device of claim 17, further comprising a conductive via connecting the first metal track to the signal lines.

19. The semiconductor device of claim 17, further comprising a conductive via connecting the second metal track to the signal lines.

20. The semiconductor device of claim 16, further comprising an insulating liner layer disposed between the first well region and the first metal track.

* * * * *